(12) United States Patent
Wang et al.

(10) Patent No.: US 7,763,513 B2
(45) Date of Patent: *Jul. 27, 2010

(54) INTEGRATED CIRCUIT DEVICE AND METHOD OF MANUFACTURE

(75) Inventors: Peng-Fei Wang, Dresden (DE); Joachim Nuetzel, Dresden (DE); Rolf Weis, Dresden (DE); Till Schloesser, Dresden (DE); Marc Strasser, Munich (DE); Hannes Luyken, Munich (DE)

(73) Assignee: Qimonda AG, Munich (DE)

( * ) Notice: Subject to any disclaimer, the term of this patent is extended or adjusted under 35 U.S.C. 154(b) by 1060 days.

This patent is subject to a terminal disclaimer.

(21) Appl. No.: 11/222,540

(22) Filed: Sep. 9, 2005

(65) Prior Publication Data

US 2007/0057301 A1    Mar. 15, 2007

(51) Int. Cl.
*H01L 21/336* (2006.01)

(52) U.S. Cl. .................. 438/259; 438/270; 438/587; 257/330

(58) Field of Classification Search .......... 438/259, 438/270–274, 587–591; 257/330–334
See application file for complete search history.

(56) References Cited

U.S. PATENT DOCUMENTS

| 5,357,464 | A | * | 10/1994 | Shukuri et al. ............ 365/149 |
| 5,945,707 | A |   | 8/1999  | Bronner et al. |
| 6,426,175 | B2 | * | 7/2002 | Furukawa et al. ........... 430/313 |
| 6,744,097 | B2 | * | 6/2004 | Yoo .......................... 257/321 |
| 7,132,333 | B2 | * | 11/2006 | Schloesser et al. ......... 438/272 |
| 7,442,609 | B2 | * | 10/2008 | Wang et al. ................ 438/272 |
| 2005/0003308 | A1 |   | 1/2005 | Frohlich et al. |

OTHER PUBLICATIONS

Deok-Hyung Lee et al., "Fin-channel-array transistor (FCAT) featuring sub-70-nm low power and high performance DRAM" IEDM Tech. Dig., pp. 407 to 410, 2003 (Abstract Only).

* cited by examiner

*Primary Examiner*—Thinh T Nguyen
(74) *Attorney, Agent, or Firm*—Dicke, Billig & Czaja, PLLC

(57) ABSTRACT

A method of manufacturing a transistor is disclosed. The method includes forming a first and a second source/drain regions, a channel connecting the first and the second source/drain regions and a gate electrode for controlling the conductivity of the channel. The gate electrode is formed by defining a gate groove in the substrate, and defining a pocket in each of the isolation trenches at a position adjacent to the groove so that the two pockets will be connected with the groove and the groove is disposed between the two pockets. A gate insulating material is provided at an interface between the active area and the groove and at an interface between the active area and the pockets. A gate electrode material is deposited so as to fill the groove and the two pockets.

10 Claims, 121 Drawing Sheets

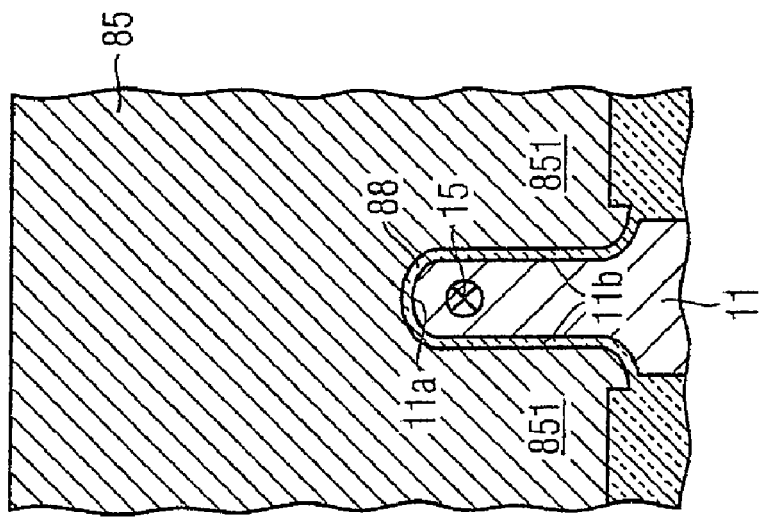
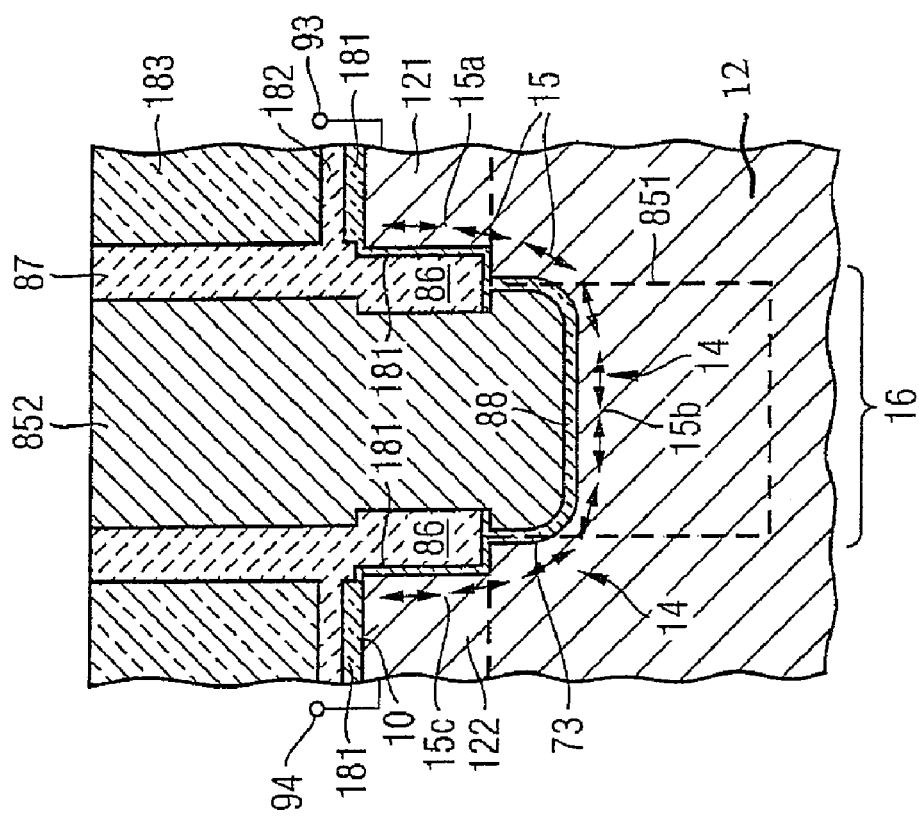

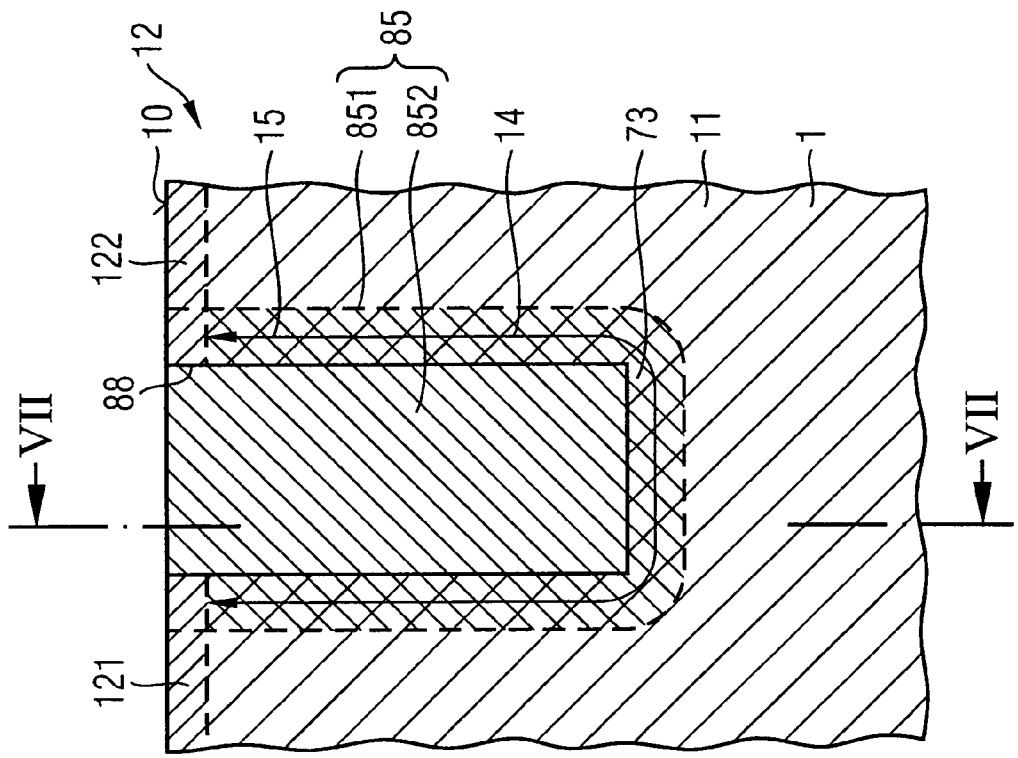

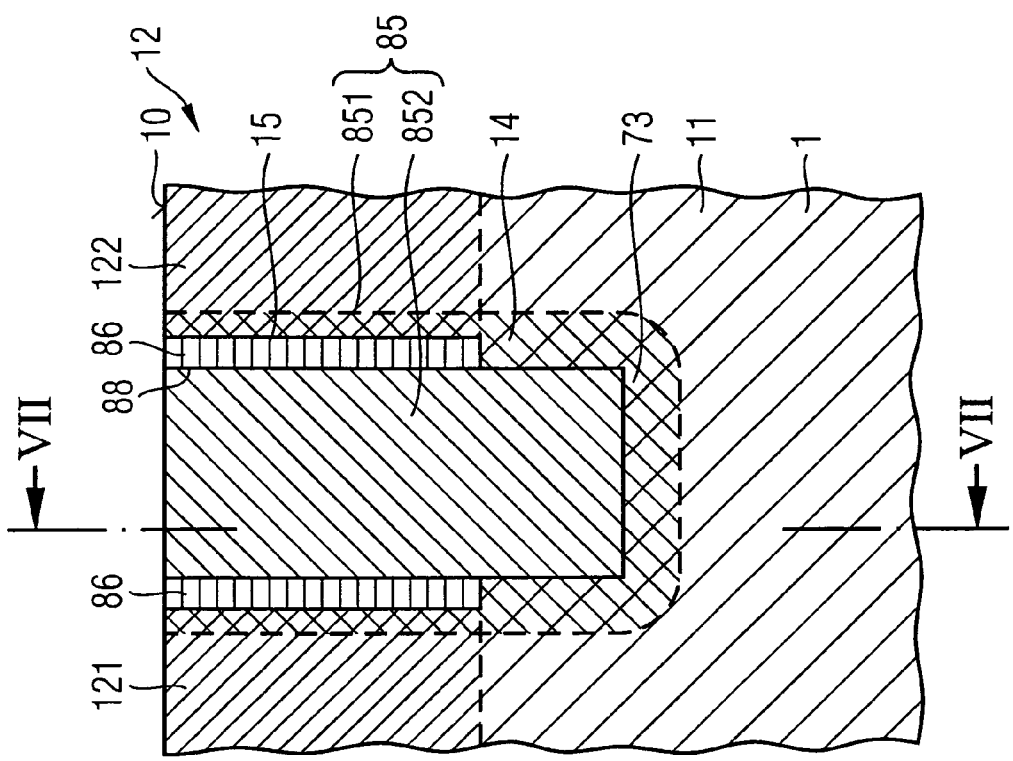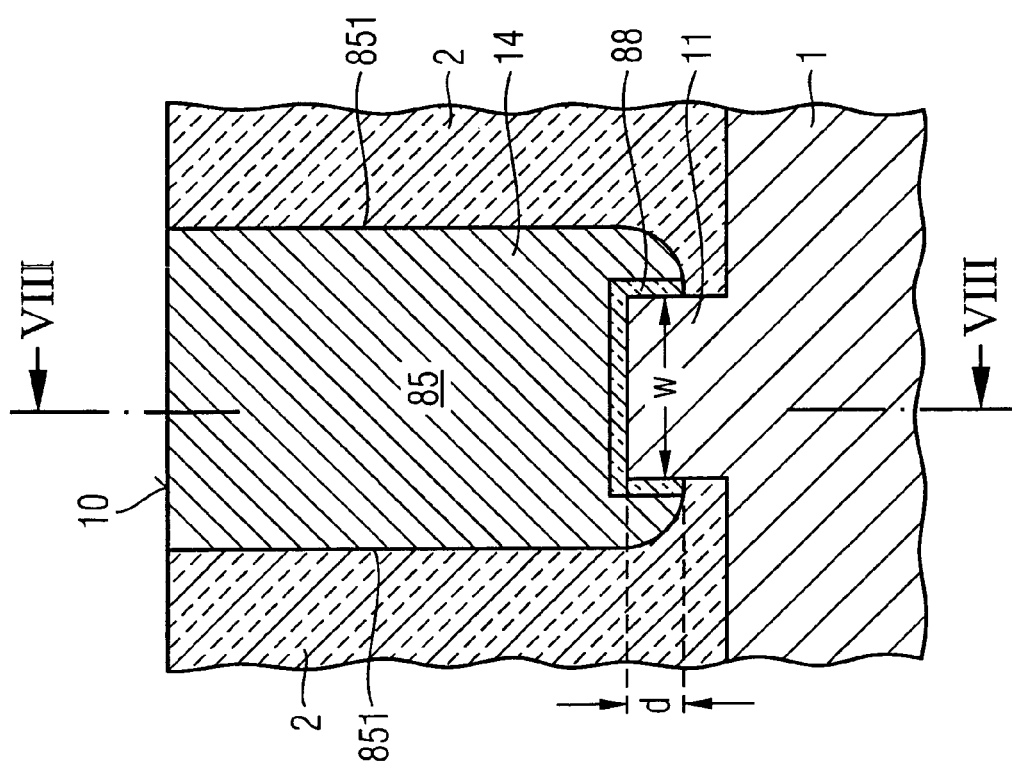

FIG 6
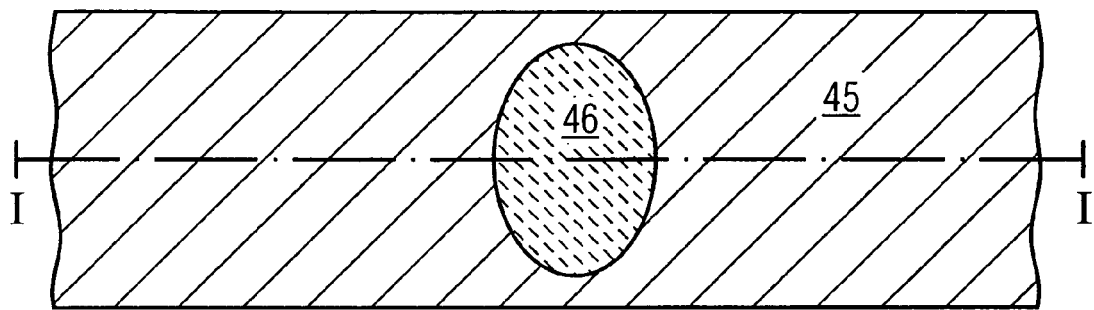
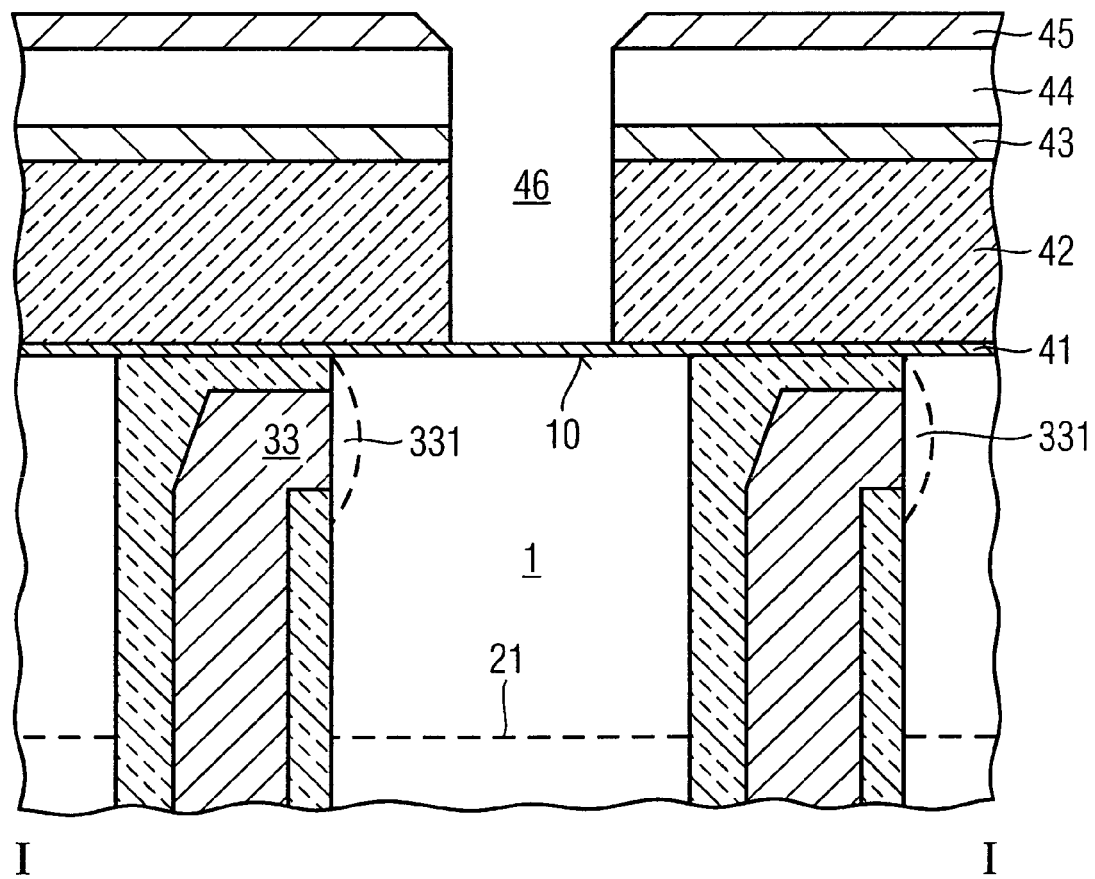

FIG 7
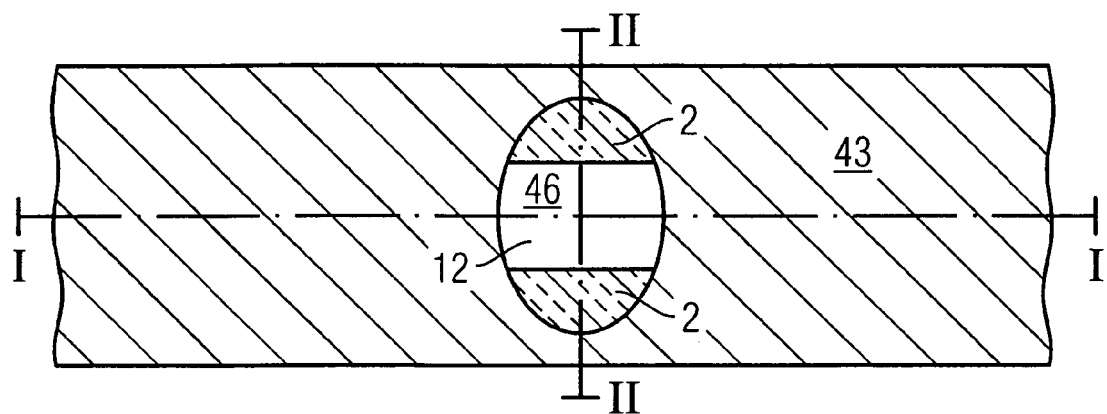
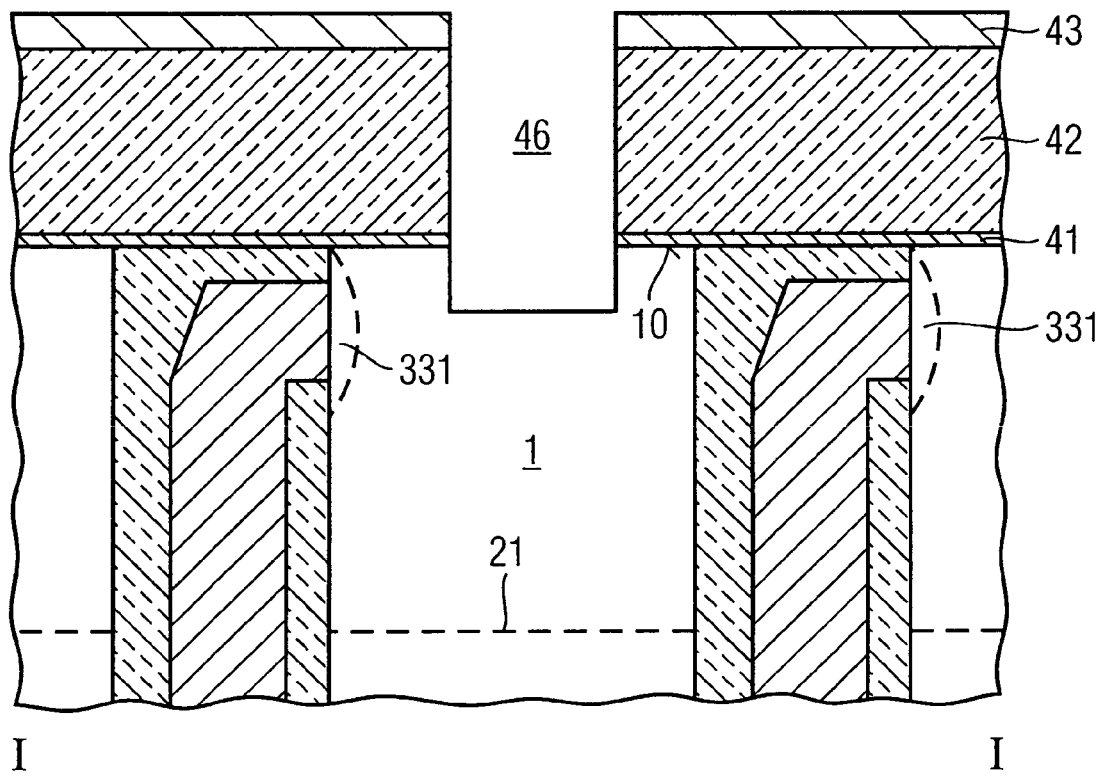

FIG 8A
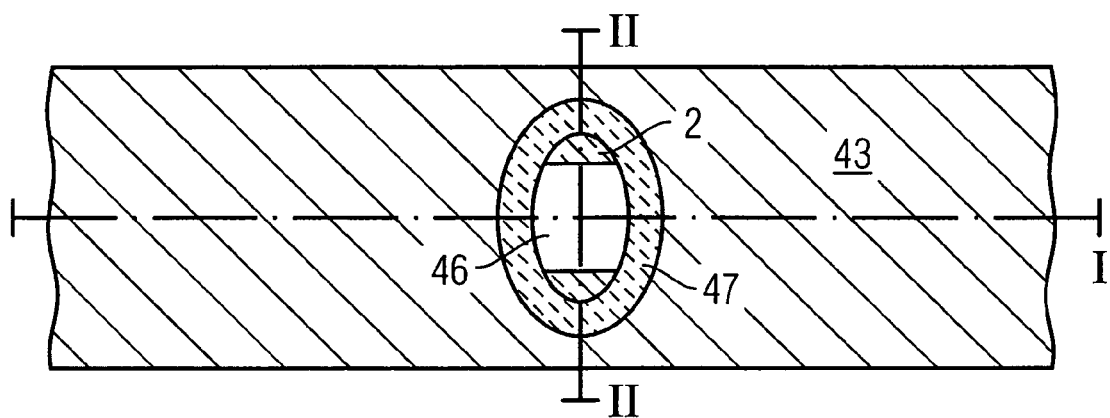
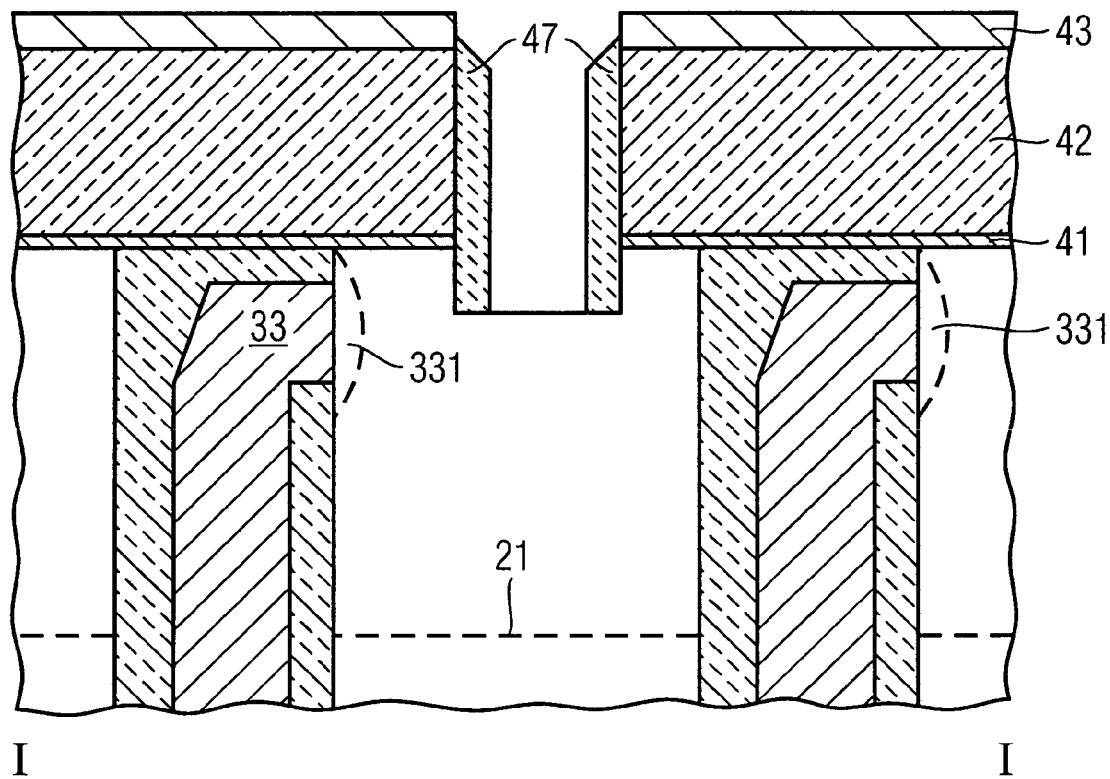

FIG 9
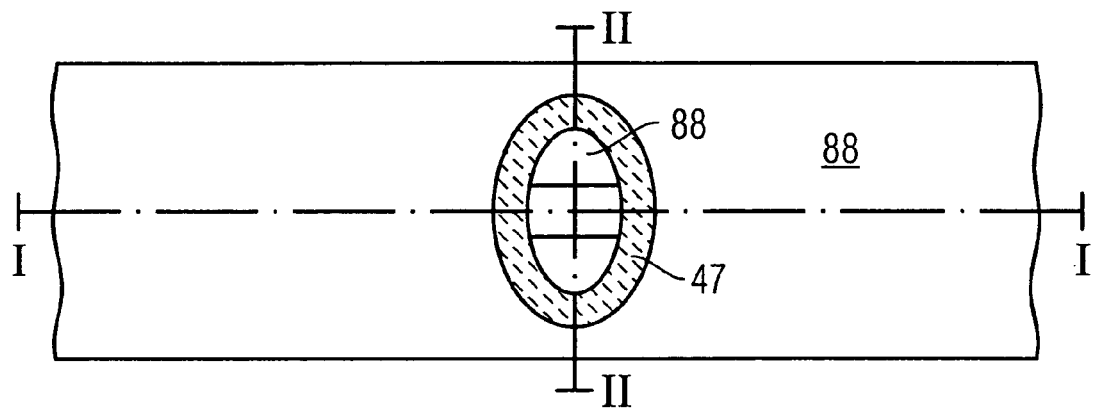
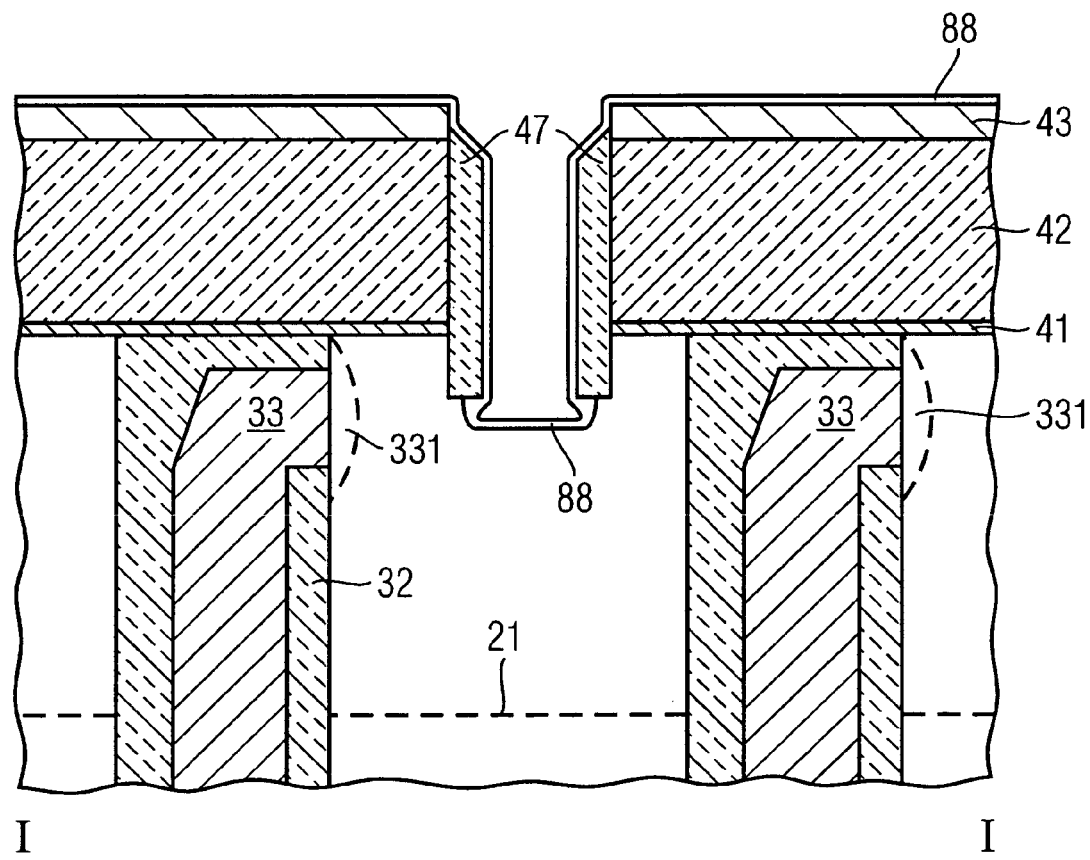

FIG 18
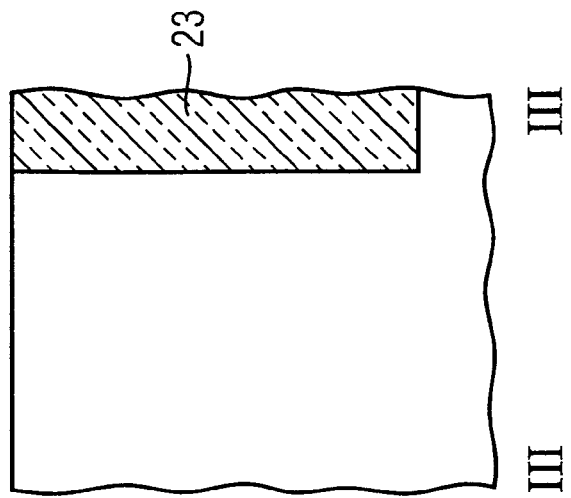
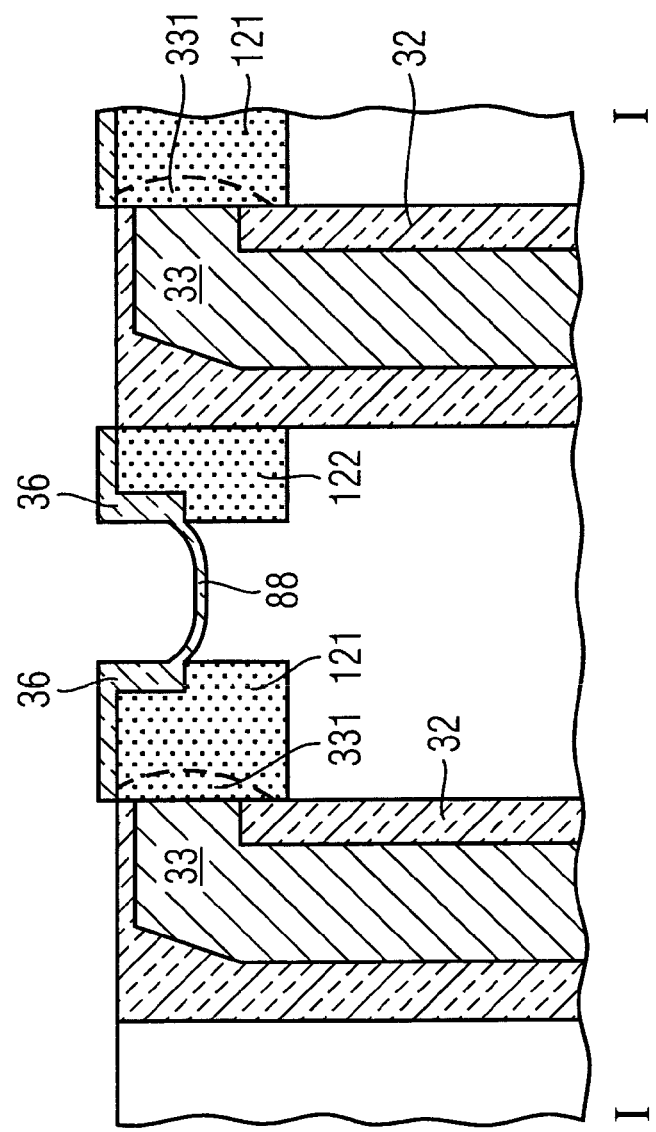

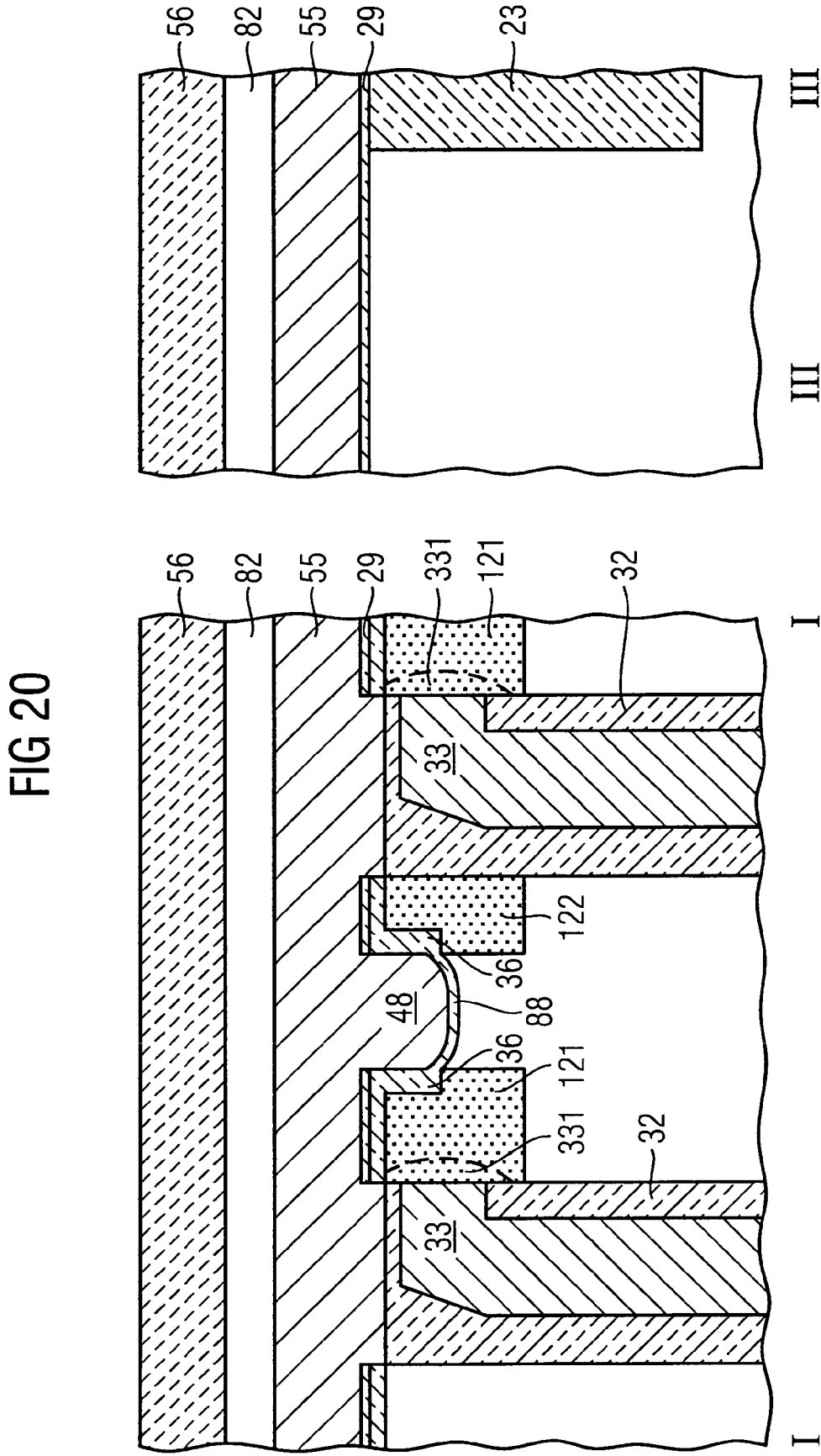

FIG 44
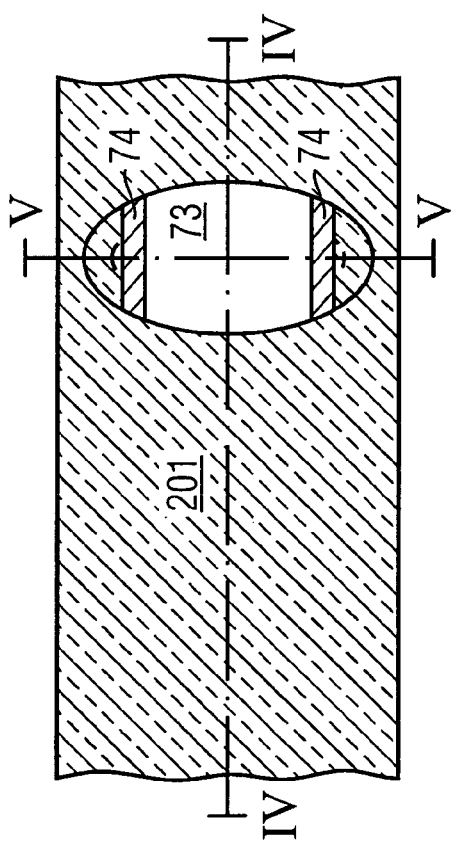
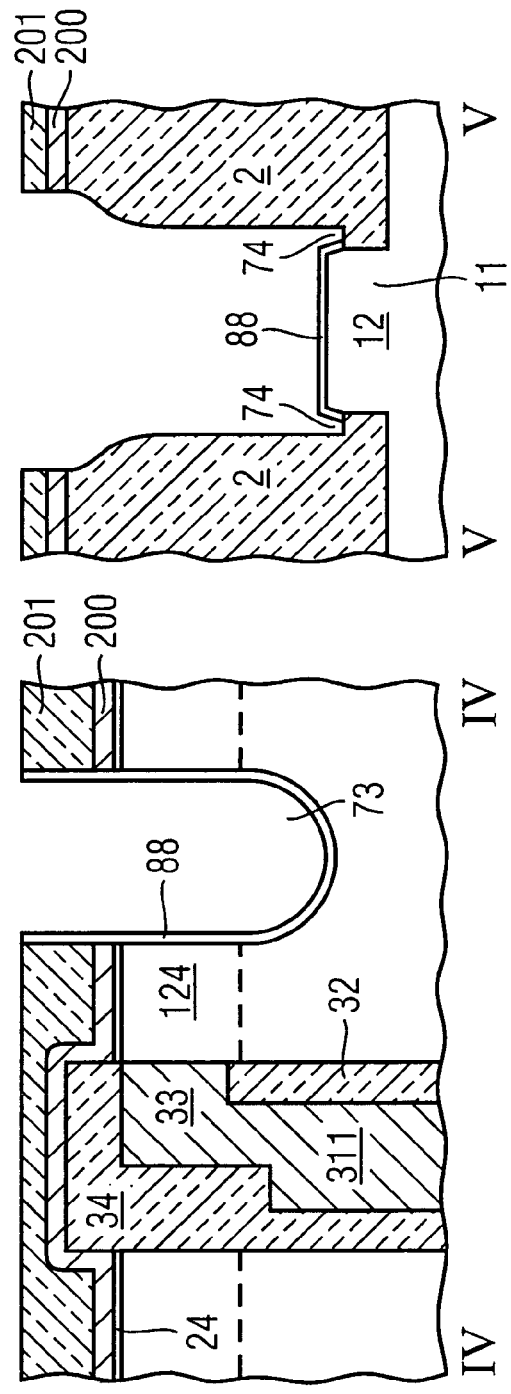

FIG 45
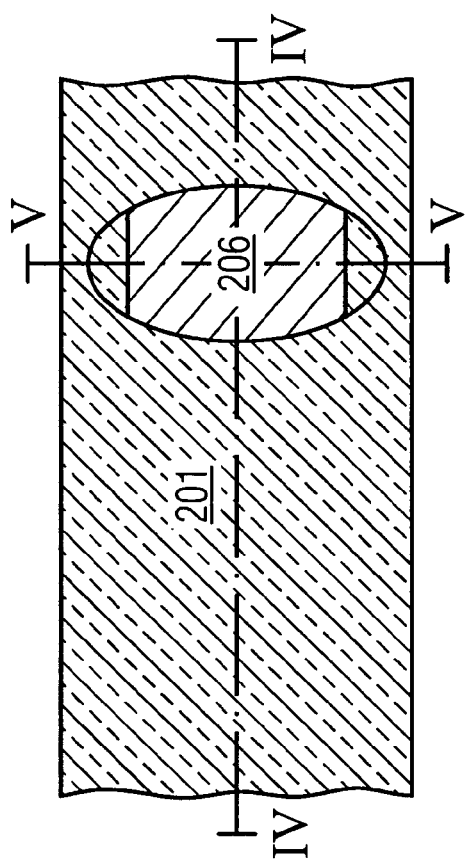
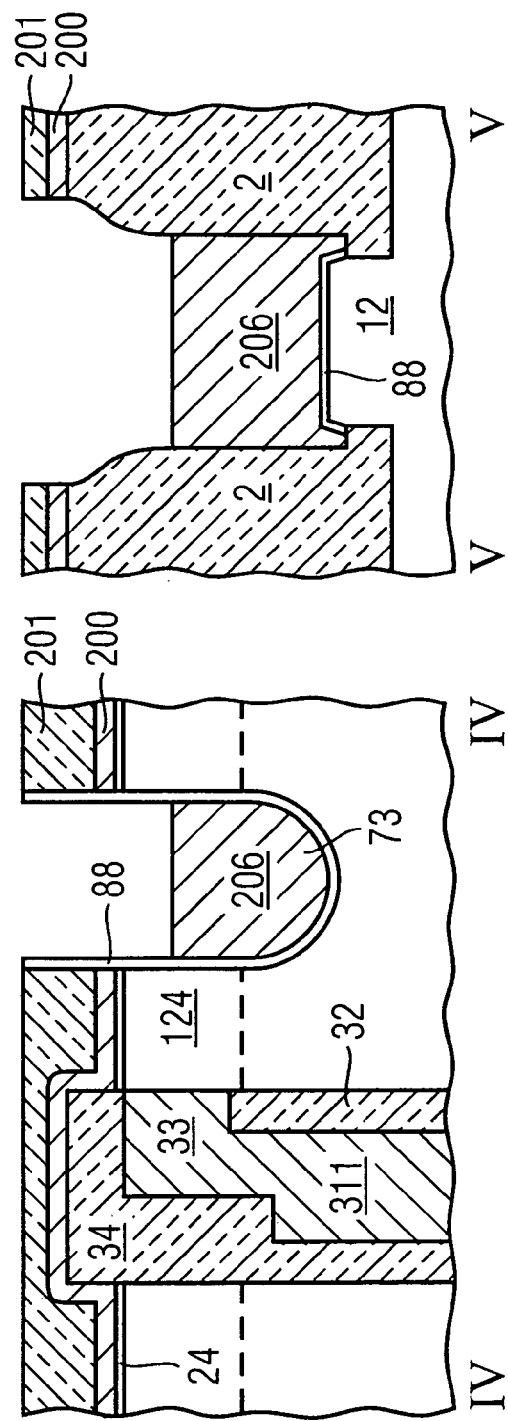

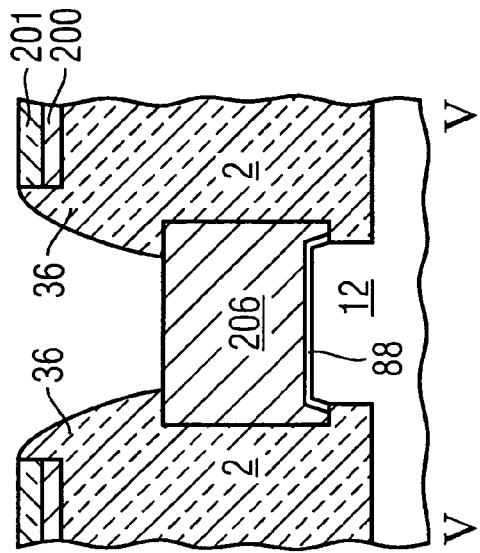
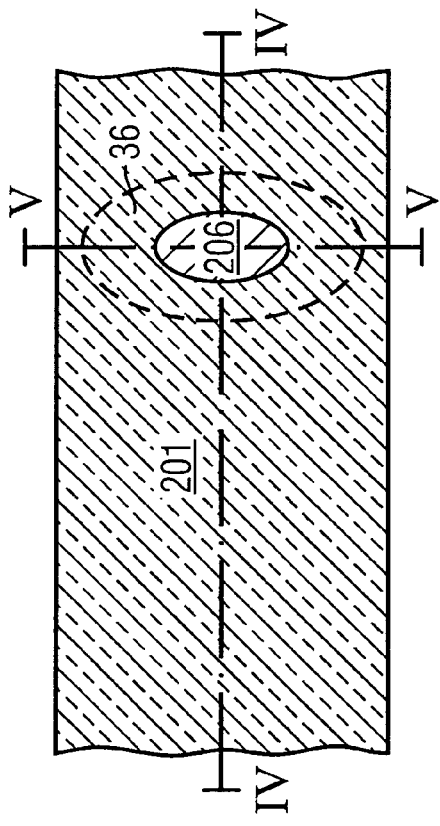
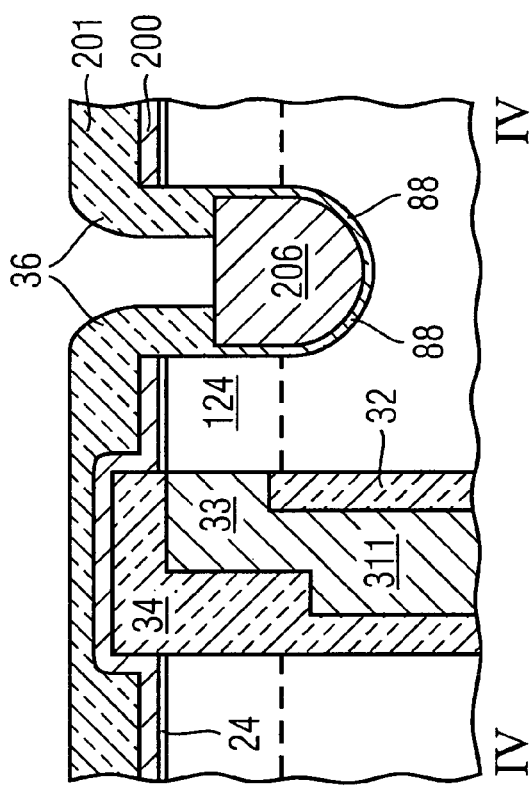
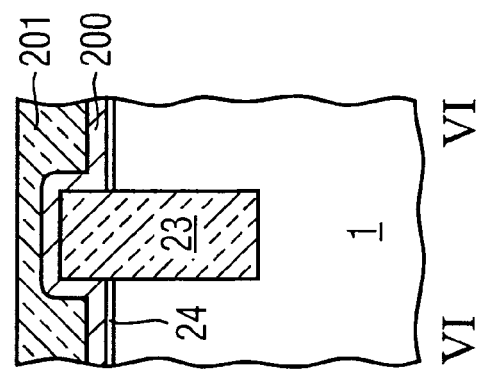
FIG 46

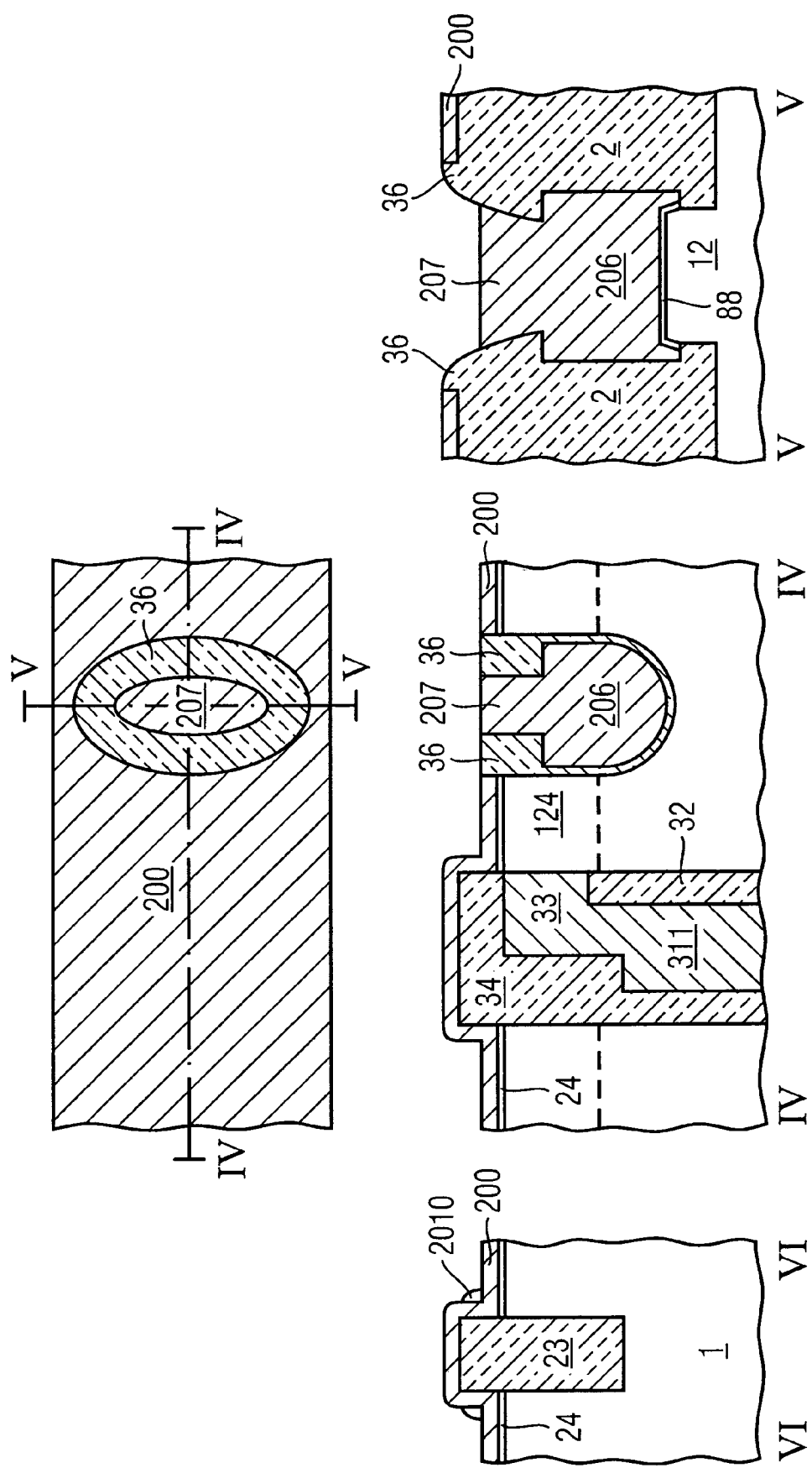

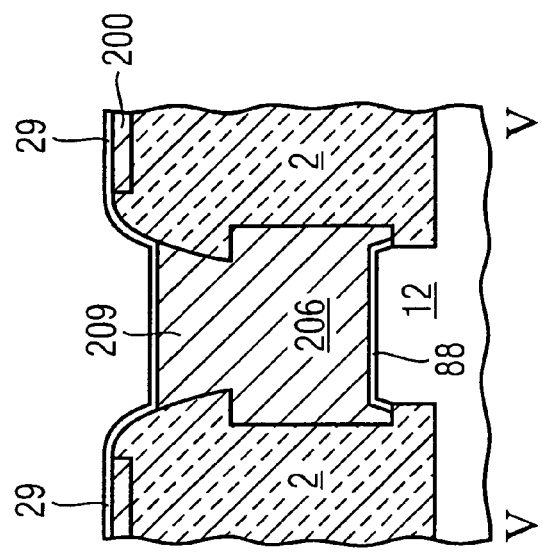
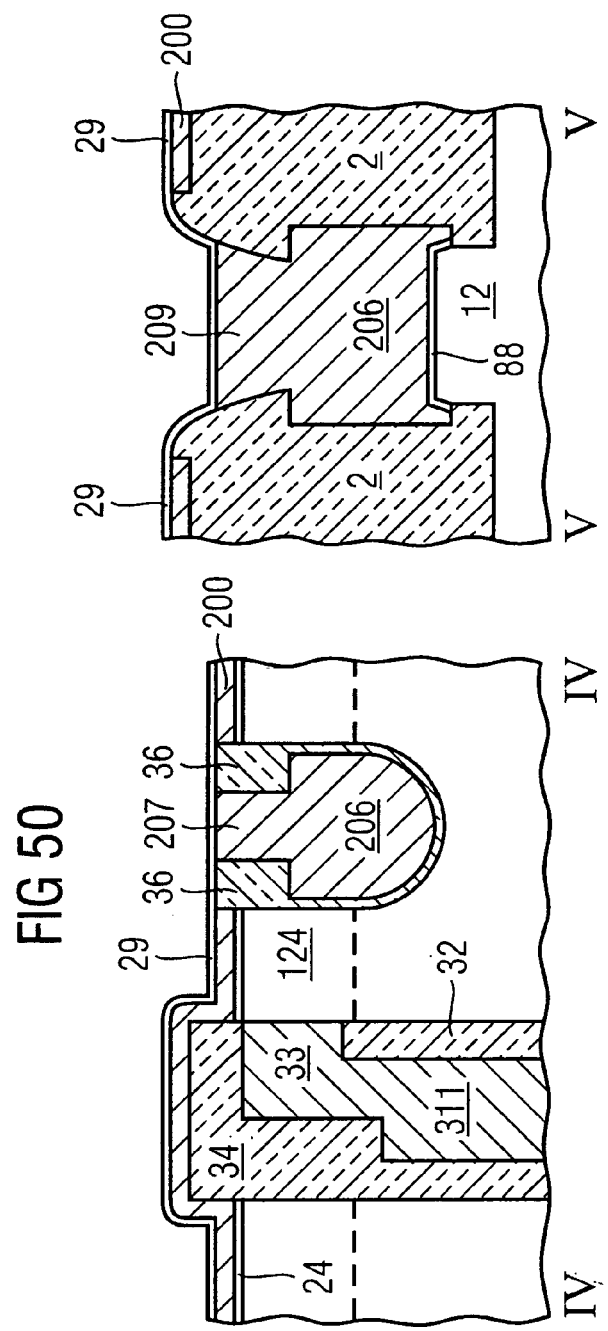
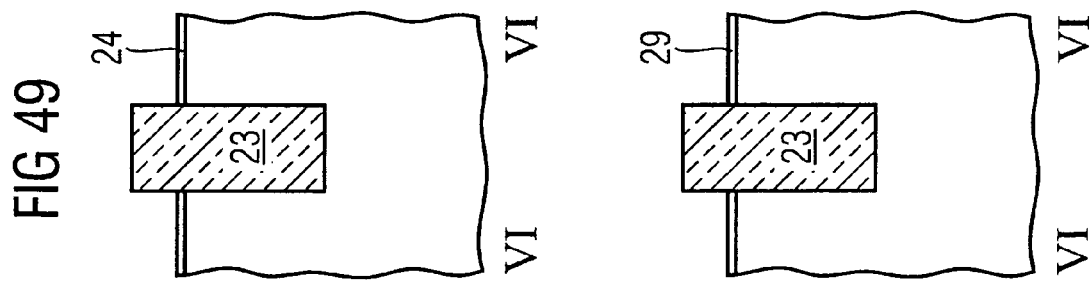

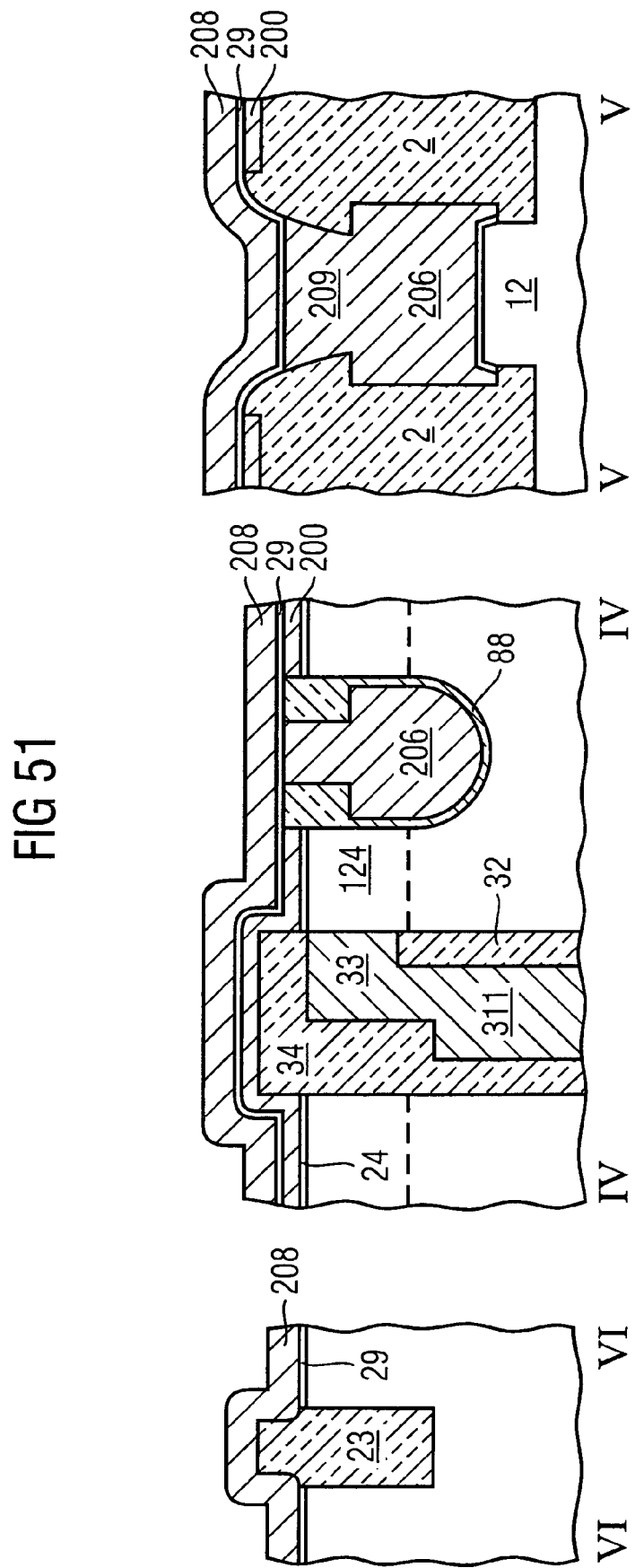

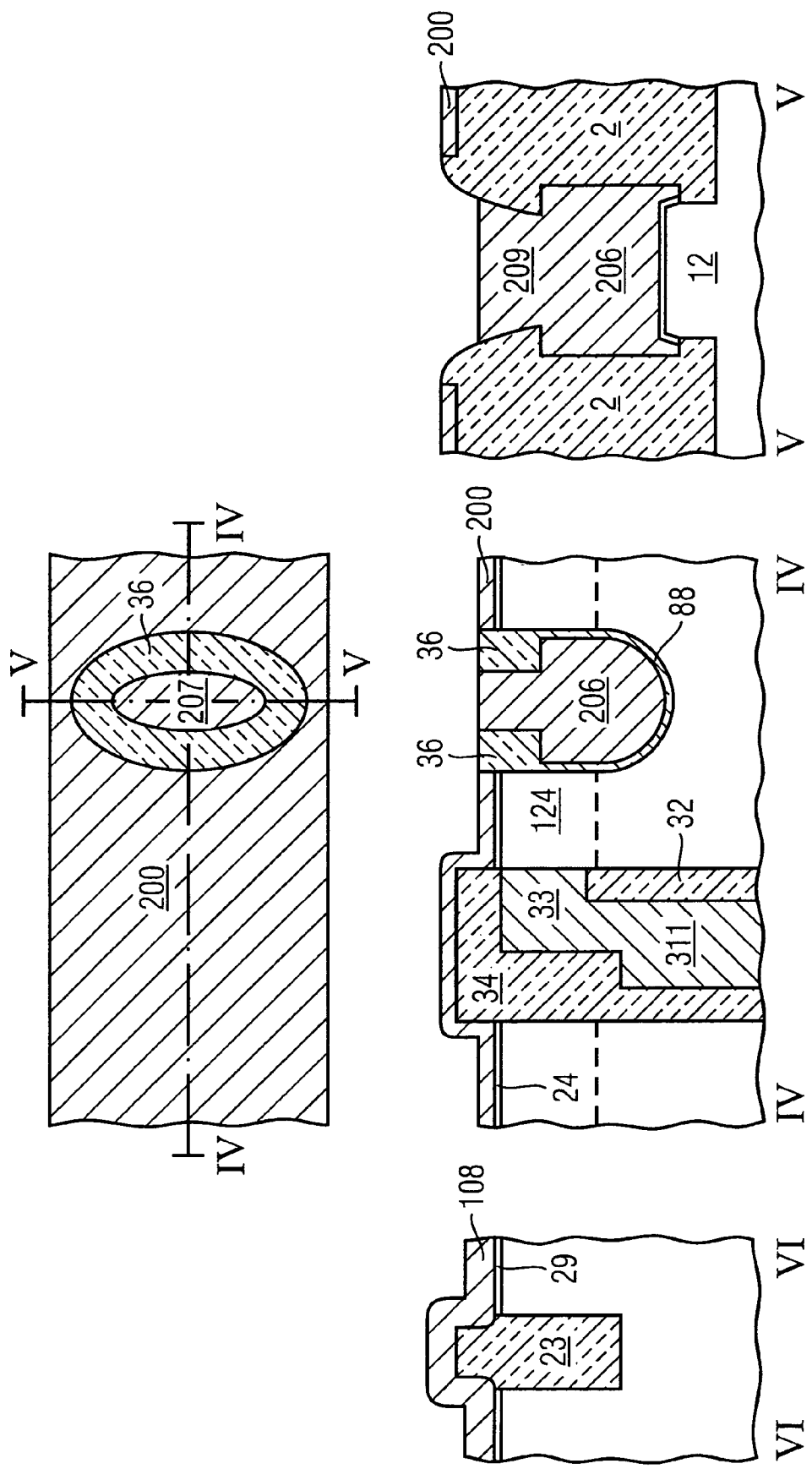

FIG 63
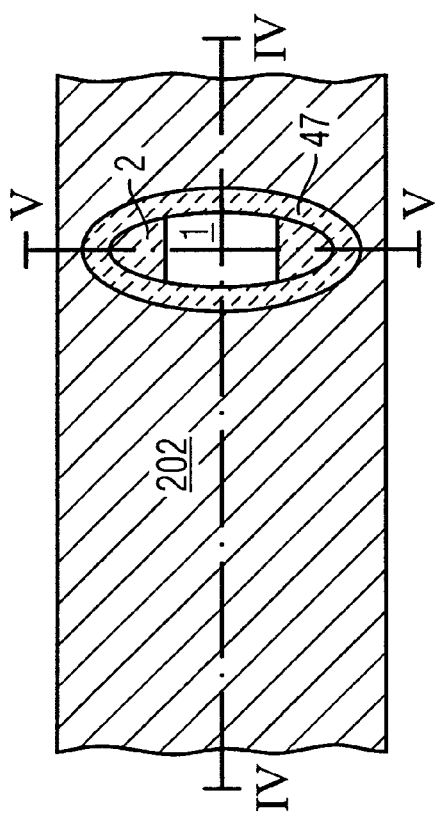
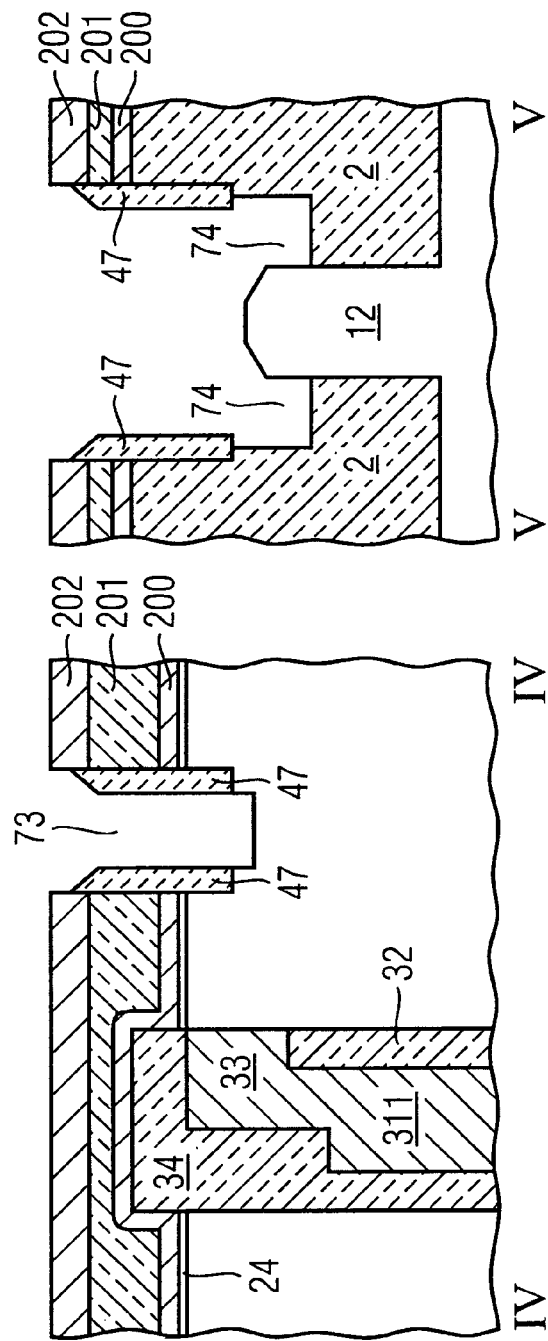

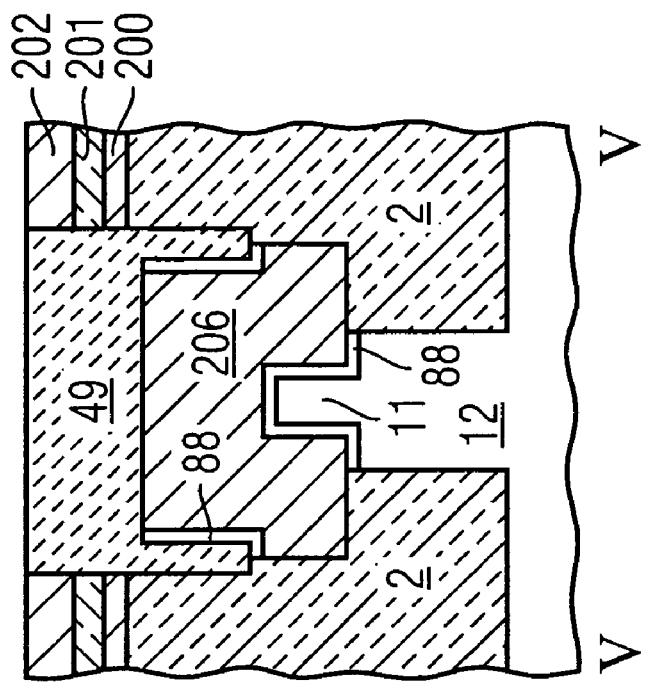
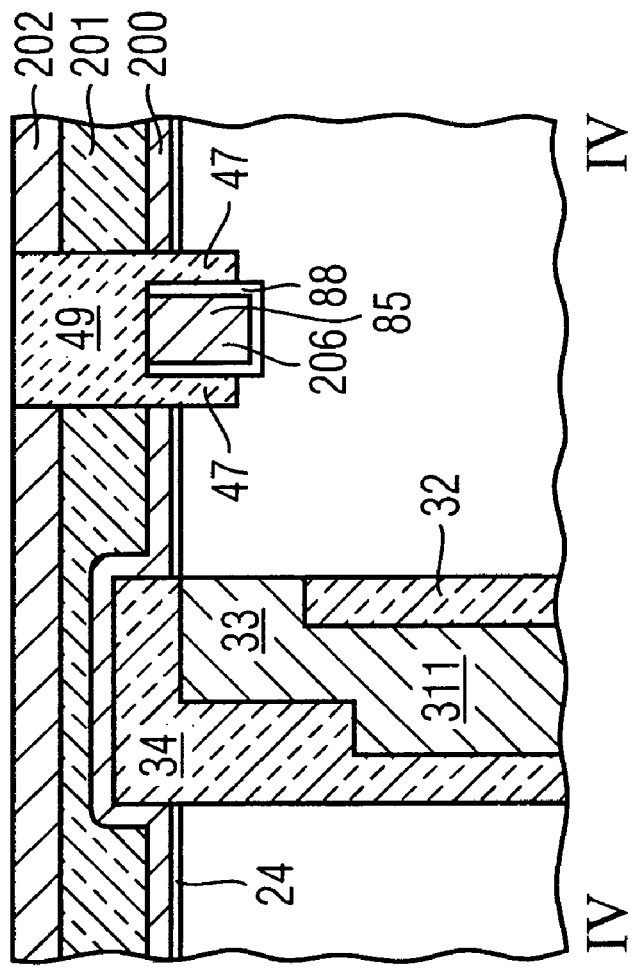
FIG 68

FIG 70
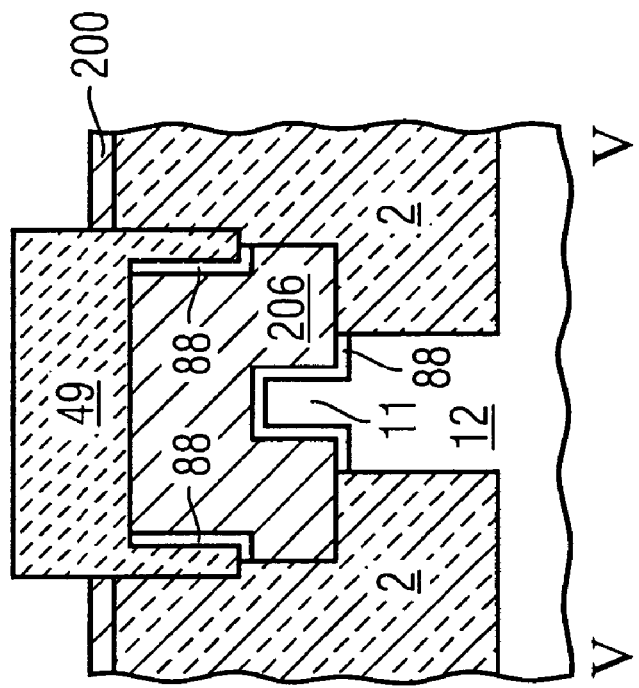
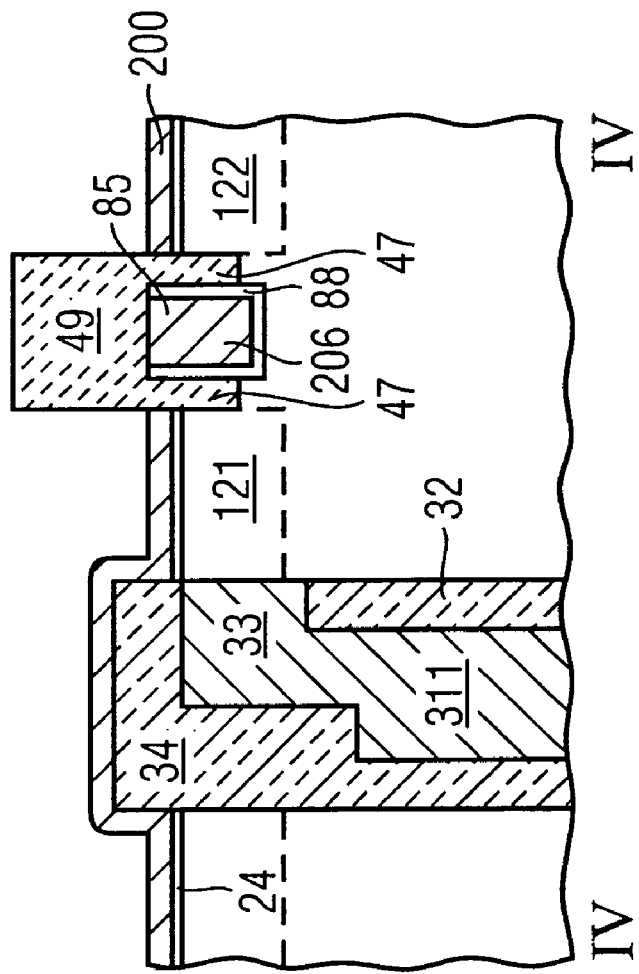

FIG 72
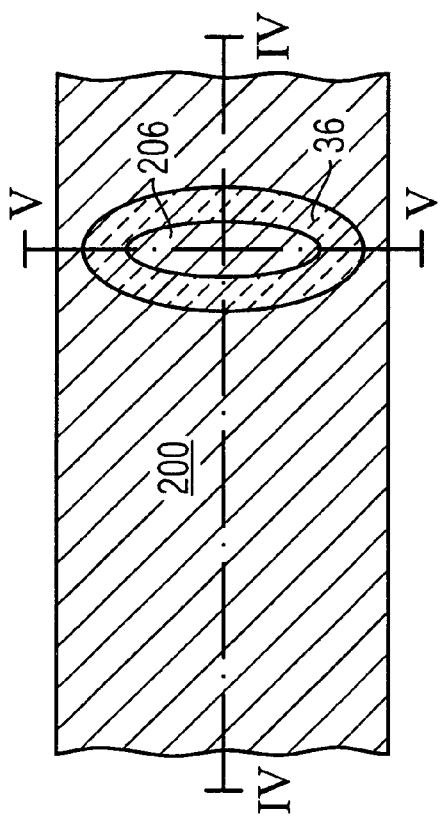
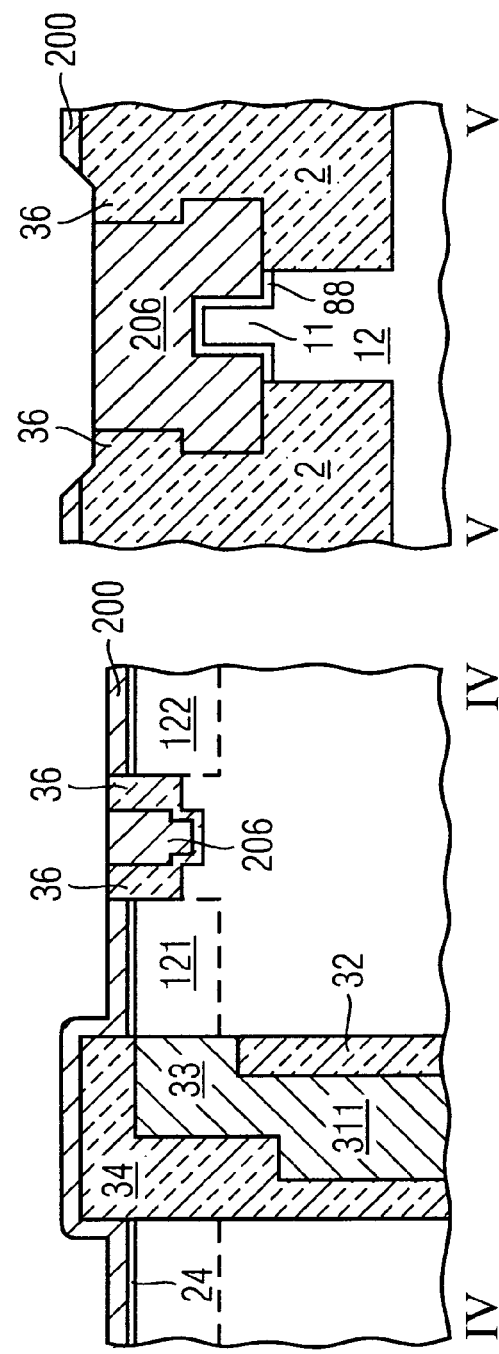

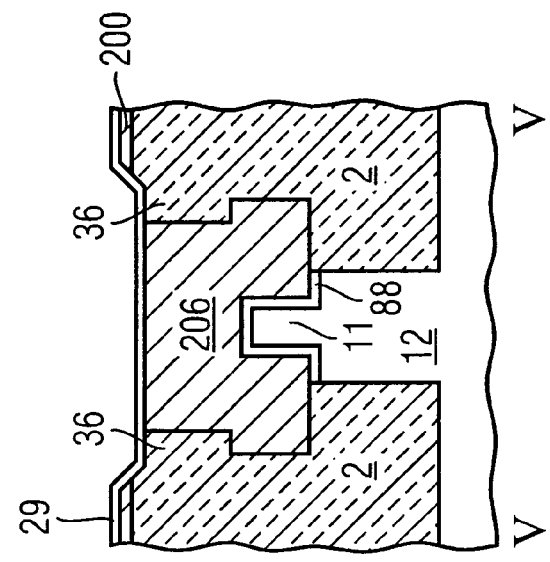
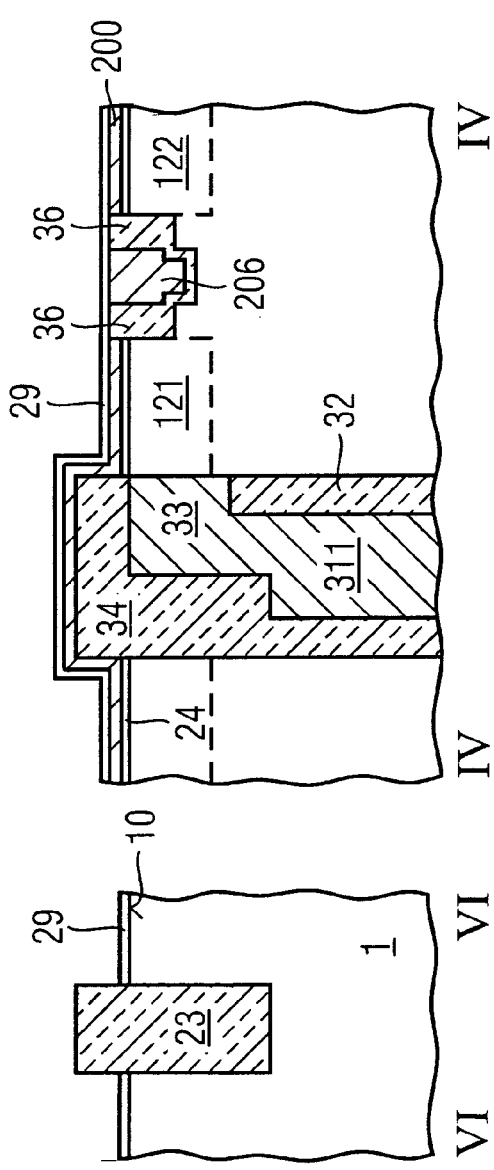
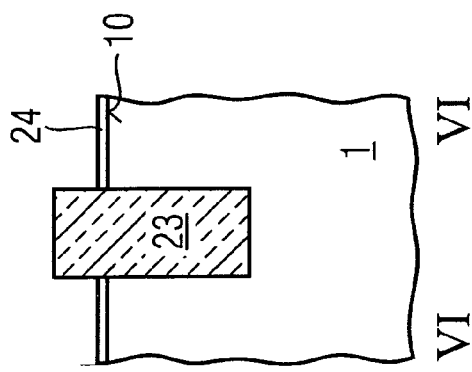
FIG 73
FIG 74

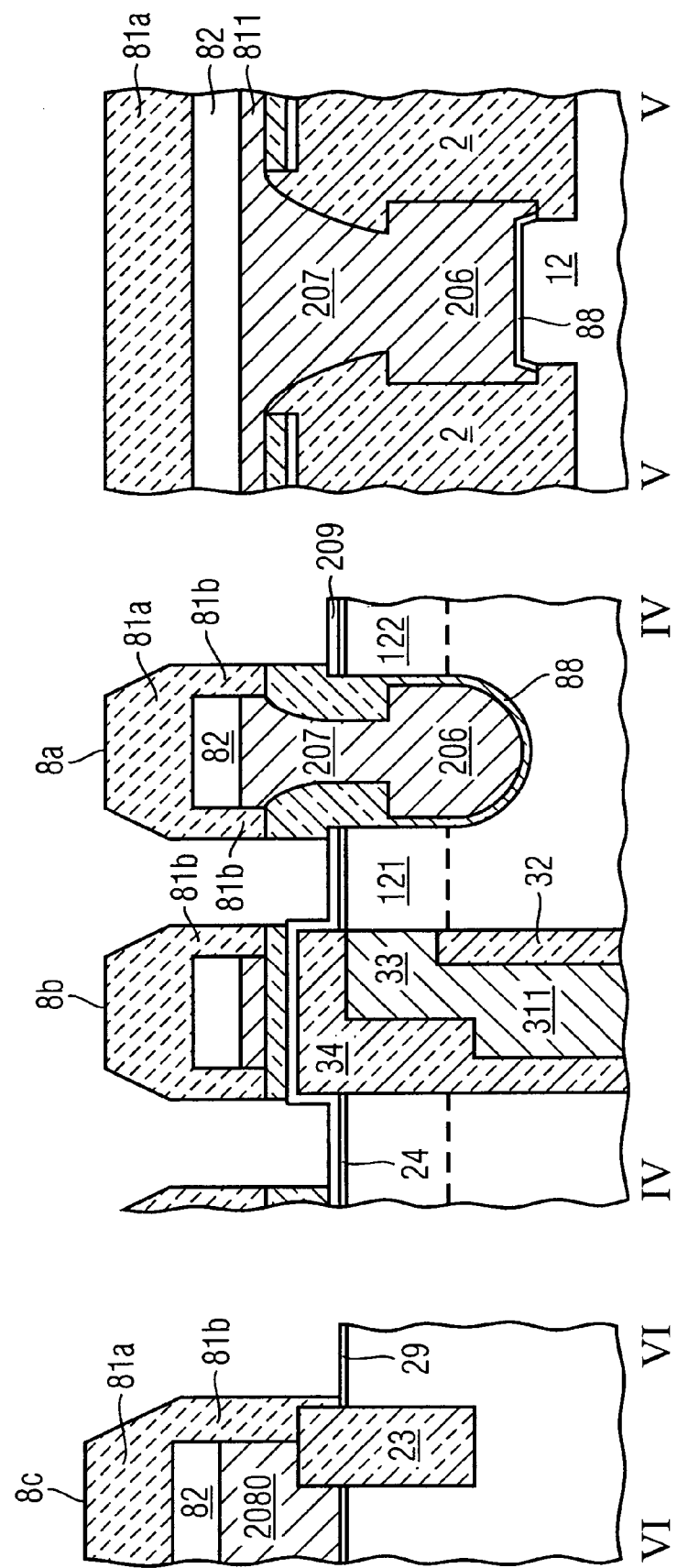

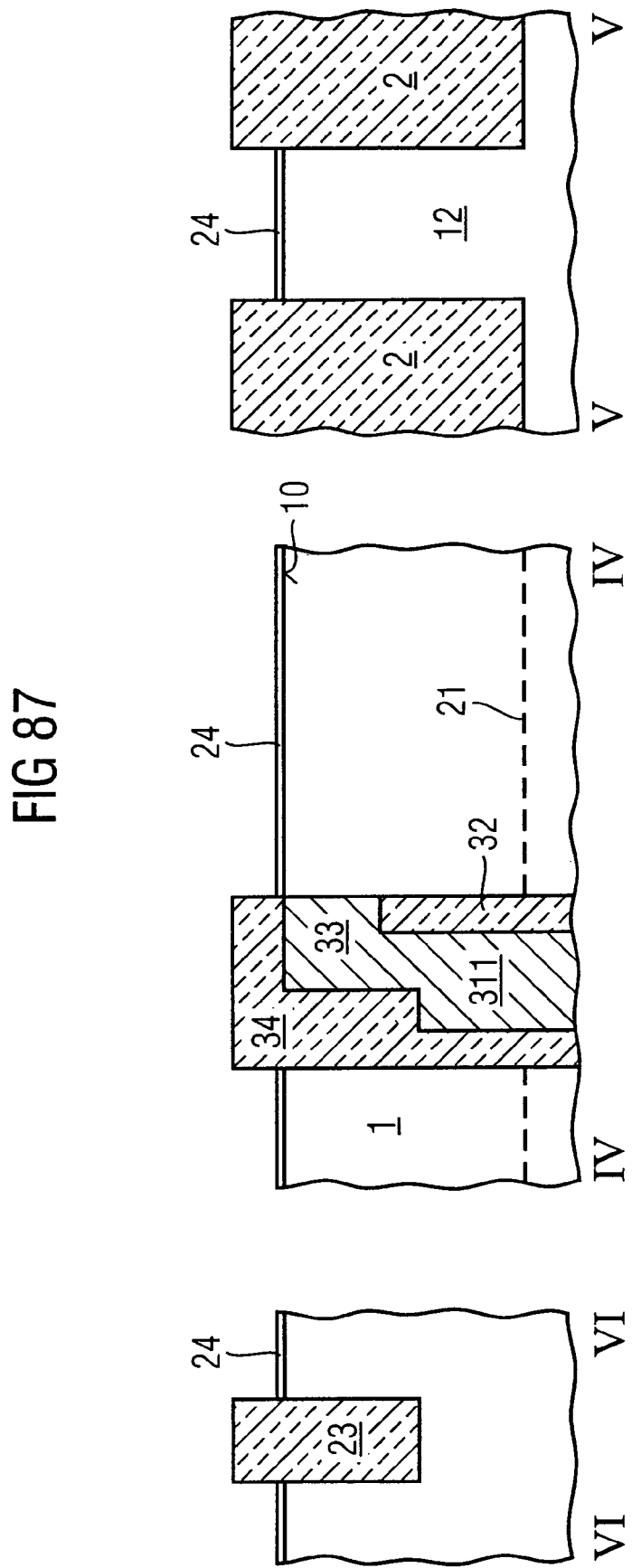

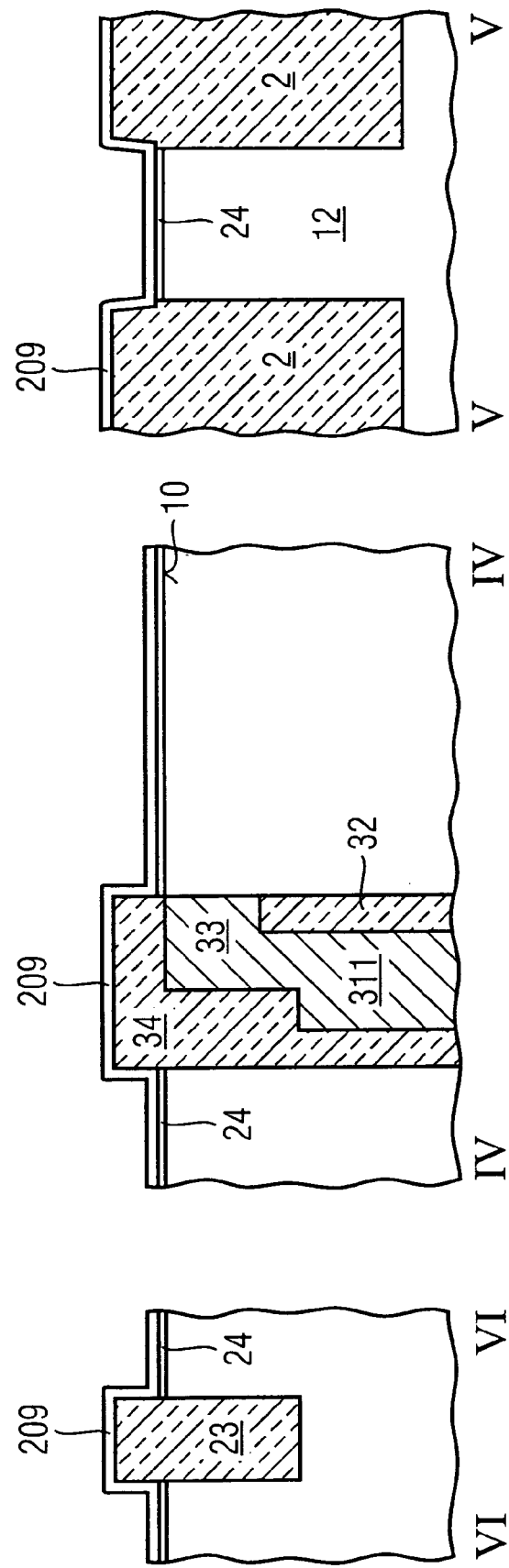

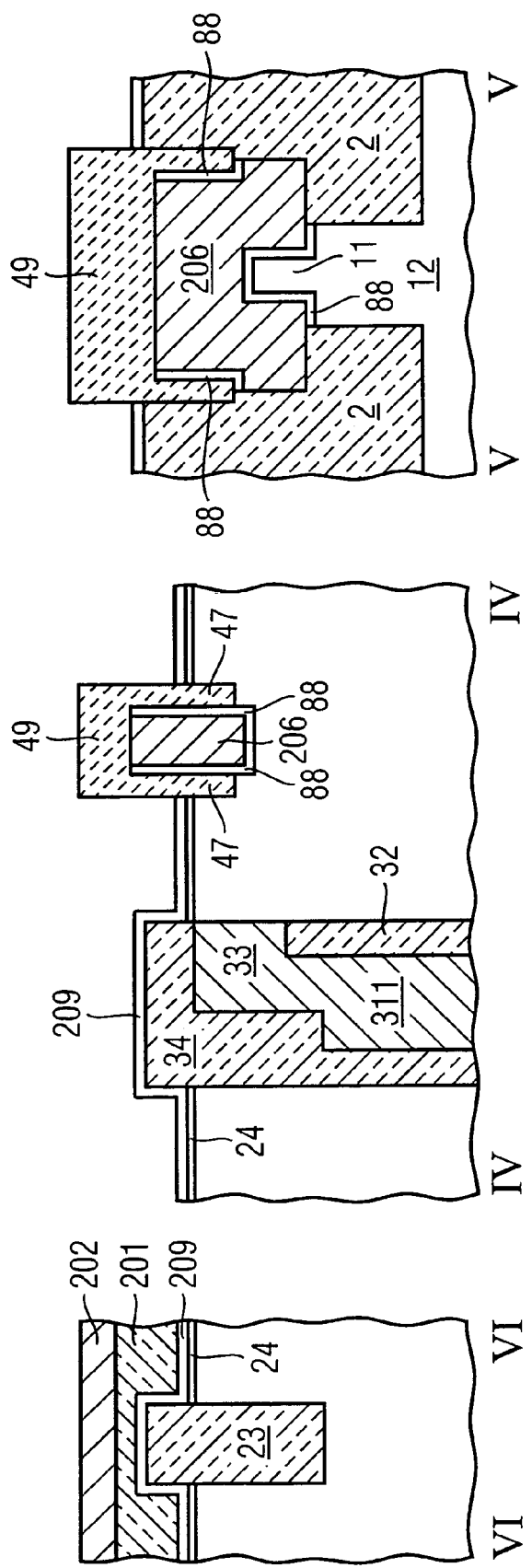

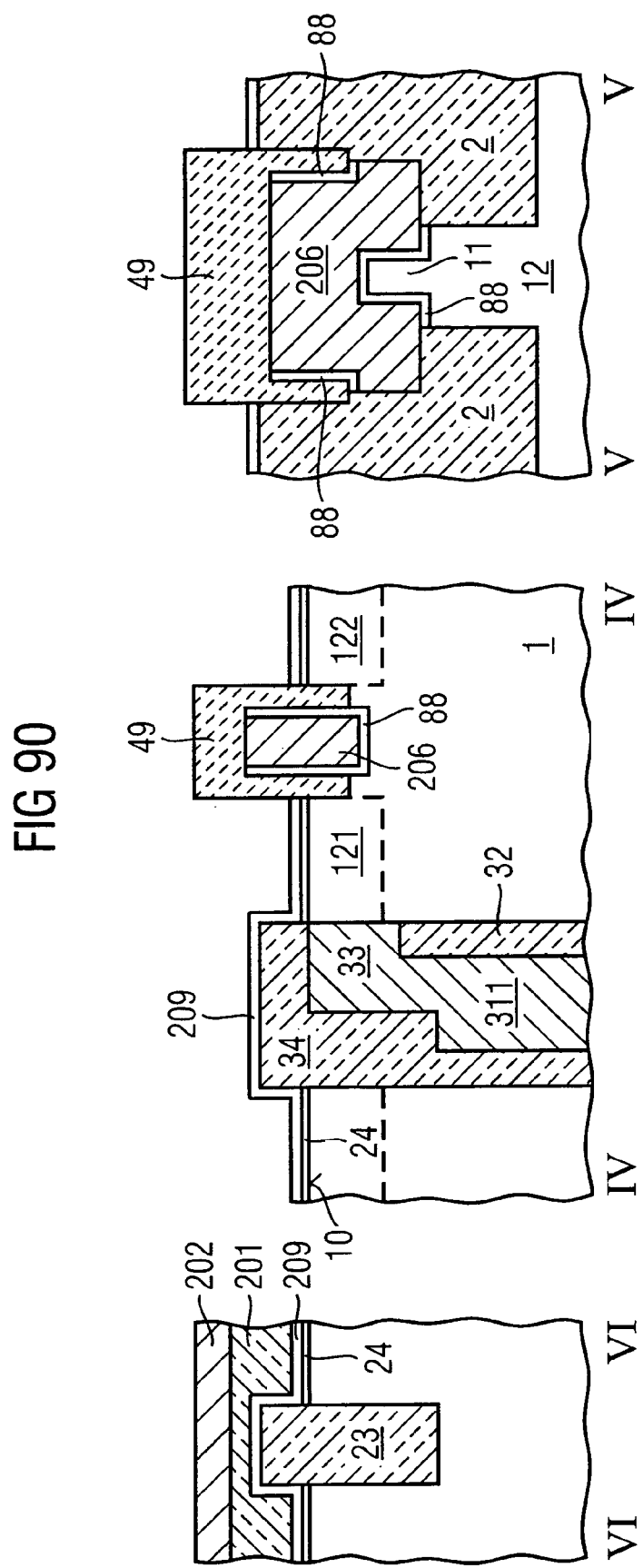

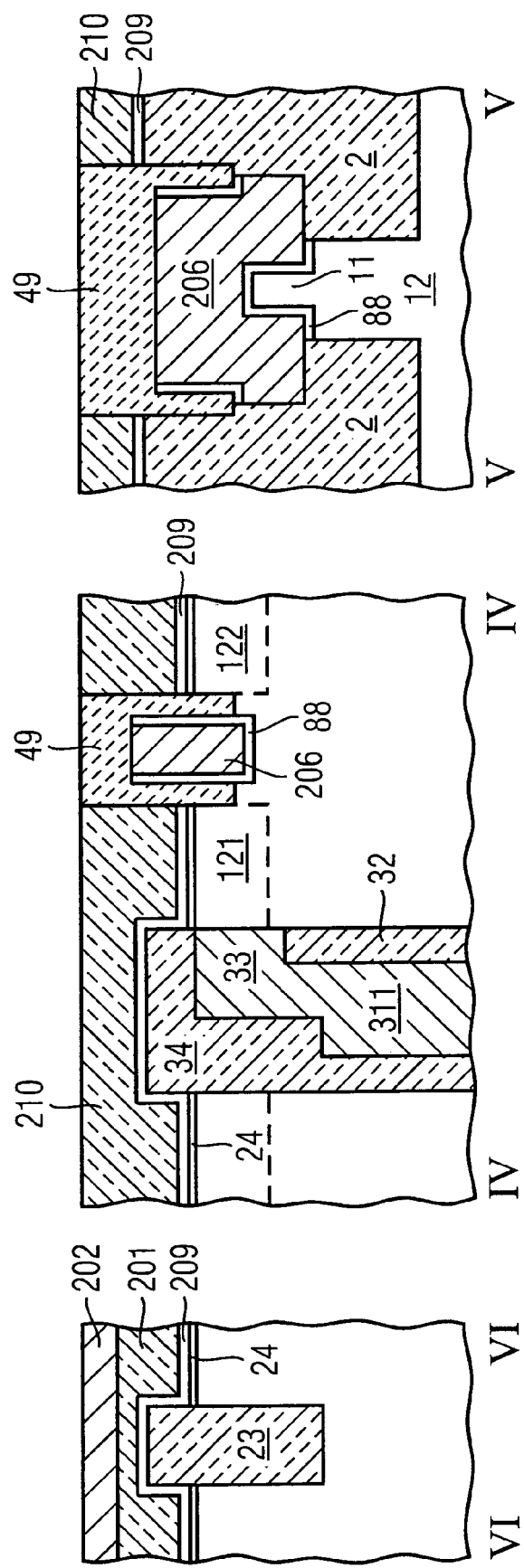

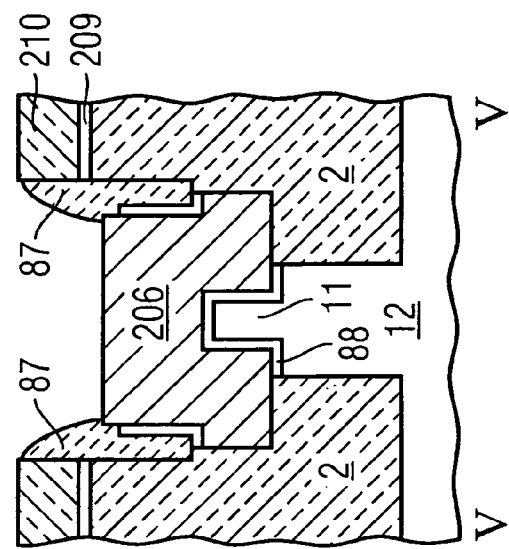
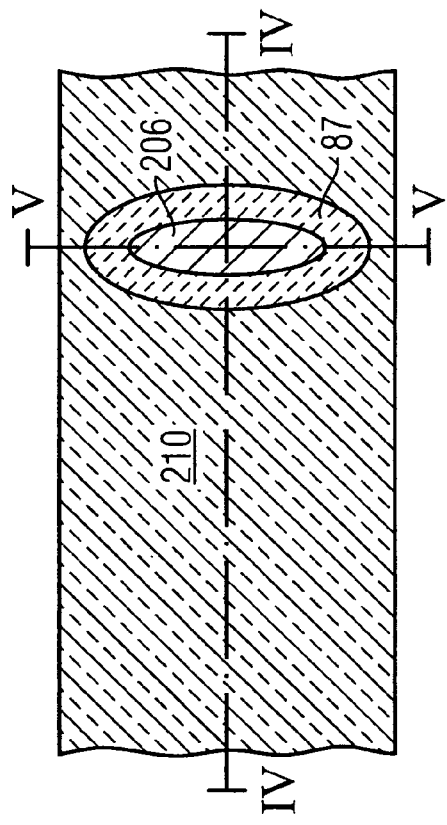
FIG 93
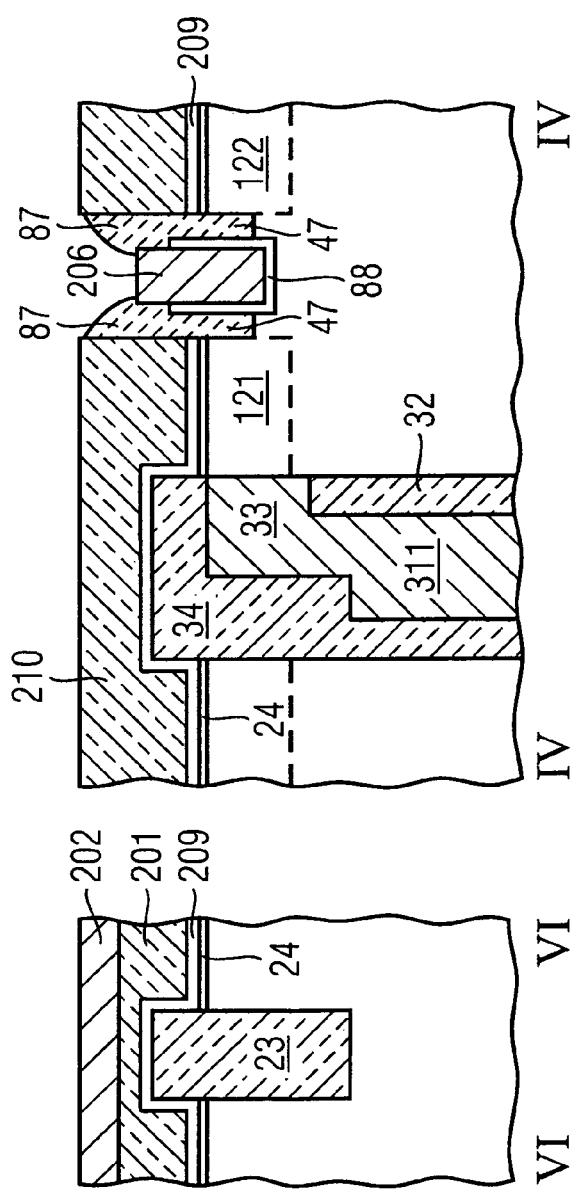

INTEGRATED CIRCUIT DEVICE AND METHOD OF MANUFACTURE

CROSS-REFERENCE TO RELATED APPLICATIONS

This non-provisional application claims the benefit of the filing date of Provisional U.S. patent application Ser. No. 10/939,255, entitled "TRANSISTOR, MEMORY CELL ARRAY AND METHOD OF MANUFACTURING A TRANSISTOR," and having a filing date of Sep. 10, 2004, and which is herein incorporated by reference.

FIELD OF THE INVENTION

The invention relates to a method of forming a transistor which can in particular be used in a dynamic random access memory cell. Moreover, the invention refers to a method of manufacturing a memory device as well as to a transistor.

BACKGROUND

Memory cells of a dynamic random access memory (DRAM) generally include a storage capacitor for storing an electrical charge which represents information to be stored, and an access transistor which is connected with the storage capacitor. The access transistor includes a first and a second source/drain regions, a channel connecting the first and the second source/drain regions as well as a gate electrode controlling an electrical current flow between the first and second source/drain regions. The transistor usually is at least partially formed in the semiconductor substrate. The gate electrode forms part of a word line and is electrically isolated from the channel by a gate dielectric. By addressing the access transistor via the corresponding word line, the information stored in the storage capacitor is read out.

In the currently used DRAM memory cells, the storage capacitor can be implemented as a trench capacitor in which the two capacitor electrodes are disposed in a trench which extends in the substrate in a direction perpendicular to the substrate surface.

According to another implementation of the DRAM memory cell, the electrical charge is stored in a stacked capacitor, which is formed above the surface of the substrate.

A memory device further includes a peripheral portion. Generally, the peripheral portion of the memory device includes circuitry for addressing the memory cells and for sensing and processing the signals received from the individual memory cells. Usually, the peripheral portion is formed in the same semiconductor substrate as the individual memory cells. Hence it is highly desirable to have a manufacturing process by which the components of the memory cell array and the peripheral portion can be formed simultaneously.

In the transistors of a memory cell, there is a lower boundary of the channel length of the transistor, below which the isolation properties of the access transistor in a non-addressed state are not sufficient. The lower boundary of the effective channel length $l_{eff}$ limits the scalability of planar transistor cells having an access transistor which is horizontally formed with respect to the substrate surface of the semiconductor substrate.

Vertical transistor cells offer a possibility of enhancing a channel length while maintaining the surface area necessary for forming the memory cell. In such a vertical transistor cell the source/drain regions of the access transistor as well as the channel region are aligned in a direction perpendicular to the substrate surface.

A concept, in which the effective channel length $L_{eff}$ is enhanced, refers to a recessed channel transistor, as is for example known from U.S. Pat. No. 5,945,707. In such a transistor, the first and second source/drain regions are arranged in a horizontal plane parallel to the substrate surface. The gate electrode is arranged in a groove, which is formed in the semiconductor substrate. The groove is disposed between the two source/drain regions of the transistor. Accordingly, the effective channel length equals to the sum of the distance between the two-source/drain regions and the twofold of the depth of the recess groove. The effective channel width $W_{eff}$ corresponds to the minimal structural size F.

Another known transistor concept refers to the FinFET. The active area of a fin FET usually has a shape of a fin or a ridge which is formed in a semiconductor substrate between the two source/drain regions. A gate electrode encloses the fin at two or three sides thereof. "Fin-channel-array transistor (FCAT) featuring sub-70 nm low power and high performance DRAM" by Deok-Hyung Lee at al., IEDM Tech. Dig., pp. 407 to 410, 2003 discloses a further transistor.

A method of forming special contact plugs is described in U.S. patent application Ser. No. 2005/0003308, the contents thereof being incorporated herein in its entirety.

SUMMARY

One or more embodiments of the present invention provide a transistor, a method of manufacturing a memory device and transistor. In one embodiment, the present invention provides a method of manufacturing a transistor having a first and a second source/drain regions, a channel connecting the first and the second source/drain regions and a gate electrode for controlling the conductivity of the channel. The gate electrode is formed by defining a gate groove in the substrate, and defining a pocket in each of the isolation trenches at a position adjacent to the groove so that the two pockets will be connected with the groove and the groove is disposed between the two pockets. A gate insulating material is provided at an interface between the active area and the groove and at an interface between the active area and the pockets. A gate electrode material so as to fill the groove and the two pockets.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 2A to 2F illustrate cross-sectional views of one embodiment of a transistor which is manufactured by a method of the present invention.

FIGS. 3 to 33 illustrate a first embodiment of the present invention.

FIGS. 34 to 54 illustrate a process of a second embodiment of the Present invention.

FIGS. 60 to 77 illustrate a third embodiment of the present invention.

FIGS. 87 to 100 illustrate a fifth embodiment of the present invention.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
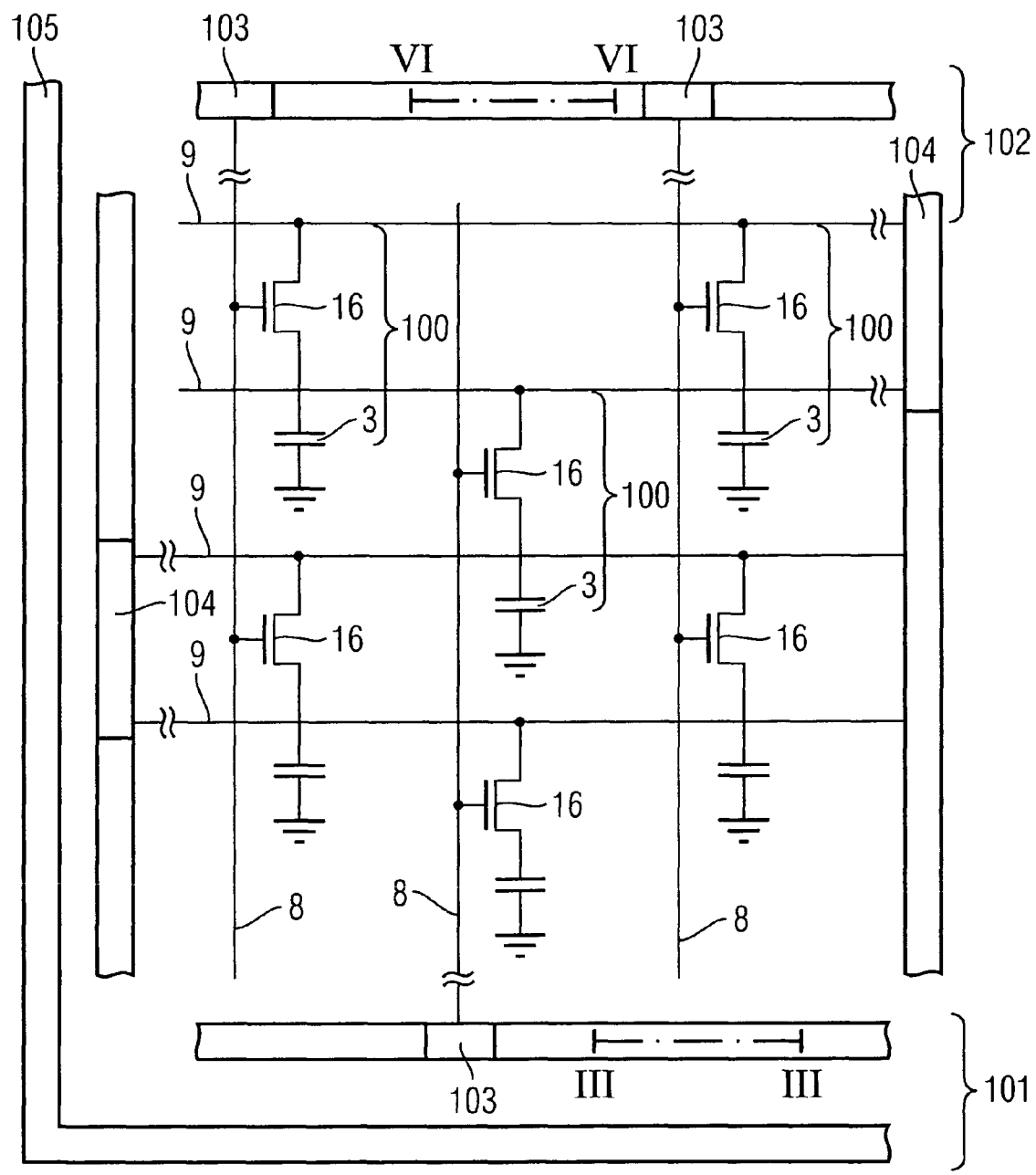
FIG. 1 illustrates a plan view of the memory device according to the present invention.

FIG. 1 illustrates a plan view of an exemplary memory device having transistors according to one embodiment of the present invention or transistors which can be manufactured by a method of the present invention. In the central portion of FIG. 1, the memory cell array comprising memory cells 100 is illustrated. Each of the memory cells 100 includes a storage capacitor 3 and an access transistor 16. The storage capacitor 3 includes a storage electrode and a counter electrode, the storage electrode being connected with a corresponding one of the first source/drain regions 121 of the access transistors 16. The second source/drain region 122 of the access transistor 16 is connected with a corresponding bit line. The conductivity of the channel formed between the first and second source/drain regions 121, 122 is controlled by gate electrode which is addressed by a corresponding word line 8. The storage capacitor, can in one embodiment, be implemented as a trench capacitor or as a stacked capacitor. The memory device usually is formed in a semiconductor substrate, in particular, a silicon substrate.

The specific layout of the memory cell array is arbitrary. In particular, the memory cells 100 can be arranged, for example in a checkerboard pattern or any other suitable pattern. As is illustrated in FIG. 1, a memory cell array is arranged so that a single memory cell 100 has an area of 8 $F^2$ (4 F×2 F) and can be implemented in a folded bitline configuration. The memory device of FIG. 1 further includes a peripheral portion 101. Usually, the peripheral portion 101 includes the core circuitry 102 including word line drivers 103 for addressing the word lines 8 and sense amplifiers 104 for sensing a signal transmitted by the bitlines 9. The core circuitry 102 usually includes other devices and in particular transistors, for controlling and addressing the individual memory cells 100. The peripheral portion 101 further includes the support portion 105 which usually lies outside the core circuitry 101. The transistors of the peripheral portion can be arbitrary. In particular, they can be implemented as conventional planar transistors. Nevertheless, they can as well be formed in the manner as is illustrated with reference to FIG. 2.

FIG. 2A illustrates a cross-sectional view of the array transistors 16 along a first direction connecting first and second source/drain regions 121, 122.

The transistor 16 includes a first and a second source/drain regions 121, 122 and a channel 14 connecting the first and second source/drain regions 121, 122. The conductivity of the channel is controlled by the gate electrode 85. The active area 12 has the shape of a fin or a ridge and three sides of the fin are enclosed by the gate electrode.

The first and second source/drain regions 121, 122 are disposed in the surface region of a semiconductor substrate 1. The gate electrode 85 includes a groove region 852 and two plate-like portions 851. The groove region of the gate electrode 85 is disposed in a groove 73 etched in the substrate surface 10.

Accordingly, the top side 11a of the active area is disposed at a deeper depth than the surface 10 of the semiconductor substrate. The plate-like portions 851 extend in a plane which lies before and behind the depicted cross-section and therefore are illustrated with broken lines. The lower part of the groove region 852 is electrically insulated from the silicon material by the gate dielectric layer 88. The first and second source/drain regions 121, 122 are electrically insulated from the groove portions 852 by the silicon nitride spacer 86. In addition, the sacrificial silicon oxide layer 181 is disposed between the silicon nitride spacer 86 and the first and second source/drain regions 121, 122. The first contact region 93 is provided so as to electrically connect the first source/drain region 121 with the storage capacitor, and a second contact region 94 is provided so as to electrical connect the second source/drain region with a bitline (not illustrated).

The gate electrode 85 usually is made from polysilicon. The first and second source/drain regions 121, 122 are implemented as normally or heavily doped silicon regions and, consequently, exhibit an excellent electrical conductivity. Optionally, the first source/drain region 121 or both source/drain regions 121, 122 may additionally comprise a lightly doped region (not illustrated), which is disposed between the channel region and the heavily doped regions, respectively. The channel 14 is lightly p-doped and therefore insulates the first from the second source/drain regions unless a suitable voltage is applied to the gate electrode 85.

A current path between the first and the second contact regions 93, 94 includes a first component 15a which extends in a first vertical direction, i.e., downwards, a second component 15b which extends in a horizontal direction, and a third component 15c extending upwards, i.e. in a second vertical direction which is opposite to the first vertical direction. Differently stated, the current path includes the channel region 14 as well as the distance from the boundary of the source/drain region 121 to the contact regions 93, 94.

Accordingly, a current flowing from the first to the second contact region 93, 94, will first have a weakly gated vertical path, thereafter, a strongly gated vertical path, followed by a strongly gated horizontal path, a strongly gated vertical path and, thereafter, a weakly gated vertical path. Differently stated, since the current path includes a portion extending in a recess which is formed in the substrate surface, a minimum distance between the heavily doped first and second source/drain regions 121, 122 is increased in comparison with a FinFET in which the active area is disposed along the substrate surface and in which the current path includes only a horizontal path. As a consequence, an electrical field at the source/drain region-channel junction and, consequently, a leakage current is reduced. Moreover, the heavily doped regions 121, 122 are separated from the gate electrode 852 by the spacer portion 86, so that the influence of the electric field of the gate electrode on the heavily doped regions is reduced.

FIG. 2B illustrates a cross-section of the transistor in a direction perpendicular to the direction of FIG. 2A. In particular, there is illustrated a section across the fin region 11 of the active area, i.e. a portion of the active area having a narrow width, the fin region being surrounded on three sides thereof by the gate electrode. In the fin region 11 the active area has the form of a ridge or a fin. The active area has a top side 11a and two lateral sides 11b, the length of the top side 11a being smaller than the length of the lateral sides 11b.

In FIG. 2B, the plate-like portions 851 of the gate electrode 851 are disposed along the lateral sides 11b of the ridge, whereas the groove-like portion 852 of the gate electrode is disposed along the top side 11a of the ridge. The gate electrode 85 is insulated from the fin region 11 by the gate dielectric 80. As can be seen from FIG. 2B, the current path 15 is in a direction perpendicular to the plane depicted in FIG. 1B.

Due to the narrow width of the fin region, the transistor body can be fully depleted, so that the subthreshold slope of the transistor can be improved. As a consequence, an improved on-current/off-current ratio is obtained. According to one embodiment of the present invention, the fin region can be locally thinned so that the width of the channel region is made smaller than the width of the first and second source/drain regions. As a consequence, the off-current of the transistor can be further improved with respect to the known transistor while the contact area of the source/drain regions is not decreased. As a result the contact resistance is not increased.

In the structure illustrated in FIGS. 2A and 2B, the length $L_{eff}$ of the channel corresponds to the distance between first and second source/drain regions. In addition, the width of the channel corresponds to the width of the region the conductivity of which is controlled by the gate electrode. In particular, the height of the fin can be 20 to 100 nm and the fin width can be less than 35 nm.

Accordingly, the transistor of the present invention provides an improved on-current in comparison with known transistors, since the width of the channel is increased whereby the resistance is reduced. Moreover, the transistor exhibits a larger slope of the subthreshold characteristics and a remarkably reduced body effect. Thereby, the on-current is further increased.

The transistor additionally provides an improved off-current due to its larger channel length and the larger slope of its subthreshold characteristics, in comparison to a known transistor.

In summary, the transistor illustrated in FIGS. 2A and 2B combines an improved on-current with a decreased off-current.

FIG. 2C illustrates a modification of the transistor structure illustrated in FIG. 2A. In FIG. 2C, the first source/drain region includes a heavily doped portion 121" and a lightly doped region 121'. The lightly doped region 121' extends to the same depth as the second source/drain region 122.

By providing the lightly doped region 121' between the heavily doped region 121" and the channel 14, the electrical field can be reduced. Accordingly, a junction leakage current can be reduced.

Generally speaking, the leakage current corresponds to the current flowing from the storage capacitor to the second source/drain region or the silicon body when the gate electrode is not addressed. Since especially the electric fields at the first source/drain region-channel junction highly influence the leakage current, it is advantageous to reduce the electric field at the first source/drain region-channel junction.

By reducing the leakage current, the retention time, i.e., the time during which an information is recognizably stored in the memory cell, can be increased.

Accordingly, an asymmetric arrangement of first and second source/drain regions, in particular, the arrangement illustrated in FIG. 2C in which the first source/drain region 121 includes a lightly and a heavily doped portion and the lightly doped portion 121' extends to the same depth as the second source/drain region 122 is highly advantageous.

Nevertheless, it lies within the scope of the present invention that also the second source/drain region 122 includes a lightly and a heavily doped portion wherein the lightly doped region is arranged between the heavily doped region and the channel region. In particular, the first and second source/drain regions comprising lightly and heavily doped portions can be arranged in a symmetric manner.

According to the embodiment illustrated in FIG. 2C, the lower side of the lightly doped first source/drain region 121' is disposed beneath the lower edge of the groove portion 852 of the gate electrode or than the top side of the fin region. As a consequence, the effective width of the first source/drain region can be remarkably increased. Since this width mainly determines an on-current, the on-current characteristics of the transistor are further improved.

The heavily doped first source/drain region 121 which will later be connected with the storage capacitor is shielded from the gate electrode by the thick spacer 86'. Accordingly, the electric field at the junction, which is connected with the storage load will be reduced. As a consequence, the retention time will further be increased.

The transistor described above can be modified in several ways. For example, the plate-like portions 851 can extend to a depth of 20 to 100 nm measured from the bottom portion of the groove region of the gate electrode.

The structure illustrated in FIG. 2A, for example, can be obtained by performing an etching process which etches the silicon substrate material as well as the isolating material from the isolation trenches. Thereafter, the pockets are etched in the isolation trenches so as to form the plate like portions 851 of the gate electrode. In particular, this can be accomplished by an etching process which etches silicon dioxide selectively with respect to silicon. For forming a transistor in this way, preferably, a first hard mask layer stack includes a silicon dioxide layer, a polysilicon (polycrystalline silicon) layer, a silicon dioxide layer as well as a polysilicon layer on top. Alternatively, the first hard mask layer stack can comprise a silicon nitride layer, a silicon dioxide layer and a polysilicon layer. In either cases it is important, that the first hard mask layer stack includes a polysilicon layer as the top most layer which will not be attacked by an etching process for etching silicon dioxide.

Optionally, a second hard mask layer stack comprising a carbon layer may provided on the surface of the first hard mask layer stack.

In FIGS. 2D and 2E, the gate electrode 85 is formed in a gate groove formed in the semiconductor substrate 1, and the plate-like portions 851 only extend slightly deeper into the substrate than the groove portion 852. In particular, as is illustrated in FIG. 2E, the plate-like portions 851 extend to a depth up to approximately 5 to 25 nm measured from the bottom portion of the groove portion of the gate electrode.

Differently speaking, in the structure illustrated in FIGS. 2D and 2E, the active area has the form of a ridge comprising a top side and two lateral sides in a cross section perpendicular to the channel direction, the top side having a width w and the lateral sides having a depth d, wherein the top side is disposed beneath a surface of the semiconductor substrate and the gate electrode is disposed along the top side and the two lateral sides, and the following relation holds:

$$d \leq w/2.$$

In addition the region which is adjacent to the gate electrode is not narrowed with respect to the active area, which is defined by forming the isolation trenches 2. Accordingly, when applying a typical gate voltage, the channel will not be fully depleted. Nevertheless, as can in particular be taken from FIG. 2E, the resulting transistor has an increased channel width in comparison with a conventional recessed channel transistor. In the transistor illustrated in FIG. 2D, the first and second source/drain regions 121, 122 can extend to a depth which is deeper than the depth, which is indicated in this Figure. In particular, they can extend to below the bottom of the gate groove 73. In the following, the transistor illustrated in FIGS. 2D and 2E will also be referred to as an EUD ("extended u-groove device")

As will be described in more detail herein after, when manufacturing the device illustrated in FIGS. 2D and 2E, the process of providing a gate electrode includes the process of defining a gate groove in the semiconductor substrate so that finally a gate groove extends in the active area from the surface of the semiconductor substrate in a direction perpendicular to the surface of the semiconductor substrate to a first depth.

In particular, defining a gate groove includes a selective etching process which selectively etches the substrate material with respect to the isolating material of the isolation trenches. Thereafter, a pocket is defined in each of the isolation trenches at a position adjacent to the groove so that the two pockets will be connected with the groove and the groove is disposed between the two pockets, the two pockets extending to a second depth larger than the first depth. A gate insulating material is provided at an interface between the active area and the groove and at an interface between the active area and the pockets, and a gate electrode material is deposited so as to fill the groove and the two pockets.

For defining the gate groove, different kinds of hard masks can be used.

In particular, a first hard mask layer stack can be provided on the surface of the semiconductor substrate 1 or on a sacrifical silicon dioxide layer which is deposited on the surface of the semiconductor substrate. The first hard mask layer stack includes at least one layer of a material which is different from the material of the semiconductor substrate. Optionally, a second hard mask layer stack can be provided on the surface of the first hard mask layer stack, the second hard mask layer stack comprising a carbon layer.

For forming the transistor illustrated with reference to FIG. 2D and 2E, the process for etching a gate groove in a substrate is an etching process which etches semiconductor material selectively with respect to the isolating material of the isolation trenches. For forming the transistor illustrated in FIGS. 2D and 2E it is not necessary that the first hard mask layer stack includes a polysilicon layer as the top most layer. In particular, the first hard mask layer stack may comprise any of the following combinations: polysilicon layer/silicon dioxide layer/polysilicon layer (optional), silicon nitride layer/silicon dioxide layer/polysilicon layer (optional) and polysilicon layer/silicon nitride layer.

Nevertheless, in one embodiment it is preferred to use the second hard mask layer stack comprising a carbon layer. In particular, the carbon hard mask is formed of a carbon film, which may be deposited, by physical vapour deposition or chemical vapour deposition. In particular, the carbon film can be made of amorphous carbon, which may optionally comprise hydrogen.

In particular, for manufacturing semiconductor devices with shrinking feature size, it is necessary to use thin resist materials for obtaining an aspect ratio of depth to diameter of a structure to be defined, the aspect ratio being limited to a certain value. However, if a resist layer having a thickness of 100 to 200 nm is taken, a desired selectivity of an etching process cannot be obtained. For this reason, it is preferred to take a carbon hard mask which includes a carbon layer having a thickness of 200 to 300 nm and a silicon oxide nitride layer having a thickness of approximately 50 to 70 nm. In particular, the SiON layer is taken as a hard layer which is patterned. In a subsequent process for patterning the carbon layer, the patterned SiON layer is taken as a hard mask. The hard mask layer made of carbon is highly advantageous, because it can easily be etched using an $O_2$-Plasma for example.

The transistor which is manufactured by the method of the present invention advantageously includes sidewalls spacers 86 as is for example illustrated in FIG. 2A. In particular, the sidewall spacers 86 are provided at an interface between the gate electrode 85 and the first and second source/drain regions 121, 122 so as to effectively insulate the gate electrode from the first and second source/drain regions. The sidewall spacers 86 have a larger thickness than the gate dielectric layer 88 and, hence, effectively shield the potential applied to the gate electrode 85 from the neighbouring first and second source/drain regions 121, 122. In particular, it is preferred to form the sidewall spacers 86, at least the upper part thereof, from silicon dioxide.

FIG. 2F illustrates an EUD in which the first and second source/drain regions 121, 122 extend to a deeper depth than it is illustrated in FIG. 2D. In addition, a spacer is provided at a boundary between the gate electrode 85 and the first and second source/drain regions 121, 122 so as to electrically isolate the gate electrode 85 from the first and second source/drain regions 121, 122.

According to a preferred embodiment of the present invention, when forming a FinFET or an EUD, the gate groove is formed and a spacer made from a sacrificial material is provided, this spacer being replaced by a permanent spacer such as an $SiO_2$ spacer at a later process. In this case, advantageously, the properties of the sacrificial spacer can be exploited, this sacrificial spacer being replaced by the permanent spacer, for example of $SiO_2$, at a later process.

In this case, the sacrificial spacer is formed at the position at which the permanent spacer is to be formed, in particular, at a position separating the gate electrode from the first and second source/drain regions.

In addition, according to one embodiment of a method of the present invention, after defining the first opening in the first hard mask layer stack, preferably, a sacrificial spacer is provided on the sidewalls of the first opening. Thereafter, the substrate material is isotropically etched and, in a following process, the sacrificial spacer is removed. Thereby, the diameter of the groove formed in the substrate can be reduced with respect to the diameter of the first opening in the first hard mask layer stack. Thereby the critical dimension ("CD") can further be reduced.

In addition, when manufacturing a memory device comprising a memory cell array as well as the peripheral portion comprising transistors as well, there are different ways of how to manufacture the transistors of the peripheral portion and the array portion. For example, the peripheral gate dielectric layer and the peripheral polysilicon layer can be formed, and then the array transistor is completed, followed by the deposition of the layer stack for forming the peripheral gate electrode as well as the word lines of the memory cell array. In this case, the peripheral gate dielectric and the peripheral polysilicon layer can advantageously be taken as part of the first hard mask layer stack for forming the array transistor. This embodiment is advantageous since the hard mask layer stack and the layers of the peripheral gate electrode can be formed by common deposition processes.

As an alternative, after growing a sacrificial oxide layer the array transistor can be formed, followed by the processes for forming the peripheral gate dielectric layer and the processes for forming the layer stacks for forming the peripheral gate electrode as well as the word lines of the array. This embodiment is advantageous, since the peripheral gate dielectric is not affected by the process processes for forming the array transistor.

In addition, in one embodiment of the present invention provides a method for manufacturing a memory cell array comprising bitlines for electrically connecting the second source/drain region with a corresponding bit line. In particular, if a hard mask layer stack comprising a silicon dioxide layer, a polysilicon layer and a silicon dioxide layer is taken as the first hard mask layer stack, a special method for forming the bitline contacts can be used. Nevertheless, if the first hard mask layer stacks includes a silicon nitride and a silicon dioxide layer, a capacitive coupling between neighbouring word lines can advantageously be avoided whereby a crosstalking effect is reduced.

In the following, reference will be made to a gate dielectric layer or a gate insulating layer such as, in particular, a gate oxide. Nevertheless, as is obvious to the person skilled in the art, any other suitable dielectric material can be used as gate dielectric.

FIGS. 3 to 33 illustrate a first embodiment of the present invention. As will be described, a memory cell incorporating the transistor comprising a spacer which is made of silicon dioxide is provided.

Figure 3A:
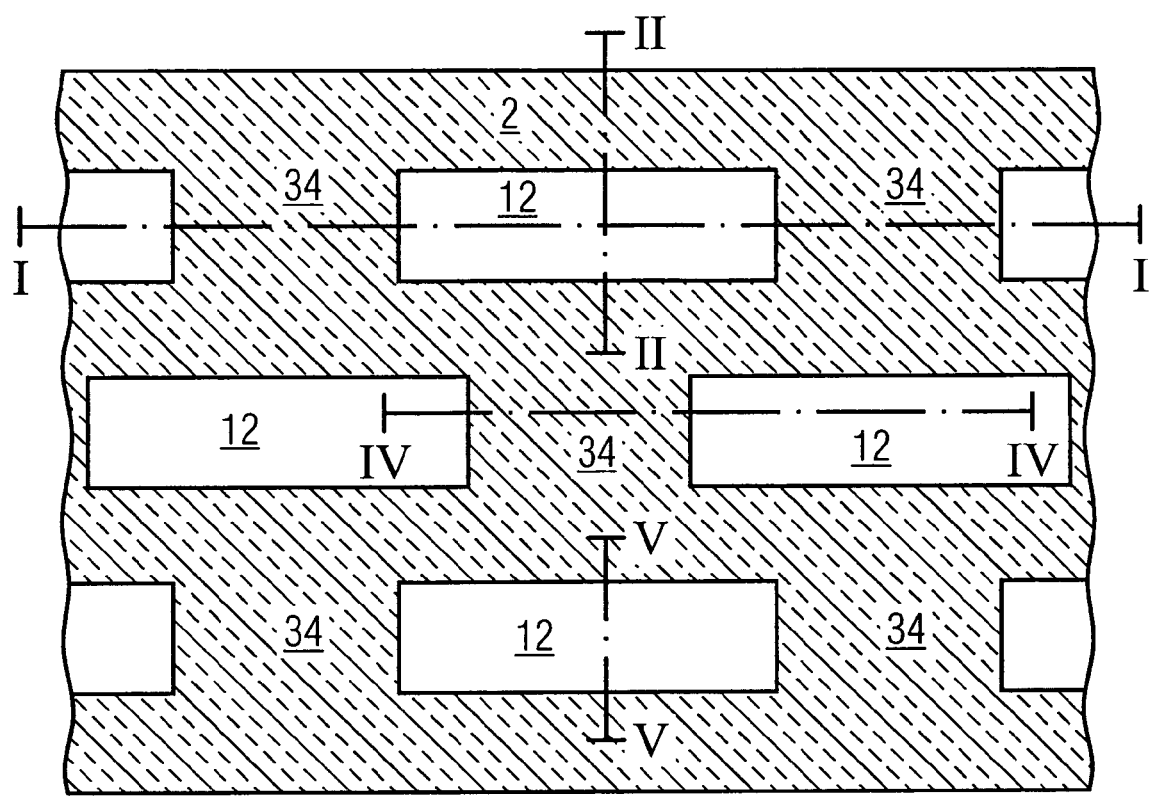

FIG. 3A illustrates a plan view on part of a memory cell array after forming the storage capacitors and after defining the active areas 12. In particular, the active areas are formed as segments of stripes, two segments of active areas 12 in one row being insulated from each other by the trench top oxide 34 which is formed above a corresponding trench capacitor. Adjacent stripes of active areas 12 of different rows are spaced apart, isolation trenches being disposed between neighbouring rows, the isolation trenches being filled with an isolating material. The segments of the active areas 12 are arranged in a checkerboard manner, so that the segments of adjacent rows are arranged in a staggered manner. To be more specific, the segments of adjacent rows are offset by half of the cell pitch, in particular, 2F.

Figure 3B:
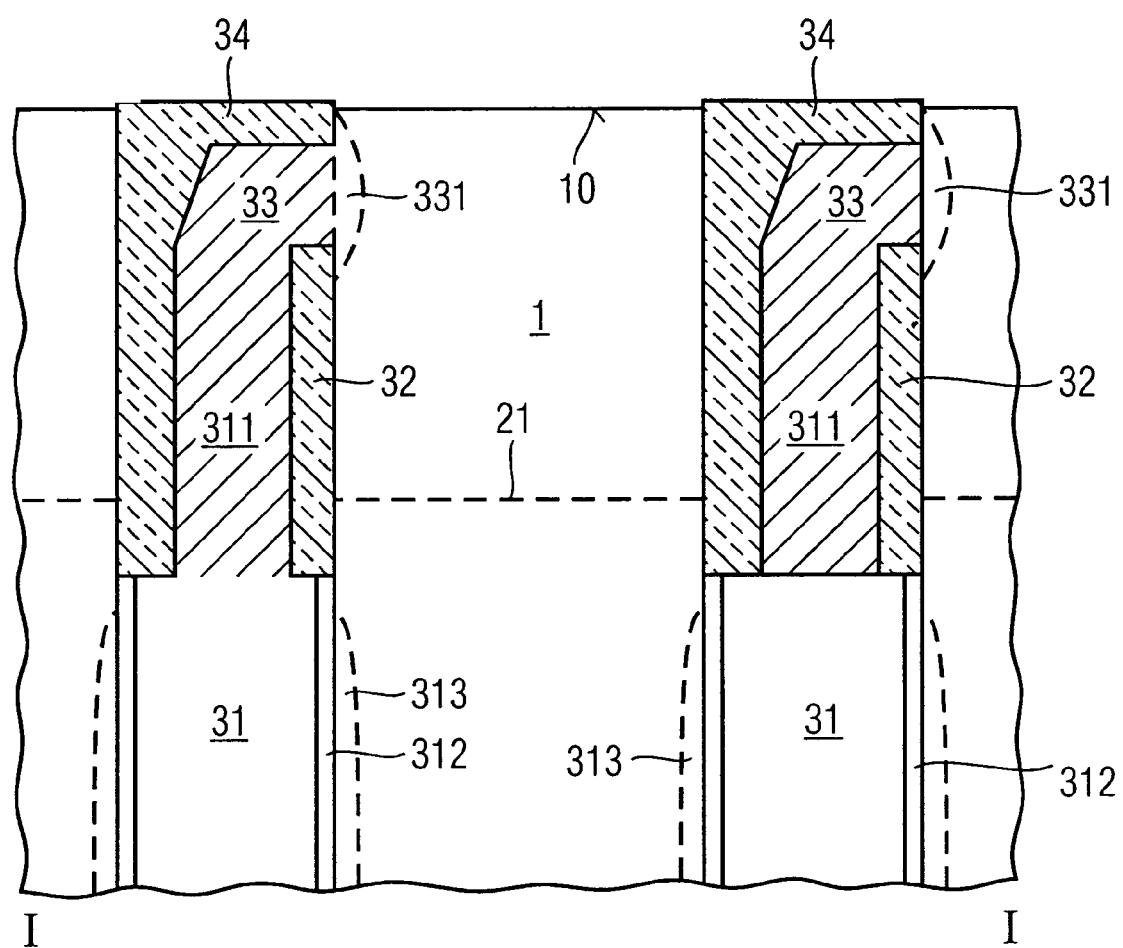

A cross-section of the array illustrated in FIG. 3A between I and I is illustrated in FIG. 3B. As can be seen from FIG. 3B, trench capacitors 3 are provided so as to extend in the semiconductor substrate 1, in particular, a silicon substrate. The trench capacitor 3 includes an inner electrode 31, a capacitor dielectric 312 which is disposed between the inner electrode 31 and the counter electrode 313. In the upper portion of the trench capacitor 3, an isolation collar 32 is provided, as is conventional in the art. A polysilicon filling 31 is provided so as to accomplish an electrical contact between the inner capacitor electrode 31 and the buried strap window 33 which is formed above the isolation collar. Above the polysilicon filling 311, a trench top oxide layer 34 is provided. For example, the total thickness of the top oxide layer 34 can be approximately 30 nm, wherein the top oxide layer 34 preferably projects from the substrate surface 10 by approximately 15 nm so that the buried strap window 33 is disposed close to the substrate surface 10. Reference numeral 21 denotes the bottom portion of the isolation trenches 2 which are formed in a cross-section parallel to the depicted cross-section.

The formation of the trench capacitor 3 is generally known and the description thereof is omitted, for the sake of convenience. In particular, the trench capacitor includes a buried strap, so as to accomplish an electrical contact between the inner capacitor electrode 31 and the first source/drain portion of the transistor to be formed. The dopants of the polysilicon filling 311 diffuse into the substrate portion so as to form the buried strap out diffusion portion 331.

In addition, isolation trenches 2 for laterally confining the active areas 12 are etched and filled with an isolating material as is common. In particular, the isolation trenches 2 are filled with a first silicon dioxide layer, a silicon nitride liner and a silicon dioxide filling.

Figure 4:
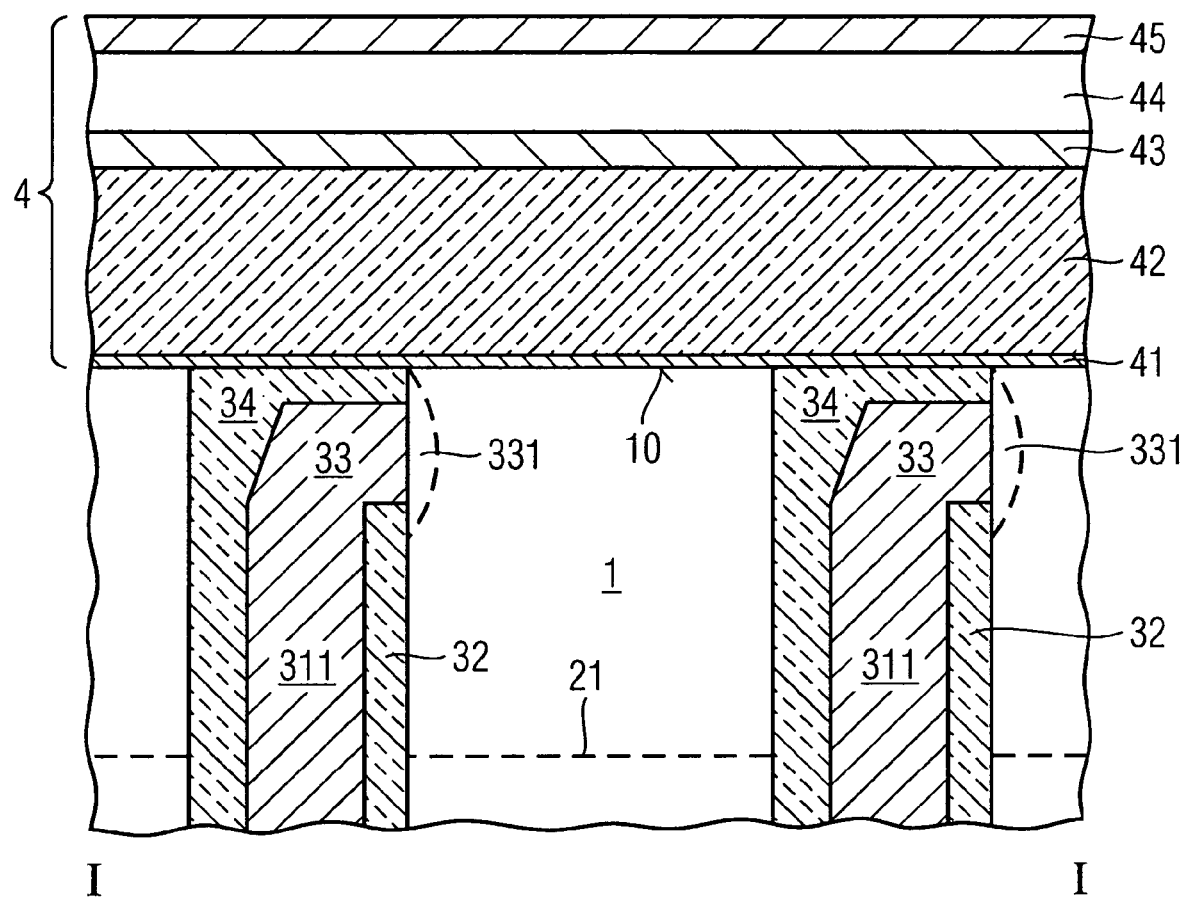

A first and a second hard mask layer stacks 4 are deposited. In particular, a silicon nitride layer 41 having a thickness of approximately 10 nm, a silicon dioxide layer 42 having a thickness of approximately 120 nm, and a polysilicon layer 43 having a thickness of 50 nm are deposited. Thereafter, a carbon hard mask layer 44 having a thickness of about 180 nm and a silicon oxynitride layer 45 having a thickness of 60 nm are deposited. In particular, the silicon oxynitride (SiON) layer 45 acts as a hard layer for patterning the carbon layer 44. In addition, the SiON layer 45 is an antireflective coating. Optionally, a sacrificial $SiO_2$ layer (not illustrated) may be provided between the substrate surface 10 and the silicon nitride layer 41. The resulting structure is illustrated in FIG. 4.

Openings are formed in the SiON layer 45. For example, the openings formed in the SiON layer 45 are formed by a tapered etching process, so that the diameter of the openings at a bottom portion thereof is smaller than the diameter at a top portion of the SiON layer. The openings are formed so that they have an oval shape, wherein the ratio between the longer side to the smaller side is approximately 2:1,2: In particular, the diameter of the opening at the bottom portion of the SiON layer 45 can be 50 to 300 nm.

Figure 5:
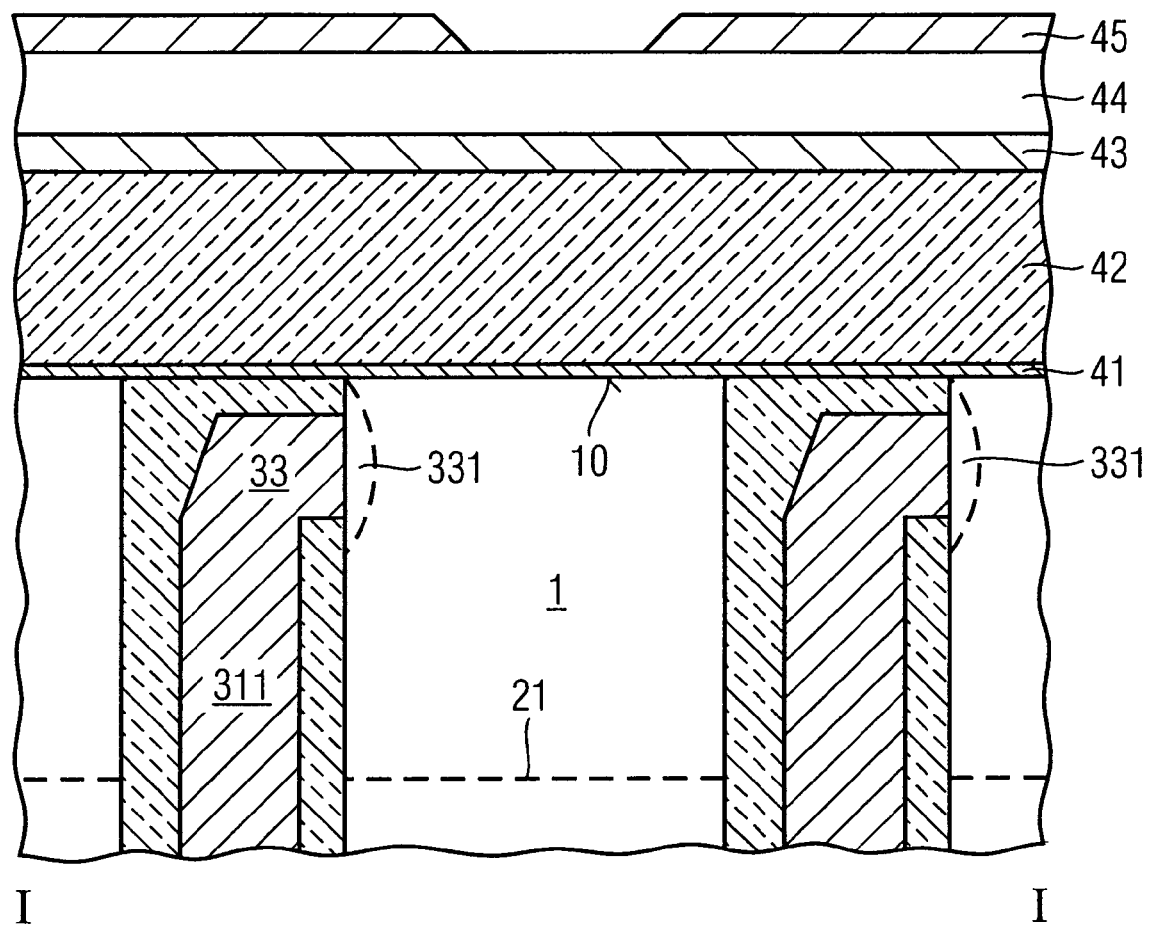

The resulting structure is illustrated in FIG. 5.

The carbon hard mask 44 is etched. Thereafter the polysilicon layer 43 and the silicon dioxide layer 42 are etched by a selective etching process which stops on the silicon nitride layer 41. The resulting structure is illustrated in FIG. 6, wherein in the top portion of FIG. 6 a plan view is illustrated. As can be seen, openings 46 are formed in the SiON layer 45. The lower portion of FIG. 6 illustrates a cross-sectional view between I and I in the top portion. As can be seen from the lower portion, the openings 46 extend to the silicon nitride layer 41.

Silicon nitride 41 is etched selectively with respect to silicon and silicon dioxide. Thereafter, an etching process is performed so as to simultaneously etch silicon dioxide and silicon. In particular, approximately 15 to 60 nm Si are etched by this etching process. As a consequence, the opening 46 extends into the silicon substrate 1. Moreover the upper portion of the isolation trenches 2 in a section which is perpendicular to the one depicted in FIG. 7 is etched as well.

Thereafter the SiON layer as well as the carbon hard mask layer 44 are removed. In particular, the carbon hard mask can be etched in an $O_2$ plasma. The resulting structure is illustrated in FIG. 7.

The upper portion of FIG. 7 illustrates a plan view on the resulting structure. As can be seen, openings 46 are formed in the polysilicon layer 43. In the opening 46, the silicon substrate material 1 of the active areas 12 is not covered. Isolation trenches are disposed adjacent to the active area 12, the isolation trenches 2 not being covered in the opening. A cross-sectional view of the structure is illustrated in the lower portion of FIG. 7. As can be seen, the opening 46 extends into the silicon substrate 1. For example, the opening 46 can extend into the substrate approximately 15 nm to 60 nm below the surface 10 thereof so as to form a gate groove 73.

A silicon nitride spacer 47 is formed. In particular, a silicon nitride layer having a thickness of approximately 0.3 F is conformally deposited followed by an anisotropic etching process, so as to form a spacer 47. Thereafter, an etching process for etching the silicon dioxide material of the isolation trenches 2 is performed. In particular, about 100 nm $SiO_2$ are etched. The resulting structure is illustrated in FIG. 8.

The upper portion of FIG. 8A illustrates a plan view on the resulting structure. As can be seen, openings 46 are formed in the polysilicon layer 43, the openings being enclosed by an annular silicon nitride layer 47. On either sides of the active areas 12, isolation trenches 2 are provided. A cross-sectional view of the resulting structure is illustrated in the lower portion of FIG. 8A. This cross-sectional view is taken between I and I as can be seen from the top portion of FIG. 8A. As can be seen, a silicon nitride spacer 47 is disposed on either sides of the openings 46.

Figure 8B:
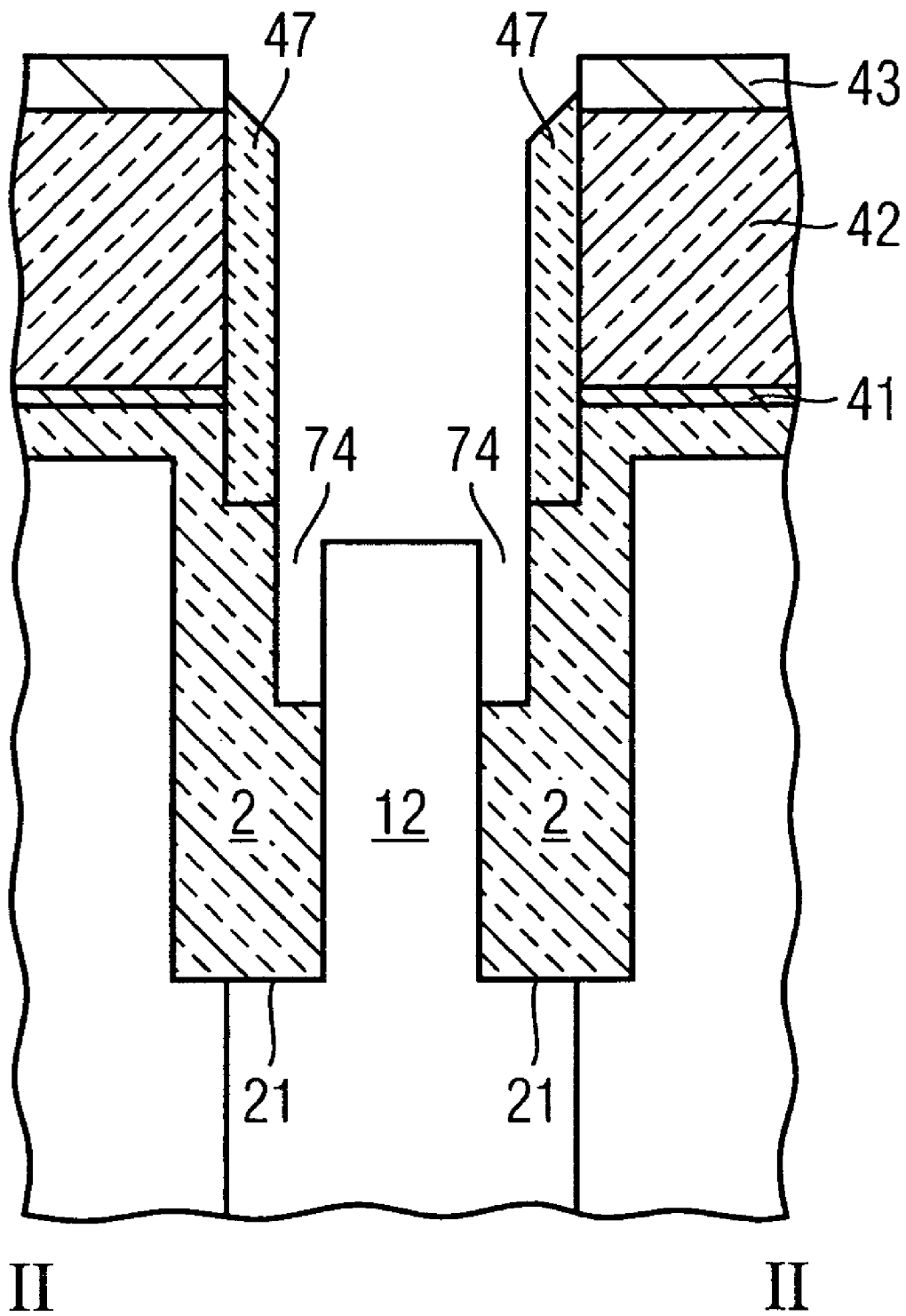

FIG. 8B illustrates a cross-sectional view which is taken between II and II as can be taken from FIG. 8A. As can be seen, pocket structures 74 which extend in the isolation trenches 2 have been formed by the oxide-etching process. In addition, the silicon nitride spacer 47 is disposed at the upper portion of the openings 46.

Optionally the active area 12 is thinned by performing an isotropic silicon-etching process. In particular, the active area is thinned by 10 to 20 nm. Accordingly, the resulting width of the active area amounts to approximately less than 35 nm. A gate dielectric layer 88 is deposited, for example by performing a ISSG (in-situ steam generated) oxidation process. The resulting structure is illustrated in FIG. 9.

In particular, the upper portion of FIG. 9 illustrates a plan view on the resulting structure. As can be seen, the active area 12 now is thinned with respect to the foregoing Figures. The whole surface area is covered by a silicon dioxide layer 88, the position of the spacer 47 being indicated in the upper portion of FIG. 9. The lower portion of FIG. 9 illustrates a cross-sectional view between I and I. As can be seen, the gate dielectric layer 88 is conformally deposited on the whole substrate surface.

Figure 10:
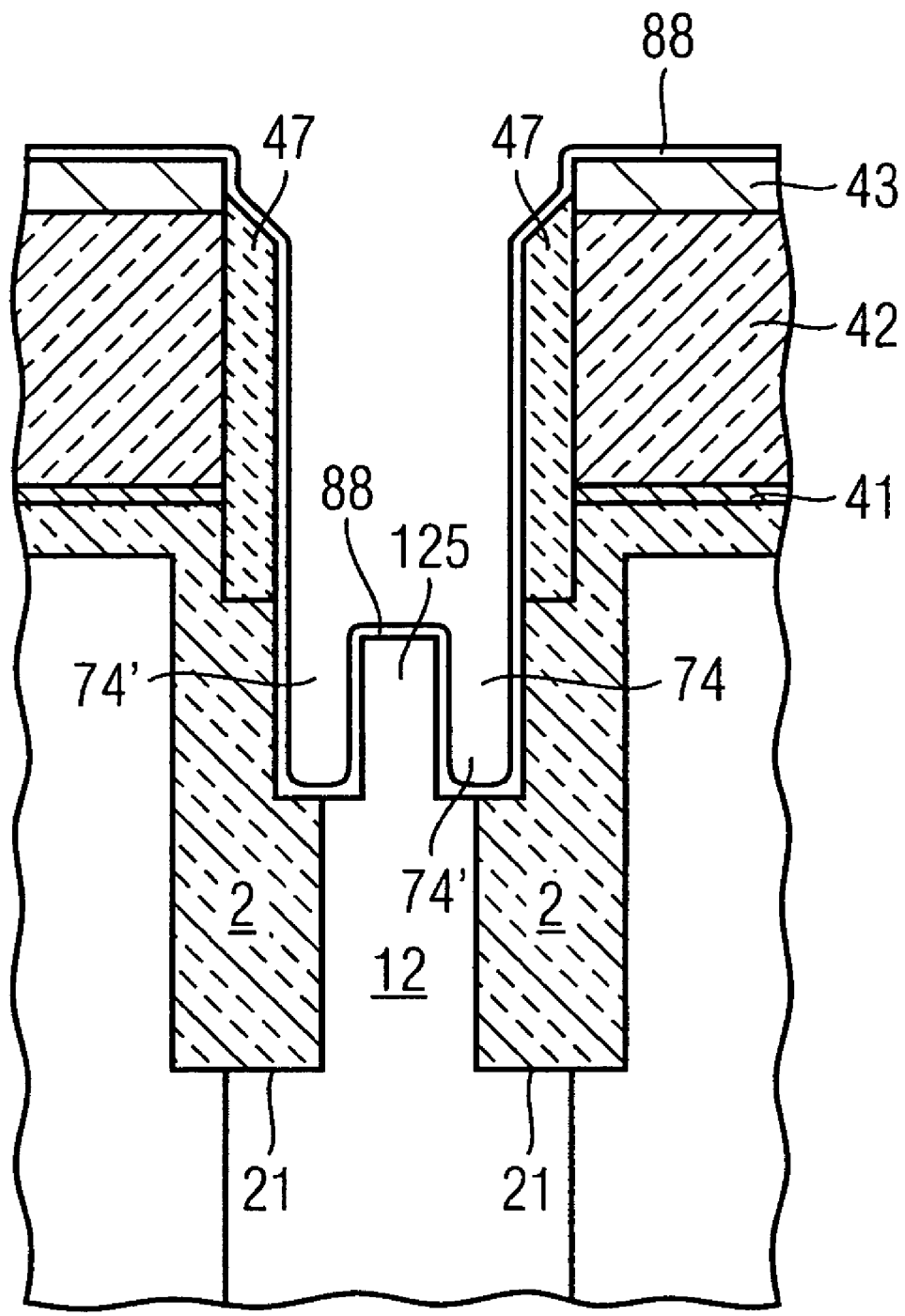

FIG. 10 a cross-sectional view between II and II as can be taken from the upper portion of FIG. 9A. As can be seen the active area 12 now includes a thinned portion 125. The silicon dioxide layer 88 is conformally formed on the whole surface. Extended pocket structures 74' have been formed by the silicon etching process.

A sacrificial silicon nitride layer having a thickness of approximately 80 nm is deposited. Thereafter, the silicon nitride layer is recessed by etching approximately 100 nm. As a consequence, a silicon nitride filling 49 is provided so as to fill the remaining opening 46 which has been formed by the former processes. Then, the $SiO_2$ layer 88 and the polysilicon layer 43 are removed by generally known methods. As a result, the silicon nitride spacer 47 and the silicon nitride filling 49 extend to a height of approximately 70 nm or higher measured from the top portion of the silicon nitride layer 41.

Figure 11A:
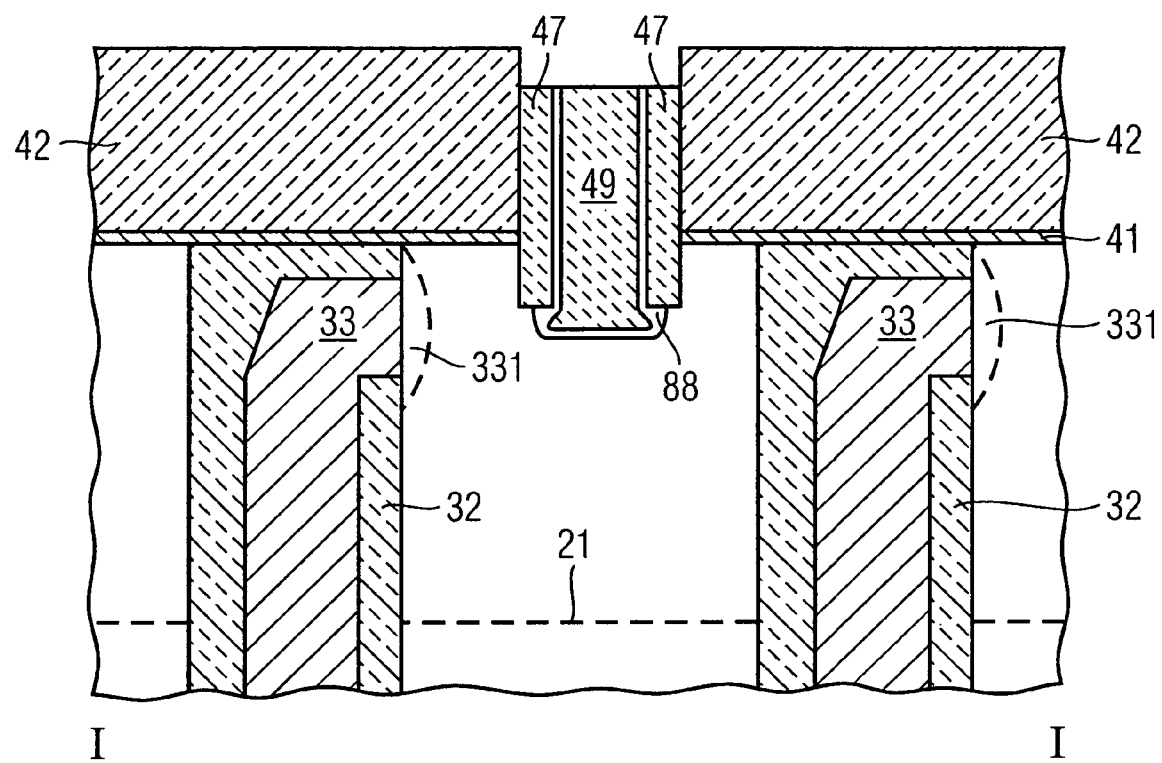

The resulting structure is illustrated in FIG. 11A, which illustrates a cross-sectional view between I and I as can be seen from FIG. 9, for example.

Figure 11B:
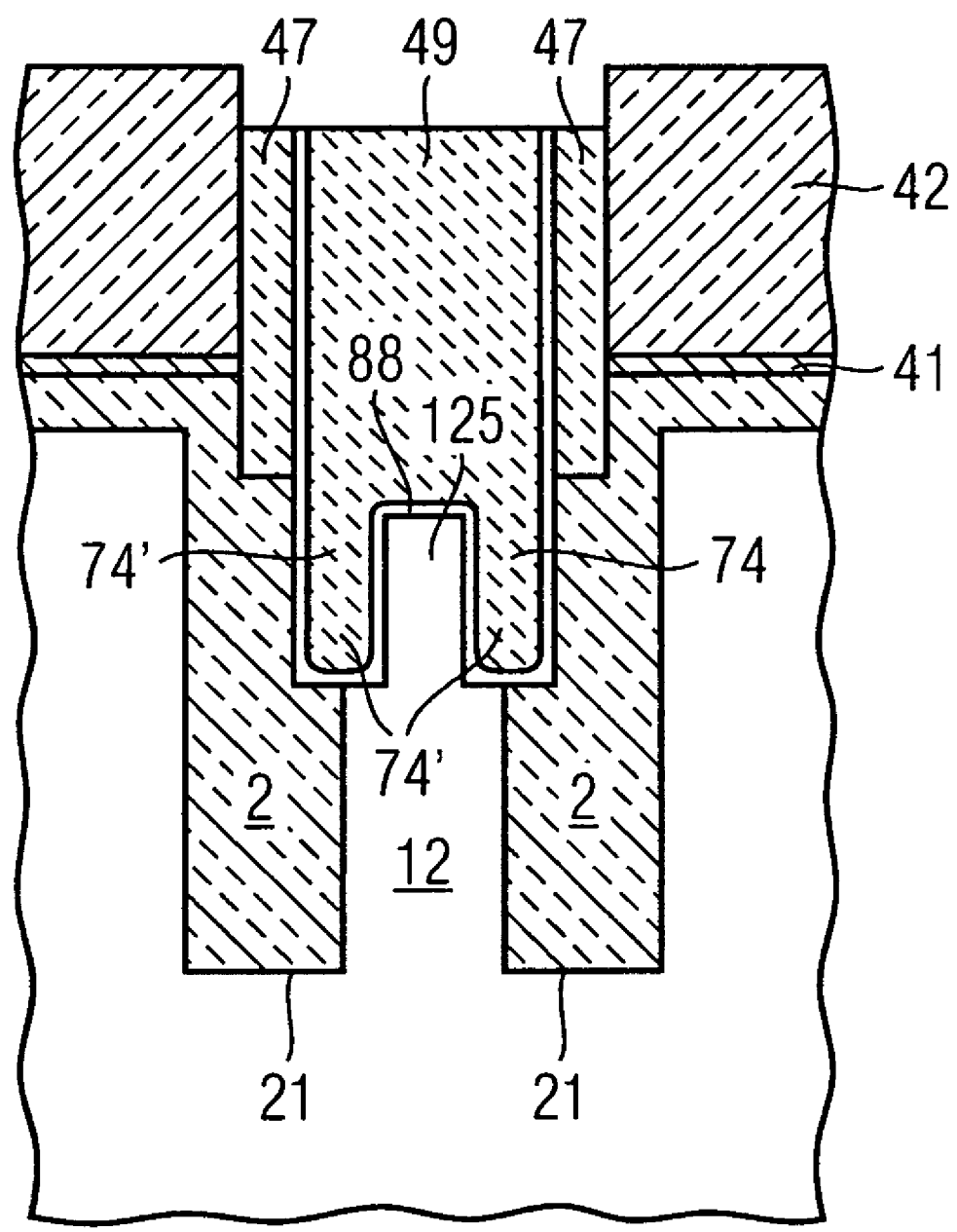

FIG. 11B illustrates a cross-sectional view which is taken between II and II. As can be seen, in a cross-section perpendicular to the cross-section illustrated in FIG. 11A the opening 46 is filled with the silicon nitride spacer 47 as well as the silicon nitride filling 49.

Figure 12:
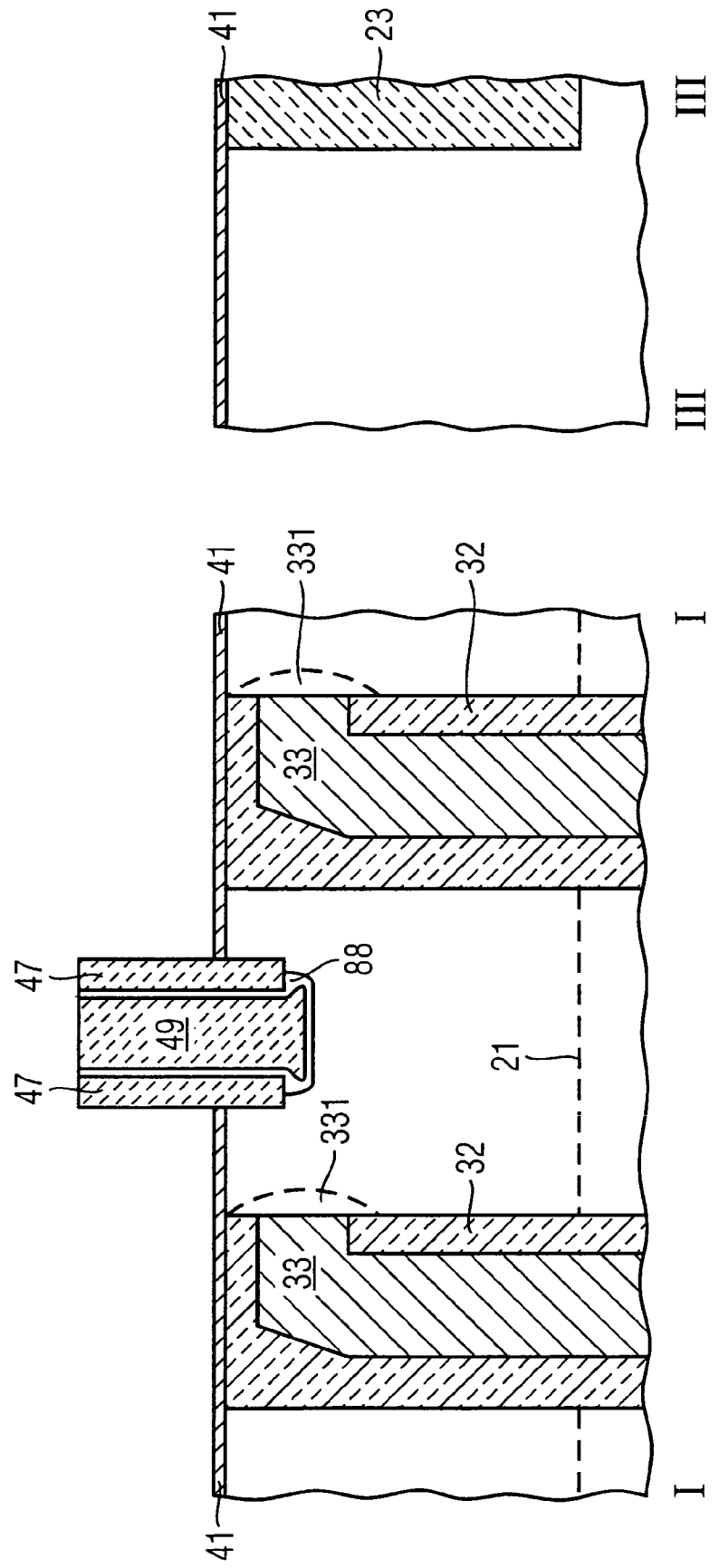

An etching process for removing the silicon dioxide layer 42 is performed. By this etching process also a top portion of the gate dielectric layer 88 which is disposed between the silicon nitride spacer 47 and the silicon nitride filling 49 is removed. The resulting structure is illustrated in FIG. 12, wherein the left part of FIG. 12 illustrates the cross-sectional view between I and I and the right part of FIG. 12 illustrates a cross-sectional view of the peripheral portion of the memory device between III and III as can for example be taken from FIG. 1. As can be seen from FIG. 12, now the complete surface of the substrate is covered by the silicon nitride layer 41, with the exception of those portions, in which the gate electrode is to be formed.

Figure 13:
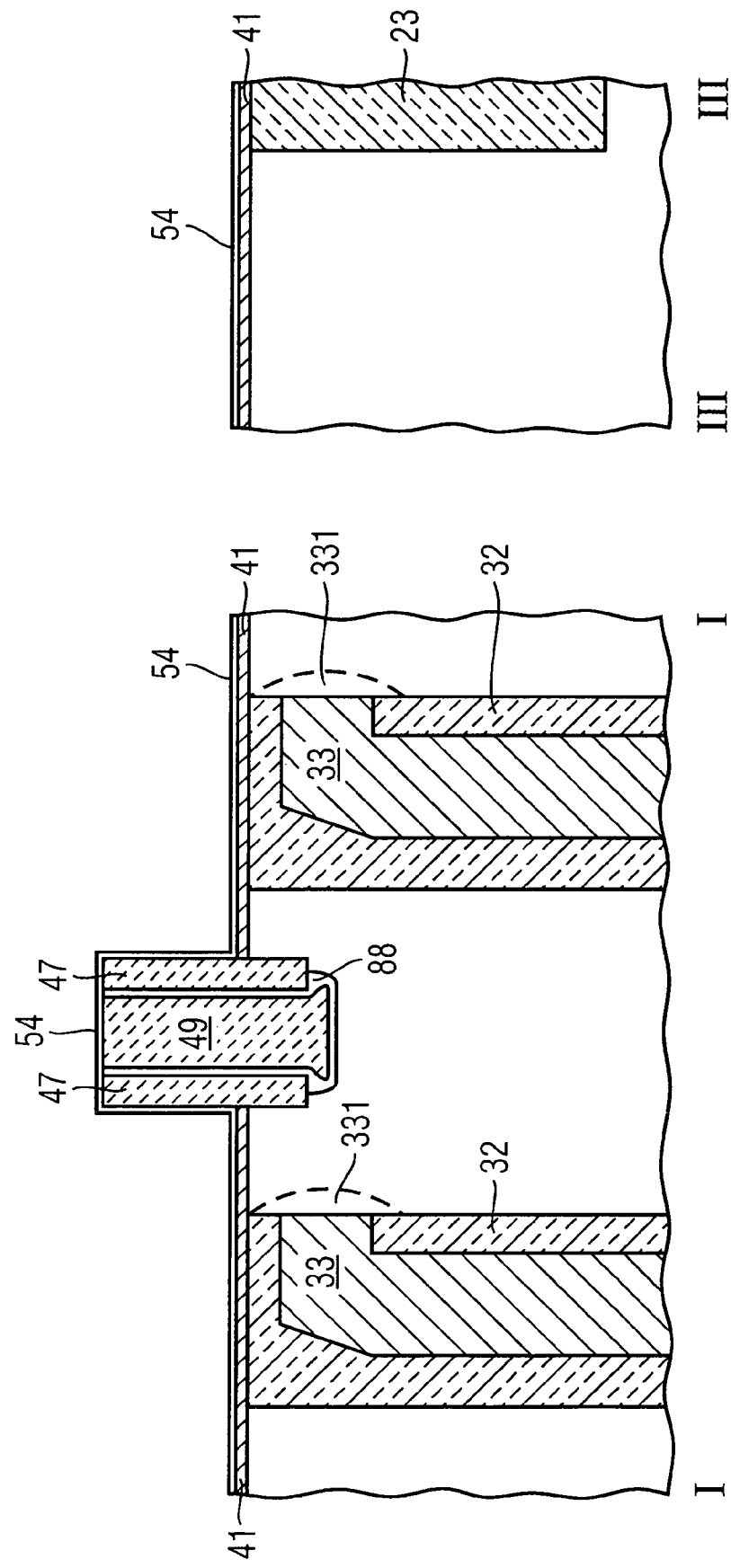

A silicon dioxide layer 54 having a thickness of 4 nm is formed as a layer for protecting the silicon nitride layer 41. For example, the silicon dioxide layer 54 can be formed by an ISSG oxidation process. The resulting structure is illustrated in FIG. 13. As can be seen, now, the whole surface is covered by a silicon dioxide layer 54.

Figure 14:
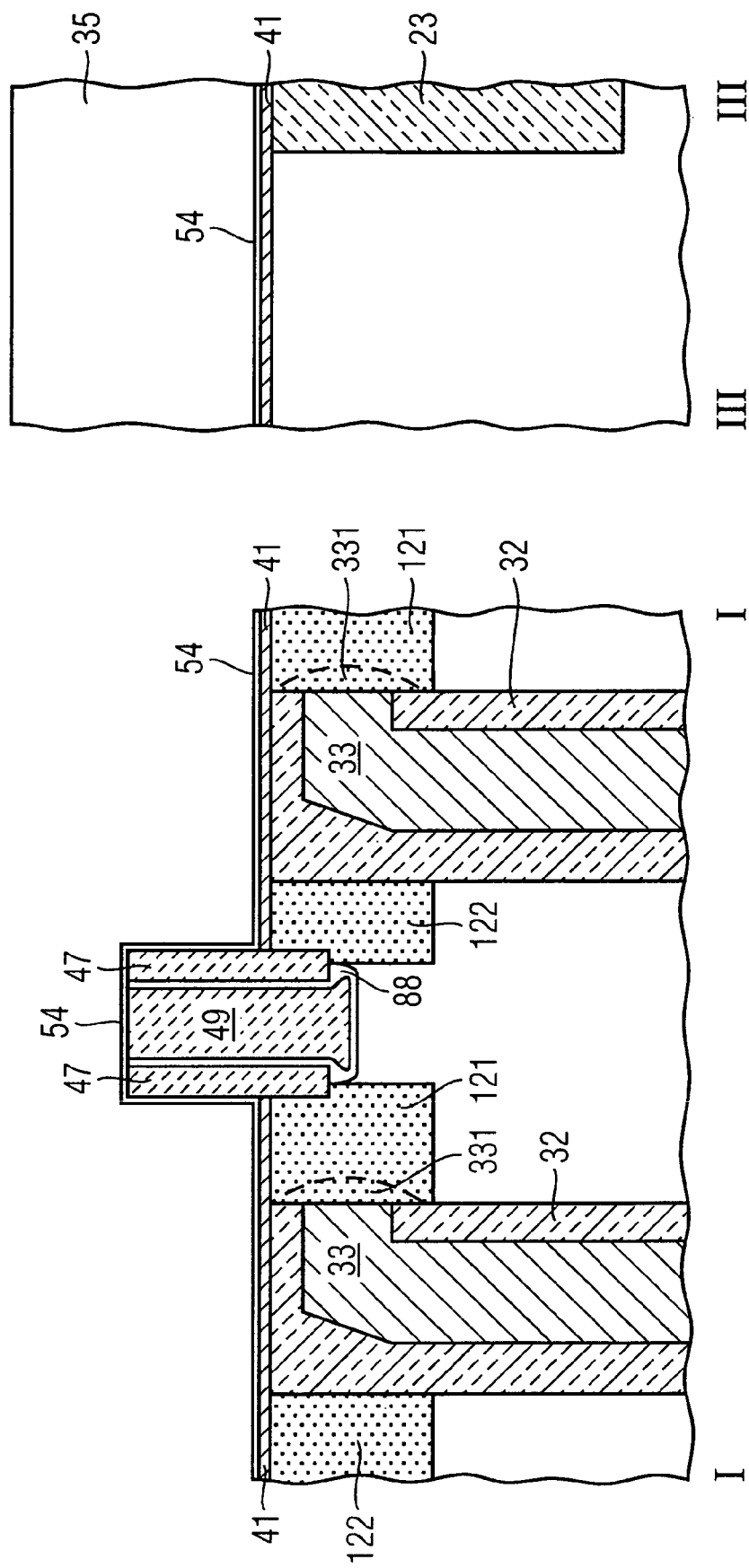

A resist material 35 is provided on the peripheral portion of the memory device leaving the array portion uncovered. Moreover, implantation processes for providing the first and second source/drain regions 121, 122 are performed. The resulting structure is illustrated in FIG. 14. As can be seen from FIG. 14, now the peripheral portion between III and III is covered by the resist layer 35 and the first and second source-drain regions 121, 122 are formed.

Figure 15:
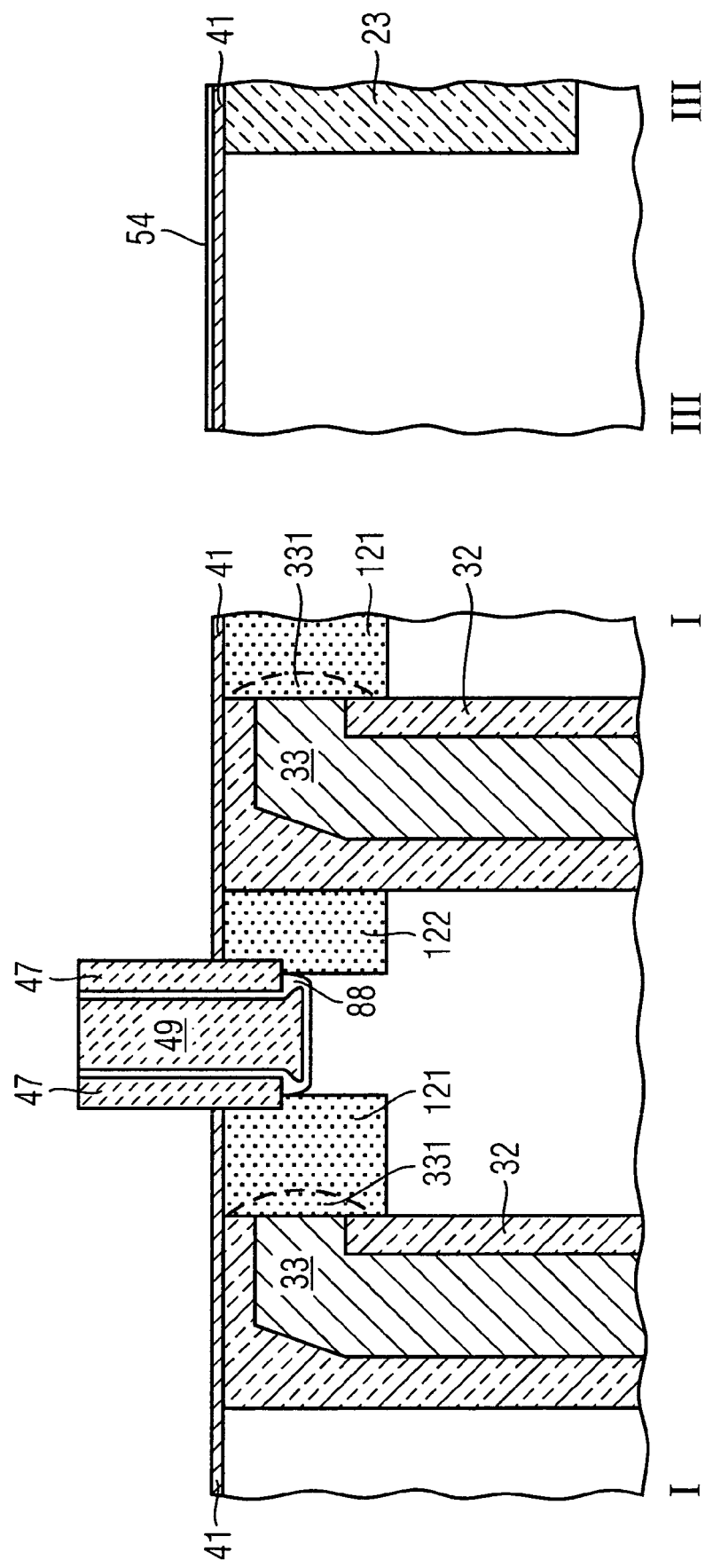

The deglazing process is performed so as to remove the silicon dioxide layer 54 from the array portion. Thereafter, the resist material 35 is removed from the peripheral portion. As a consequence, the peripheral portion remains protected by the silicon dioxide layer 54, whereas in the array portion, the surface is covered by the silicon nitride layer 41. The resulting structure is illustrated in FIG. 15.

An etching process with hot phosphoric acid (hot phos) is performed so as to selectively etch silicon nitride with respect to silicon dioxide. As a consequence, the silicon nitride layer 41 is removed from the array portion. In addition, the silicon nitride spacers 47 and the silicon nitride filling 49 in the middle of the formed opening are completely etched. Since this etching process is selective with respect to silicon dioxide, the peripheral portion is not etched by this etching process.

Figure 16:
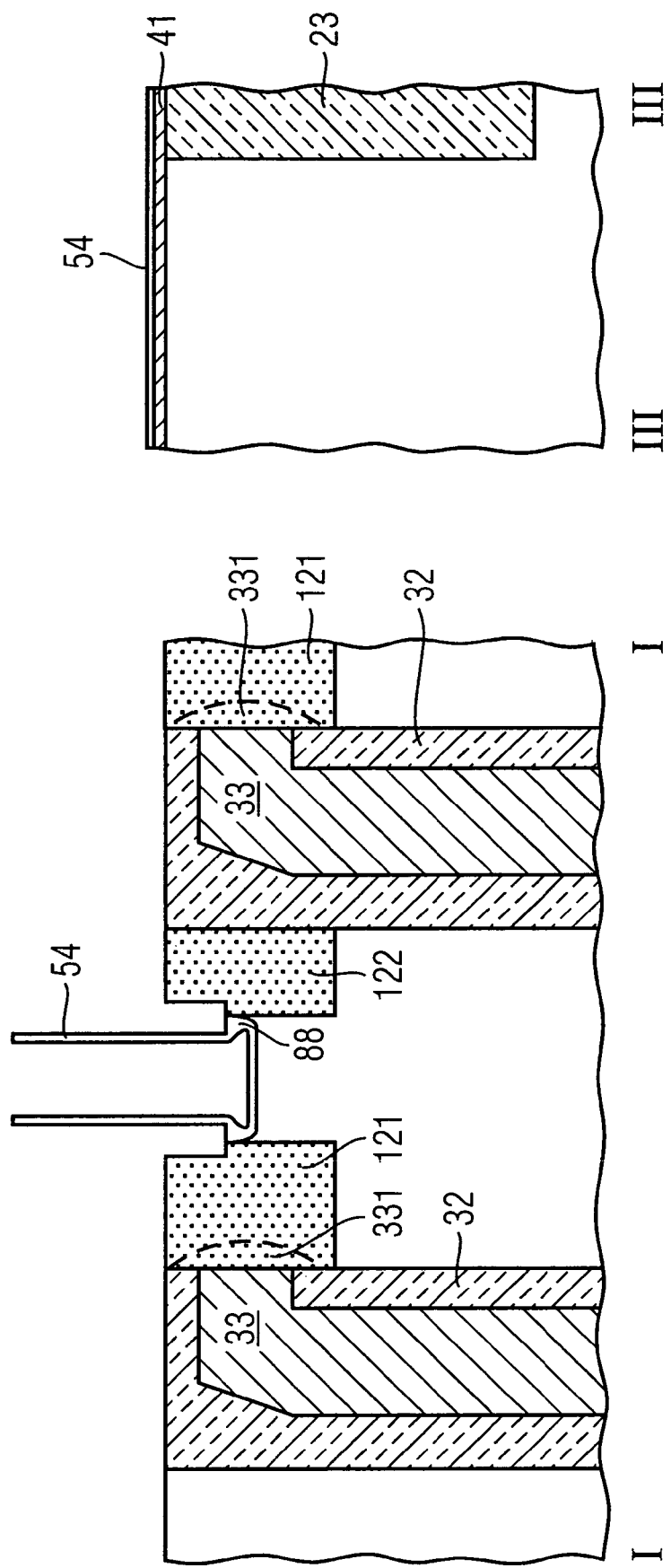

The resulting structure is illustrated in FIG. 16.

Figure 17:
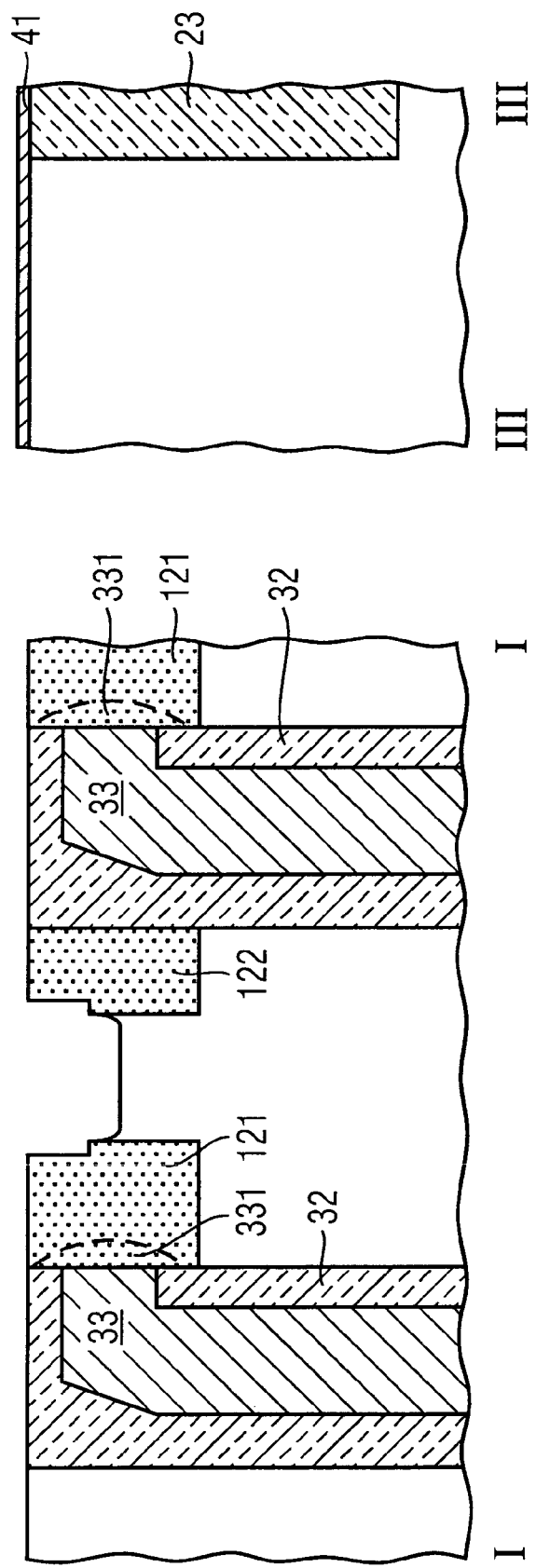

An etching process of etching silicon dioxide is performed. As a consequence, the $SiO_2$ layer 54 as well as the $SiO_2$ layer 88 are removed. The resulting structure is illustrated in FIG. 17.

At a temperature of approximately 800° C. an oxidation process with HCl vapour is performed. Thereby, the uncovered silicon material is oxidized so as to form silicon dioxide. As a result, a silicon dioxide layer is formed. In particular, the silicon dioxide layer includes the gate dielectric layer 88 and the silicon dioxide spacer 36 which is formed having a thickness of approximately 15 to 20 nm, thereby consuming 9 to 12 nm Si.

A nitride-etching process with hot phosphoric acid is performed. Thereby the silicon nitride layer 41 is removed from the peripheral portion. The resulting structure is illustrated in FIG. 18.

Optionally, an implantation process for providing the doped regions of the peripheral transistor can be performed. Then, the sacrificial $SiO_2$, if present, is removed.

Figure 19A:
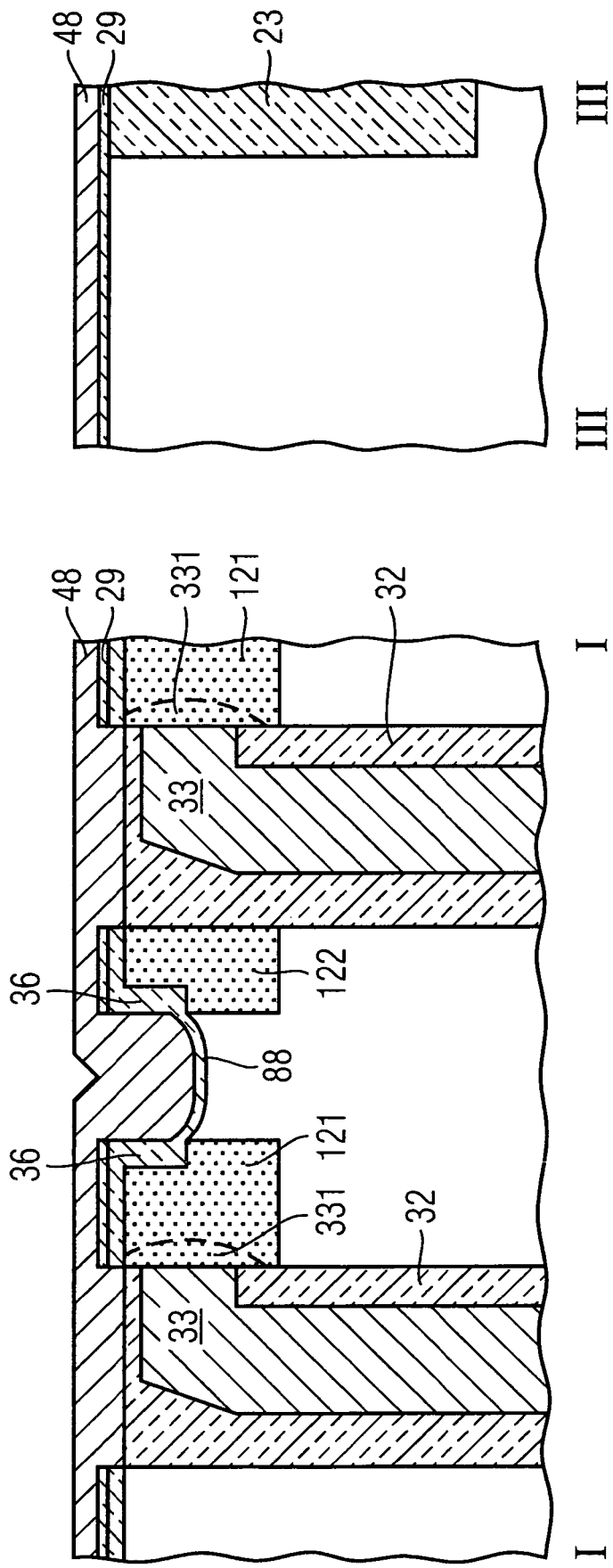

Thereafter, an oxidation process in HCl vapour is performed, so as to provide the peripheral gate dielectric layer 29. Thereafter, a polysilicon layer having a thickness of approximately 80 nm is deposited, followed by an etching process for recessing about 60 nm polysilicon. As a result, the whole surface is covered by a polysilicon layer 48, the opening formed in the substrate surface now being filled by polysilicon material. The resulting structure is illustrated in FIG. 19. In particular, as can be seen from FIG. 19A, in the cross-sectional view between I and I, the gate groove now is filled with polysilicon material. In the following Figures, although portions of the $SiO_2$ layers 36, 29 are illustrated above the capacitor trench, it is obvious to the person skilled in the art, that—depending on the process conditions under which the $SiO_2$ layers have been formed, these layers are not formed as continuous layers which cover the capacitor trench. To be more specific, if the $SiO_2$ layers 36, 29 have been formed by thermal oxidation, they are not formed above the trench top oxide 34 which is filled in the capacitor trenches.

Figure 19B:
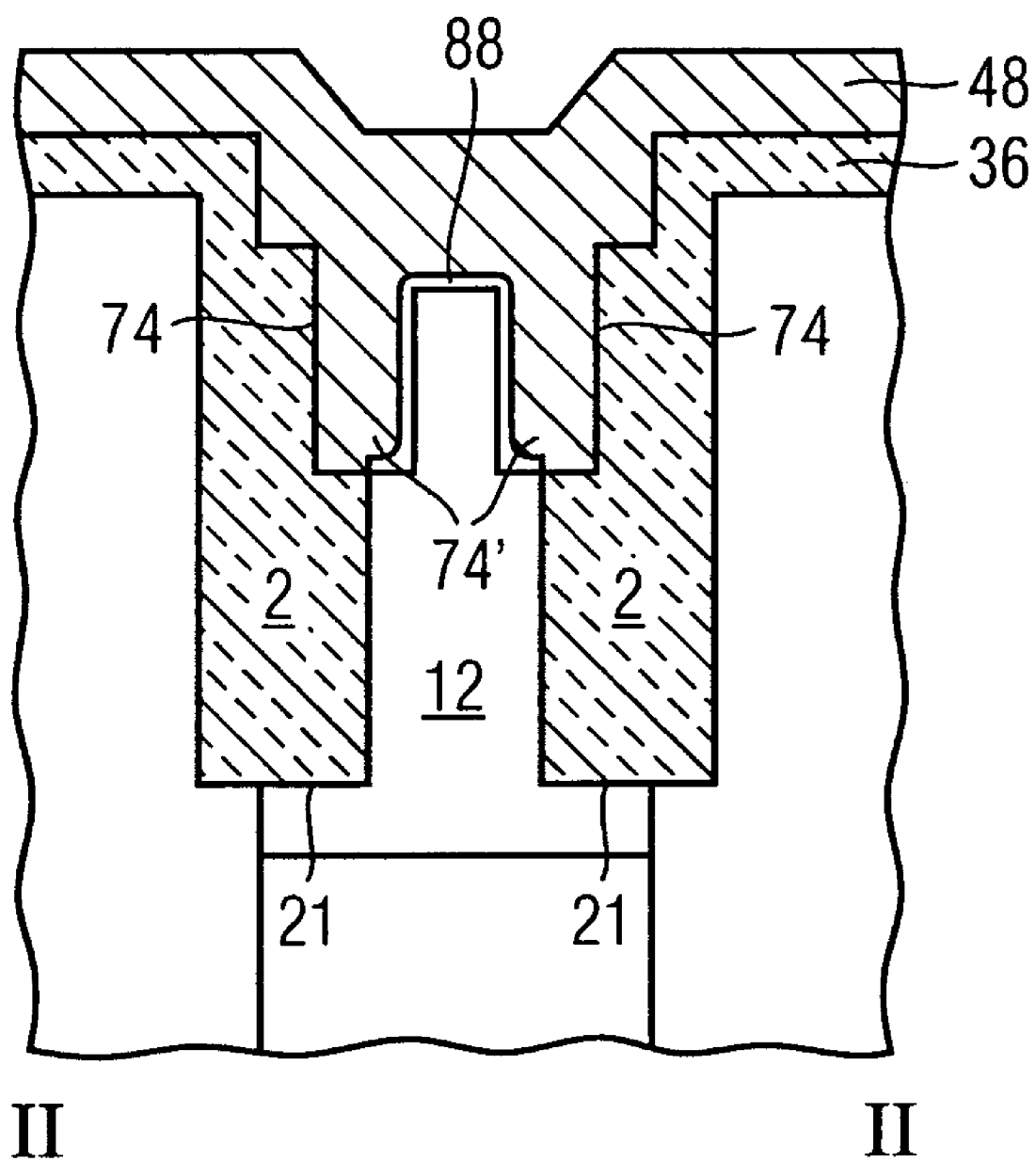

As can be further seen from FIG. 19B which illustrates a cross-sectional view between II and II, also in a cross-section perpendicular to the one depicted in FIG. 19A, the gate groove is filled with polysilicon material.

In the next process, the layers for forming the gate stack are deposited. In particular, a polysilicon layer 55, a tungsten layer 82 and a silicon nitride layer 56 are deposited as is conventional in the art. The resulting structure is illustrated in FIG. 20.

Figure 21:
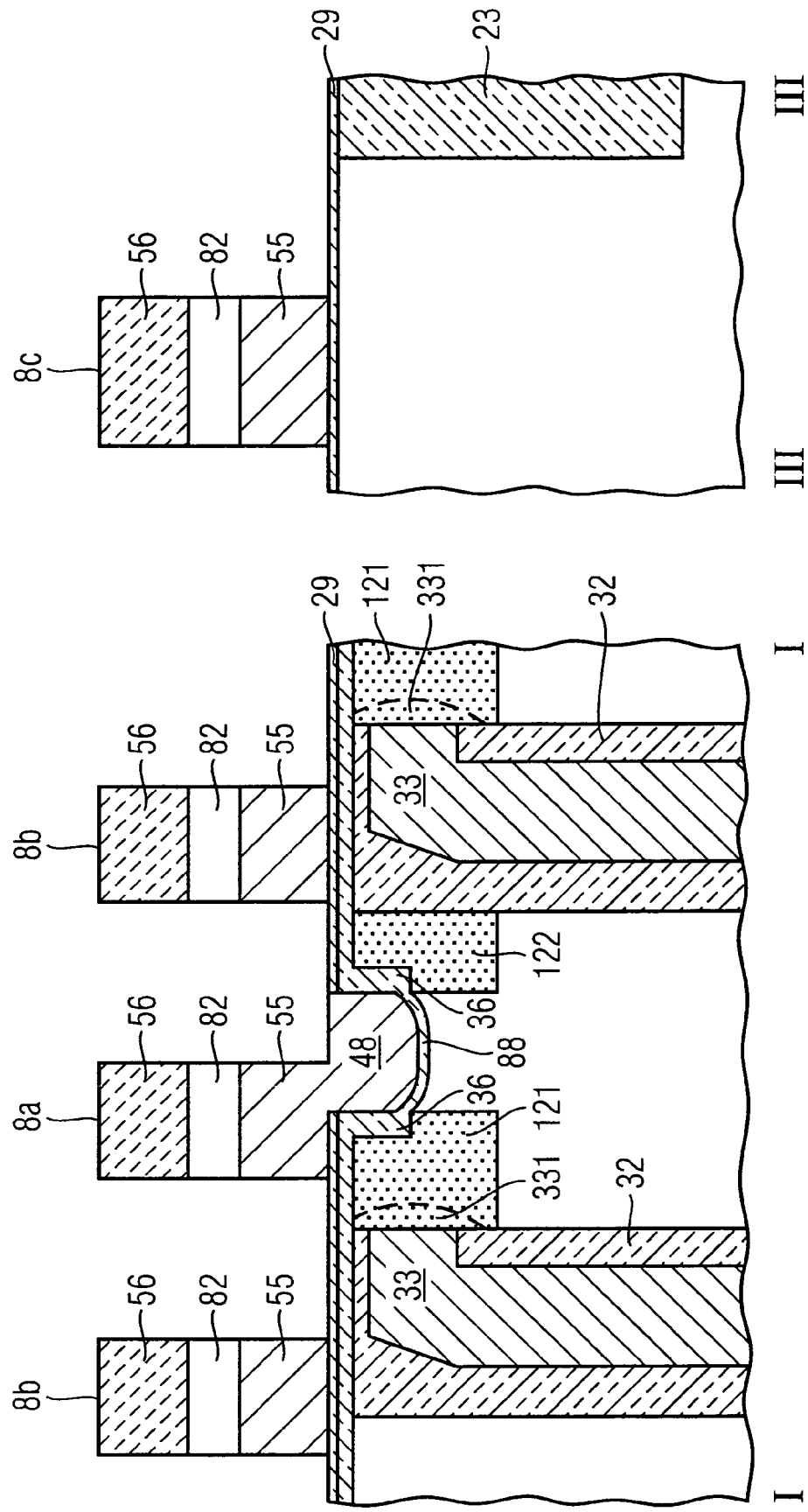

Thereafter, the layer stack for forming the gate electrode is patterned so as to form the word lines. In particular, the layers are etched using a resist pattern which has been formed by using a mask having a lines/spaces pattern. Then, the layer stack is etched. Preferably, the end point of the process of etching the polysilicon layer 55 is detected by end point detection so as to stop on the polysilicon material 48. The resulting structure is illustrated in FIG. 21. As can be seen, active word lines 8a and passing word lines 8b have been formed in the array portion, whereas a peripheral gate electrode 8c has been formed in the peripheral portion between III and III. In FIG. 21 a slight misalignment of the word lines 8a, 8b with respect to the gate electrodes is illustrated. As will be apparent from the following description, such a misalignment will not cause unwanted shorts.

The following will describe process processes which are performed so as to enable the formation of a bit line contact while avoiding shorts being the lower portion of the gate electrode and the bit line contact.

Etching the polysilicon layer 55 is performed. Optionally, the process of etching the polysilicon layer 55 can be an overetching process which also etches the polysilicon layer 48. Alternatively, an additional etching process for etching the polysilicon layer 48 can be performed. The resulting structure after etching the polysilicon material is illustrated in FIG. 22.

Figure 22:
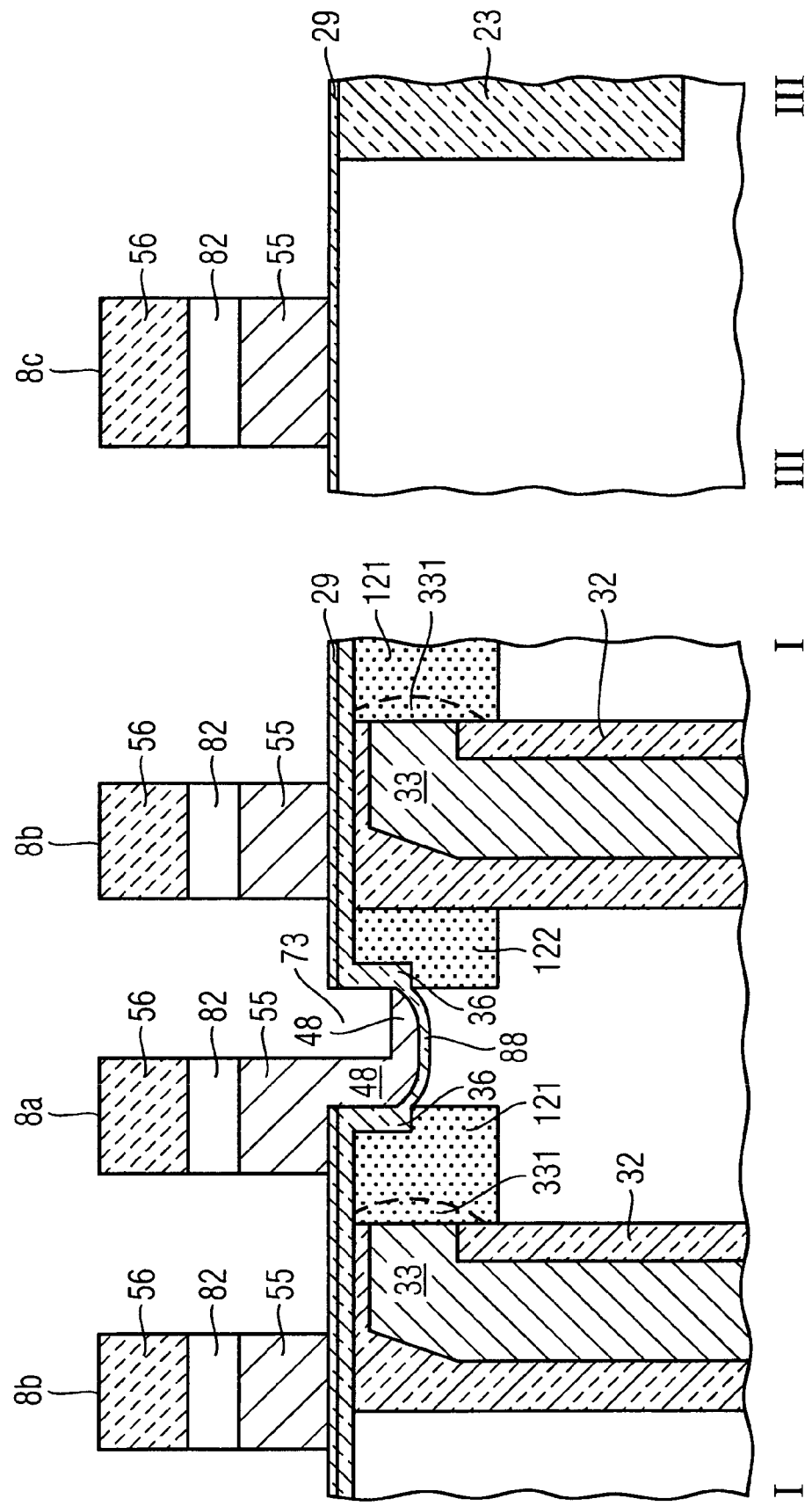
Figure 23:
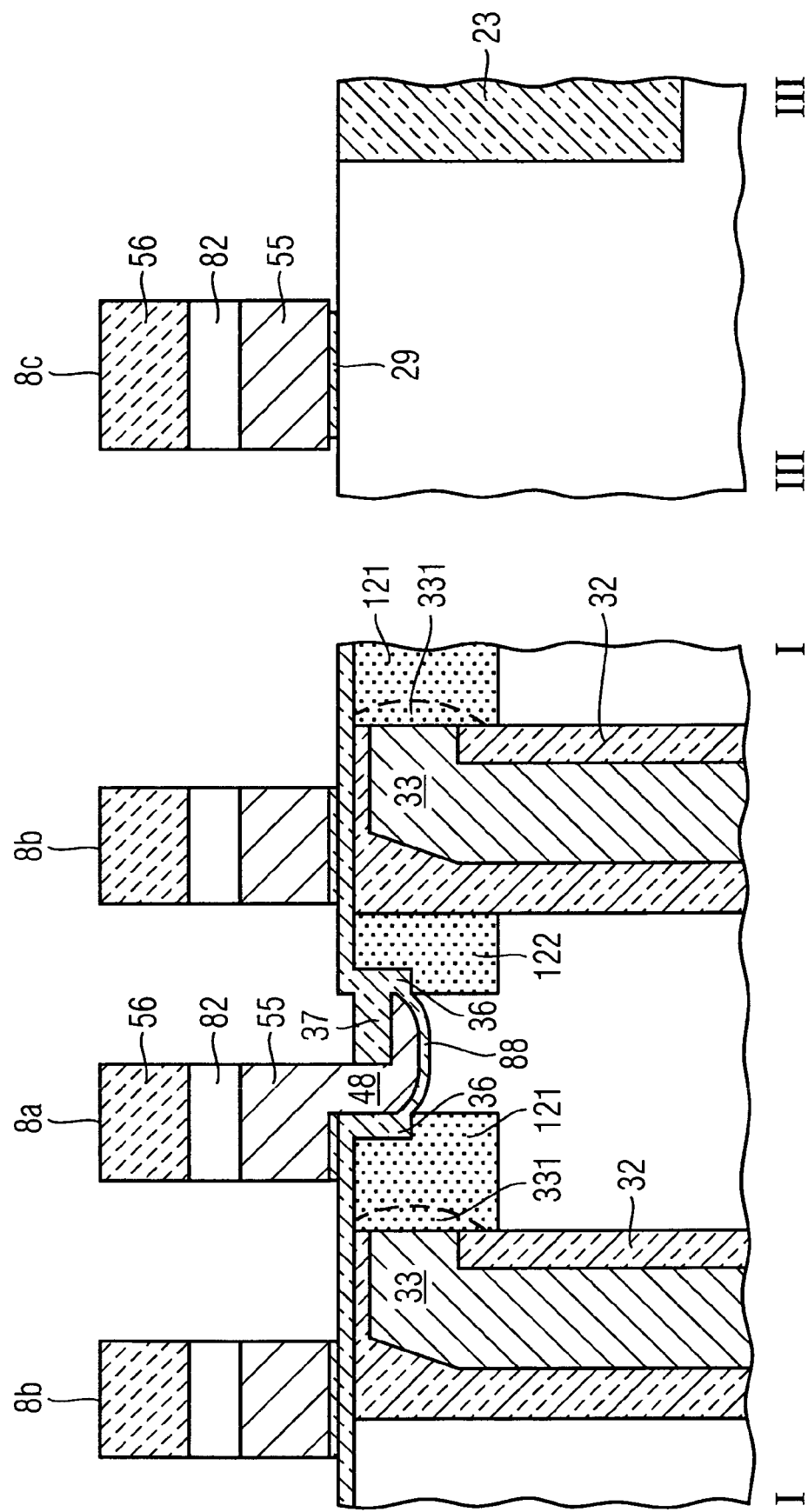

As can be seen from FIG. 22, in the array portion between I and I, the polysilicon material now is removed in an upper portion of the gate groove 73. Thereafter, optionally this exposed portion of the gate groove 73 can be filled with silicon dioxide. To this end, first, about 30 nm $SiO_2$ are deposited by using a CVD process using TEOS (tetraethyl ortho silicate) as a starting gas. Thereafter, the silicon dioxide layer is etched by approximately 40 nm. As a consequence, the $SiO_2$ filling 37 is formed at the bottom portion of the gate groove. In the peripheral portion between m and III and III the gate dielectric layer 29 is also etched. The resulting structure after this optional process is illustrated in FIG. 23.

Figure 24:
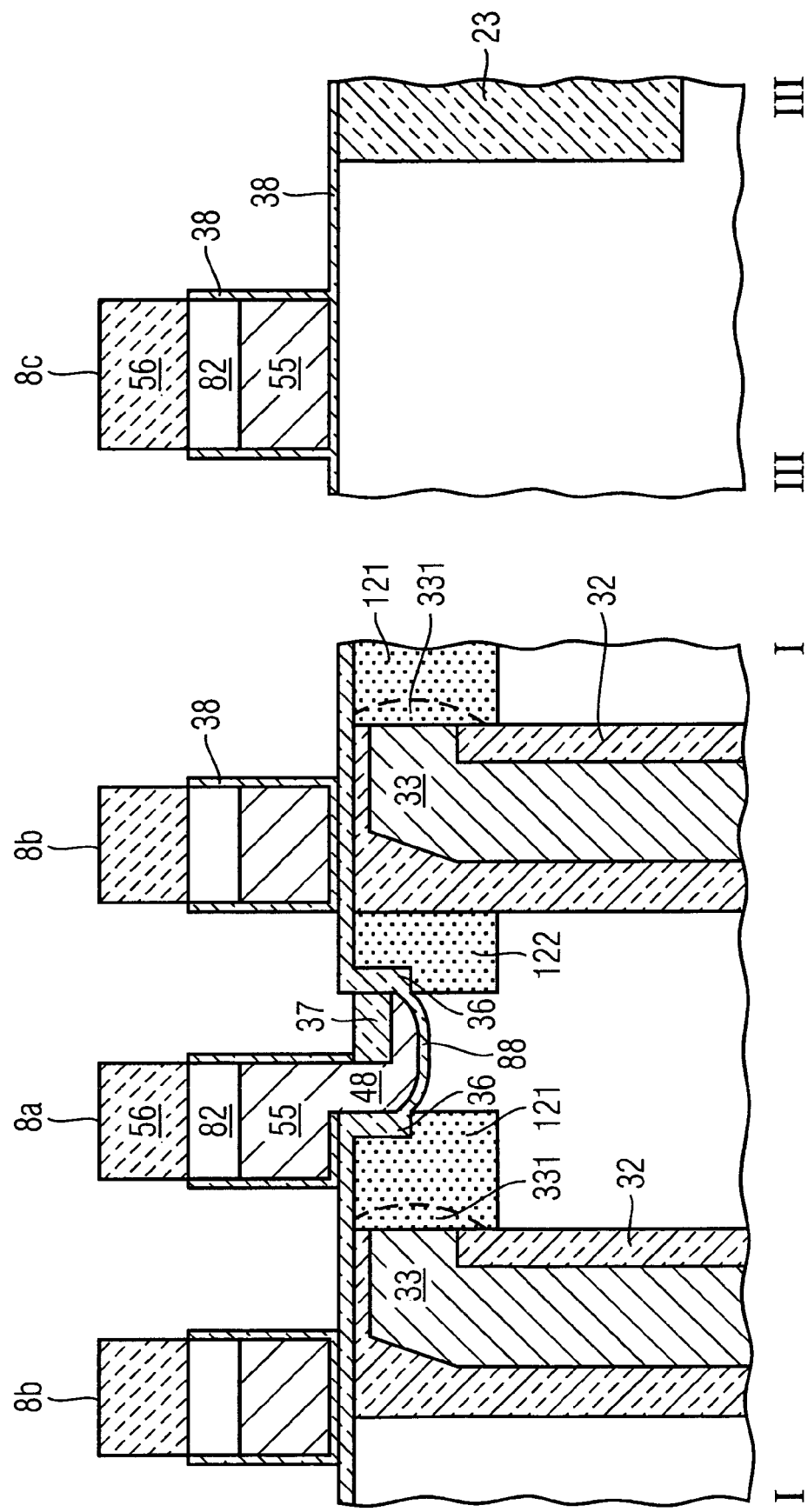

Optionally, an oxidation process so as to form a sidewall oxide 38 having a thickness of approximately 7 nm is formed by generally known methods. The resulting structure is illustrated in FIG. 24.

Thereafter, a method of forming bit line contacts to the second source/drain region 122 will be described. The process processes are already known and are merely described as an example. As is obvious to the person skilled in the art, the bit line contacts can as well be formed by any other suitable process processes, in particular, by self aligned contact formation.

For forming the bit line contacts, first a silicon dioxide layer 57 having a thickness of approximately (0.3×F) is deposited by a generally known method, for example, the TEOS method. Optionally, as an alternative to the process of depositing a silicon dioxide filling 37 which is described with reference to FIG. 23, this process can be performed so as to fill the upper portion of the gate groove with silicon dioxide.

Figure 25:
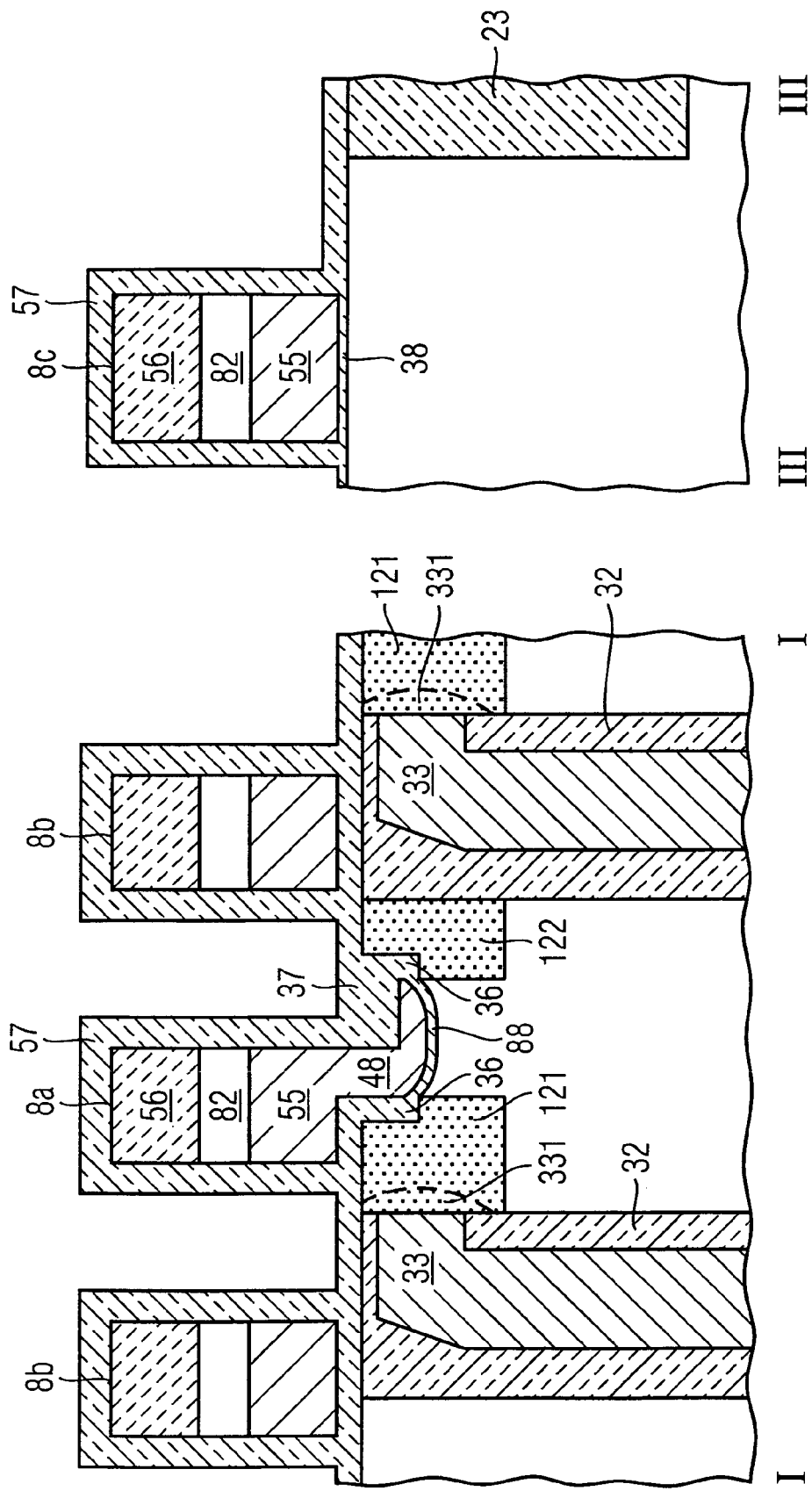

The resulting structure is illustrated in FIG. 25.

Figure 26:
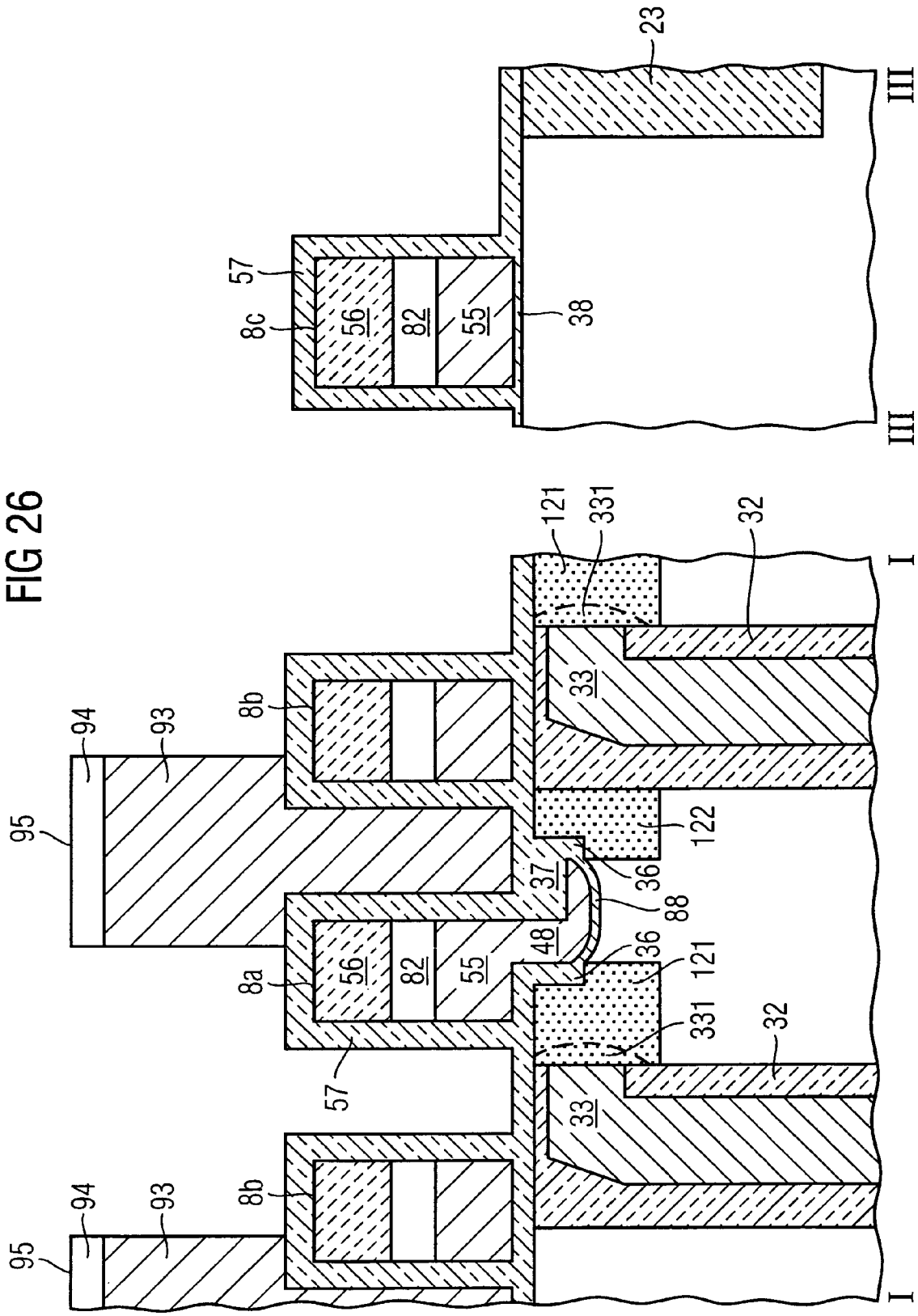

Thereafter, a bit line contact plug 95 is formed by conventional methods. In particular, an undoped polysilicon layer 93 is deposited. Thereafter, a CMP process is performed, followed by a CVD (chemical vapour deposition) process for forming a silicon nitride layer 94. Thereafter, the contact plugs 95 are photolithographically defined using a bit line contact mask and etching the polysilicon layer 93 and the silicon nitride layer 94. Thereafter, the photoresist material is removed from the surface. The resulting structure is illustrated in FIG. 26. As can be seen, bit line contact plugs 95 are formed at a position above the second source/drain region 122.

Figure 27:
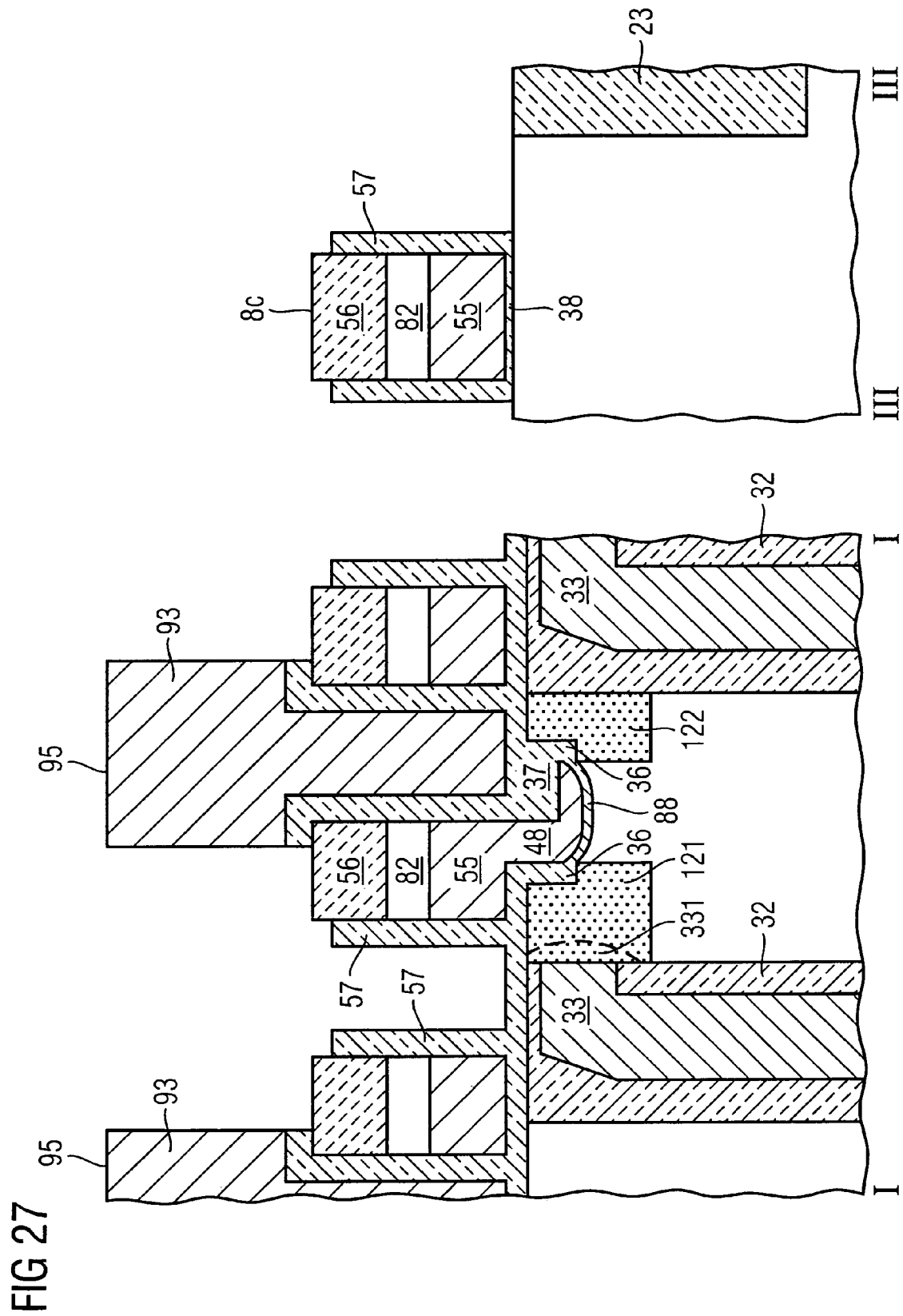

A deglazing process is performed so as to remove part of the superficial silicon dioxide layer. Thereafter, a wet etching process for etching silicon nitride 94 is performed. Then, an anisotropic etching process is performed so as to remove the horizontal portions of the silicon dioxide layer 57. The resulting structure is illustrated in FIG. 27.

As can be seen, in the array portion, a contact plug 95 made of polysilicon is formed above the second source/drain region 122. The first source/drain region 121 is not covered. In the peripheral portion between III and III, the silicon dioxide layer 57 is removed from the horizontal surface portion.

Figure 28:
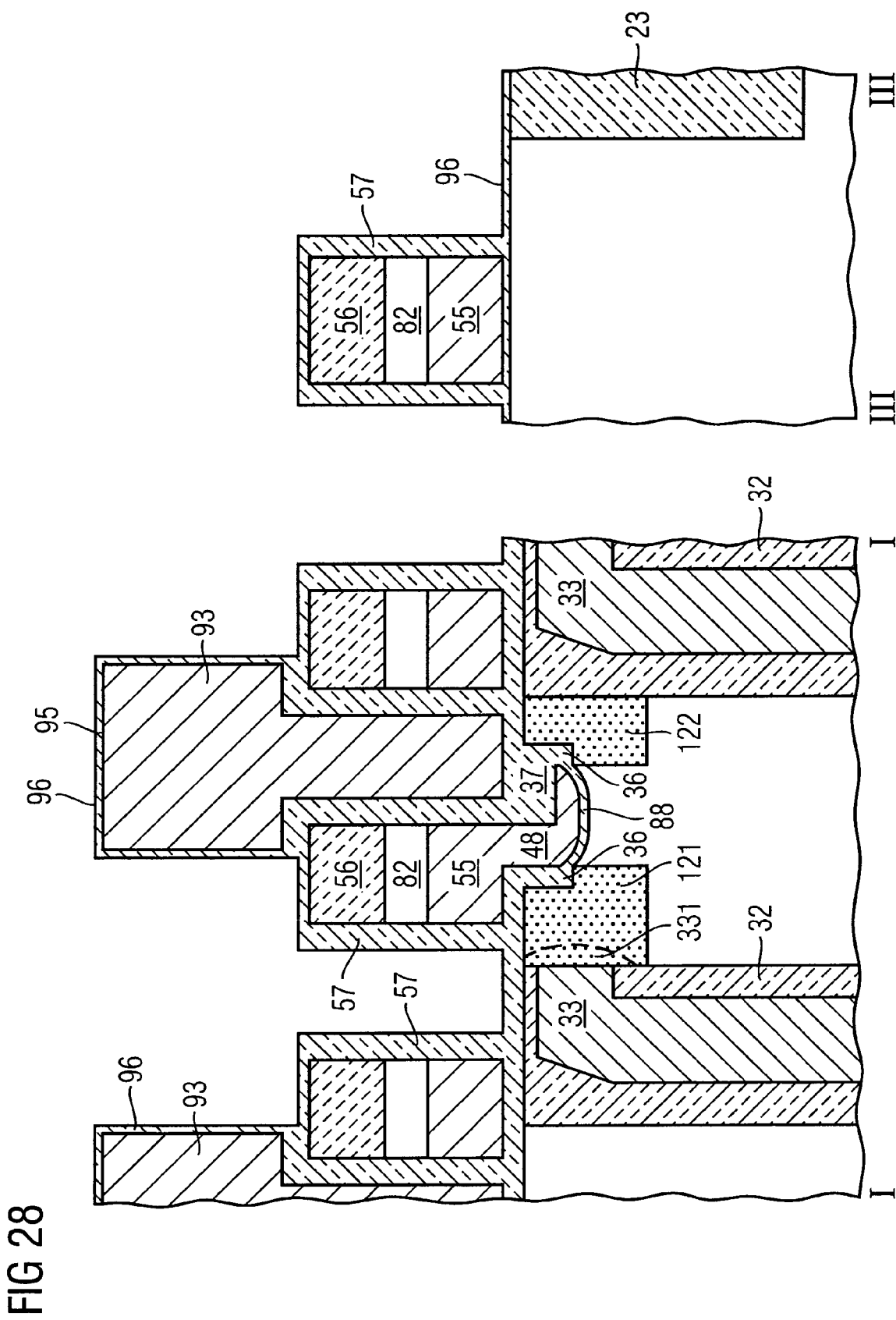

A silicon dioxide layer 96 is deposited on the whole surface. Thereafter implantation processes for implanting the lightly doped portions in the peripheral portion of the memory device are performed. In addition, the p- and n-doped portions are provided by ion implantation processes. The resulting structure is illustrated in FIG. 28. As can be seen, the whole surface is covered by a thin silicon dioxide layer 96.

Figure 29:
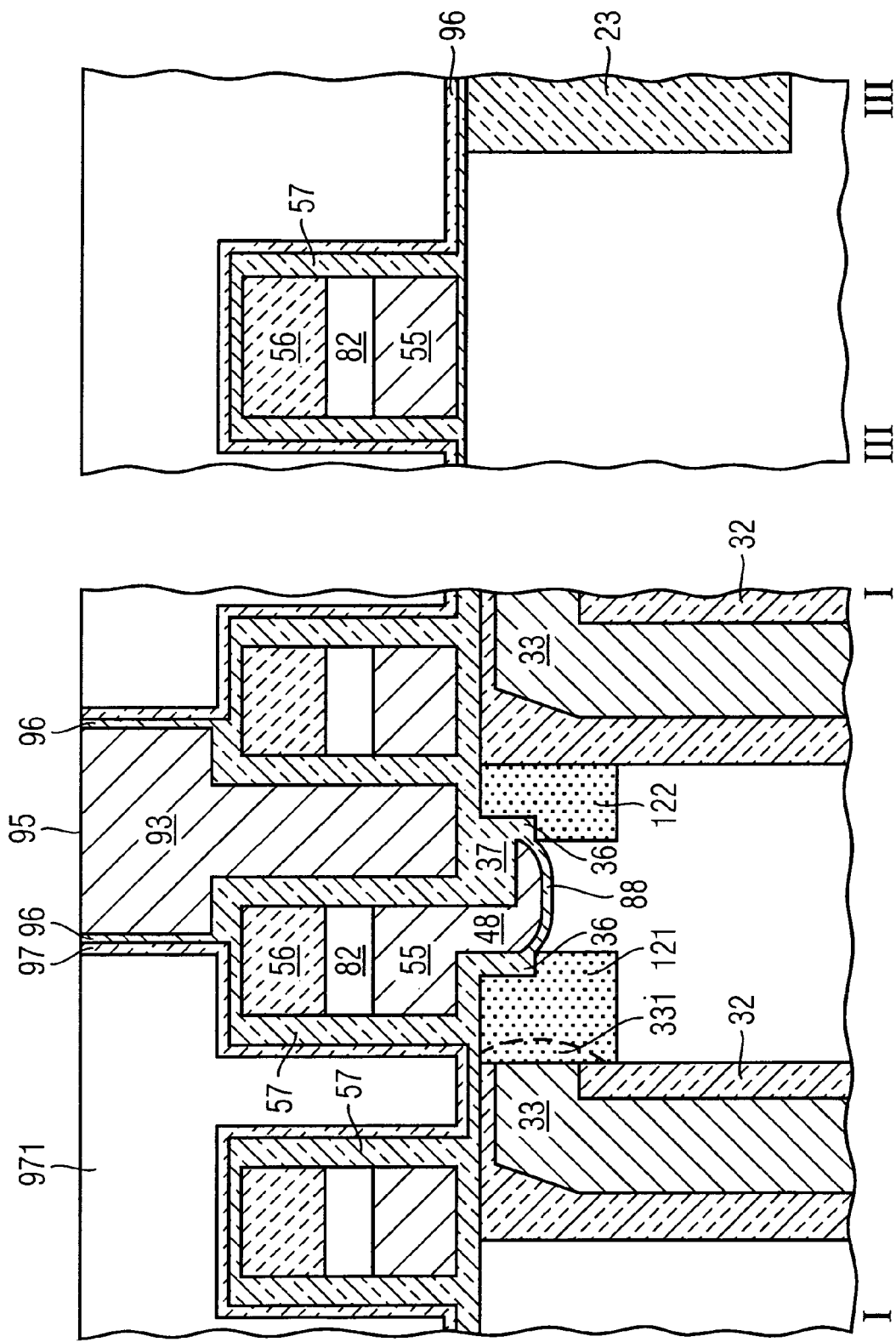

A silicon nitride layer 97 having a thickness of 12 nm is deposited by a LPCVD (low pressure CVD) method. Thereafter, a BPSG layer is deposited. The BPSG layer 971 is annealed and a CMP process is performed so as to remove the oxide layer 96. The resulting structure is illustrated in FIG. 29. As can be seen from the left part of FIG. 29, illustrating a cross-sectional view of the array portion, the polysilicon material 93 of the bit line contact plug 95 now is uncovered.

Figure 30:
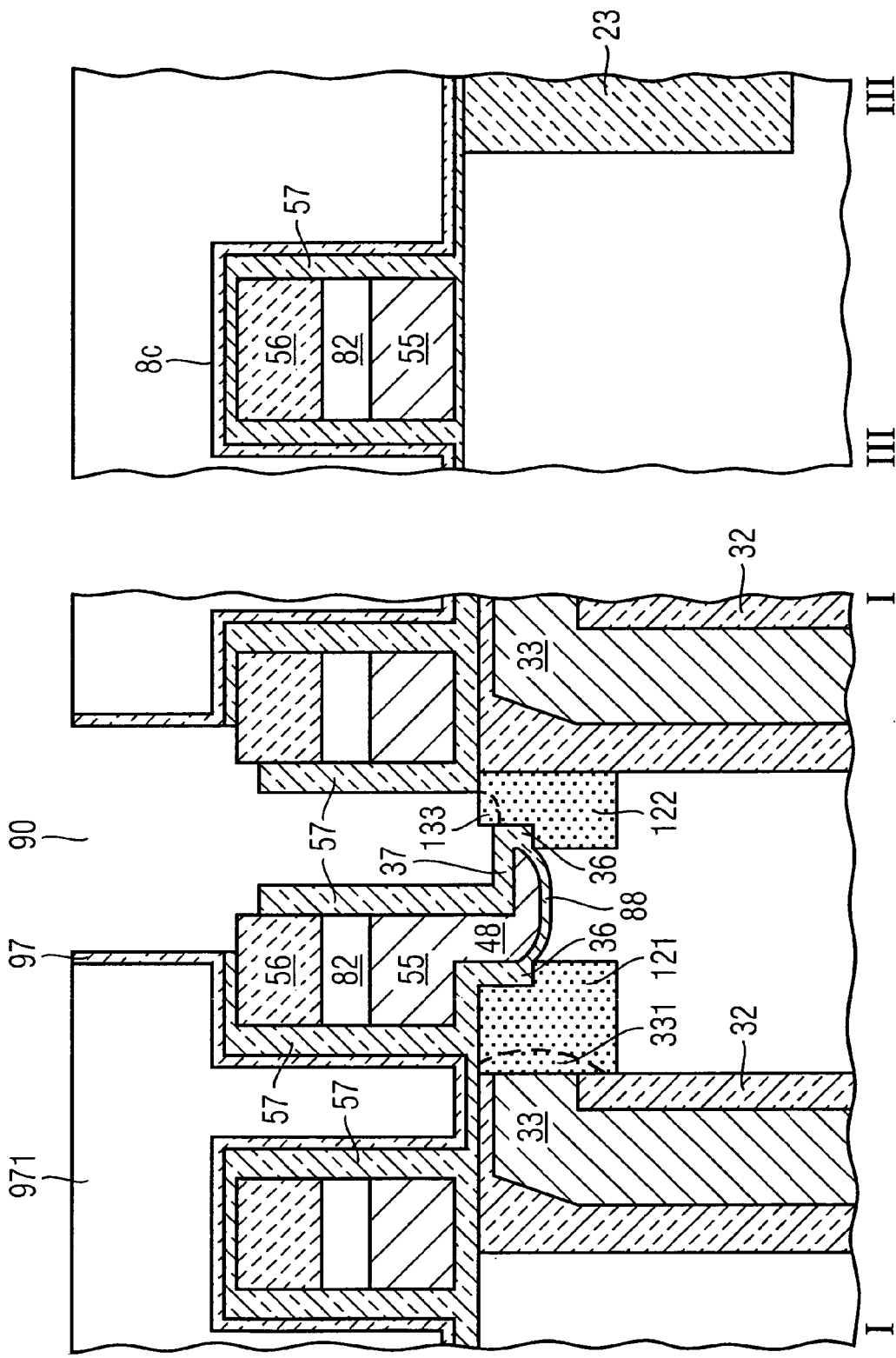

The polysilicon material 93 is removed by a conventional etching process. Thereafter, the spacer oxide 96 which has been directly adjacent to the bit line contact plug 95 is etched. As a consequence, a bit line contact opening 90 is formed in the surface. Thereafter, an ion implantation process can be performed so as to provide a doped pocket 133 forming part of the second source/drain region. The resulting structure is illustrated in FIG. 30. As can be seen, the bit line contact opening 90 is in contact with the second source/drain region 122.

Figure 31:
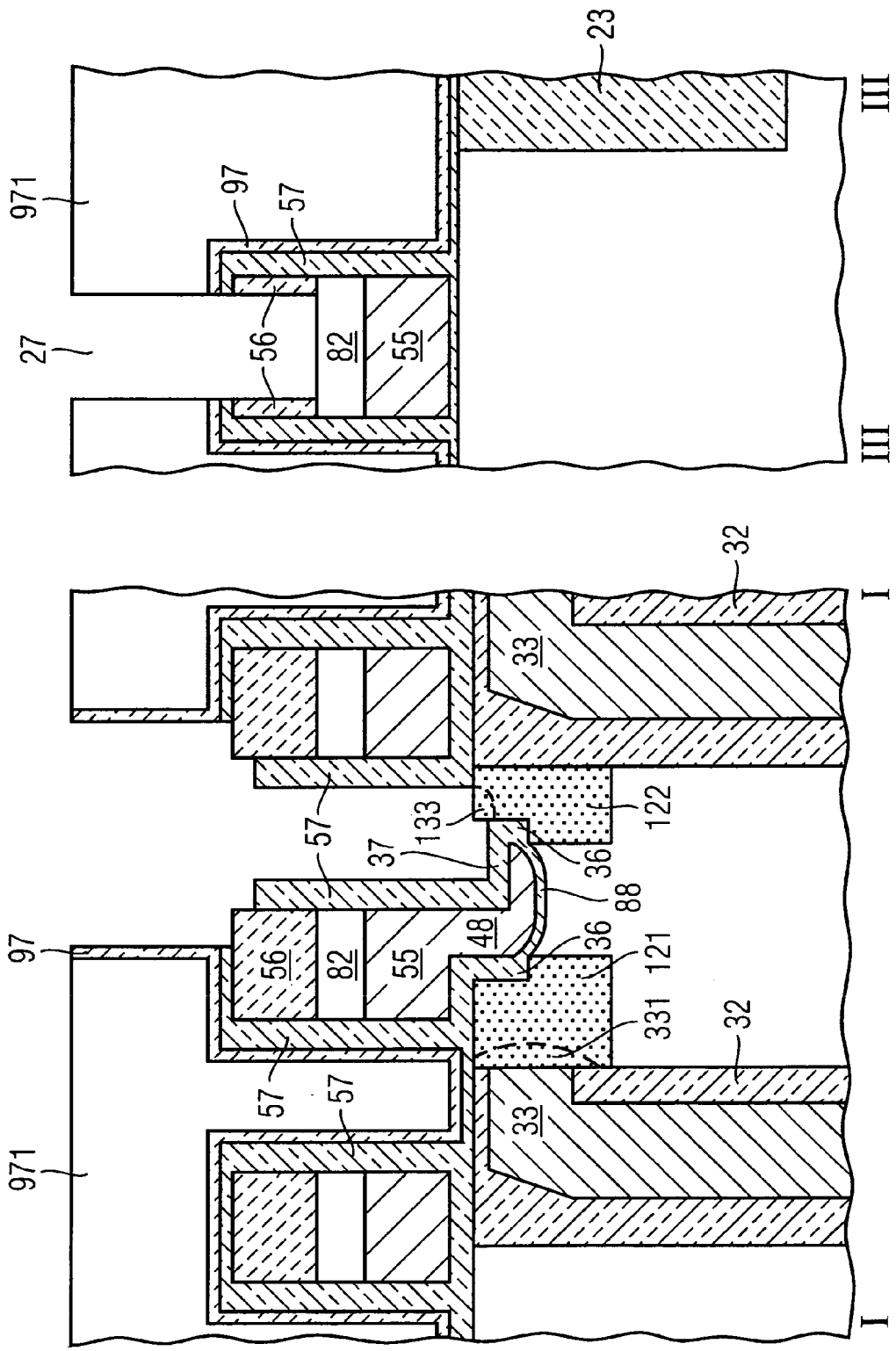

An opening 27 is formed in the peripheral portion so as to contact the peripheral gate electrode 8c. This peripheral gate electrode contact opening 27 is formed by conventional methods, i.e., by photolithographically defining the corresponding opening. The resulting structure is illustrated in FIG. 31.

Figure 32:
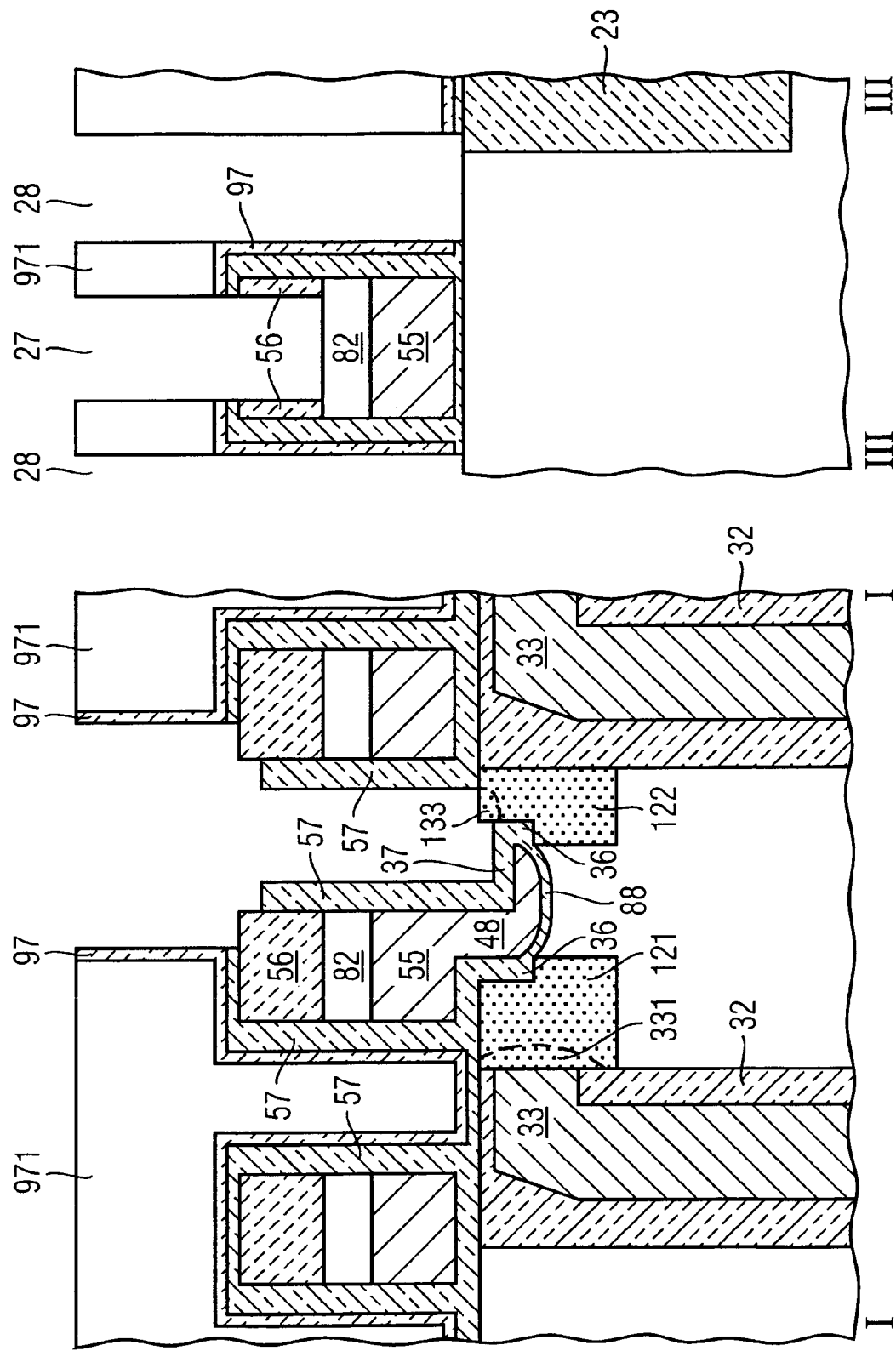

In addition, peripheral contacts 26 are formed in the peripheral portion by photolithographically patterning and etching the openings 28. In particular, the openings 27 and 28 can be simultaneously formed by one common etching process. In addition, implantation processes for reducing the contact resistance are performed. The resulting structure is illustrated in FIG. 32. As can be seen, in the peripheral portion a peripheral gate electrode opening 72 and peripheral contact openings 28 have been formed.

For completing the contacts, the electric conductive material is filled in the patterned openings 27, 28 and 90. In particular, a Ti layer 98 and a TiN layer 981 are formed, for example, by sputtering. Thereafter, a tungsten layer 99 is deposited, for example by a MOCVD (metal organic chemical vapour deposition) or a sputter method. Thereafter, a CMP (chemical mechanical polishing) process is performed.

Then, bitlines 9 are formed by a commonly known method.

Figure 33:
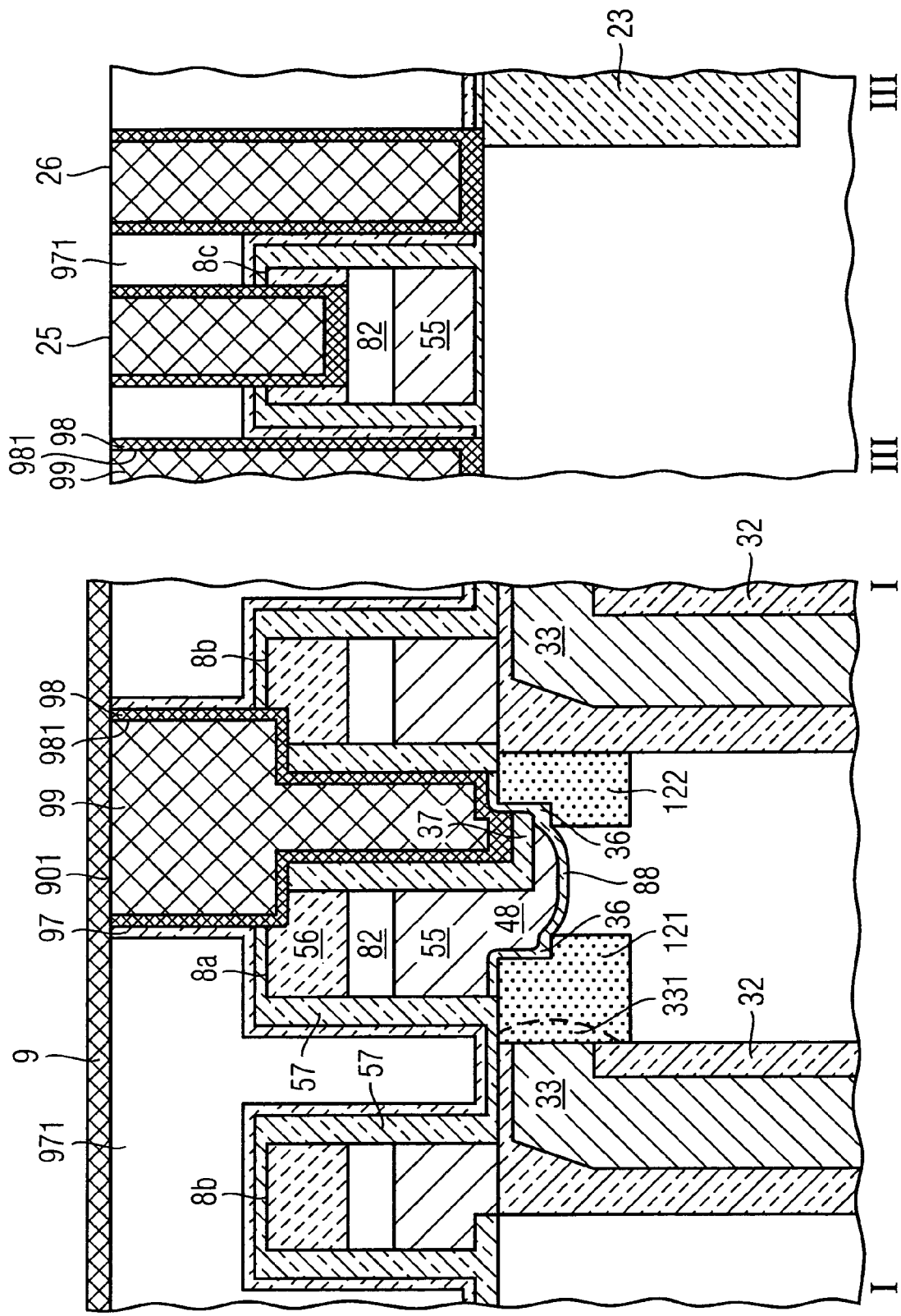

The resulting structure is illustrated in FIG. 33. As can be seen, now a memory cell is formed comprising a storage capacitor 3, which is connected with the first source/drain region 121 of the transistor. The transistor further includes a second source/drain region 122 and a gate electrode 48 which is insulated from the channel by a gate dielectric layer 88. The gate electrode 48 is connected with the corresponding word line 8a comprising a polysilicon layer 55 and a tungsten layer 82. The gate electrode 48 is insulated from the first and second source/drain regions 121, 122 by the silicon dioxide spacer 36 and the gate dielectric layer 88, so that an electrical field of the gate electrode can be reduced. The second source/drain region 122 is connected with a bit line 9 via a bit line contact 901. As can be taken from FIG. 33, even a misalignment of the bit line contact 95 with respect to the word lines 8a, 8b will not cause an unwanted short. The bit lines 9 extend in a direction which is perpendicular with respect to the direction of the word lines 8a, 8b.

On the right hand part of FIG. 33, in addition, the peripheral portion is illustrated, the gate electrode 8c of the peripheral portion being connected via a peripheral gate electrode contact 25 and peripheral contacts 26 being provided. In the array portion, the first and second source/drain portions 121 and 122 extend to a larger depth then the gate electrode 48. As a consequence, the channel connecting the first and second source/drain regions mainly has horizontal components with respect to a substrate surface. In a cross-sectional view which is taken perpendicularly with respect to the depicted cross-section the active area is enclosed at three sides thereof by the gate electrode 48. In particular, the fin region in which the active are has the shape of a ridge, is thinned so that during the operation of the array transistor, the channel can be fully depleted.

The second embodiment refers to a method of manufacturing a memory device wherein part of the array portion and part of the peripheral portion are processed by the same process. The first hard mask layer stack for forming the gate electrodes includes a first polysilicon layer, a silicon dioxide layer and optionally a second hard mask layer. The second hard mask layer stack includes a carbon layer.

According to the second embodiment of the present invention, the first polysilicon layer covering the array portion also acts as a mask for masking the peripheral portion during the manufacture of transistors in the array portion. The array transistor is formed as a recessed channel transistor in which the plate-like portions of the gate electrode extend deeper into the substrate than the groove region of the gate electrode, the difference of depth not being large. After completing the array transistor, the first polysilicon layer is removed from the peripheral portion and the peripheral portion of the memory device is completed.

In the next Figures, cross-sectional views of the array portion and of the peripheral portion are illustrated. In these views, the isolation trenches 2 in the array portion extend to a deeper depth than the isolation trenches 23 in the peripheral portion. However, as is clearly to be understood, the isolation trenches 2 in the array portion can extend to any suitable depth in comparison with the isolation trenches 23 in the peripheral portion. In particular, usually, the isolation trenches 2 in the array portion extend to the same depth as the isolation trenches 23 in the peripheral portion.

For implementing the second embodiment of the present invention, starting from the structure which is illustrated in FIG. 3, for example, first, a sacrificial oxide layer 24 is grown on the whole substrate surface. Thereafter, lithographic processes for defining the portions to be doped are performed. Next, the well implants are performed as is usual.

Figure 34:
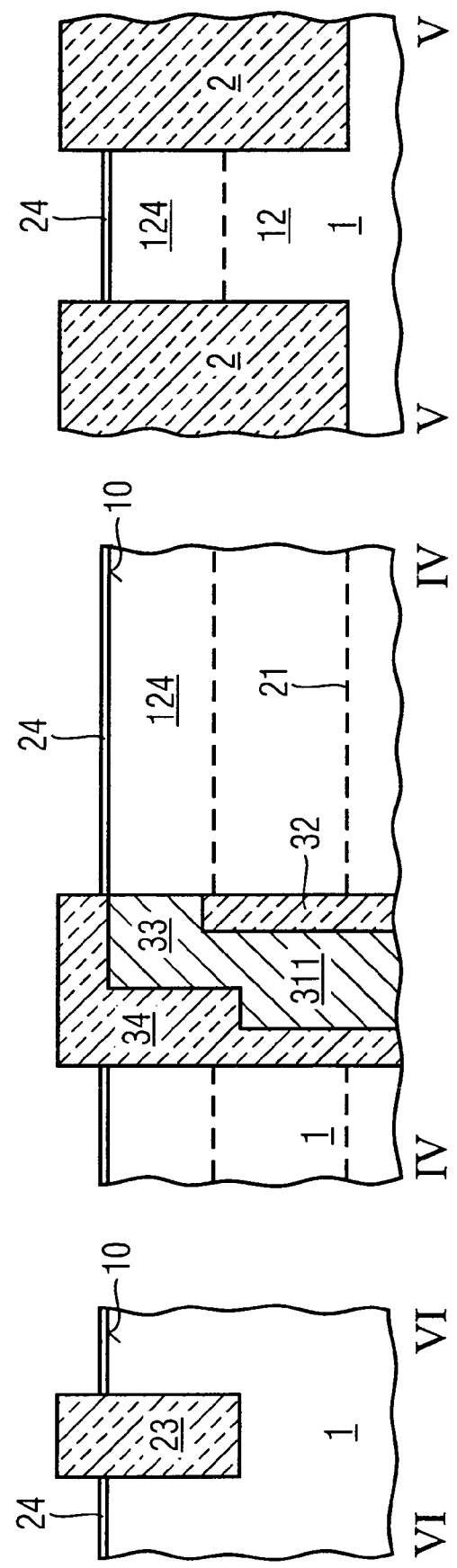

Thereafter, an ion implantation process is performed so as to provide the doped portions 124, which will form the first and second source/drain regions of the completed transistor. During this implantation process, the peripheral portion is masked by the photoresist layer. After this process, the photoresist material is removed from the peripheral portion. FIG. 34 illustrates the cross-sectional view of the resulting structure.

In particular, the cross-sectional view between IV and IV illustrates a view parallel to the direction of the active areas 12, as can as well be taken from FIG. 3A. In addition, the right hand portion of FIG. 34 illustrates the cross-sectional view between V and V which is taken perpendicularly with respect to the direction of the active areas, as can as well be taken from FIG. 3A. Moreover, the cross-sectional view between VI and VI illustrates a cross-sectional view of the peripheral portion, as can be taken from FIG. 1. As can be seen from FIG. 34, a doped substrate portion 124 is provided at the substrate surface 10 in the array portion, whereas in the peripheral portion no doped region is provided.

In addition, as can be taken from FIG. 34, the isolation trenches 2 in the array portion extend to a predetermined depth, the bottom portion of the isolation trenches being indicated by the broken line 21 in the cross-sectional view between IV and IV.

A polysilicon liner 200 is deposited by generally known methods, the polysilicon liner having a thickness of approximately 20 to 60 nm.

Figure 35:
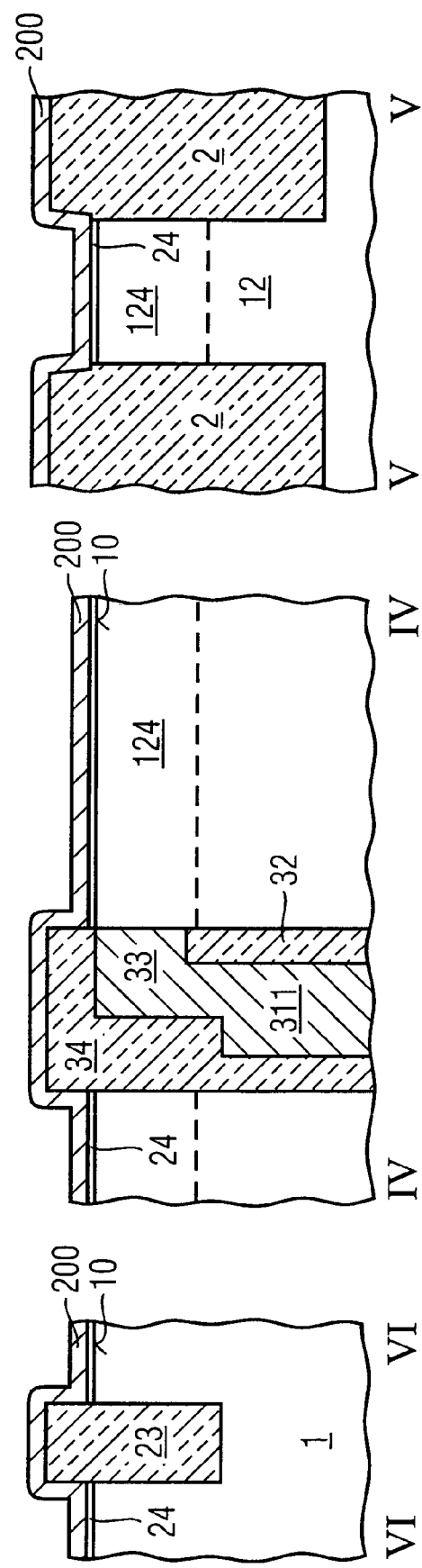

The resulting structure is illustrated in FIG. 35. As can be seen from FIG. 35, the whole substrate surface now is covered by the polysilicon liner 200.

Figure 36:
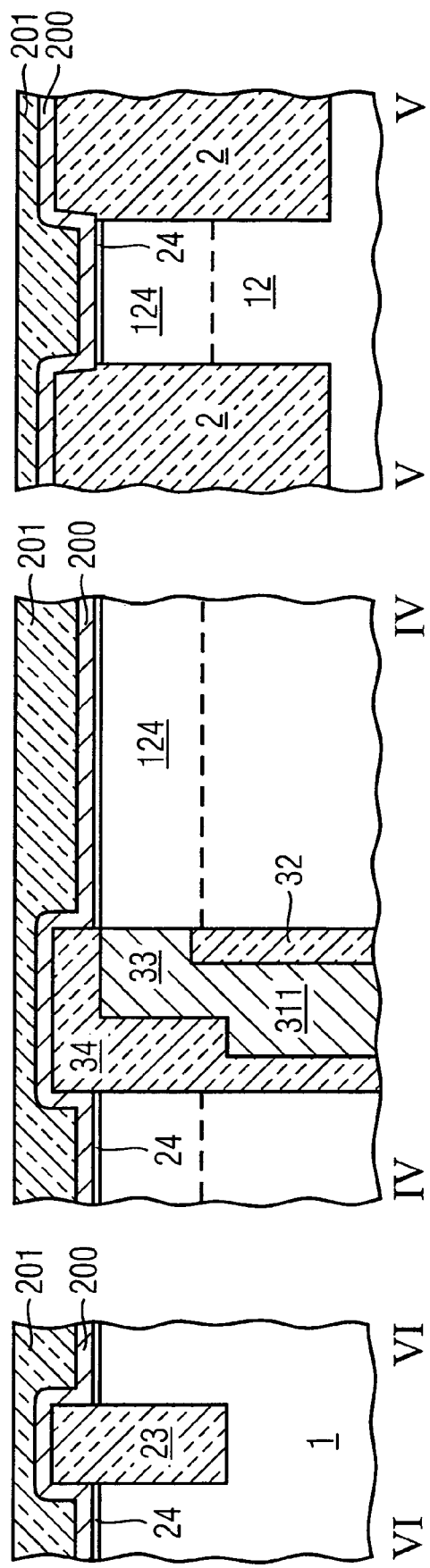
Figure 37:
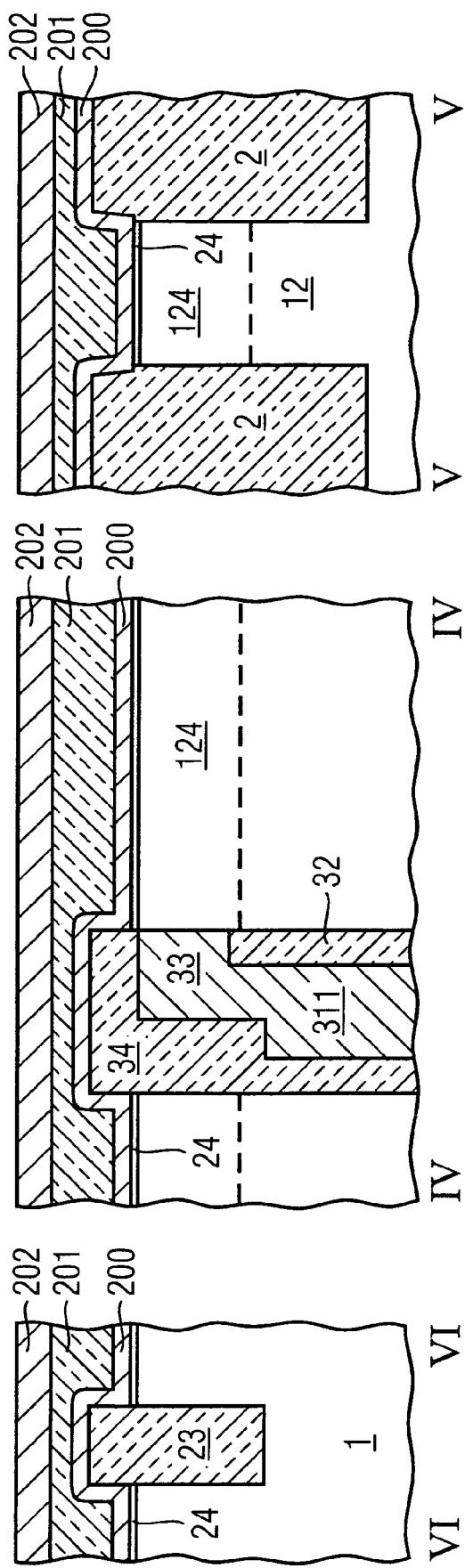

A silicon dioxide layer 201 is deposited by a generally known method. In particular, the silicon dioxide layer 201 has a thickness of approximately 100 nm resulting in a planar substrate surface. The resulting structure is illustrated in FIG. 36. Thereafter, as can be seen from FIG. 37, a polysilicon layer 202 having a thickness of approximately 60 to 120 nm is provided by a general known method so as to cover the whole substrate surface.

First a carbon hard mask layer 203 having a thickness of approximately 150 to 300 nm is deposited by generally known methods over the whole substrate surface, followed by a SiON layer 204 having a thickness of approximately 50 to 100 nm.

Figure 38:
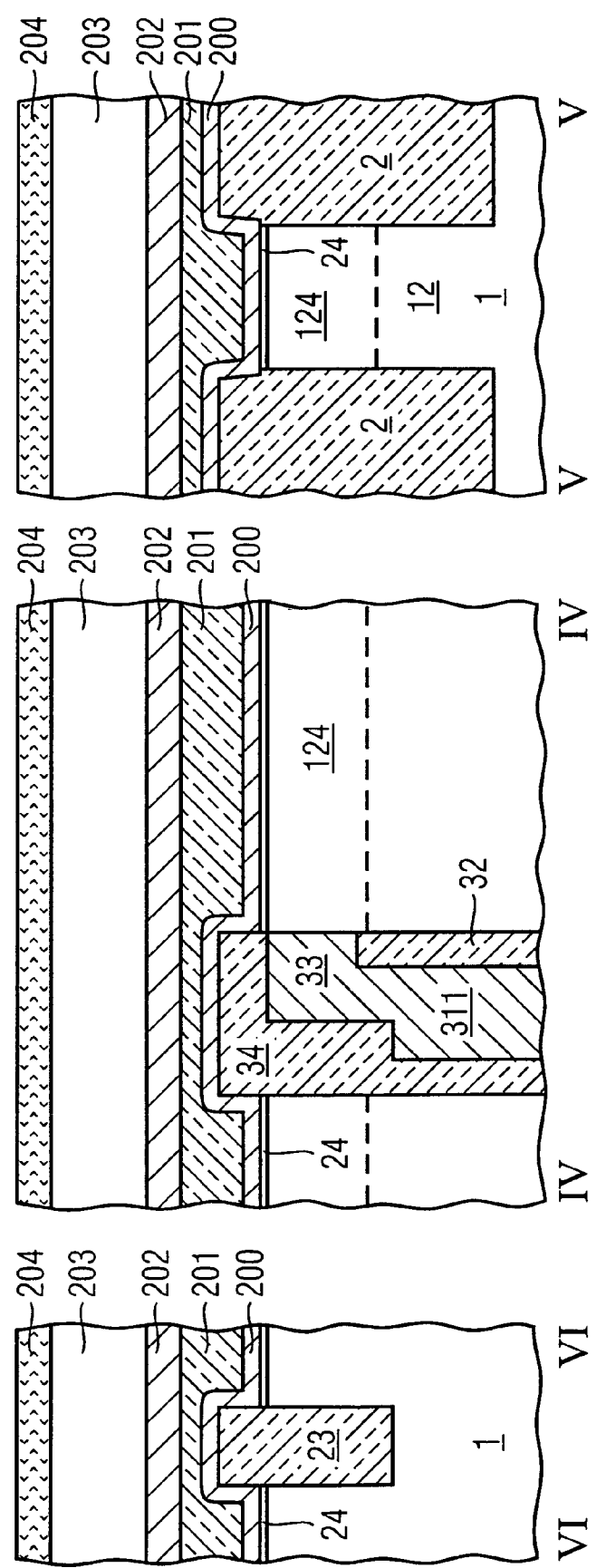

The resulting structure is illustrated in FIG. 38.

Figure 39:
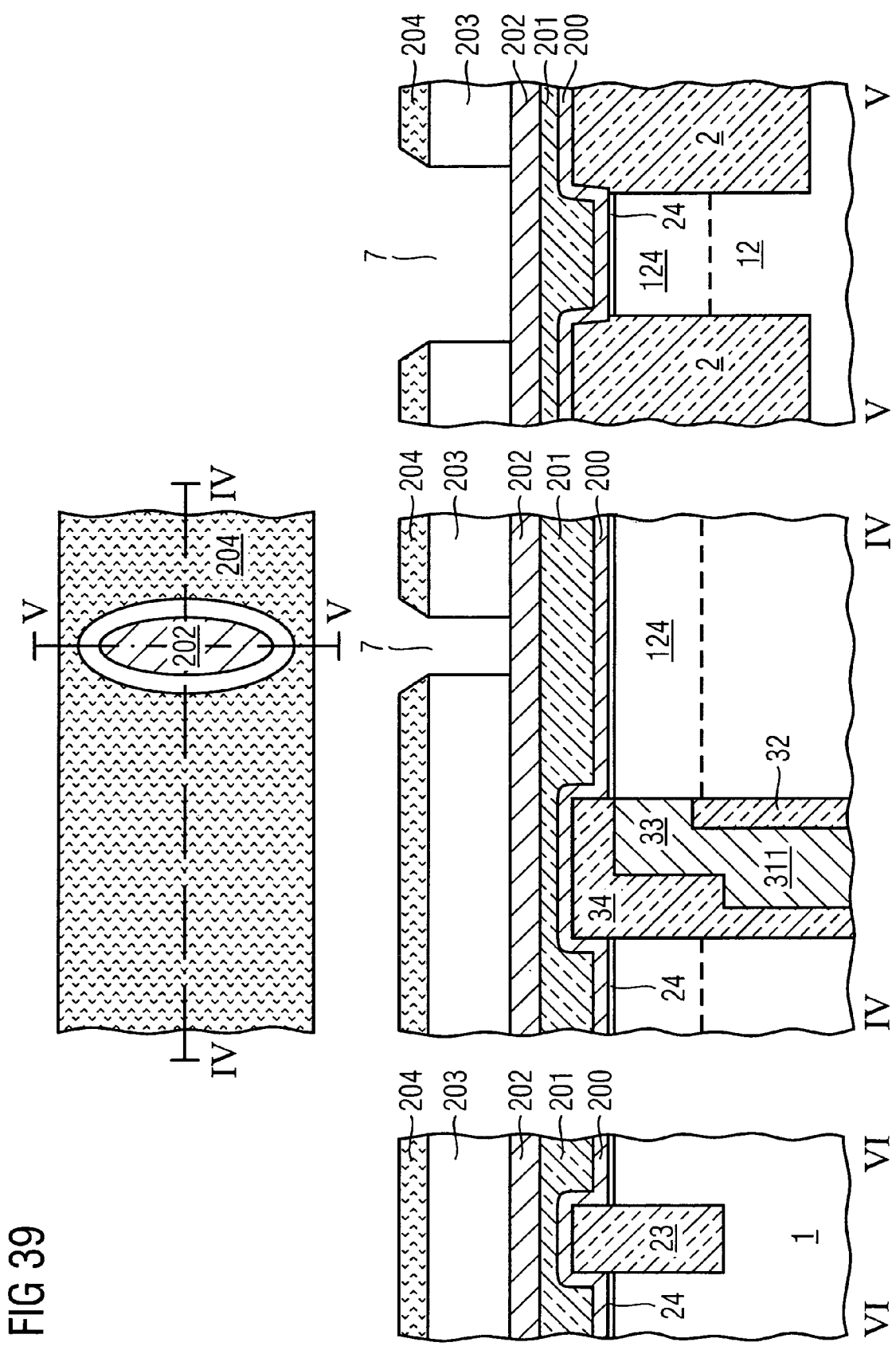

Openings are formed in the SiON layer 204 and the carbon hard mask 203. As can be taken from the upper portion of FIG. 39 showing a plan view of the resulting structure, the openings to be formed have an oval shape having two different diameters in a direction parallel to the active area direction and in the direction perpendicular thereto. Preferably, first a tapered etching process is performed so as to etch the SiON layer 204, followed by an etching process for etching the carbon hard mask layer 203, this etching process not being tapered.

The resulting structure is illustrated in FIG. 39. As can be seen from the cross-sectional view between IV and IV, the opening 7 is formed in the carbon hard mask layer 203 and the SiON layer 204. The opening 7 has a smaller diameter in the cross-sectional view between IV and IV than in the cross-sectional view between V and V. The diameter of the opening 7 between V and V is larger than the width of the active area 12. In addition, the peripheral portion is not affected by this etching process.

Figure 40:
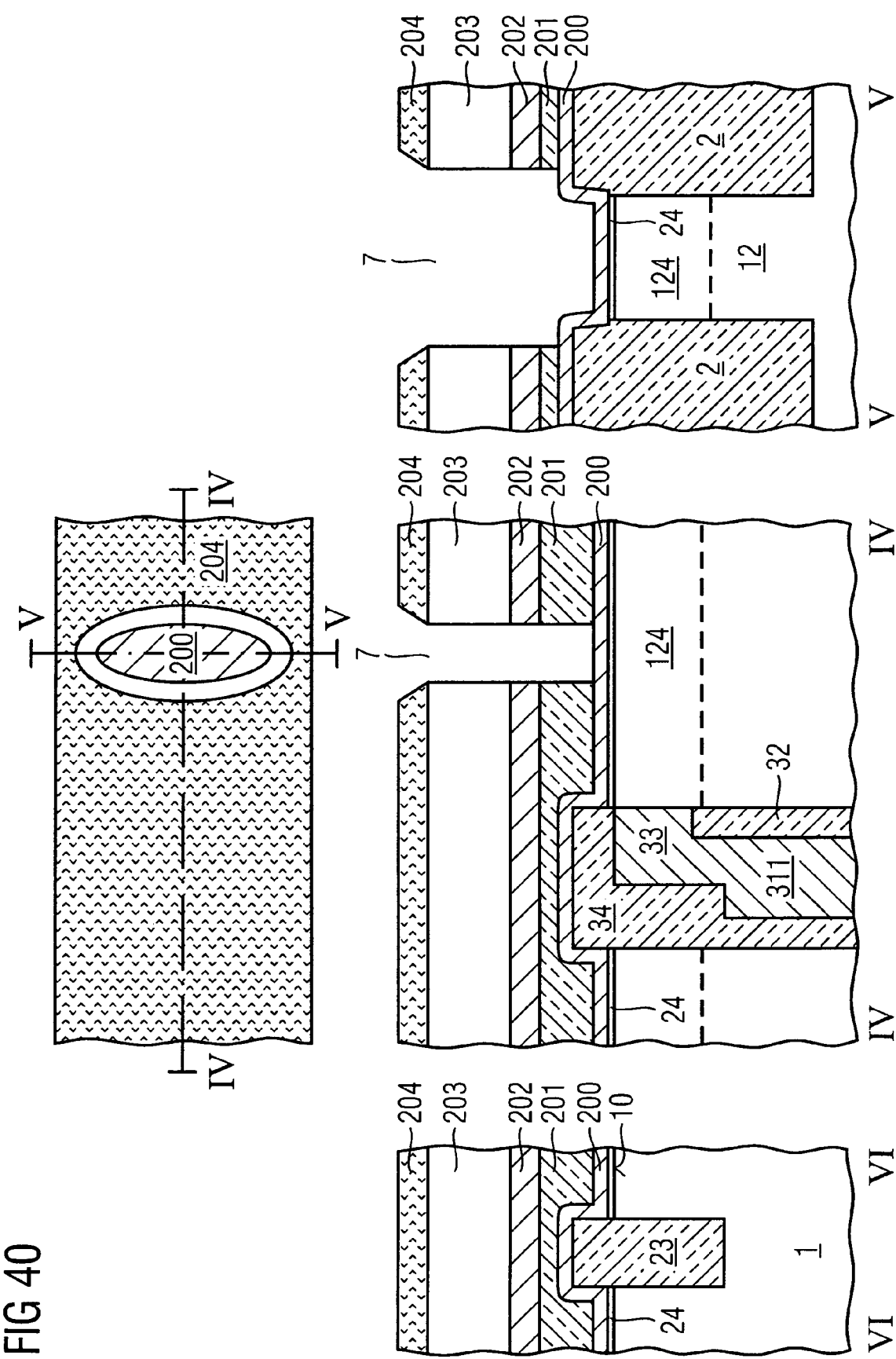

The polysilicon hard mask layer 202 is etched, followed by an etching process for etching silicon dioxide. The resulting structure is illustrated in FIG. 40. As can be seen, in the cross-sectional view between IV and IV, the opening 7 is etched, stopping on the polysilicon layer 200. In addition, in the cross-sectional view between V and V, the opening 7 is etched stopping on the polysilicon layer 200 whereas the peripheral portion is not affected.

Figure 41:
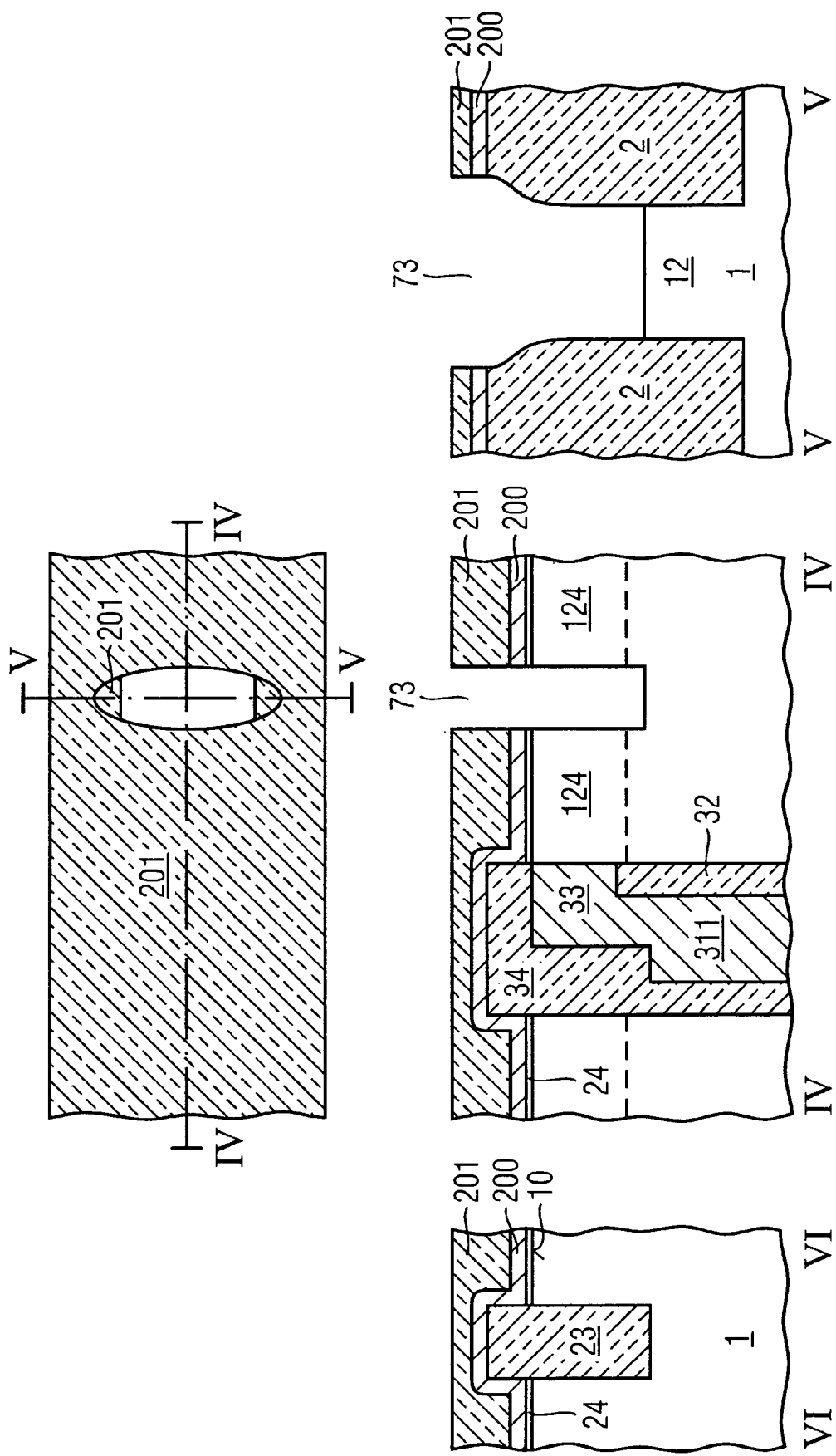

The SiON layer 204, the carbon hard mask layer 203 and the polysilicon layer 202 are removed, leaving the structure covered with the silicon dioxide layer 201. Thereafter, an etching process for etching polysilicon is performed, followed by a short silicon dioxide, breakthrough etching process. By this etching process the silicon dioxide layer 24 is opened. Thereafter, an etching process of etching silicon is performed, resulting in a silicon groove 73 which is formed in the silicon substrate material. The resulting structure is illustrated in FIG. 41.

As can be seen, the silicon groove 73 extends to a depth so that the bottom side of the groove 73 is disposed beneath the bottom side of the doped portion 124. As can be taken from the cross-sectional view between VI and VI, the SiON, carbon and polysilicon hard mask layers 204, 203, 202 are also removed from the peripheral portion. As can be taken from the plan view which is illustrated in the upper portion of FIG. 41, the resulting surface is covered with silicon dioxide, wherein the portion of the active area 12 which is opened by the silicon groove 73 is uncovered.

Figure 42:
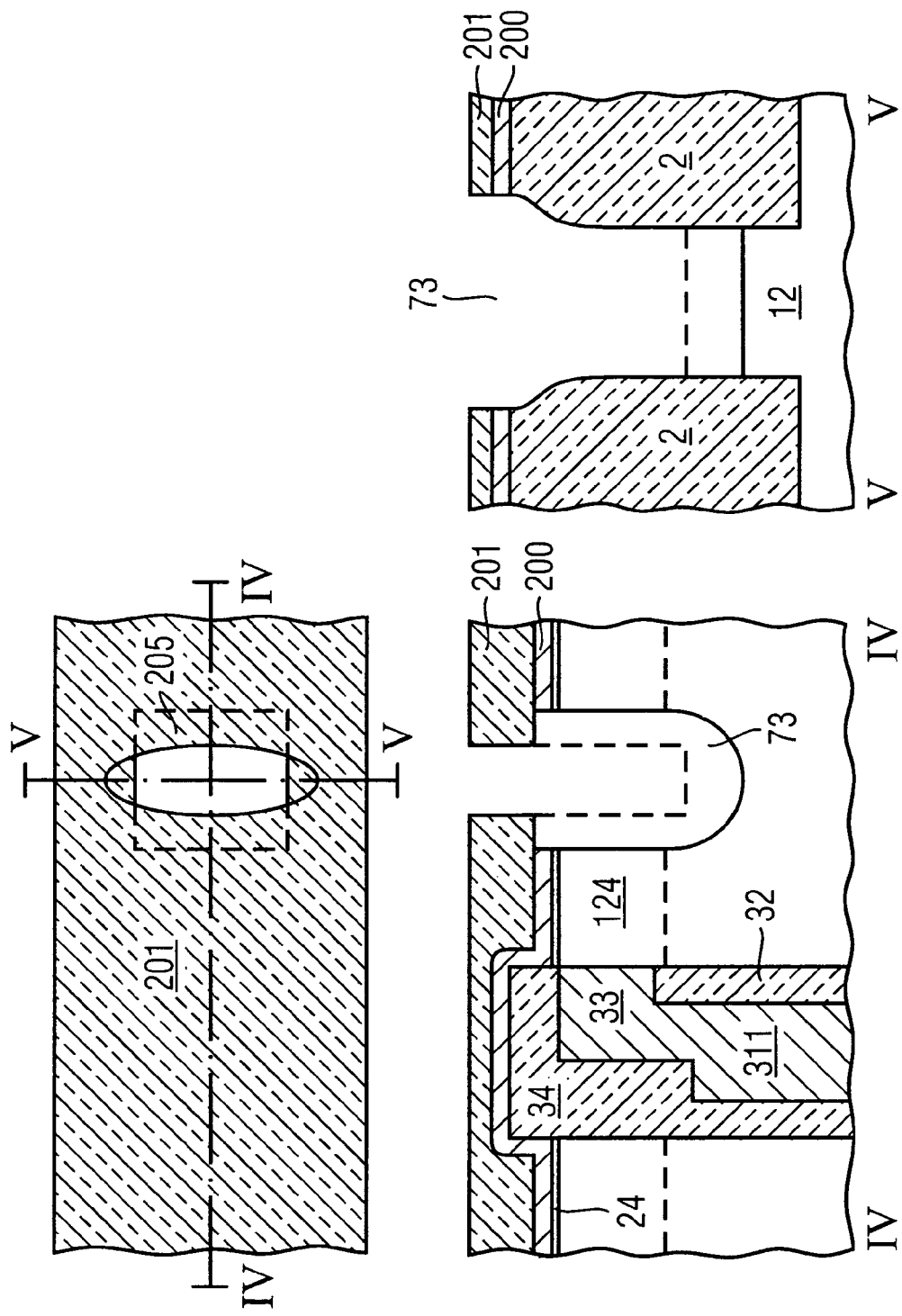

Thereafter, an isotropic silicon-etching process is performed so as to laterally remove 10 to 20 nm silicon material. As a consequence, in the cross-sectional view between IV and IV of FIG. 42, the silicon groove 73 is widened, whereas the groove 73 is deepened in the cross-section view between V and V. The position of the silicon groove before this etching process is indicated by the broken lines. At the top portion of the silicon groove 73, the silicon dioxide layer 301 laterally projects from the side walls of the groove. The resulting plan view is illustrated in the upper portion of FIG. 42. A bottle structure 205 is formed.

Optionally, an additional sacrificial silicon dioxide layer is formed. Thereafter, an isotropic etching process in HF (hydrofluoric acid) is performed. As a consequence, the bottle structure is removed, and pockets 74 are formed in the isolation trenches 2. In particular, the pockets 74 extend deeper in the isolation trenches than the silicon groove 73. Nevertheless, the difference between the depth of the pocket structures 74 and the silicon groove 73 is only small. In particular, this etching process is performed so as to etch about 10 to 20 nm, depending on the minimal structural feature size F of the technology used.

Figure 43:
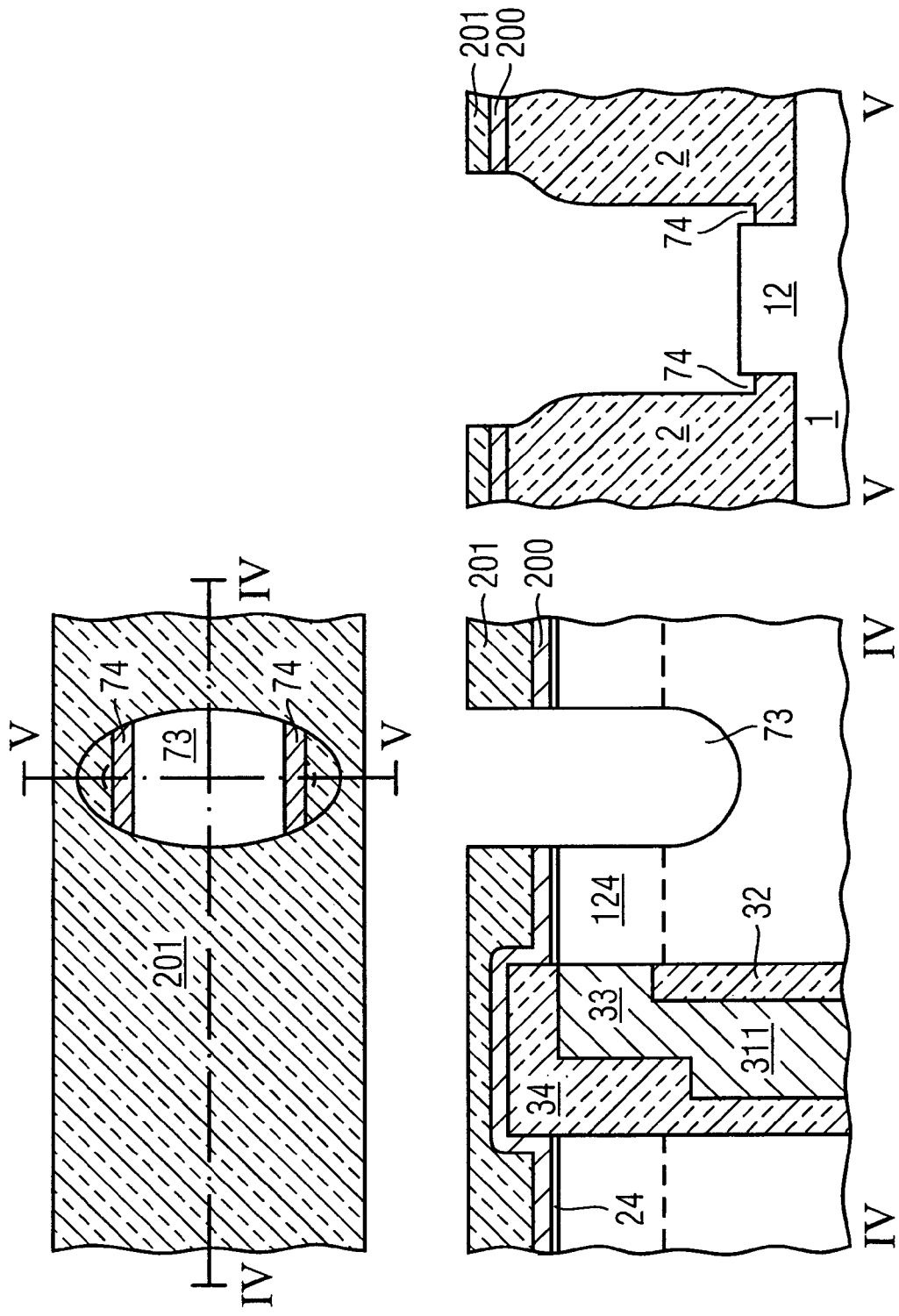

The resulting structure is illustrated in FIG. 43. As can be seen from the cross-sectional view between IV and IV, the bottle structure 205 now is removed in this cross-sectional view. In addition, as can be seen from the cross-sectional view between V and V, pocket structures 74 are formed. The pocket structures 74 only slightly project with respect to the surface of the active area 12. The plan view on the resulting structure is illustrated in the upper portion of FIG. 43.

An oxidation process is performed so as to provide a gate dielectric layer 88. The gate dielectric layer 88 has a thickness of 2 to 6 nm, depending on the technology used.

The resulting structure is illustrated in FIG. 44, wherein the upper portion of FIG. 44 illustrates a plan view, whereas the lower portion of FIG. 44 illustrates the respective cross-sectional views. As can be taken from the cross-sectional views between IV and IV and between V and V, the surface of the gate groove 73 now is covered with the gate dielectric layer 88.

A polysilicon layer 206 is deposited, followed by an optional CMP process for planarizing the surface and an isotropic etching process for etching the polysilicon layer. As a result, the lower portion of the silicon groove 73 is filled with the polysilicon material 206 as can also be taken from FIG. 45.

Thereafter, a silicon dioxide spacer 36 is formed in the upper portion of the silicon groove 73. In particular, a silicon dioxide layer is deposited by generally known methods, followed by an anisotropic etching process for removing the horizontal portions of the deposited silicon dioxide layer. As a result, the silicon dioxide spacer 36 is formed. FIG. 46 illustrates the resulting structure. In particular, the upper portion of FIG. 46 illustrates a plan view on the resulting structure, whereas the lower portion of FIG. 46 illustrates the corresponding cross-sectional views. In particular, the silicon dioxide spacer 36 is formed on the side walls of the silicon groove 73 in the upper portion thereof.

Figure 47:
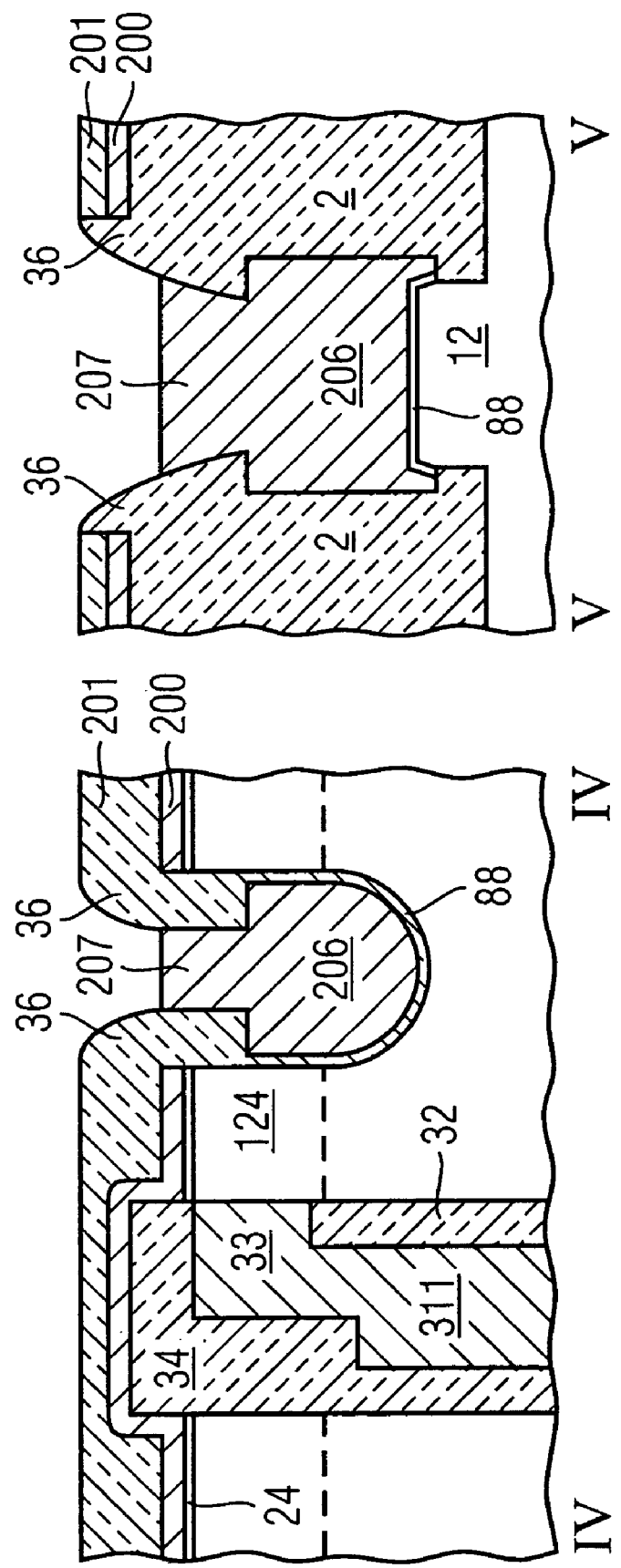

Optionally, the recess 73 formed in the semiconductor substrate is filled by a further polysilicon filling 207 and an etching process for partially etching this additional filling 207 is performed. The resulting structure after this optional process is illustrated in FIG. 47. As can be seen from the cross-sectional view between IV and IV which is taken parallel to the direction of the active area, the height of the surface of the additional polysilicon filling 207 approximately corresponds to the upper edge of the polysilicon liner 200.

An anisotropic etching process for removing the $SiO_2$ layer is performed. As a consequence, the $SiO_2$ layer 201 is horizontally etched. The resulting structure is illustrated in FIG. 48. As can be seen, in the cross-sectional view between VI and VI of the peripheral portion, the oxide spacer 2010 can be formed adjacent to the peripheral isolation trench 23. In the array portion, the silicon dioxide layer 201 is completely removed leaving the $SiO_2$ spacer 36 in the silicon grooves 73. The resulting plan view is illustrated in the upper portion of FIG. 48.

The array portion is covered by an etching mask. Then, the remaining portion of the silicon dioxide layer is removed and a polysilicon etching process is performed. Moreover, the sacrificial oxide layer 24 is removed. Thereafter, the resist is stripped from the array portion.

The resulting cross-sectional view of the peripheral portion is illustrated in FIG. 49. As can be taken from FIG. 49, now substrate surface in the peripheral portion is uncovered. Since during the previous process processes the array portion has been covered with a suitable resist layer, the array portion has not been affected by the described processes.

An etching process for removing the silicon dioxide layer is performed. Thereby, the silicon dioxide layer 24 is removed from the peripheral portion. Thereafter, a peripheral gate dielectric layer 29 is formed. For example, the peripheral gate dielectric layer can have a thickness of 1 nm to 6 nm, depending on the structural feature size F. By the processes of removing the peripheral silicon dioxide layer 24 and providing the gate dielectric layer 29, a gate dielectric layer 29 having less damages due to the previous process processes now is present. The resulting structure is illustrated in FIG. 50. As can be taken from the cross-sectional view between VI and VI showing the peripheral portion, the whole surface is covered by the silicon dioxide layer 29. In the array portion, as well as the silicon dioxide layer 29 is deposited, covering the whole surface as can be taken from the cross-sectional views between IV and IV as well as between V and V.

A polysilicon layer 208 having a thickness of 35 nm is deposited by generally known methods. The resulting structure is illustrated in FIG. 51.

The peripheral portion is covered with an etching mask, leaving the array portion uncovered. Thereafter, an etching process for etching the polysilicon layer 208 and an etching process for etching the silicon dioxide layer 29 from the array portion is performed. The mask covering the peripheral portion is removed. The resulting structure is illustrated in FIG. 52. As can be taken from the cross-sectional view between VI and VI, the peripheral portion is not affected by the process. In the array portion, the polysilicon layer 208 as well as the peripheral gate dielectric layer 29 are removed.

Starting from the structure illustrated in FIG. 52, the peripheral portion as well as the array portion are processed by common process processes. To be more specific, during the subsequent processes, neither the array portion nor the peripheral portion are selectively masked with a corresponding resist material so that only one of the array portion or the peripheral portion is processed.

Figure 53:
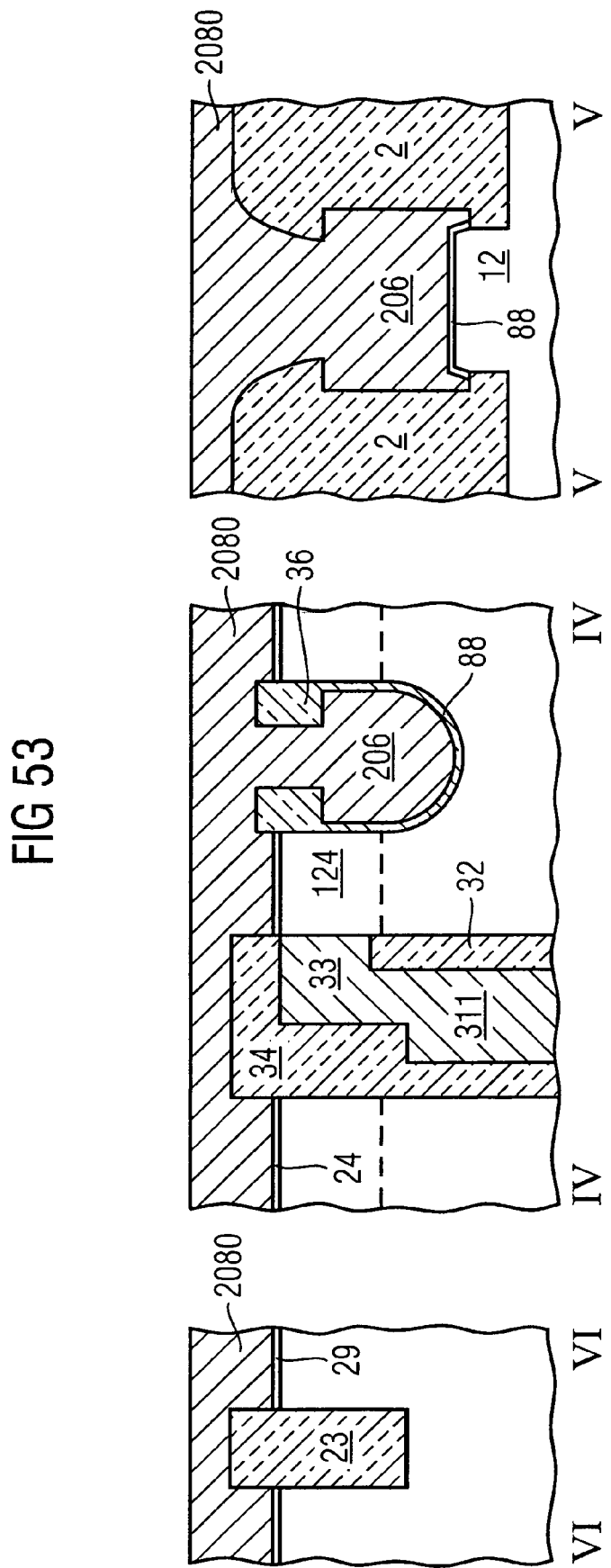

Optionally, an additional polysilicon layer 811 is deposited. The resulting structure is illustrated in FIG. 53. As can be taken from the various cross-sectional views illustrated in this Figure, the whole substrate surface now is covered by the polysilicon layer 2080.

The layers for forming the word lines and the peripheral gate electrodes are deposited. In particular, the gate electrode can be formed of WSi. In this case, a silicon layer 811, a WSi (tungsten silicide) layer 82 as well as a silicon nitride layer 81a are deposited on the whole surface. The resulting structure is illustrated in FIG. 54.

Nevertheless, as is obvious to the person skilled in the art, the layer stack for forming the word lines and the peripheral gate electrode can be formed by any other method as is generally used in the art.

Figure 59:
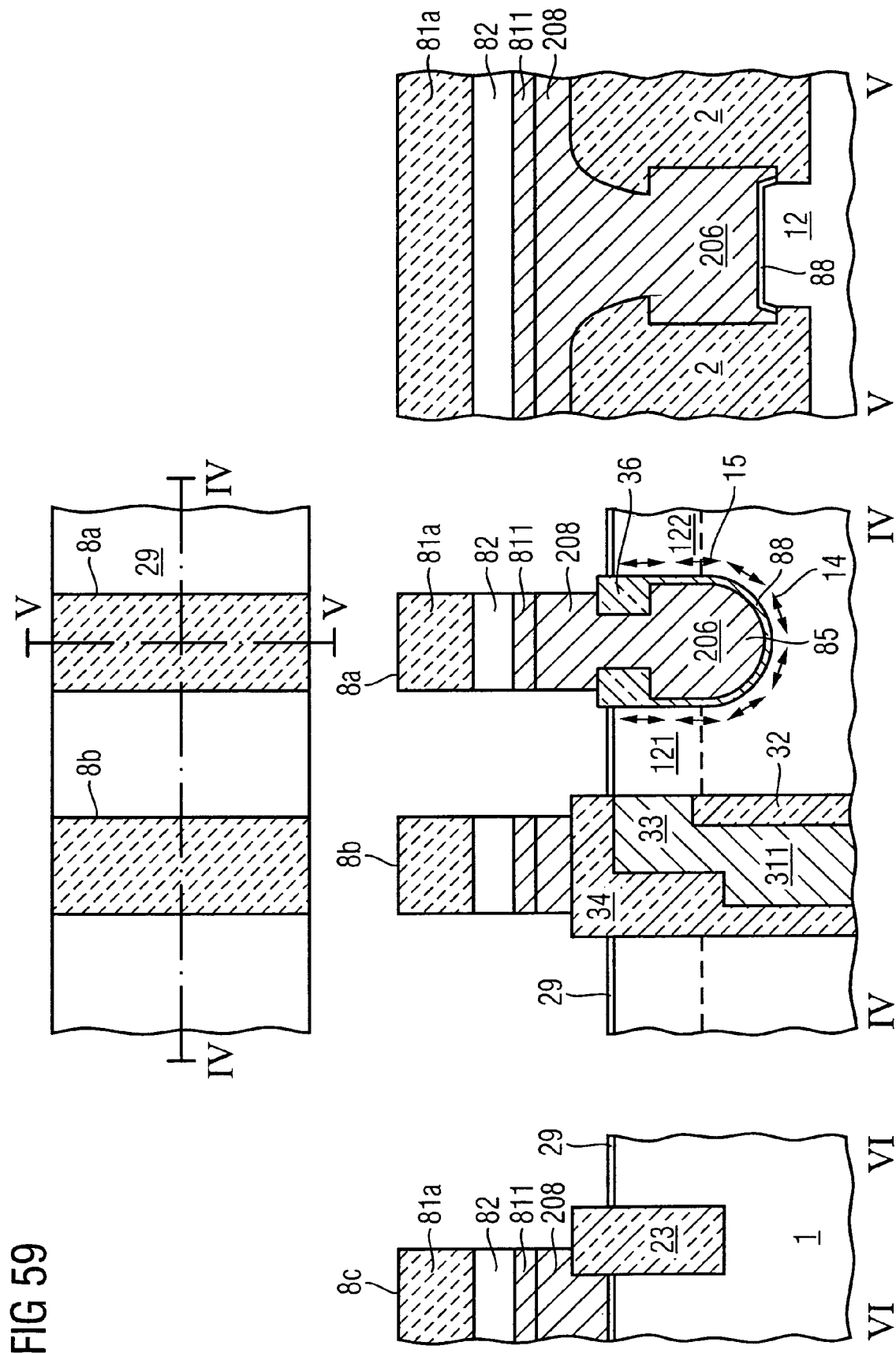
FIG. 59 illustrates views of a completed transistor which is manufactured by a method according to the second embodiment of the present invention.

Thereafter, the gate layer stack can be patterned using a mask having a lines/spacers pattern in the array portion so as to result in the structure illustrated in FIG. 59.

Figure 54:
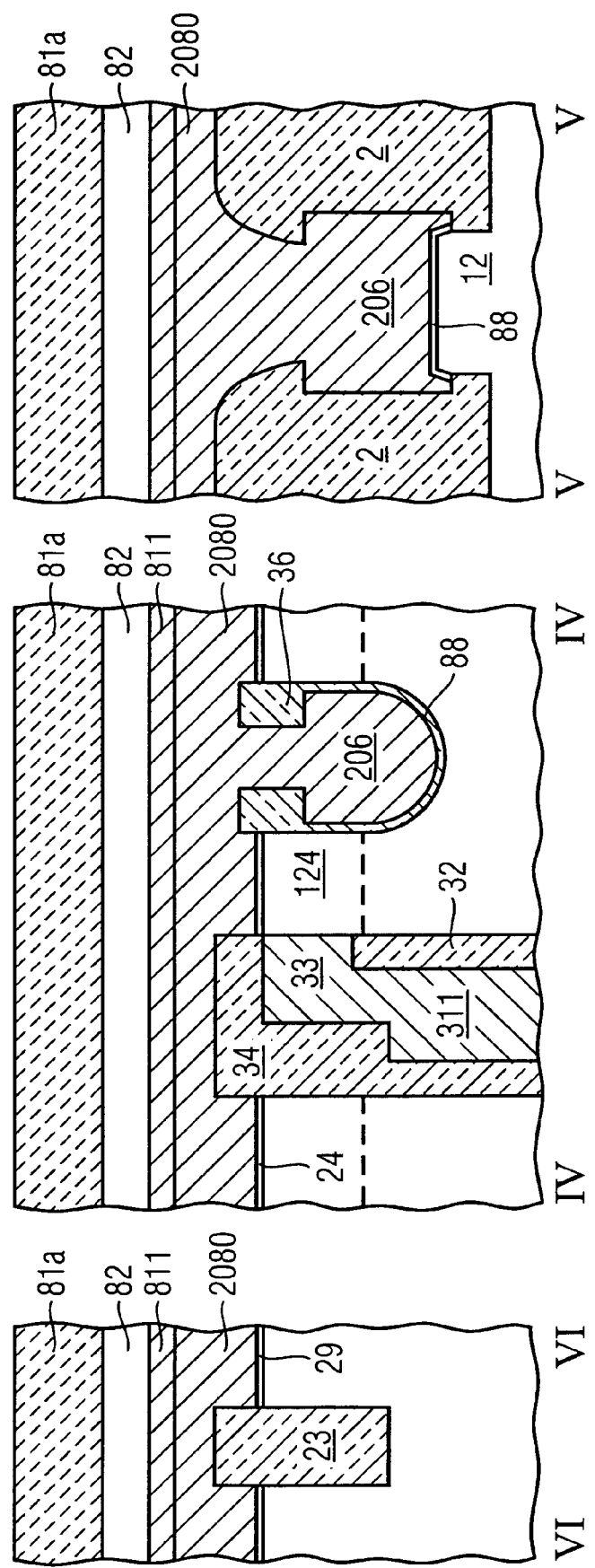

According to an alternative process flow, the structure illustrated in FIG. 54 can be obtained by a different method. According to the second embodiment of the present invention, a hard mask layer stack comprising a first polysilicon layer 200 is provided. In order to provide the required selectivity for an etching process, a sacrificial layer 24 must be provided between the substrate surface 10 and the first polysilicon layer 200. Accordingly, the process of forming a memory device can additionally be simplified, if the sacrificial oxide layer 24 and the polysilicon layer 200 form the peripheral gate dielectric layer and part of the layer stack for forming the peripheral gate electrode. Nevertheless, in this modification, special care has to be taken that the gate dielectric layer 29 and the first polysilicon layer 200 are not affected by the process processes for forming the transistor in the array portion.

Figure 55:
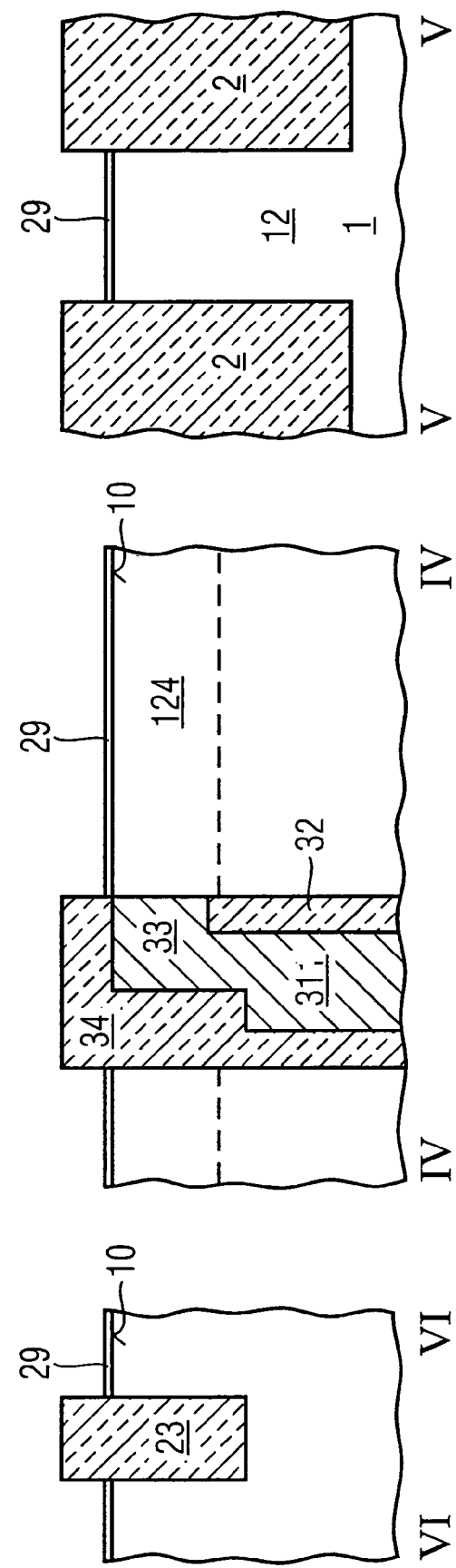
FIGS. 55 to 58 illustrate a process of a modification of the second embodiment.

According to the alternative process flow, starting from the structure illustrated in FIG. 3, the well implantation processes for defining the wells in the array portion are performed as has been described above. In addition, an ion implantation process for providing the doped portion 124 which will later define the first and second source/drain regions is performed. Thereafter, the resist material is removed from the whole surface. Then, a silicon dioxide layer 29 acting as a peripheral gate dielectric 29 is deposited. The resulting structure is illustrated in FIG. 55. As can be seen from FIG. 55, the whole surface now is covered with the silicon dioxide layer 29.

Figure 56:
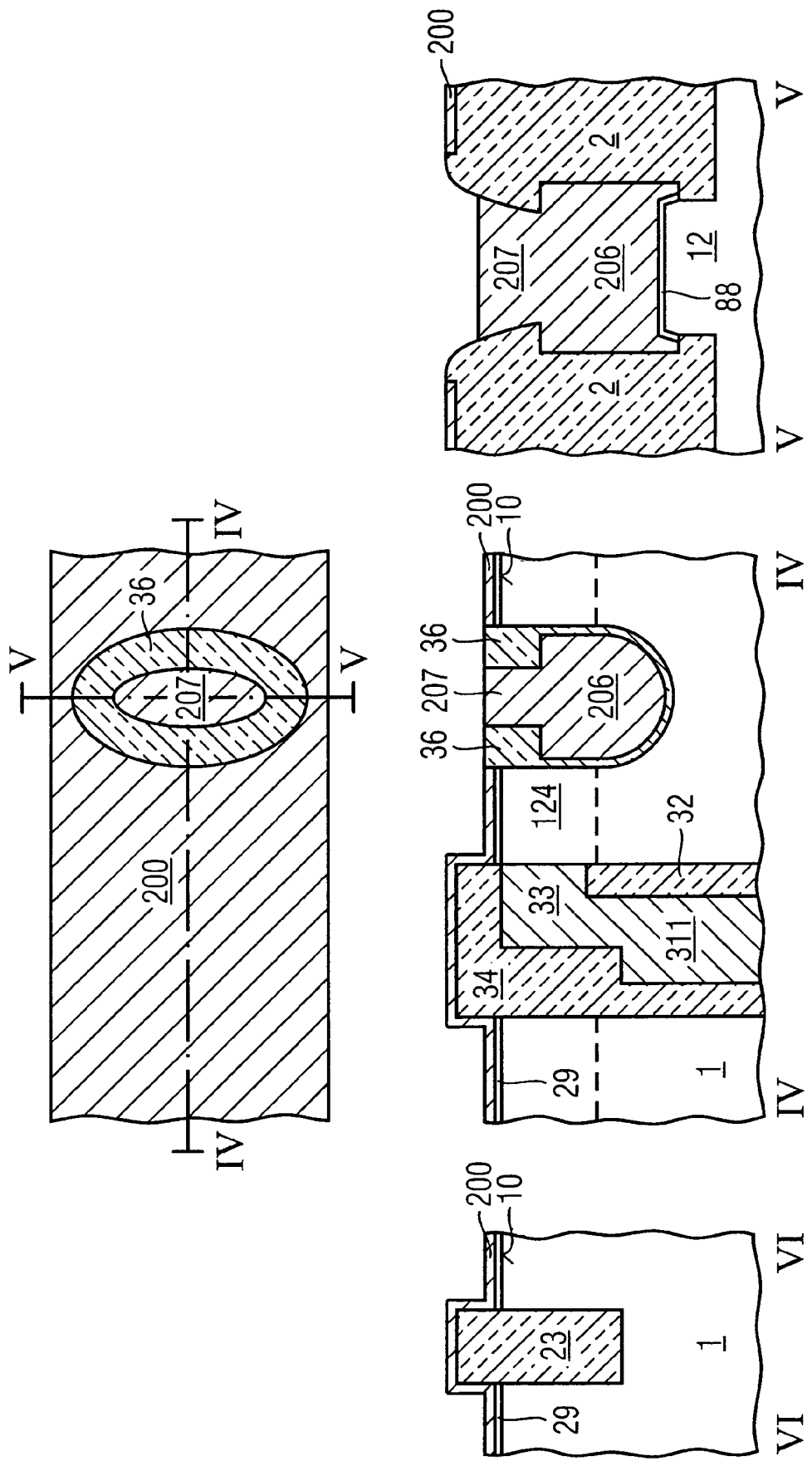
Figure 57:
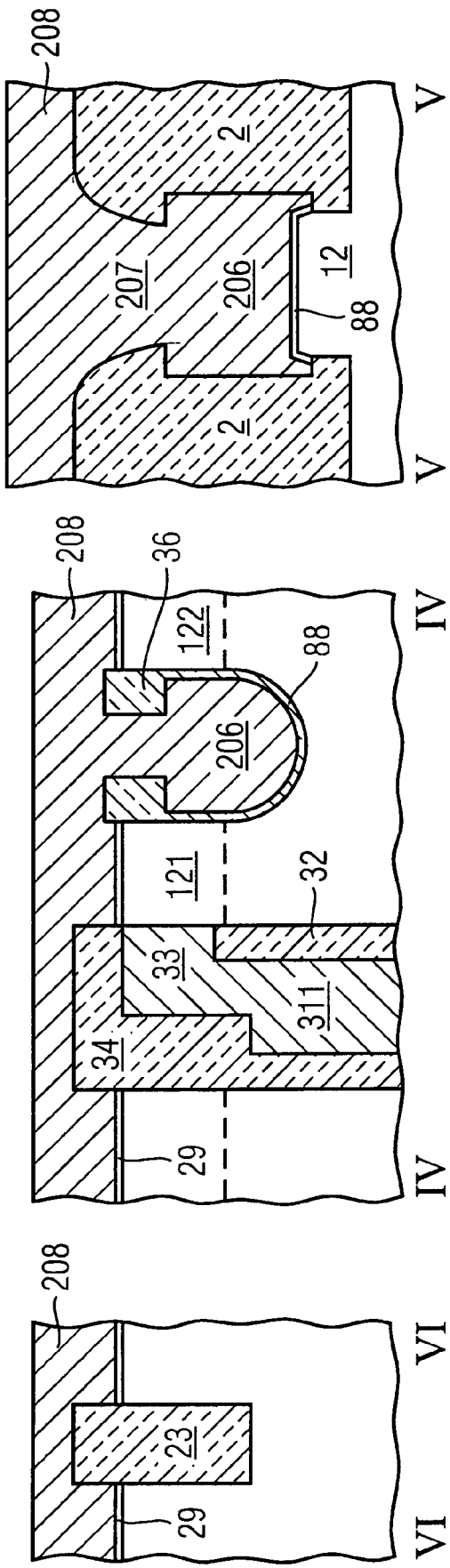

Thereafter, the process processes which have been described with reference to FIGS. 35 to 48 are performed. The resulting structure is illustrated in FIG. 56. As can be seen from FIG. 56, the whole surface now is covered with the polysilicon layer 200. In the gate grooves 73, the polysilicon material 206, 207 is filled, the upper portion of the gate electrode being insulated from the doped portion 124 by a silicon dioxide spacer 36. In the array portion, the polysilicon liner 200 is formed above the peripheral gate dielectric layer 29. Optionally, the array portion can be covered with a suitable mask, leaving the peripheral portion uncovered. Thereafter, an etching process to remove the silicon dioxide residuals from the peripheral portion is performed. After removing the mask from the array portion, a polysilicon layer 208 is deposited over the whole surface. The resulting structure is illustrated in FIG. 57.

Figure 58:
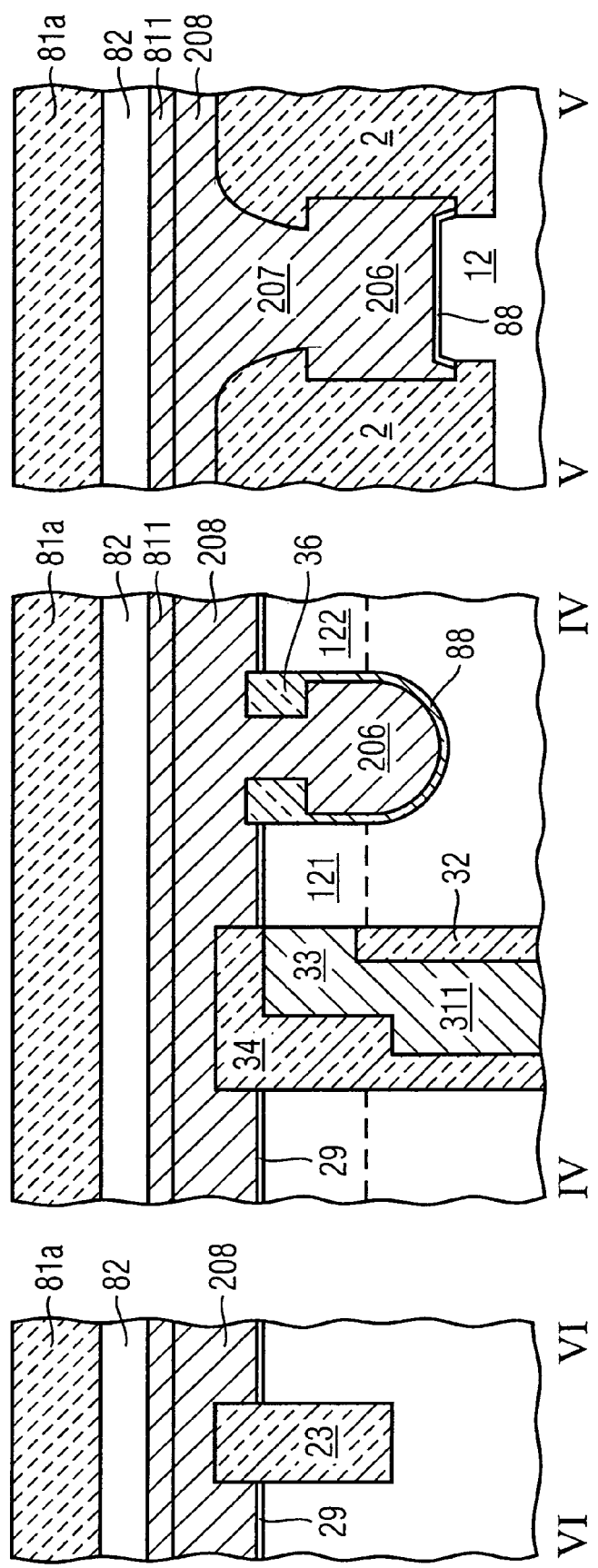

Thereafter, the layers for forming the word lines and the peripheral gate electrodes are deposited by generally known methods. For example, a silicon layer 811 as well as a WSi layer 82 can be deposited, followed by a silicon nitride layer 81a. The resulting structure is illustrated in FIG. 58. Nevertheless, as is obvious to the person skilled in the art, the layer stack for forming the word lines and the peripheral gate electrode can be formed by any other method as is generally used in the art.

Thereafter, using a suitable mask, for example a mask having a lines/spacers pattern, the deposited layers for forming the word lines and the gate electrodes in the peripheral portion are patterned. The resulting structure is illustrated in FIG. 59. In particular, as can be seen from the upper portion of FIG. 59, showing a plan view on the resulting structure, an active word line 8a as well as a passing word line 8b are formed on the substrate surface. As can be seen from the cross-sectional view between VI and VI, showing a cross-sectional view of the peripheral portion, a peripheral gate electrode 8c is formed which is insulated from the active portion of the support by the gate dielectric layer 29.

Figure 60:
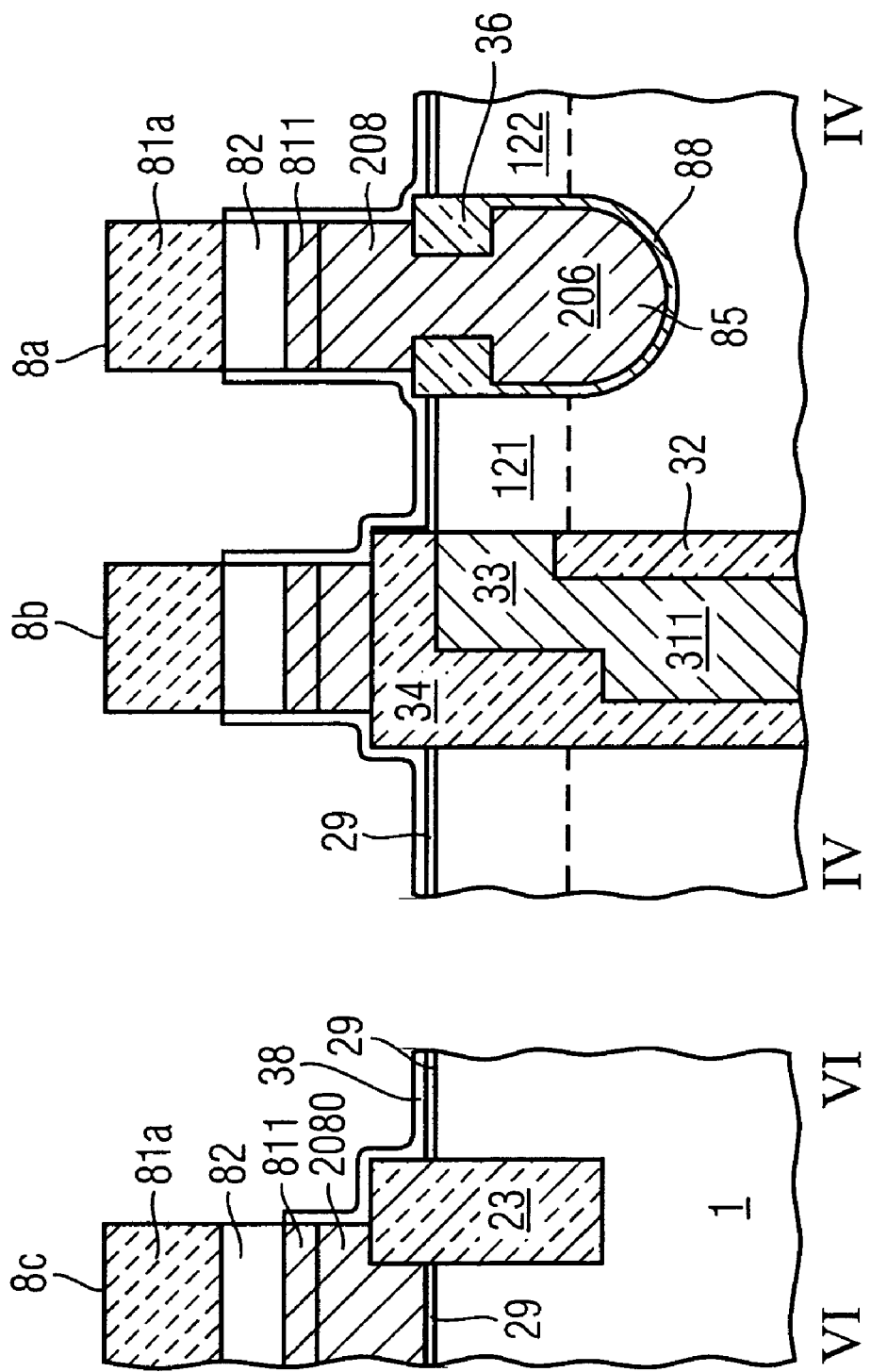

As can further be taken from the cross-sectional view between IV and IV, the gate electrode 85 is connected with a corresponding active word line 8a. The transistor formed includes first and second source/drain regions 121, 122. A channel 14 is formed between the first and second source/drain regions. A current path 15 between the first and second source/drain regions includes vertical as well as horizontal components with respect to the substrate surface 10. The first source/drain region 121 is connected with the storage electrode 31 of the storage capacitor 3 via a polysilicon filling 311. The gate electrode 85 is insulated from the channel 14 by a gate dielectric layer 88. In addition, a silicon dioxide spacer 36 is provided at the upper portion of the gate electrode for shielding the gate electrode from the first and second source/drain regions, thereby reducing a leakage current of the transistor. The illustrated structure can be completed by forming the bit line contacts for example by the process flow illustrated with reference to FIG. 24 to 33. To be more specific, in the next process, a silicon dioxide layer 38 can be optionally deposited as is illustrated in FIG. 60.

After completing the bit line contacts, bit lines are formed so as to extend perpendicularly with respect to the word lines.

According to a third embodiment of the present invention, the transistor in the array portion is formed as a FinFET, in which the gate electrode encloses the active area at three sides thereof, the gate electrode comprising two plate-like portions which extend to a deeper depth than according to the second embodiment of the present invention. Since the second embodiment includes an isotropic etching process for etching 10 to 20 nm $SiO_2$, the second polysilicon layer 202 is not required for forming the array transistor according to the second embodiment, as is also illustrated with reference to FIG. 43. However, since according to the third embodiment the etching process for etching $SiO_2$ etches about 100 nm, the second polysilicon hard mask layer 202 is required for implementing the third embodiment of the present invention.

For manufacturing the array transistor according to the third embodiment, first, the process processes which have been described with reference to FIG. 34 to 40 are performed. Nevertheless, the implantation process for providing the doped portion 124 which will later form the first and second source/drain regions is not conducted.

Figure 61:
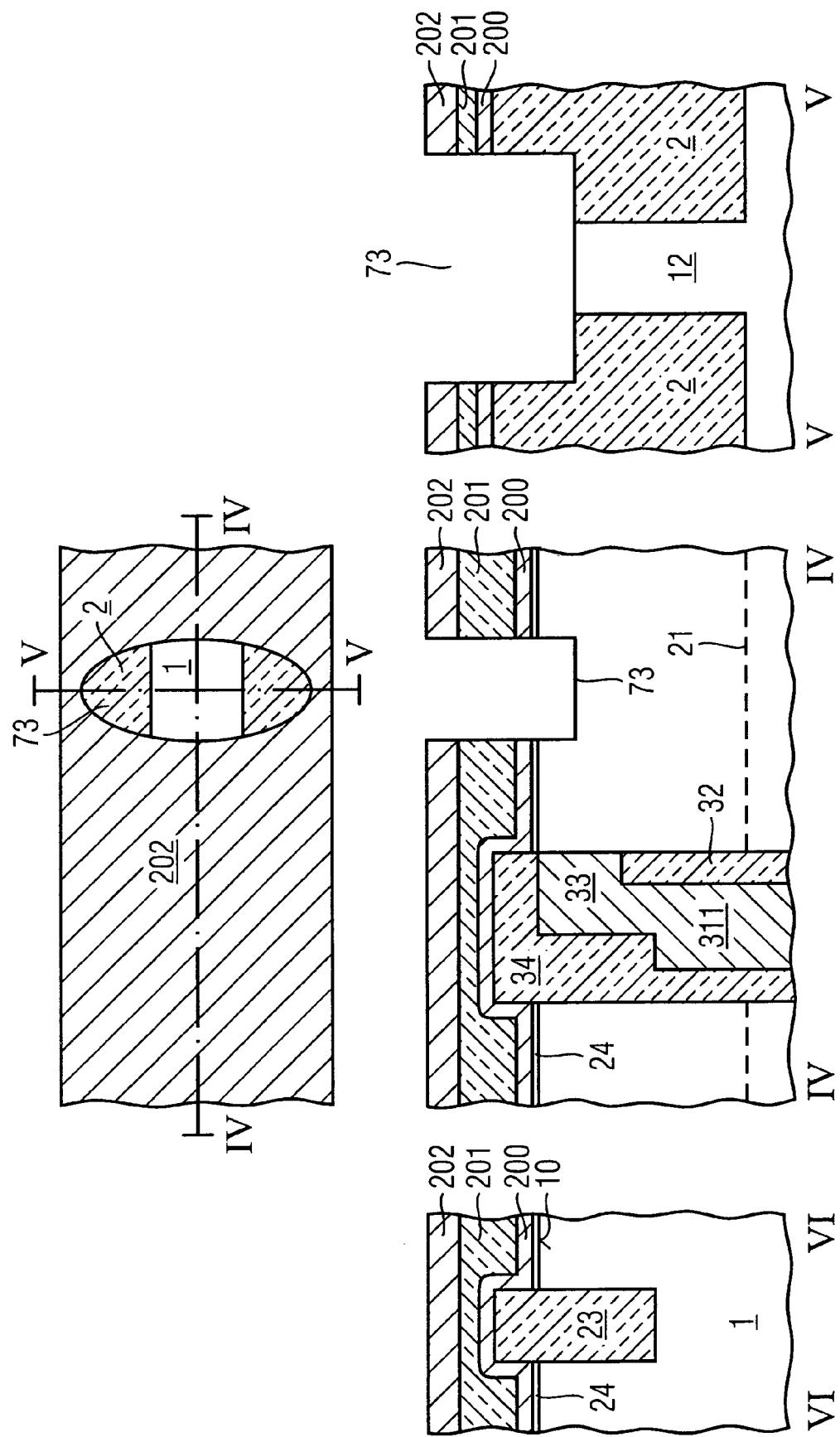

After forming the openings 7 in the hard mask layer stack as has been described with reference to FIG. 40, an etching process which etches both, silicon and silicon dioxide, is performed. Thereby, the openings 7 are also formed in the polysilicon layer 200 as well as in the silicon dioxide layer formed above the substrate surface and the silicon dioxide material filled in the isolation trenches 2. The resulting structure is illustrated in FIG. 61. As can be seen from FIG. 61, in the cross-sectional view between IV and IV, openings 73 are formed in the silicon substrate as well as in the layers formed above. Since the etching process which just has been performed, is unselective with respect to Si and $SiO_2$, the opening 73 has a broader cross-section than the opening 73 illustrated in FIG. 41, for example. In addition as can be seen from the cross-sectional view between V and V which is taken perpendicularly with respect to the cross-sectional view between IV and IV, the opening 73 extends in the substrate material as well as in the isolation trench 2. In addition, the opening 73 can extend to a depth of 15 to 60 nm below the substrate surface 10.

The support portion which is illustrated between VI and VI has not been affected by these etching processes. In particular, a polysilicon liner 200, a $SiO_2$ layer 201 and a polysilicon layer 202 are formed on the substrate surface 10 in the peripheral portion. As can be seen from the plan view in the upper portion of FIG. 61, the openings 73 have an oval shape, wherein on either sides of the active area 12, the isolation trenches 2 are not covered.

Figure 62:
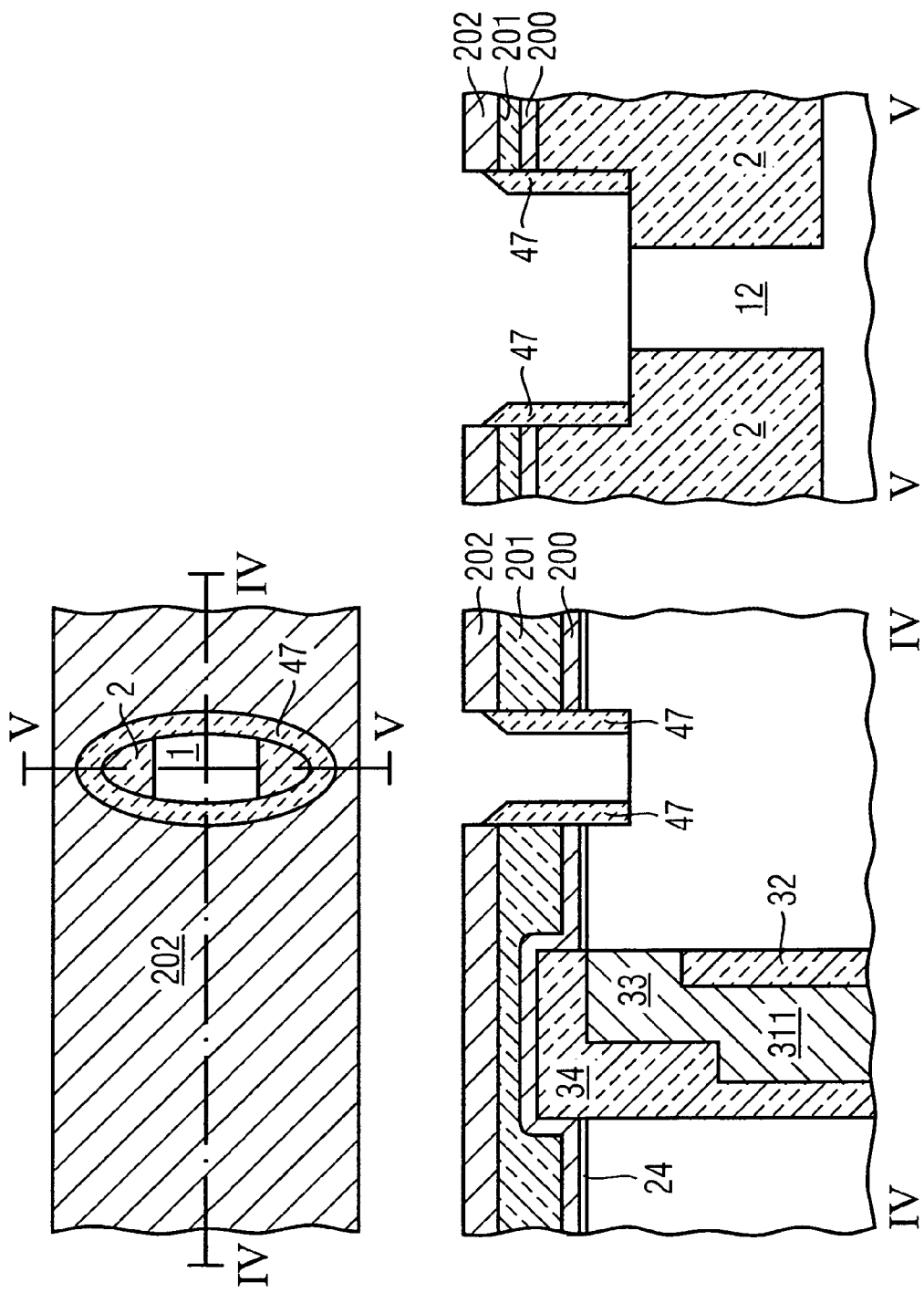

Optionally, a thin silicon dioxide liner can be deposited on the whole surface. Thereafter, a silicon nitride spacer is formed by generally known methods. In particular, a silicon nitride layer having a thickness of approximately 0.2×F to 0.3×F is conformally deposited. Thereafter, an anisotropic etching process for removing the horizontal portions of the silicon nitride layer is performed. Thereby, the side walls of the opening 73 are covered with the silicon nitride spacer 47. The resulting structure is illustrated in FIG. 62.

An anisotropic etching process for etching silicon dioxide material selectively with respect to silicon is performed. Since the side walls of the opening 73 are protected by the silicon nitride spacer 47, pocket structures 74 are formed in the isolation trenches 2 by this etching process. For example, by this etching process about 100 nm $SiO_2$ material are etched so that the bottom side of the pocket structures 74 is about 100 nm below the bottom side of the silicon nitride spacers 47 and about 150 nm below the surface 10 of the semiconductor substrate 1. The resulting structure is illustrated in FIG. 63. As can be seen from the cross-sectional view between IV and IV, parallel to the direction of the active areas, the grooves are slightly deepened, whereas in a cross-section perpendicular thereto the pocket structures 74 are formed.

Figure 64:
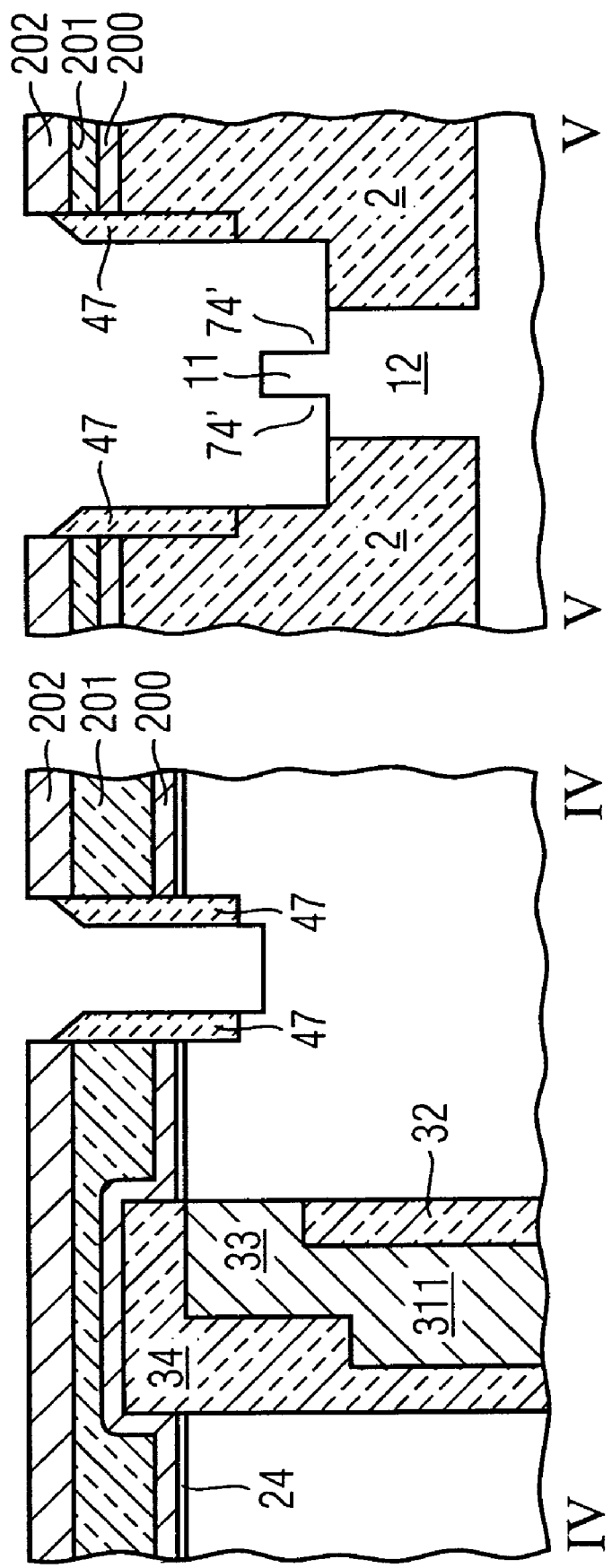

An isotropic Si etching process is performed so as to narrow the active area 12. As a consequence, a narrowed fin region 11 is formed, and the pockets 74' are extended. The resulting structure is illustrated in FIG. 64.

Figure 65:
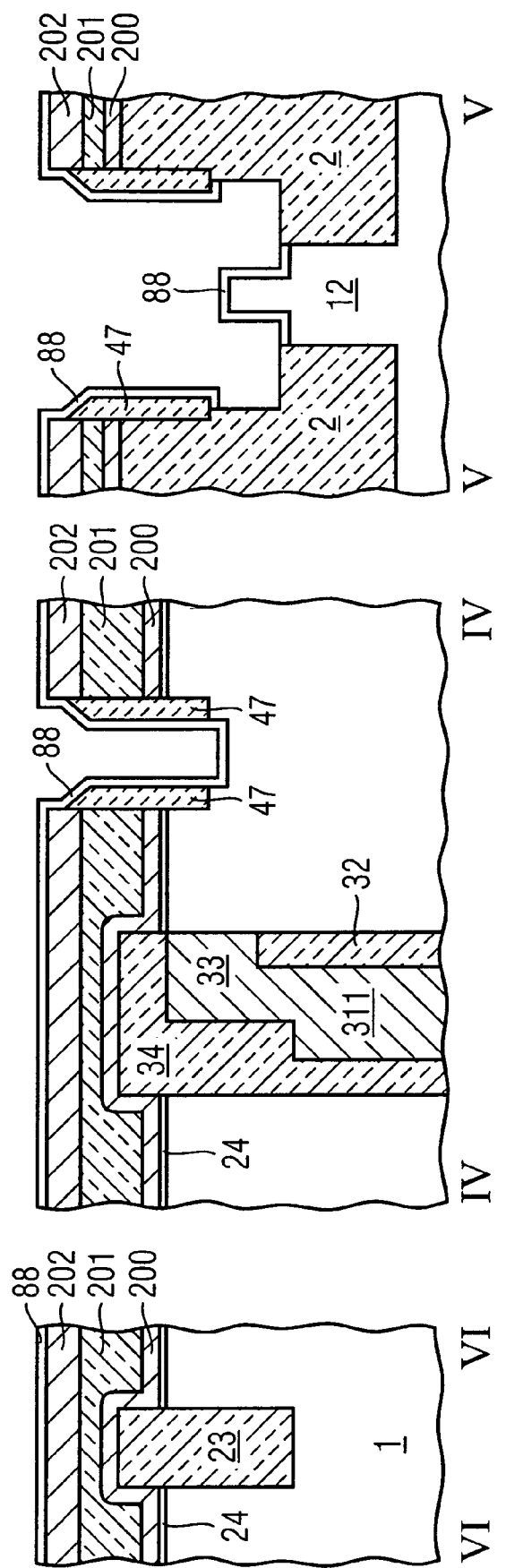

A silicon dioxide layer 88 acting a as a gate dielectric layer is deposited by generally known methods. The resulting structure is illustrated in FIG. 65.

Figure 66:
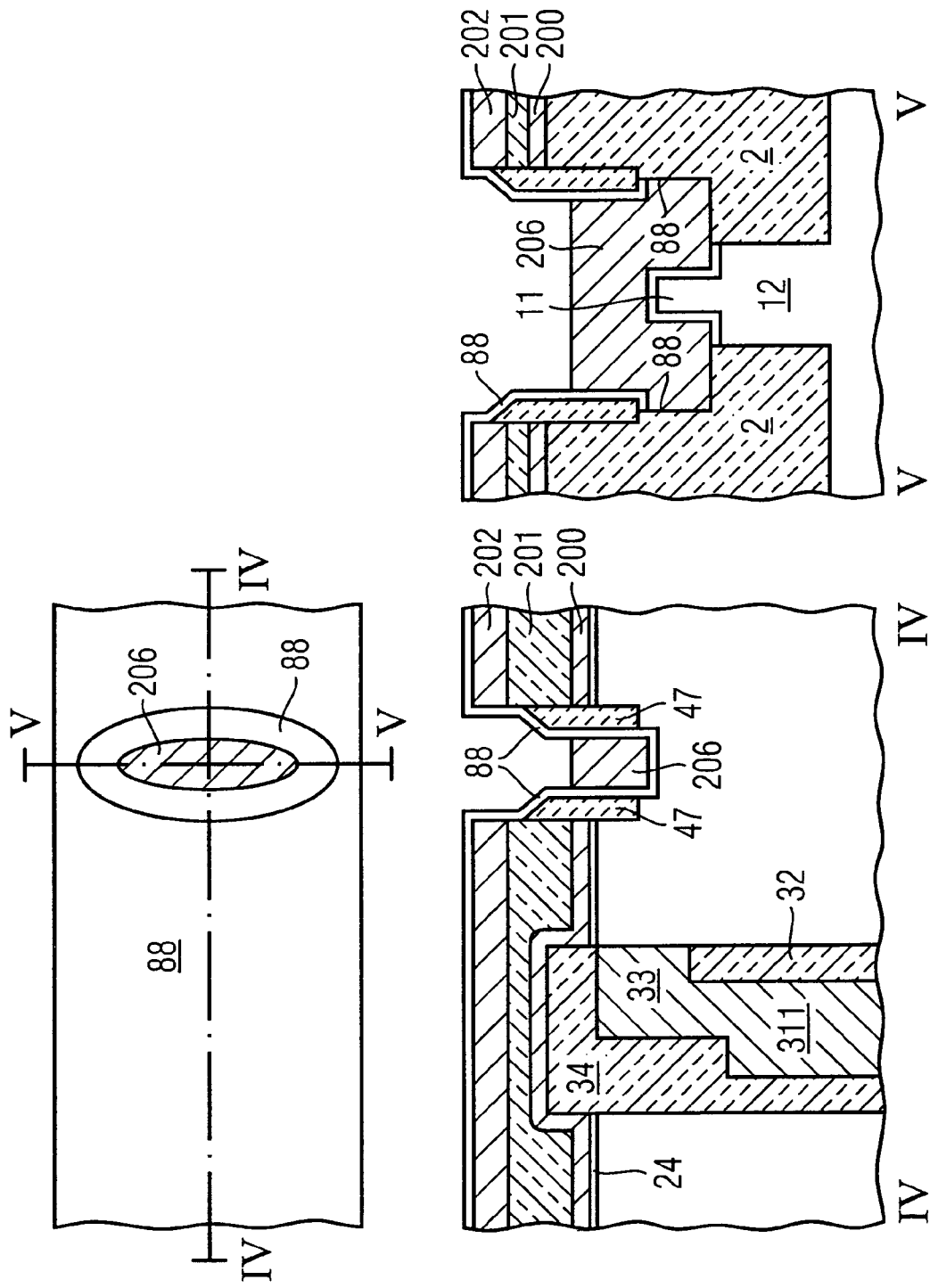

Thereafter, a polysilicon layer is formed by generally known methods and then, the polysilicon layer is recessed. As a consequence, the surface of the polysilicon filling 206 which is formed in the gate groove 73 is disposed at the same height as the surface of the polysilicon liner 200. The resulting structure is illustrated in FIG. 66.

As can be seen from the plan view, the polysilicon filling 206 is disposed in the middle of the gate groove 73. As can be taken from the cross-sectional view between IV and V as well as between V and V, the whole surface is covered with a silicon dioxide layer 88, with the exception of the polysilicon filling 206 which is disposed in the gate groove 73.

As can be taken from the cross-sectional view between V and V, now the groove 73 encloses the active area 12 at three sides thereof.

Figure 67:
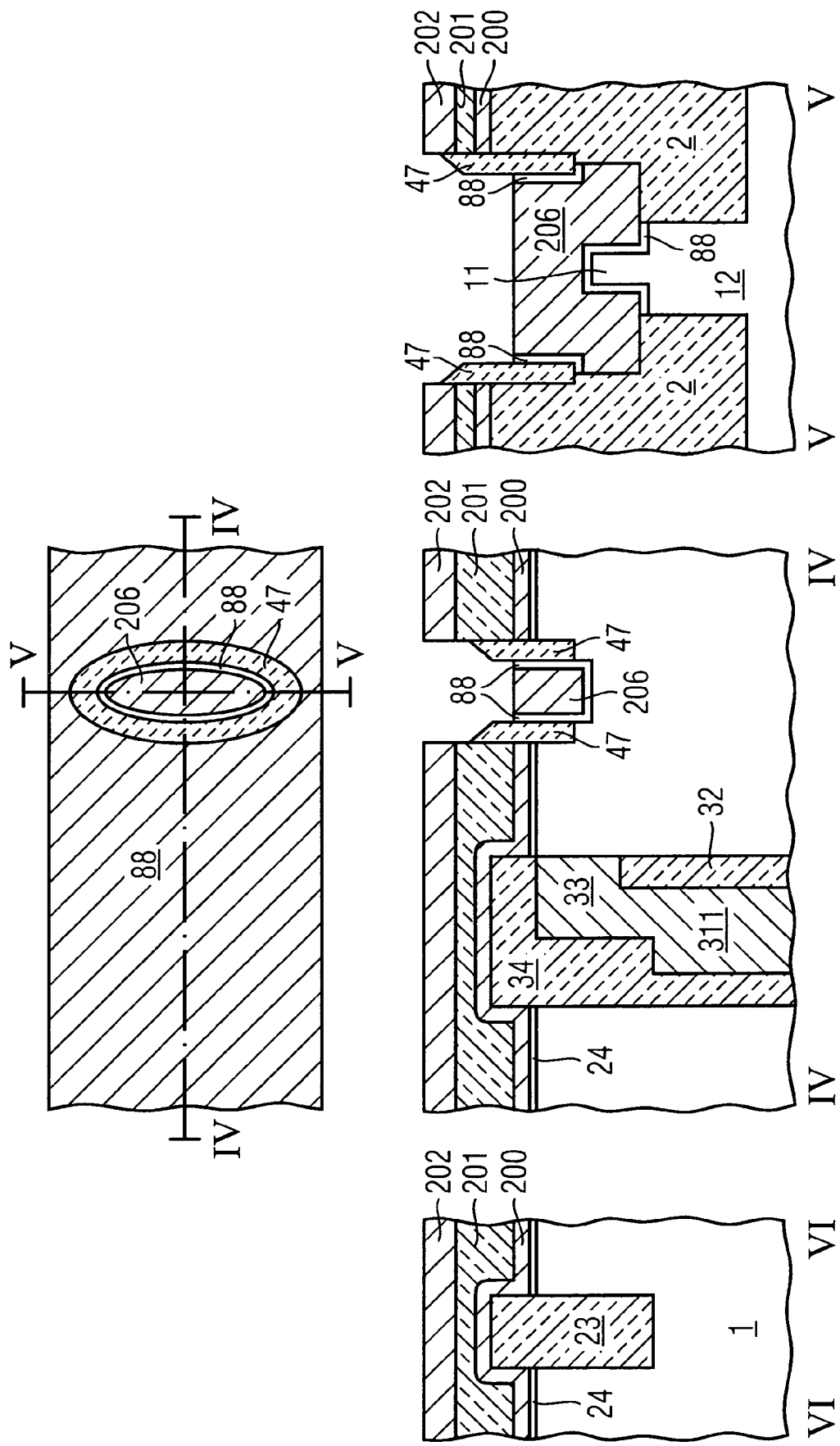
Figure 69:
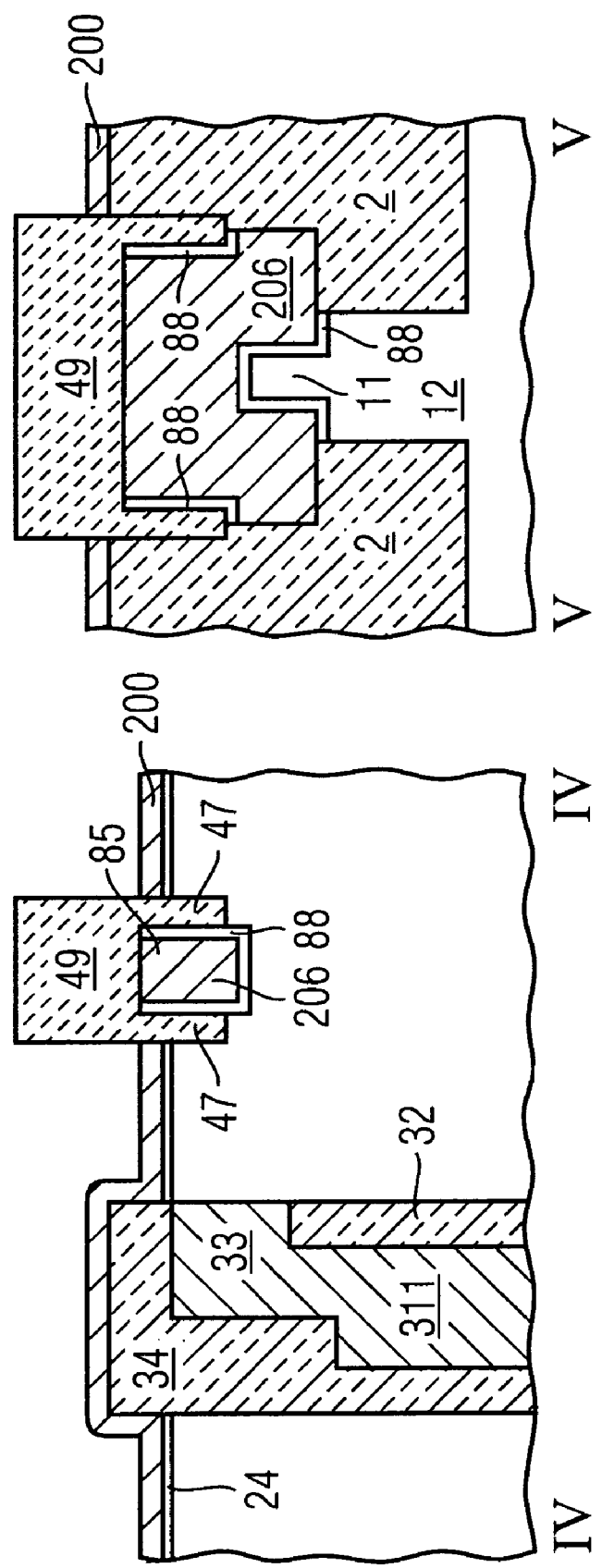

An etching process for etching silicon dioxide is performed, so that the gate dielectric layer 88 is removed from those portions which are not covered by the polysilicon filling 206. The resulting structure is illustrated in FIG. 67. As can be seen from the cross-sectional view between VI and VI illustrated in the peripheral portion, now the polysilicon layer 202 is uncovered. In the array portion, in the cross-sectional view between IV and IV, the silicon nitride spacer 47 is uncovered. In addition, outside the gate grooves, the polysilicon layer 202 is uncovered. The plan view of the resulting structure is illustrated in the upper portion of FIG. 67.

A silicon nitride layer is deposited so as to completely fill the openings 73. In addition, an anisotropic etching process is performed so as to remove the horizontal portions of the silicon nitride layer. As a consequence, the upper portions of the gate grooves 73 is filled with a silicon nitride filling 49. The resulting structure is illustrated in FIG. 68, showing the filled gate grooves 73.

Thereafter, the peripheral portion is masked by an appropriate mask leaving the array portion uncovered. Then, an etching process for etching polysilicon as well as an etching process for etching silicon dioxide are performed. As a consequence, the polysilicon layer 200 is uncovered in the array portion. In addition, the silicon nitride filling 49 projects from the gate grooves 73. In particular, the silicon nitride filling 49 projects by approximately 100 to 200 nm with respect to the surface 10 of the silicon substrate.

Thereafter, ion implantation processes for defining the first and second source/drain regions 121, 122 are performed. The resulting structure is illustrated in FIG. 70. As can be seen from the cross-sectional view between IV and IV, the first and second source/drain regions 121, 122 are formed in the upper portion of the silicon substrate 1. In particular, the bottom side of the first and second source/drain regions 121, 122 can be disposed beneath the bottom side of the gate electrode 85. Nevertheless, the bottom side of the first and second source/drain regions 121, 122 can as well be disposed at the same height or above the bottom side of the gate electrode 85.

Figure 71:
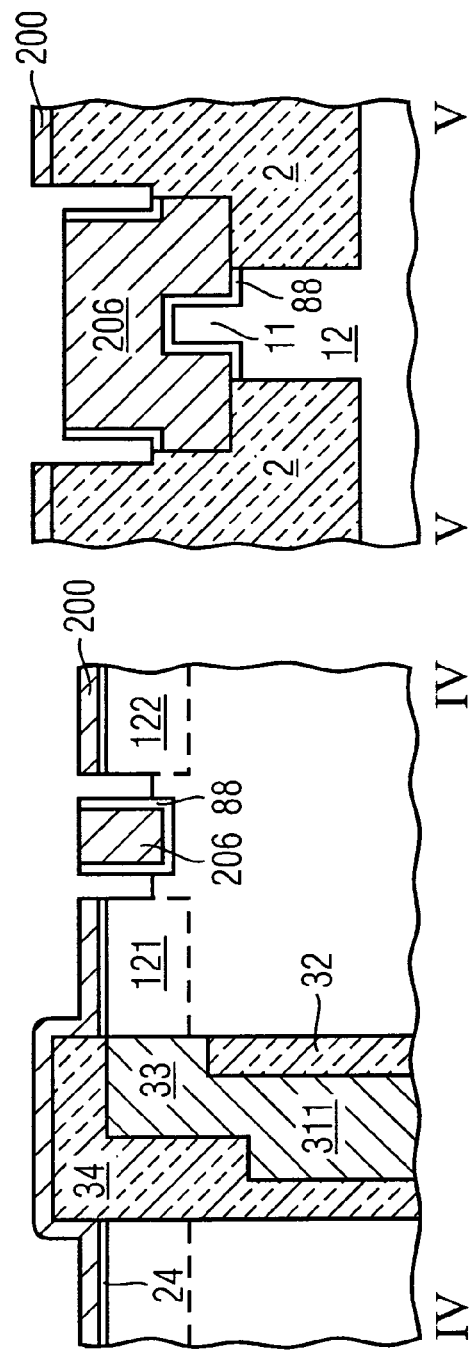

An etching process for etching silicon nitride is performed. As a consequence, the projecting portions of the silicon nitride filling 49 are removed as well as the silicon nitride spacers 47. The resulting structure is illustrated in FIG. 71. As can be seen from the cross-sectional view between IV and IV, openings are formed between the gate dielectric layer 88 and the first and second source/drain regions 121, 122. As can be seen from the cross-sectional view between V and V, openings are formed between the polysilicon filling 206 and the isolating material of the isolation trenches 2.

A silicon dioxide layer having a thickness of at least 10 nm is deposited, in particular by a TEOS or a HDP (high density plasma) method as is conventional. Thereafter, an anisotropic etching process is performed so as to form the silicon dioxide spacer 36 in the openings formed in the substrate surface 10. This etching process is performed so that an overetching of 5 to 10 nm is obtained. As a consequence, the silicon dioxide spacer 36 are formed as can be seen from FIG. 72.

The array portion is masked with a resist material leaving the peripheral portion uncovered. Thereafter, an etching process of etching silicon dioxide is performed, followed by a process of etching polysilicon. Thereafter, the resist material is removed from the array portion. As a consequence, in the peripheral portion between VI and VI the structure illustrated in FIG. 73 is obtained. In particular, in this structure, the surface 10 of the silicon substrate is only covered with the sacrificial silicon dioxide layer 24. Thereafter, a silicon dioxide etching process is performed so as to remove the silicon dioxide layer 24, followed by a process of forming a peripheral gate dielectric 29. As a consequence, the structure illustrated in FIG. 74 is obtained. In particular, as can be taken from FIG. 74, a peripheral gate dielectric layer 29 is formed in the peripheral portion between VI and VI, whereas the remaining surface is covered with the silicon dioxide layer 29.

Figure 75:
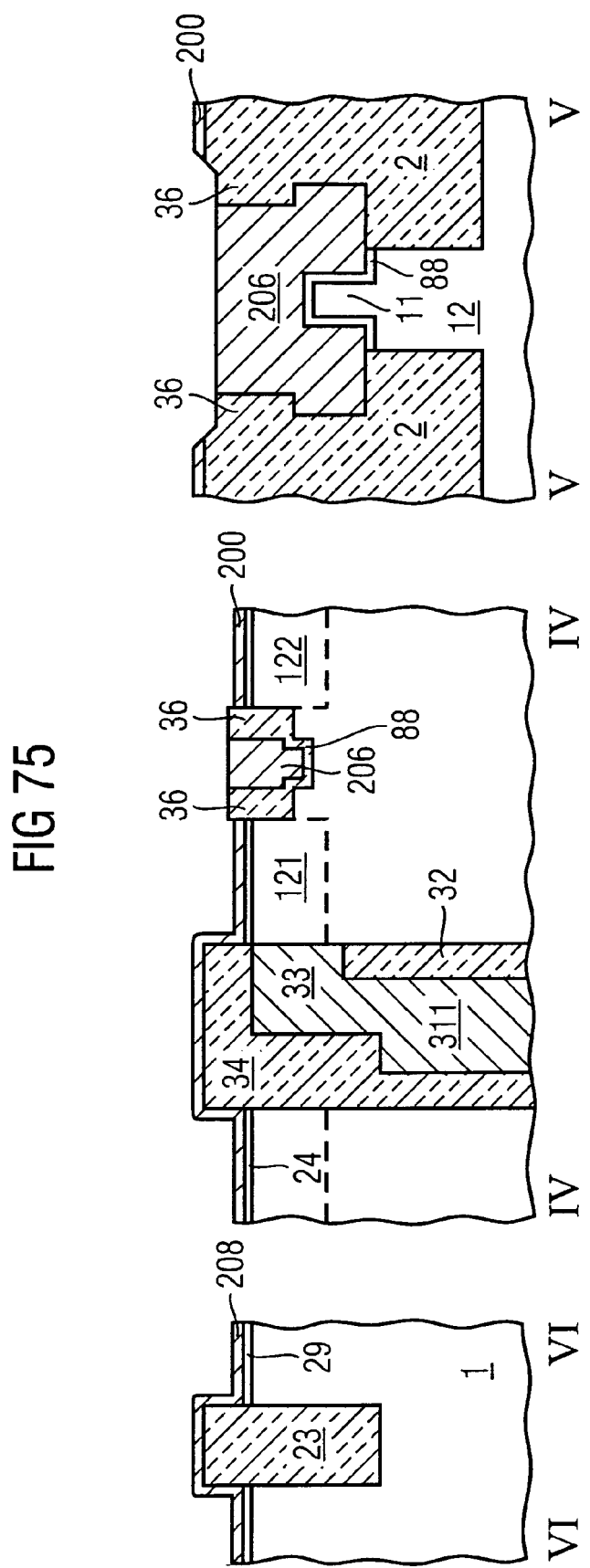

Thereafter, a polysilicon layer having a thickness of about 30 to 100 nm is deposited on the whole surface. Thereafter, a suitable resist layer is applied on the peripheral portion, masking the peripheral portion while leaving the array portion uncovered. Then, an etching process for etching polysilicon is performed, followed by an etching process for etching silicon dioxide. After removing the mask from the peripheral portion, as a result, the structure illustrated in FIG. 75 is obtained. In particular, in the peripheral portion, a thick polysilicon layer 208 is present, whereas in the array portion, the thin polysilicon layer 200 is uncovered, with the silicon dioxide spacer 36 being uncovered at the portion of the gate electrode.

In the next process, a polysilicon layer having a thickness which is selected so that the final polysilicon layer thickness of the layer stack of about 40 to 100 nm is obtained is deposited by generally known method, followed by the usual gate electrode layer stack. Nevertheless, as is obvious to the person skilled in the art, the layer stack for forming the word lines and the peripheral gate electrode can be formed by any other method as is generally used in the art.

Figure 76:
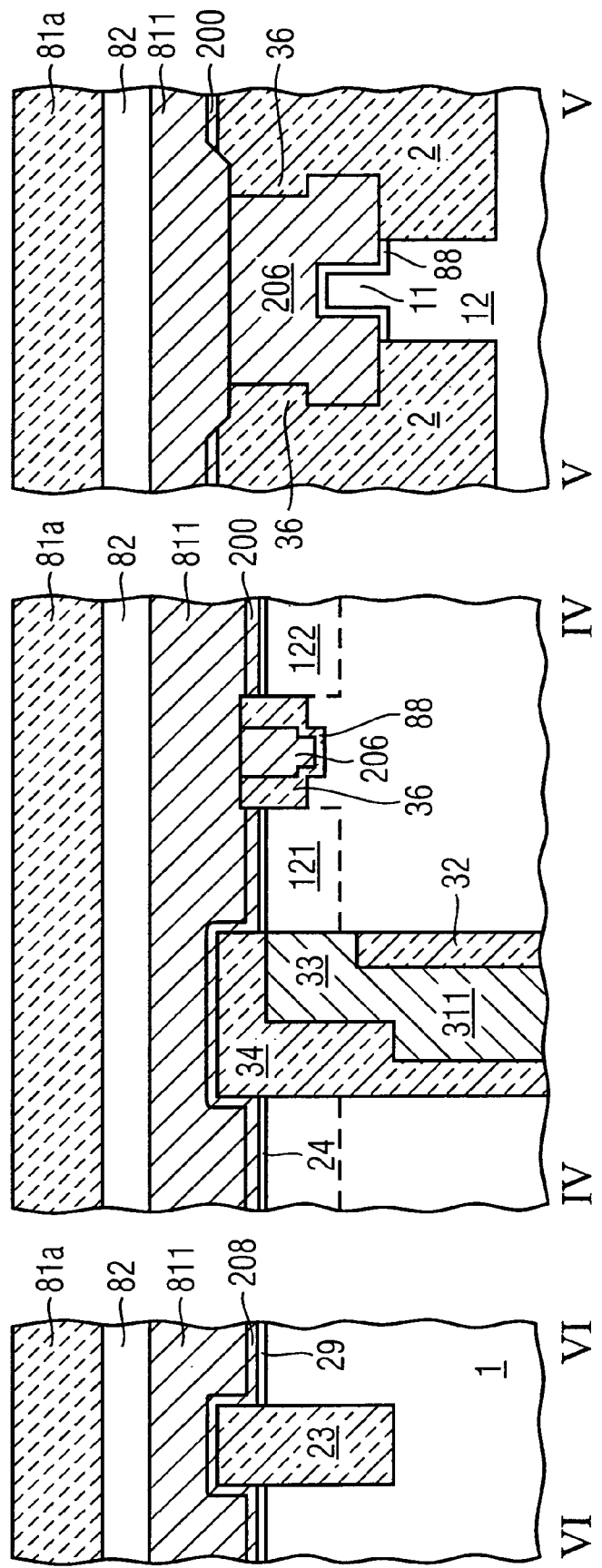

The resulting structure is illustrated in FIG. 76, in which the whole surface is covered by the silicon nitride layer 81a.

Figure 77:
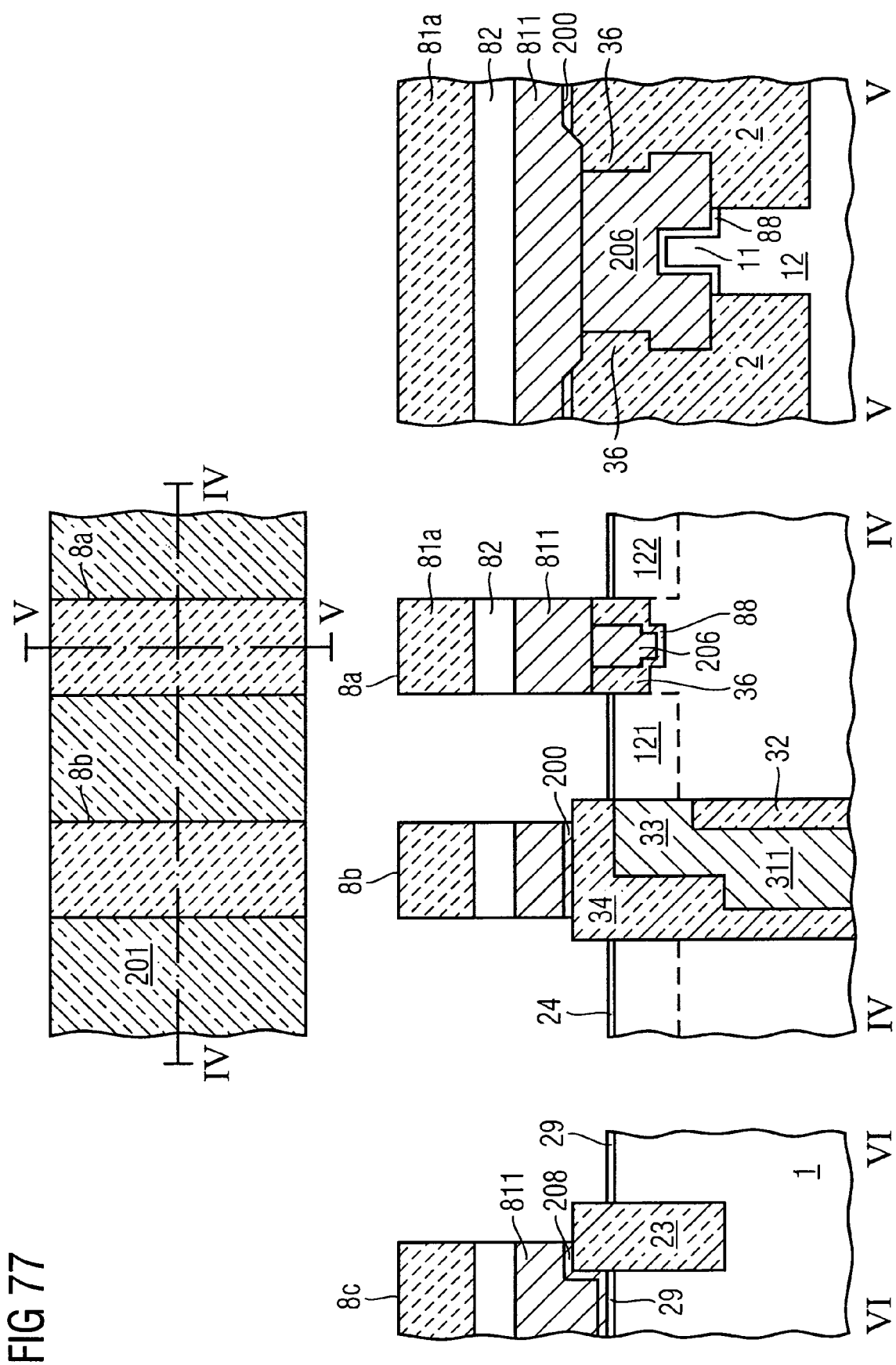

Thereafter, the deposited layer stack is patterned using the mask having a lines/spacers pattern so as to obtain the structure illustrated in FIG. 77.

In particular, as can be taken from the plan view in the upper portion of FIG. 77, active and passing word lines 8a, 8b are provided on the surface. In the peripheral portion between VI and VI, a peripheral gate electrode is formed. In the array portion between IV and IV, a gate electrode, in which the polysilicon filling 206 is insulated from the first and second source/drain regions by a silicon dioxide spacer 36 is provided. The gate electrode is disposed near the surface of the semiconductor substrate 1, and the bottom side of the first and second source/drain regions 121, 122 is disposed beneath the bottom side of the gate electrode 85. As can be taken from the cross-sectional view which is taken between V and V, the active region 12 includes a narrowed fin region 11 which is enclosed by the gate electrode at three sides thereof.

According to the following embodiment of the present invention, the first hard mask layer stack for patterning the array transistor includes a silicon nitride layer and a silicon dioxide layer. Optionally, a sacrificial oxide layer 24 may be provided between the substrate surface 10 and the silicon nitride layer. If the transistor to be formed is a FinFET, a polysilicon layer must be provided on the surface of the silicon dioxide layer of the first hard mask layer stack. If the transistor to be formed has pocket structures which do not extend to such a deep depth (EUD), the polysilicon layer is optional.

In addition, the second hard mask layer stack includes a carbon hard mask layer. During the process processes for fabricating the transistor in the array portion, the peripheral portion is masked with silicon nitride liner. After completing the array transistor, the peripheral portion is completed.

Figure 78:
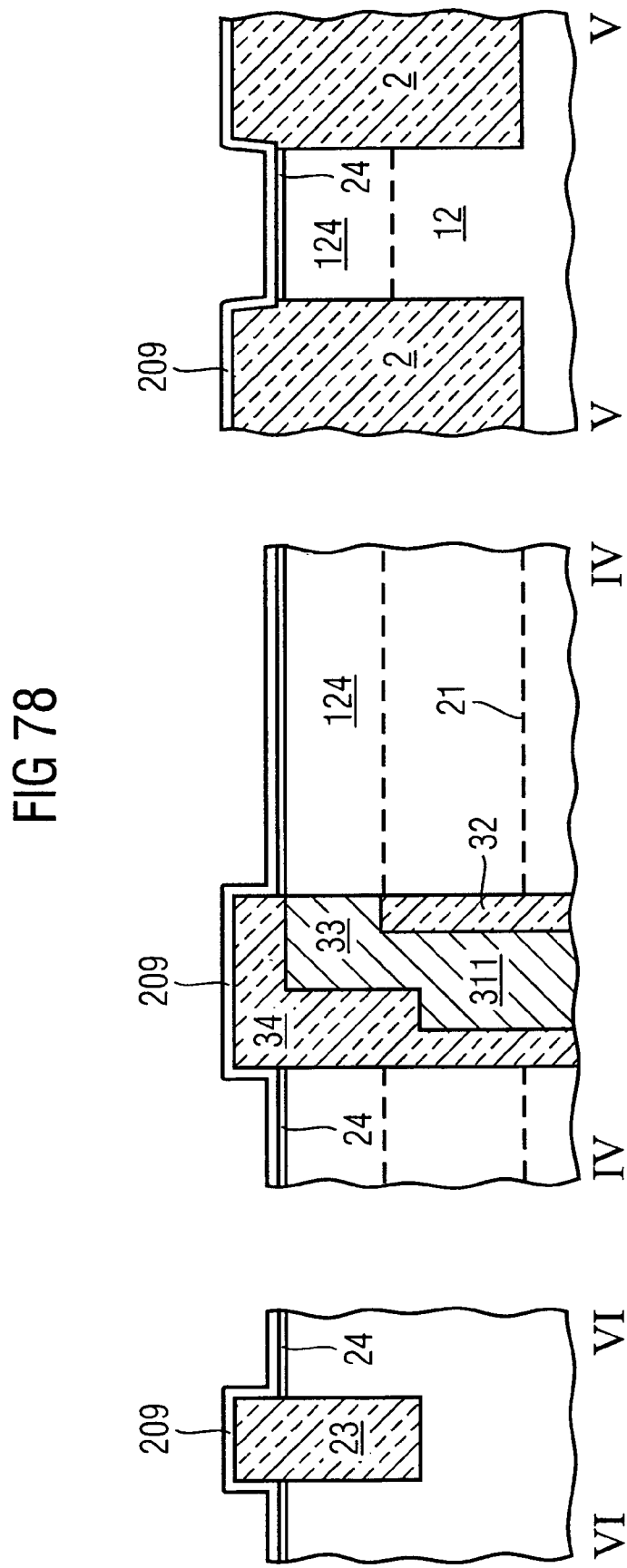
FIGS. 78 to 86 illustrate a fourth embodiment of the present invention.

According to the fourth embodiment, the array transistor is formed with pockets that only slightly project with respect to the surface of the active area 12. Differently speaking, the transistor is implemented as a so-called EUD. For implementing the fourth embodiment of the present invention, starting from the structure illustrated in FIG. 34, first, a silicon nitride liner 209 is deposited so as to cover the whole surface. The resulting structure is illustrated in FIG. 78.

Figure 79:
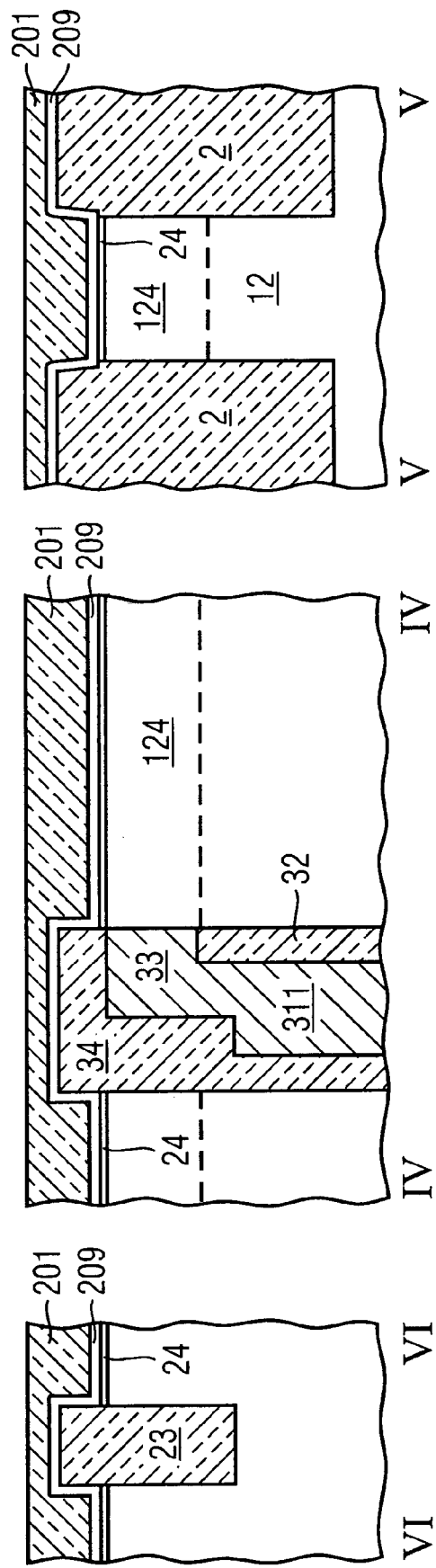

As can be seen from the cross-sectional view between VI and VI showing the peripheral portion of the memory device, the peripheral portion is covered with a silicon nitride liner 209. In addition, in the array portion, the silicon nitride liner covers the active area, the isolation trenches as well as the trench top oxide 34. Thereafter, a silicon dioxide layer is deposited, the silicon dioxide layer 201 having a thickness so as to planarize the whole surface. The resulting structure is illustrated in FIG. 79. As can be seen from the cross-sectional views, a planarized surface of the silicon dioxide layer 201 is provided.

Figure 80:
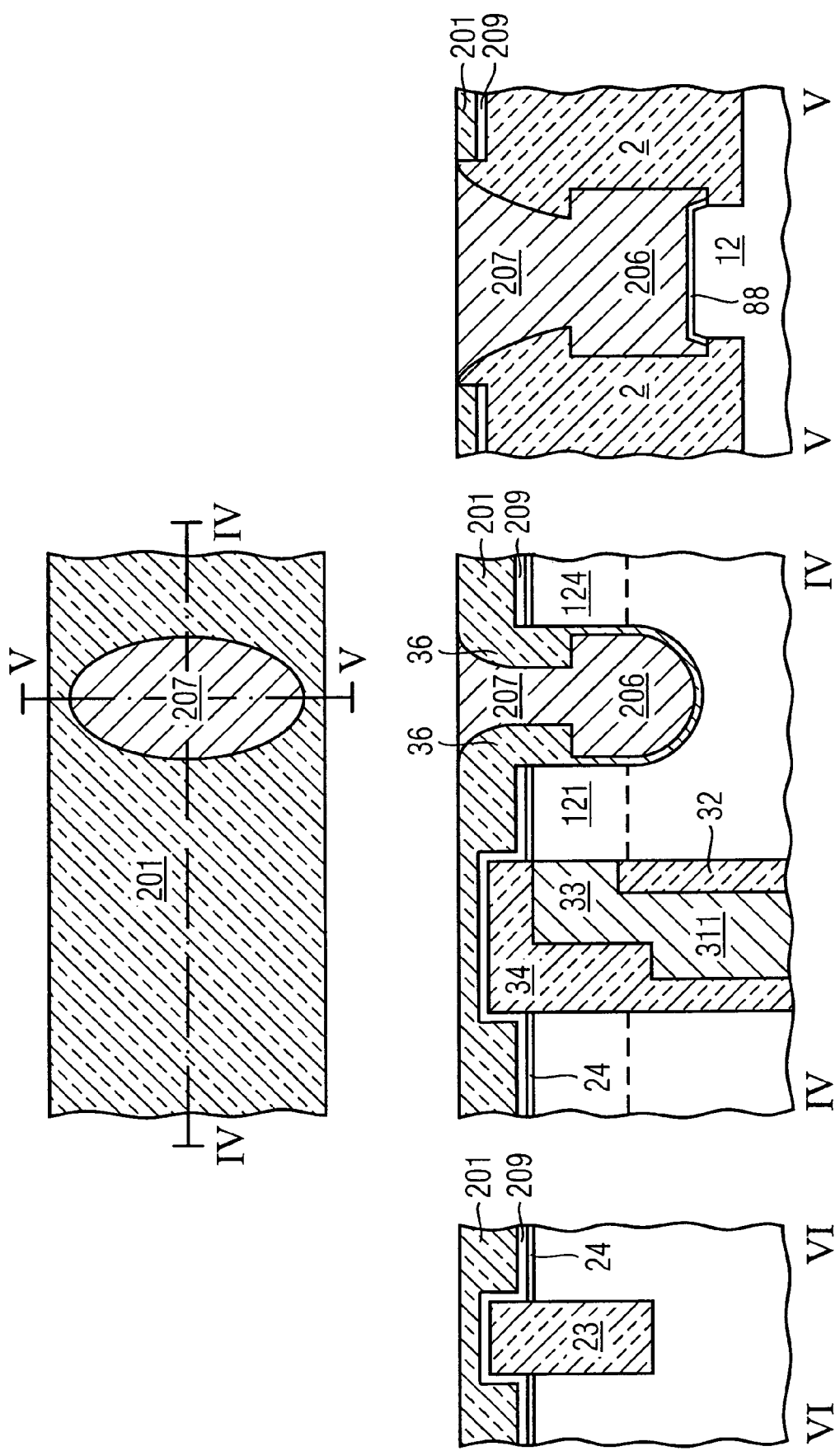

In the following, the same process processes which have been described with reference to FIGS. 37 to 47 are performed, with the exception, that a silicon nitride liner 209 is provided instead of the polysilicon liner 200 which has been used according to the second embodiment of the present invention. In addition, after filling the polysilicon materials 207, a planarizing process such as a CMP process is performed so as to obtain a planarized surface. In more detail, the recessing process which has been performed according to the description in connection with FIG. 47 is not performed. As a result, the structure illustrated in FIG. 80 is obtained. As can be seen from the plan view which is illustrated in the upper portion of FIG. 80, oval islands of polysilicon materials 207 are disposed in a silicon dioxide surface 201. The peripheral portion has not been changed by these process processes, as can be taken from the cross-sectional view between VI and VI. In addition in the array portion, a planarized surface is provided, with the polysilicon filling 207 extending to the surface of the silicon dioxide layer 201.

Figure 81:
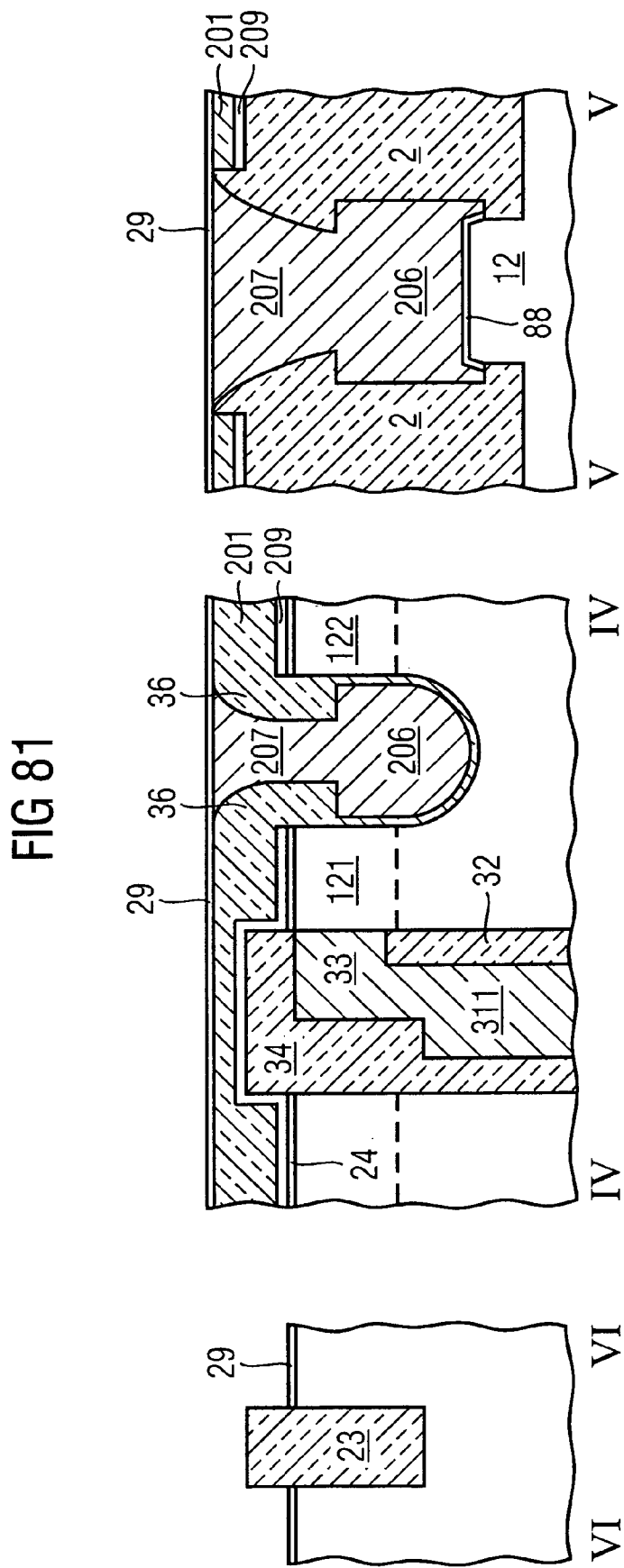

The array portion is masked with a suitable resist material, leaving the peripheral portion uncovered. Thereafter, an etching process for etching silicon dioxide 201 is performed, followed an etching process for etching silicon nitride 209. These layers are removed from the peripheral portion, since the array portion is masked with the mask. Thereafter, the sacrificial oxide layer 24 is stripped from the peripheral portion and the mask is removed from the array portion. Thereafter, a process for depositing a peripheral gate dielectric layer 29, in particular, a peripheral gate oxide layer, is performed. As can be seen from the structure illustrated in FIG. 81, the gate dielectric layer 29 covers the peripheral portion between VI and VI as well as the array portion between IV and IV and V and V.

Figure 82:
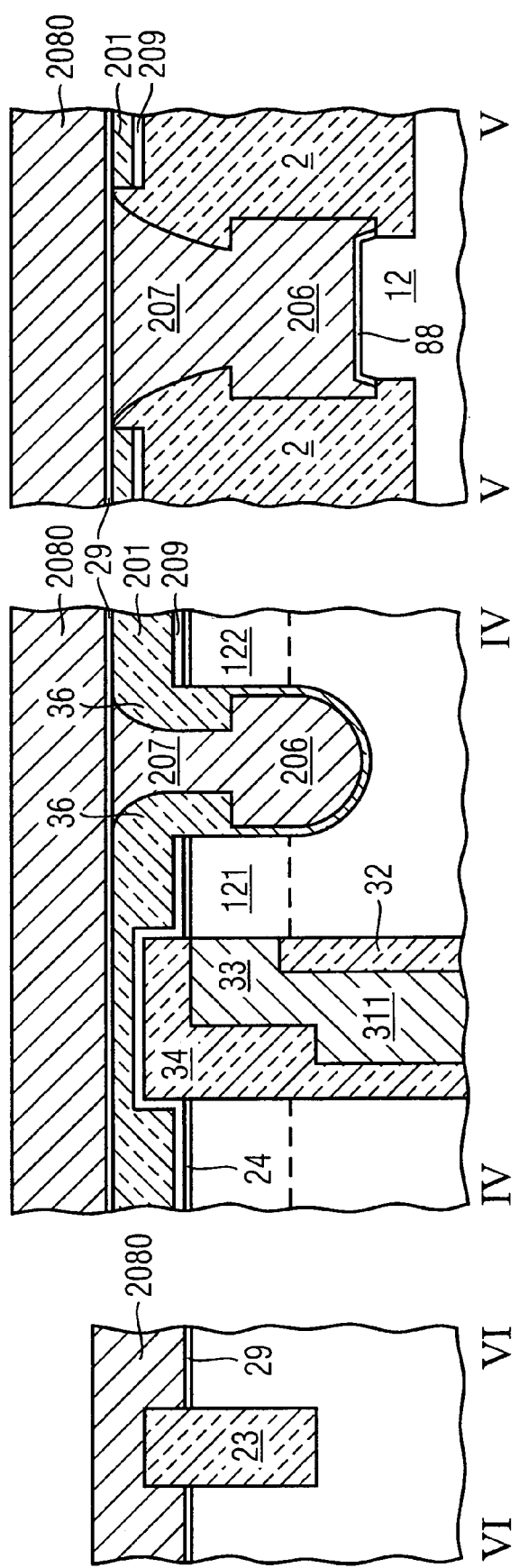

Thereafter, a polysilicon layer 2080 nm is deposited over the whole surface. As a result, the structure illustrated in FIG. 82 is obtained. As can be seen, the peripheral portion as well as the array portion are covered by the thick polysilicon layer 2080.

Figure 83:
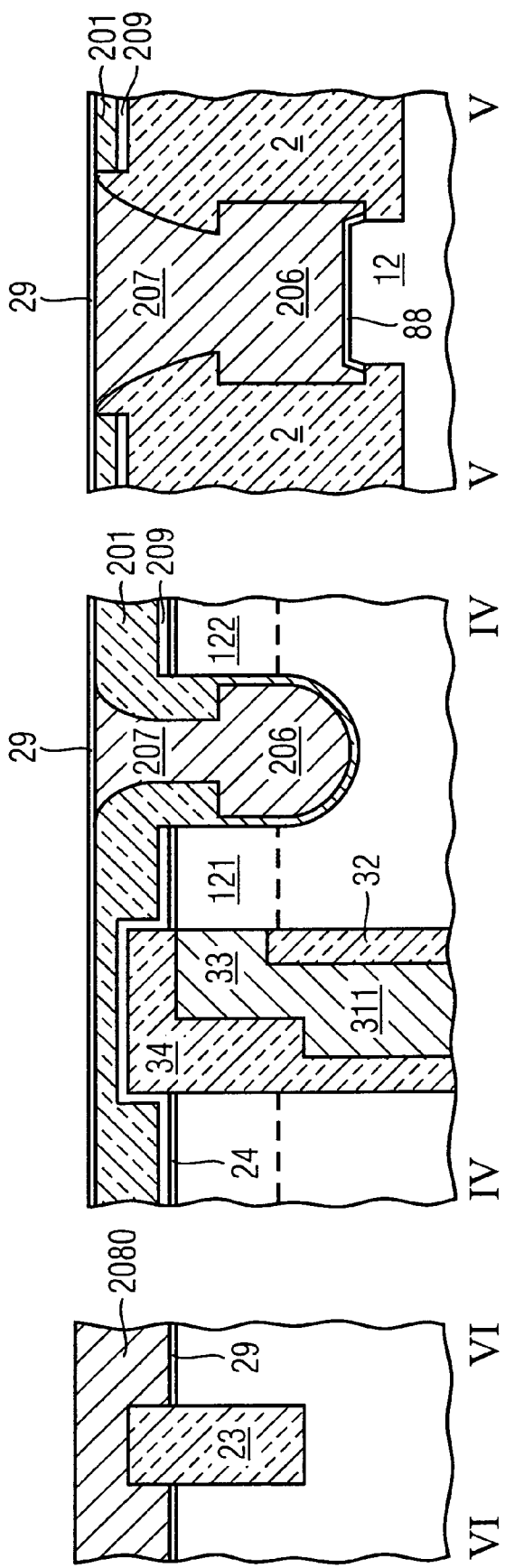

Thereafter, the peripheral portion is covered with a suitable mask, leaving the array portion uncovered. Then, an etching process for etching polysilicon is performed. As a result, the structure illustrated in FIG. 83 is obtained. To be more specific, in the peripheral portion, the substrate is covered with a polysilicon layer 2080, whereas in the array portion the surface is covered with a peripheral gate dielectric layer 29. For completing the gate electrode and the word lines, the peripheral gate dielectric layer 29 is removed from the array portion and, optionally, a polysilicon layer 811 is deposited, followed by a tungsten layer 82 and a silicon nitride layer 81a. Nevertheless, as is obvious to the person skilled in the art, the layer stack for forming the word lines and the peripheral gate electrode can be formed by any other method as is generally used in the art.

Figure 84:
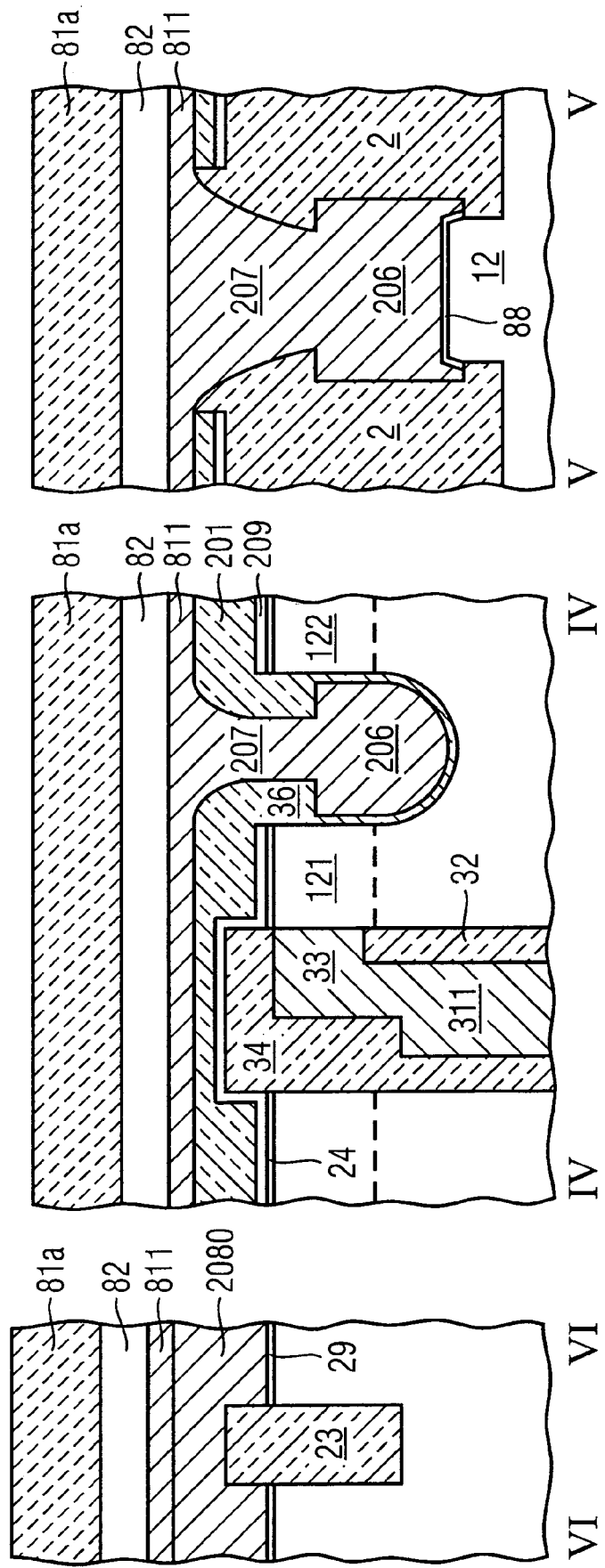

The resulting structure is illustrated in FIG. 84. As can be seen, in the peripheral portion between VI and VI the tungsten layer 82 is formed on the thick polysilicon layer 2080. In contrast in the array portion, the tungsten layer 82 is formed on the thin polysilicon layer 811. As a consequence, a topography is generated between the array portion and the peripheral portion.

Figure 85:
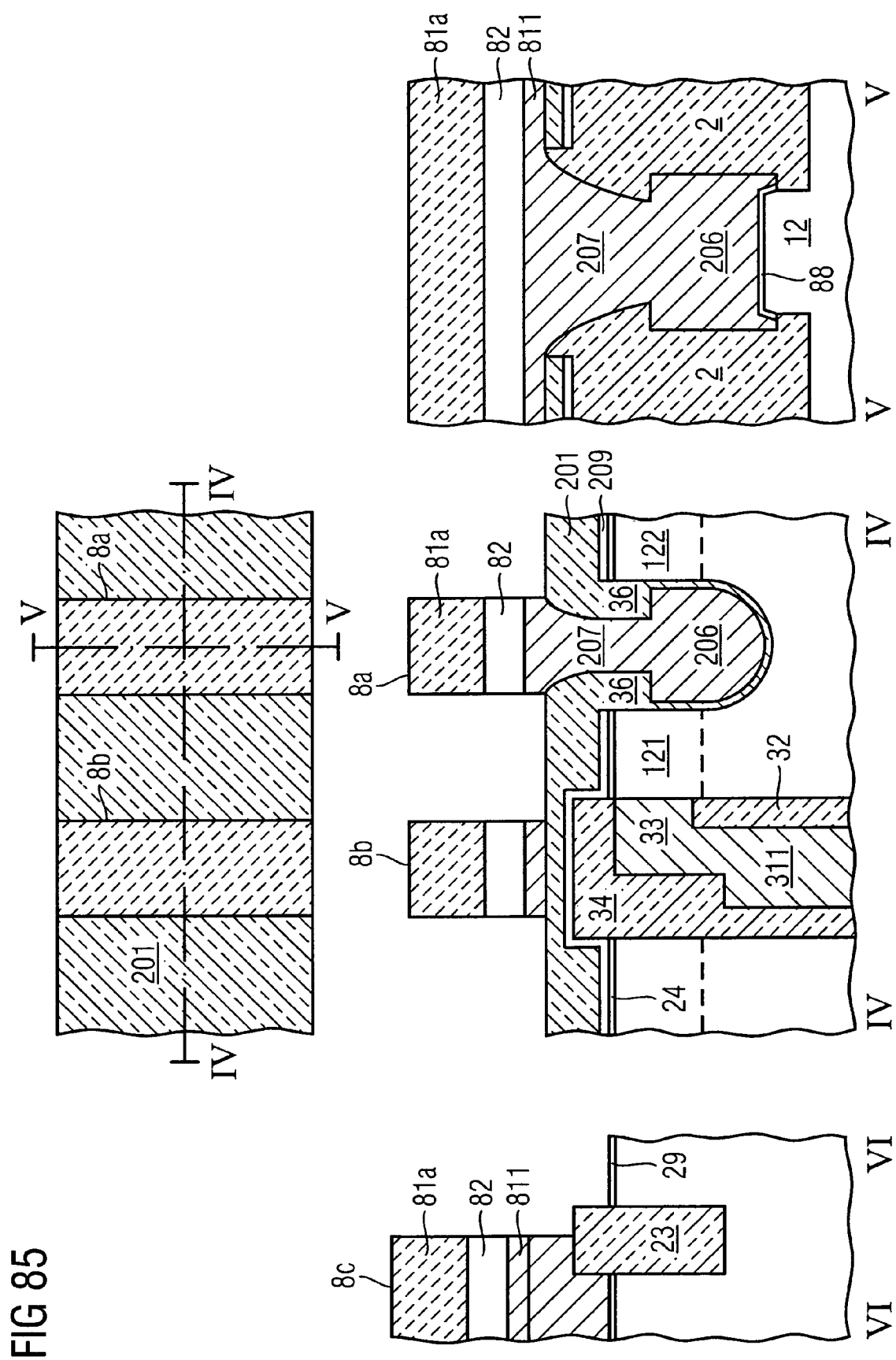

For completing the word lines in the array portion and the gate electrodes in the peripheral portion, a lithographic process using a mask having a lines/spacers pattern is performed, followed by an anisotropic etching process for etching the silicon nitride layer 81a, the tungsten layer 82 as well as the polysilicon layers 2080, 811. Accordingly, the word lines comprising the active word lines 8a and passing word lines 8b are formed in the array portion, whereas the gate electrode 8c is formed in the peripheral portion between VI and VI. A plan view on the resulting structure is illustrated in the upper portion of FIG. 85.

Thereafter, a silicon nitride spacer is deposited by generally known methods and an isotropically etched down to the silicon nitride liner 209. The resulting structure is illustrated in FIG. 86A. As can be seen from FIG. 86A, the horizontal portions of the array portion now are covered with a silicon nitride layer 81a, 209. In addition, in the peripheral portion, the gate electrode is encapsulated with the silicon nitride spacer 81b. In the illustrated structure, the word lines are laterally isolated from each other by the remaining portions of the silicon nitride hard mask layer 209 and the silicon dioxide hard mask layer 201. Accordingly, a capacitive coupling between passing word lines and the adjacent bit line contacts is greatly reduced. Moreover, since the silicon nitride layer 209 and the trench top oxide layer 34 are disposed between the passing word line and the polysilicon filling 311 of the trench capacitor, a capacitive coupling between the passing word line 8b and the storage electrode of the trench capacitor is reduced.

Figure 86B:
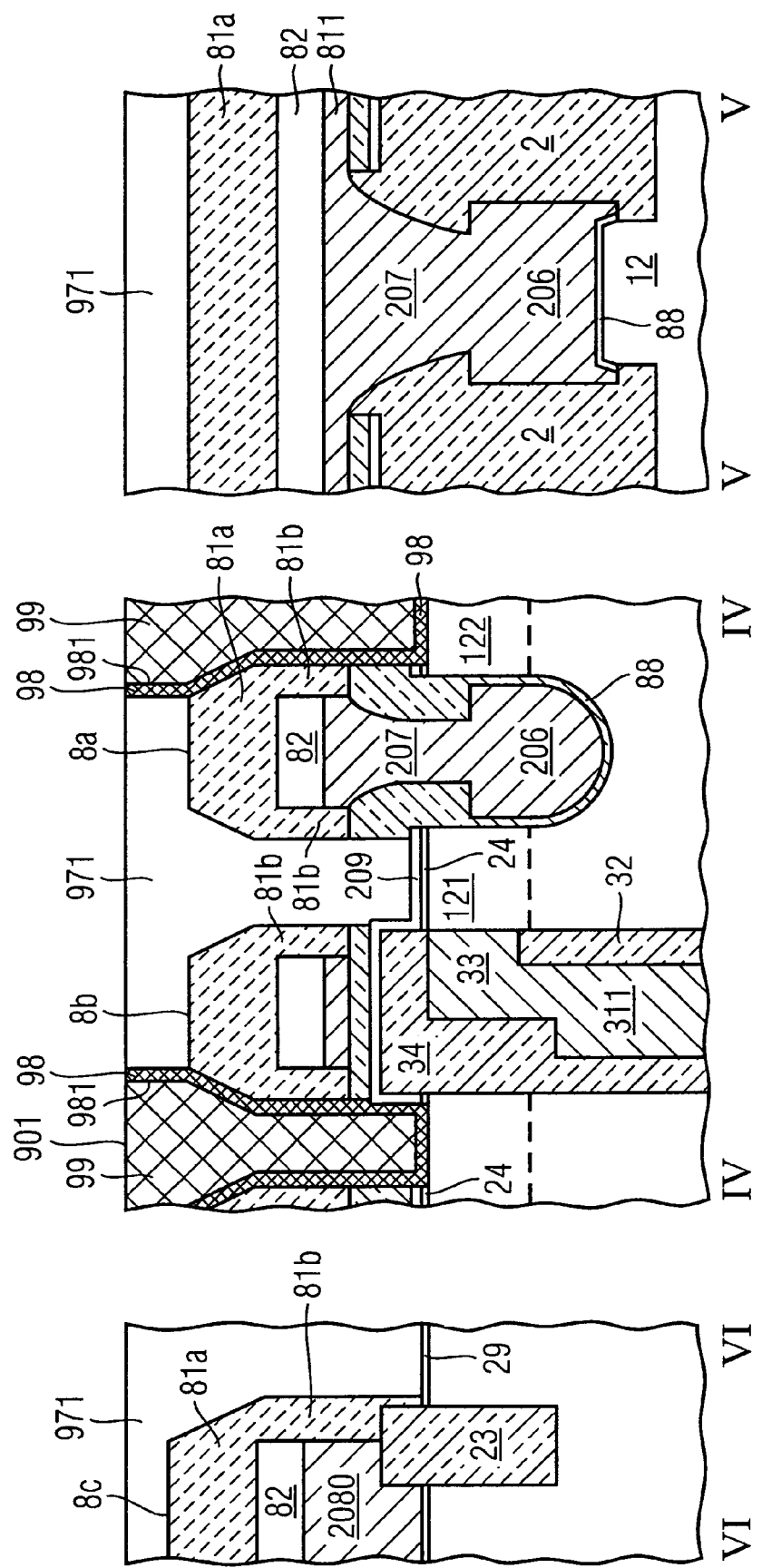

For providing the bitline contacts on top of the second source/drain portion 122, a conventional process in which the bitline contacts are formed in a self-aligned manner is especially preferred. The resulting structure comprising bit line contacts is illustrated in FIG. 86B. In a manner which is similar to the bit line contacts illustrated in FIG. 33, the bit line contacts illustrated in FIG. 86B comprise a liner layer stack comprising a titanium layer and a titanium nitride layer as well as a tungsten filling 99. Neighbouring bit line contacts 901 are electrically insulated from each other by a BPSG layer 971 or a spin-on glass (SOG) layer. For completing the structure, bit lines extending perpendicularly with respect to the word lines are provided.

According to the fifth embodiment of the present invention, the silicon nitride liner is deposited on the whole substrate surface during the process processes for forming the array transistor which is formed as a FinFET. In particular, the peripheral gate dielectric is provided after defining and filling the gate groove of the array transistor.

For implementing the fifth embodiment of the present invention, starting from the structure illustrated in FIG. 3, for example, in the array the well implantation processes are performed as is usual. The resulting structure is illustrated in FIG. 87. Thereafter, a silicon nitride liner is deposited over the whole surface. As a result, the structure illustrated in FIG. 88 is obtained. As can be seen from FIG. 88, the whole surface is covered with a silicon nitride liner 209.

Then, the same process processes which have been described with reference to FIGS. 61 to 69 are performed. The resulting structure is illustrated in FIG. 89. As can be seen from the cross-sectional view between VI and VI, the whole peripheral portion is covered with a silicon nitride liner 209, the silicon dioxide layer 201 as well as polysilicon layer 202. In addition, the array portion is covered with a silicon nitride liner 209 and the silicon nitride filling 49. Starting from the structure illustrated in FIG. 89, ion implantation processes for providing the first and second source/drain portions 121, 122 are performed. The resulting structure is illustrated in FIG. 90. As can be seen, the first and second source/drain regions 121, 122 are formed adjacent to the surface 10 of the silicon substrate 1.

Thereafter, a silicon dioxide layer 210 is deposited, followed by a planarization process so as to obtain a planarized surface, in which the silicon nitride filling 49 is uncovered. The resulting structure is illustrated in FIG. 91. As can be seen from FIG. 91, the silicon nitride filling 49 is unexposed.

Figure 92:
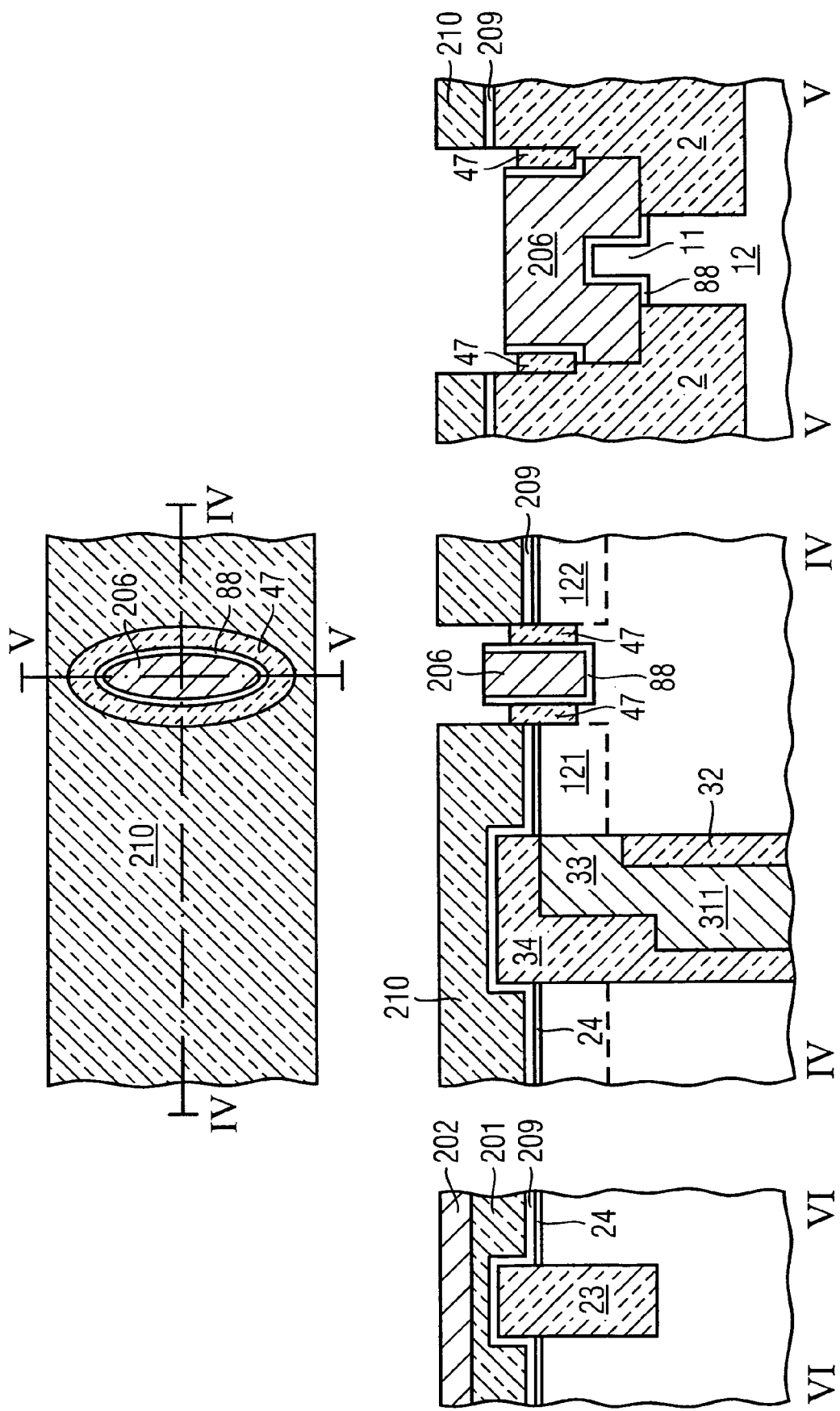

Thereafter, an etching process for etching the silicon nitride filling 49 is performed. As a consequence, the silicon nitride spacer 47 which is adjacent to the lower portion of the gate electrode 85 is maintained. The resulting structure is illustrated in FIG. 92. As can be seen from the cross-sectional view between IV and IV, the peripheral portion is not affected by this process, whereas in the array portion, the upper part of the silicon material of the gate grooves is removed. Nevertheless the bottom portion of the silicon nitride spacer 47 is maintained. Thereafter, a silicon nitride inner spacer 87 is formed by usual process processes. In particular, a silicon nitride layer is deposited, followed by an anisotropic etching process so as to remove the horizontal portions of the deposited silicon nitride layer. The resulting structure is illustrated in FIG. 93. As can be seen, the surface of the polysilicon layer 206 now is uncovered, with silicon nitride spacers 87 laterally shielding the gate electrode from the surrounding material.

Figure 94:
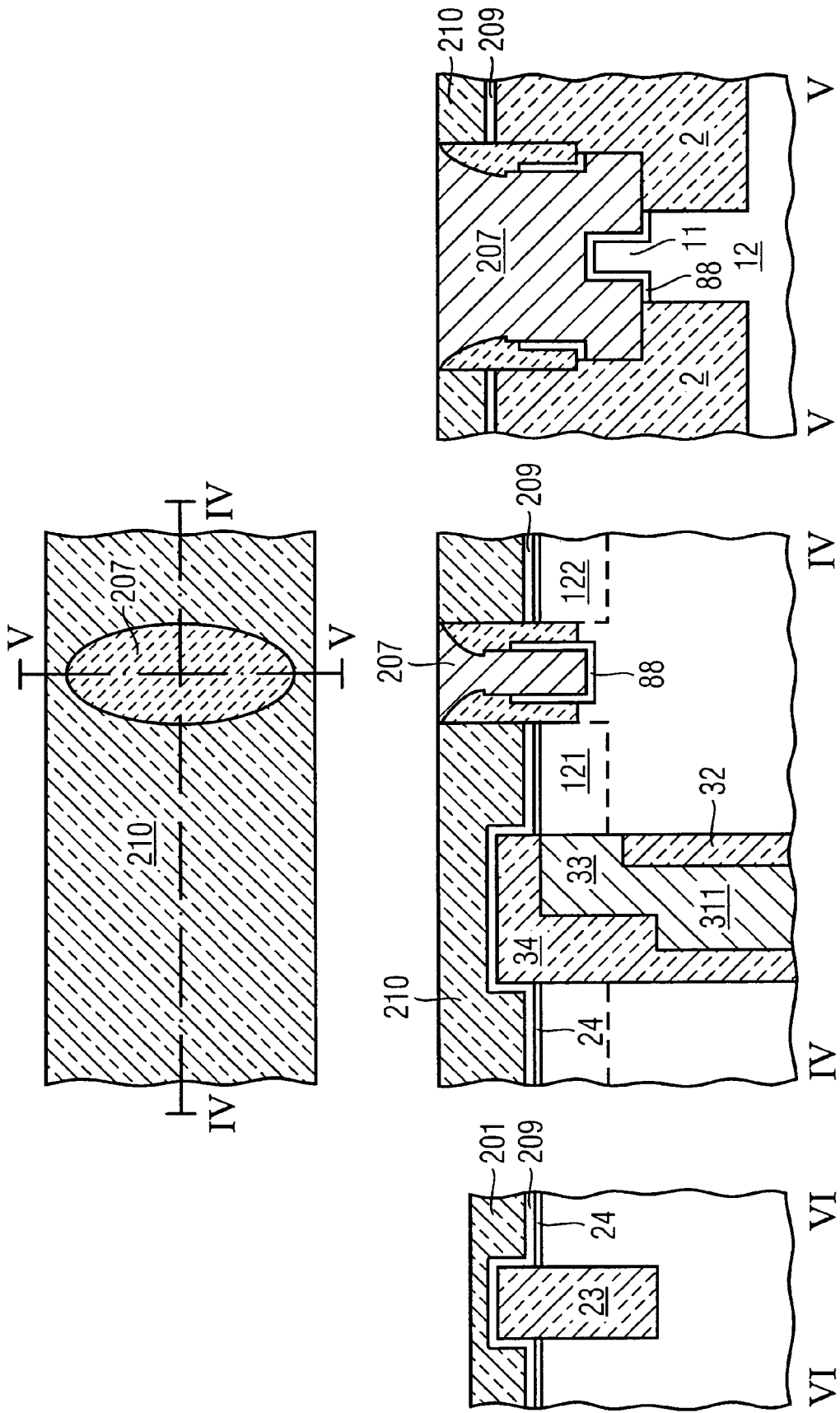
Figure 95:
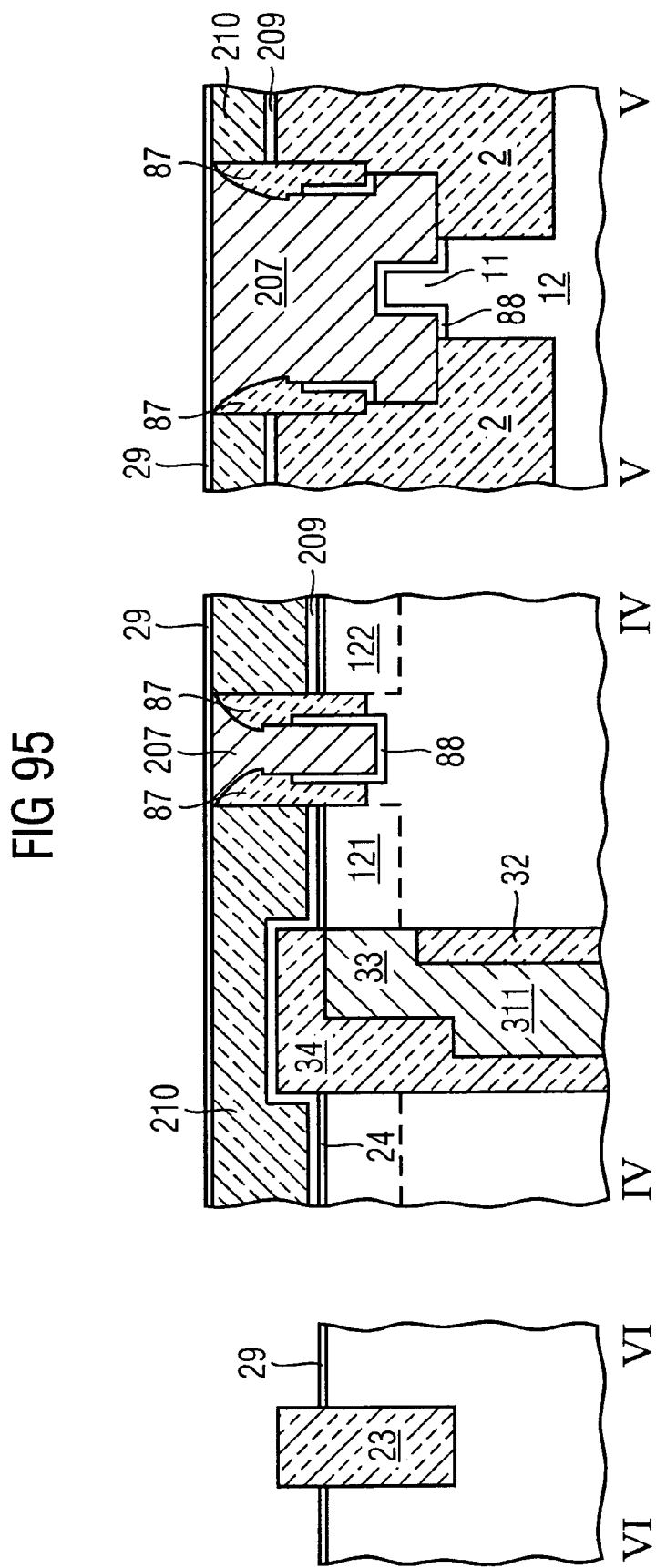

Thereafter, a polysilicon layer 207 is deposited and etched so that a planarized surface is formed. In particular, the gate grooves 73 now are filled in their upper part with the polysilicon material 207. By the planarization etching process, also the polysilicon layer 202 is removed from the peripheral portion between IV and IV, as can be seen from FIG. 94. Thereafter, the array portion is masked with a suitable mask leaving the peripheral portion uncovered. Then, an etching process for etching silicon dioxide is performed, followed by an etching process for etching silicon nitride. In addition, the sacrificial oxide layer is removed from the peripheral portion. After removing the mask from the array portion, an oxidation process is performed so as to provide a peripheral gate dielectric layer 29. As can be seen from FIG. 95 showing the resulting structure, the whole surface now is covered with the silicon dioxide layer 29.

Figure 96:
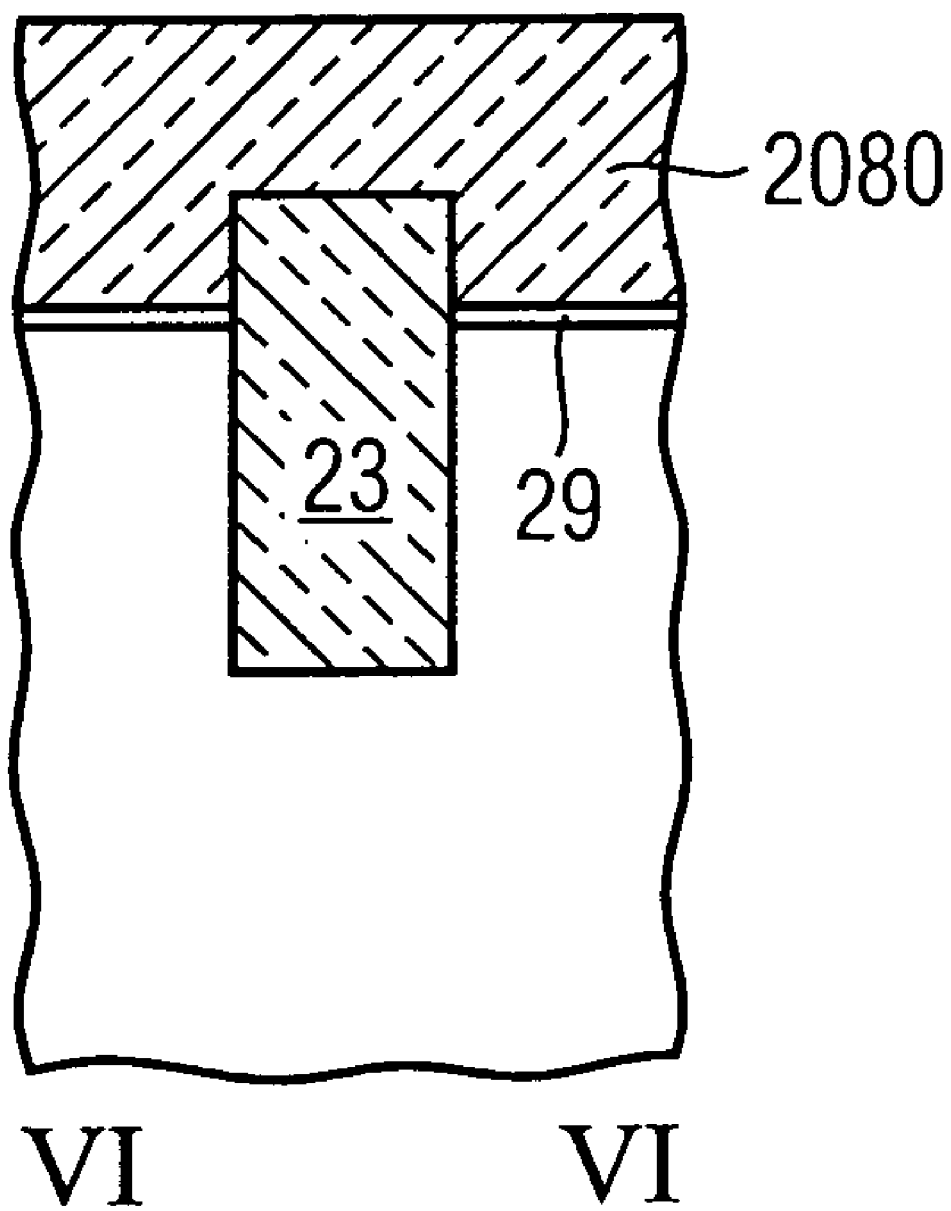
Figure 97:
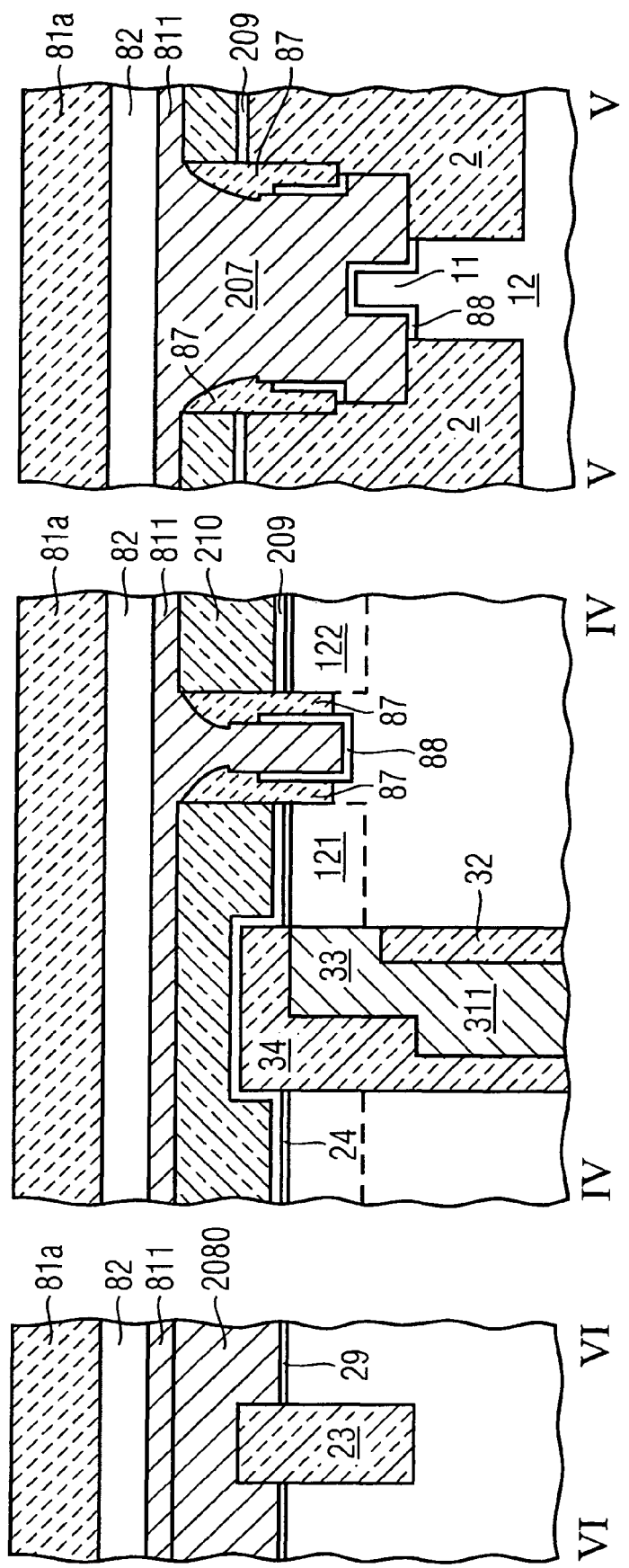

Thereafter, a polysilicon layer 2080 having a thickness which approximately corresponds to the thickness of the silicon dioxide layer 210 in the array portion is deposited over the whole surface. Then, the peripheral portion is covered with a suitable mask, leaving the array portion uncovered. Then, an etching process for etching the polysilicon layer 2080 from the array portion is performed. As a result, the polysilicon layer 2080 is maintained in the peripheral portion. The resulting cross-sectional view of the peripheral portion between VI and VI is illustrated in FIG. 96. After removing the mask from the peripheral portion, an etching process for etching the gate dielectric layer 29 from the array portion is performed. Then, optionally, the polysilicon layer 811 is deposited in the array portion. Thereafter, a tungsten layer 82 is formed, followed by silicon nitride layer 81a. The resulting structure is illustrated in FIG. 97.

Nevertheless, as is obvious to the person skilled in the art, the layer stack for forming the word lines and the peripheral gate electrode can be formed by any other method as is generally used in the art.

Figure 98:
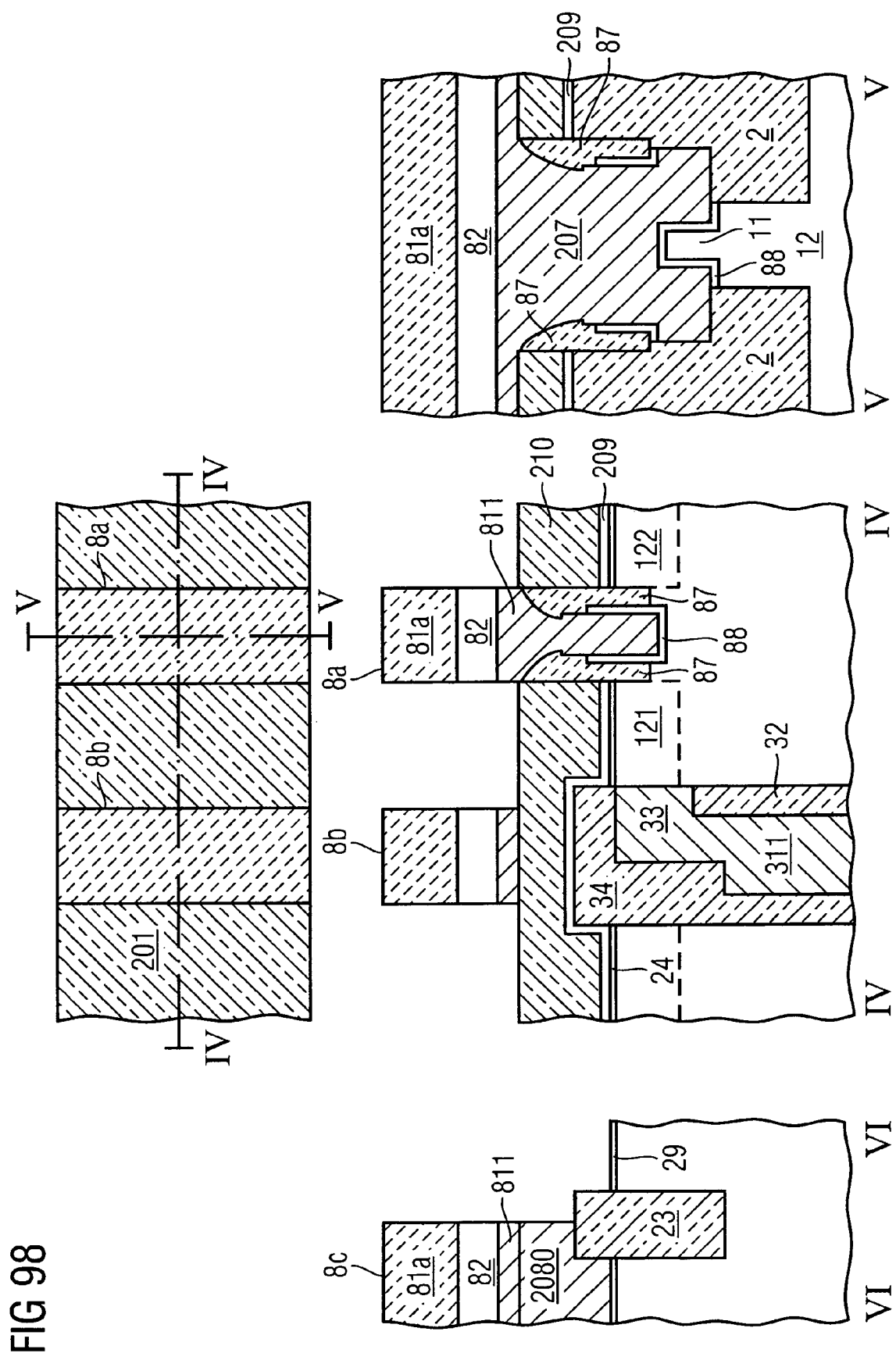
Figure 99:
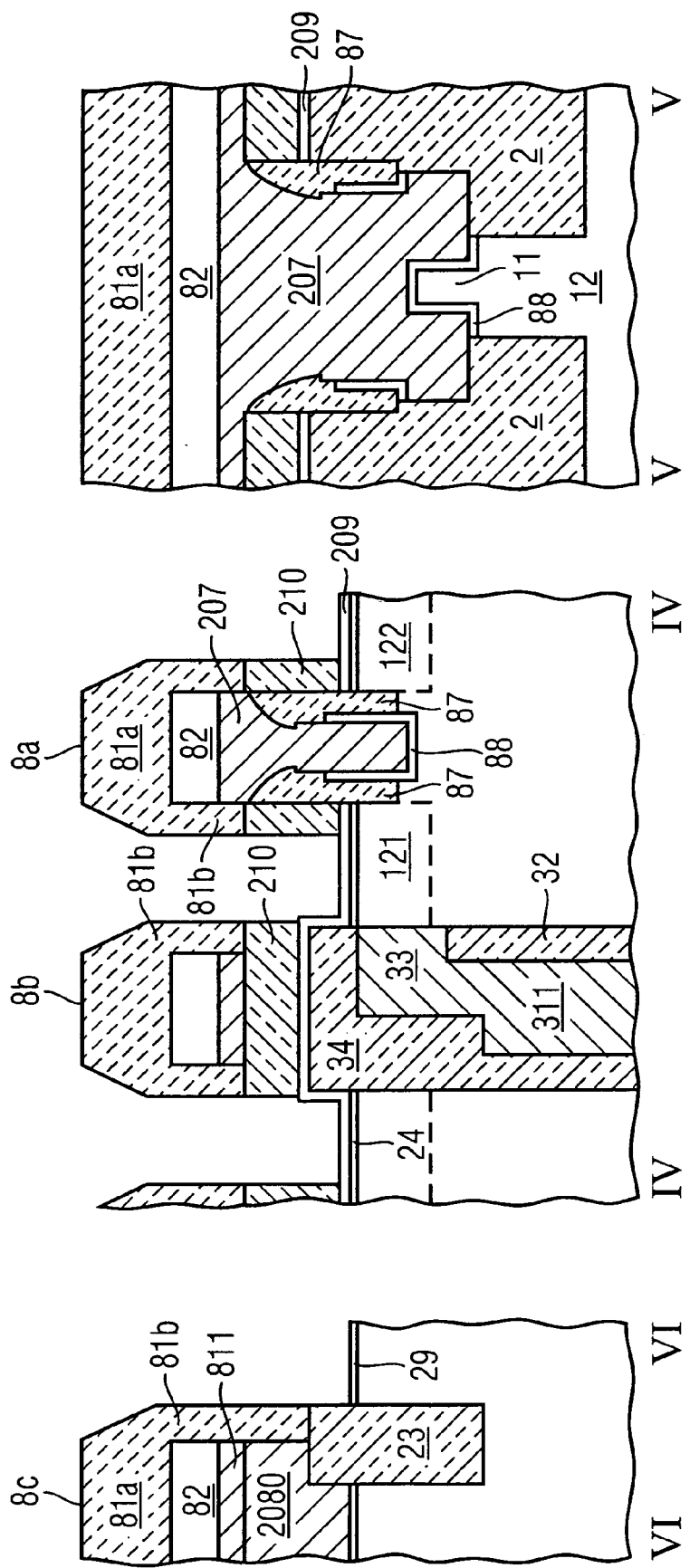
Figure 100:
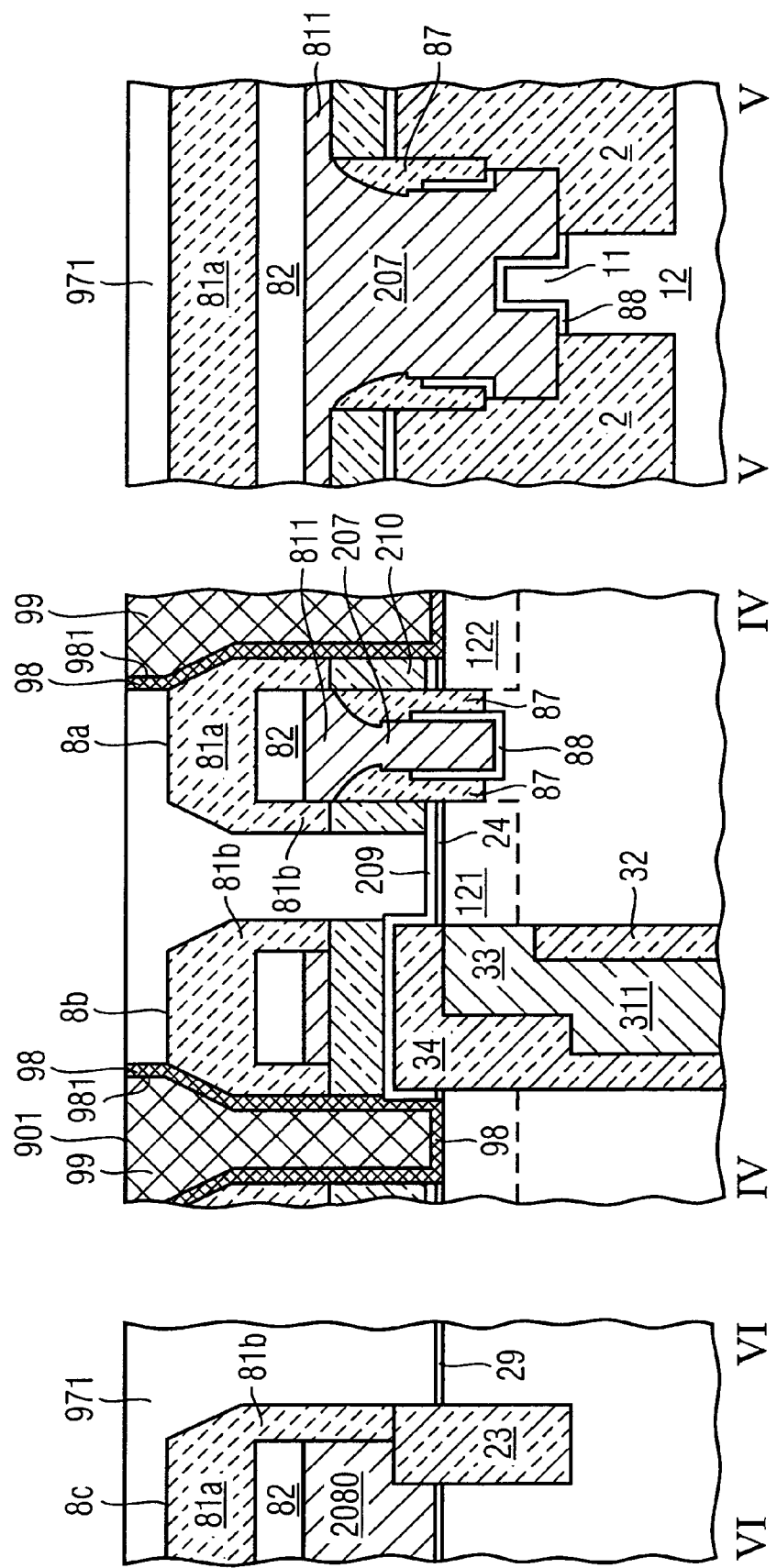

Then, in the same manner as has been described above with reference to FIGS. 85 and 86A, the formed layer stack is patterned so as to form active and passing word lines 8a, 8b as well as a peripheral gate electrode 8c. The resulting structure is illustrated in FIG. 98. As can be seen from the cross-sectional view between IV and IV, the silicon dioxide layer 210 is filled in the spaces adjacent to the active word lines 8a. In the next process, silicon nitride spacer is formed by generally known methods, in particular, by depositing a silicon nitride layer and anisotropically etching this layer. As a result, the spacers 81b as illustrated in FIG. 99 are formed. Thereafter, the silicon dioxide layer 210 is etched in the spaces between adjacent word lines, the etching process stopping on the silicon nitride liner 209. As can be seen from FIG. 99, the lower portion of the active word line 8a is encapsulated with a silicon dioxide spacer 210. FIG. 100 illustrates the structure after completing the bit line contacts 901 which are formed in a self-aligned manner similarly as has been described above by providing a liner layer stack comprising a titanium layer 98, a titanium nitride layer 981 as well as a tungsten filling 99. In the illustrated structure, the word lines are laterally isolated from the adjacent bit line contacts 901 by the remaining portions of the silicon nitride hard mask layer 209 and the silicon dioxide hard mask layer 201. Accordingly, a capacitive coupling between word lines and neighbouring bit line contacts is greatly reduced. In addition, since the silicon nitride layer 209 and the remaining portions of the silicon dioxide hardmask layer 210 are disposed between the passing word line and the polysilicon filling 311 of the trench capacitor, a capacitive coupling between the passing word line 8b and the storage electrode of the trench capacitor is reduced.

Thereafter, the process processes for forming bit line contacts in a self-aligned manner are performed.

FIGS. 101 to 119 illustrate a sixth embodiment of the present invention. According to the sixth embodiment of the present invention, an extended U-groove device (EUD) is formed by employing a hard mask layer stack comprising a silicon dioxide layer 29, which will also act as the peripheral gate dielectric layer, as the bottom hard mask layer, a polysilicon layer 208, which will act as a peripheral gate electrode, and a silicon nitride layer 41 on top. The hard mask layer stack can be patterned using a photoresist layer which is directly applied onto the surface of the silicon nitride layer 41. As an alternative, a carbon hard mask layer (not illustrated) is applied onto the surface of the silicon nitride layer 41, followed by a SiON layer (not illustrated), and the SiON layer is patterned using a photoresist layer.

Figure 101:
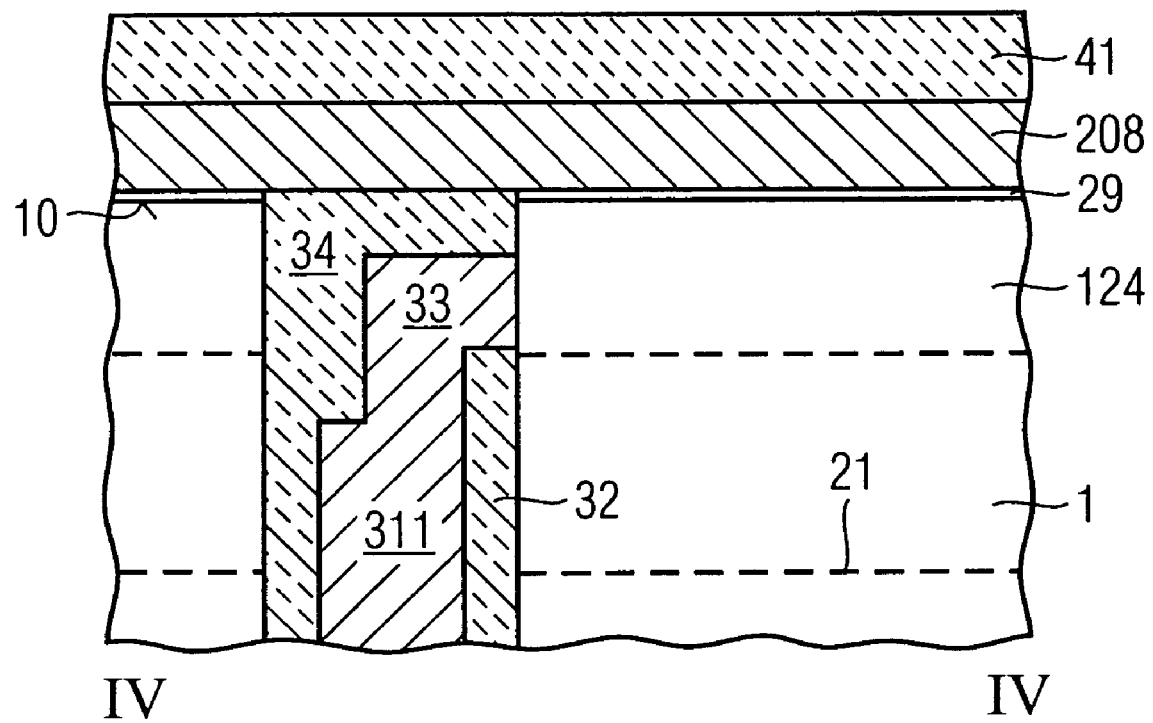
FIGS. 101 to 119 illustrate a sixth embodiment of the present invention.

For implementing the sixth embodiment of the present invention, after defining the storage capacitors, after performing the usual well implants and defining the isolation trenches for laterally confining the active areas, an ion implantation process is performed so as to provide the doped portion 124. Thereafter, the silicon dioxide layer 29 is formed by generally known methods. Then, a polysilicon layer 208 is deposited, followed by a silicon nitride layer 41. FIG. 101 illustrates the resulting structure. The bottom side of the isolation trenches (not illustrated in this cross-sectional view) is indicated by broken lines 21. The doped portion 124 is formed adjacent to the buried strap window 33.

Figure 102:
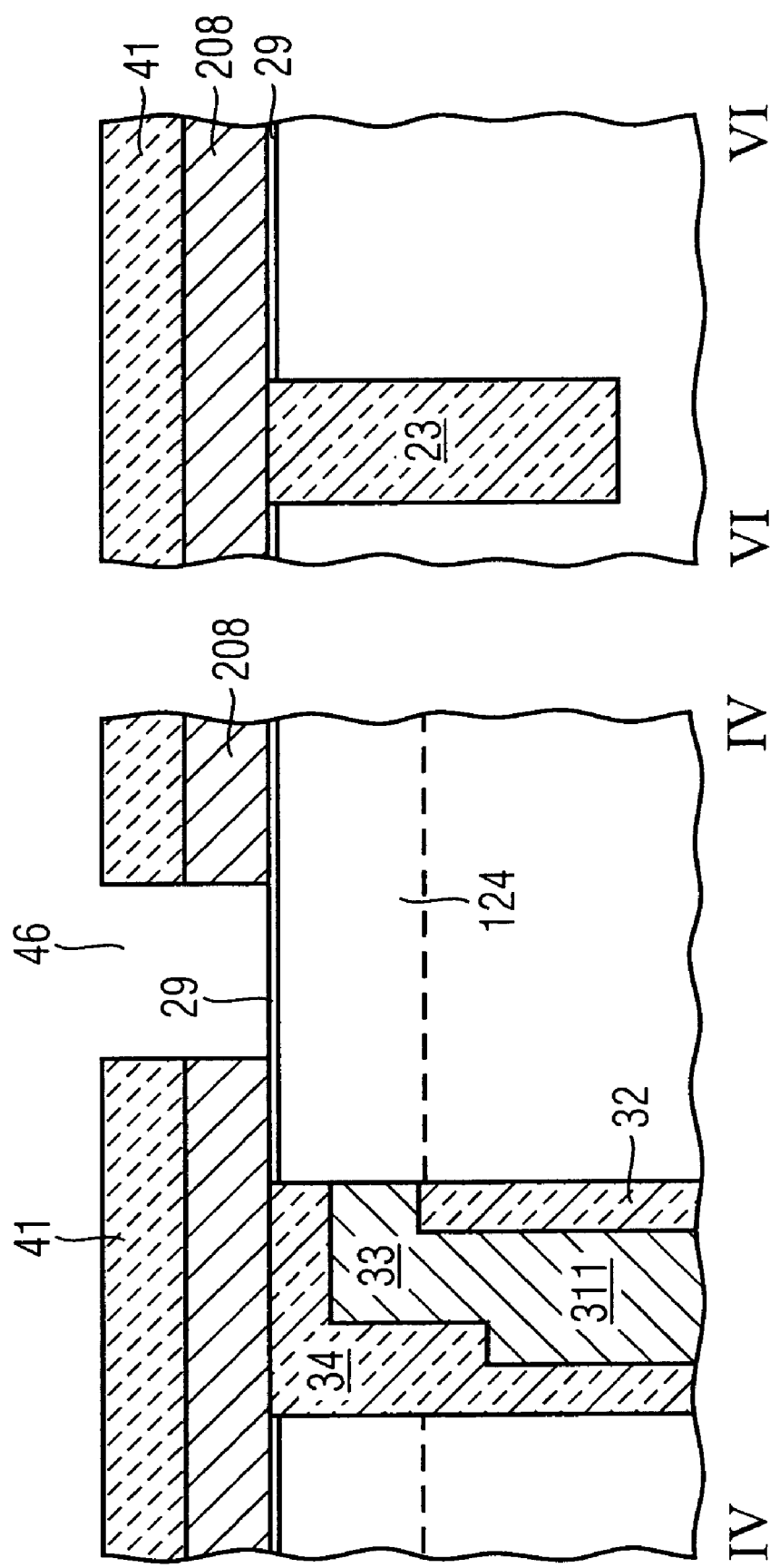

A photoresist material (not illustrated) is applied and patterned so as to form openings 46 for defining the gate electrodes. In particular, the openings 46 are photolithographically defined in the photoresist layer. Thereafter, the openings are etched in the silicon nitride layer 41. Then, the photoresist material is removed and a selective etching process for etching polysilicon selectively with respect to silicon nitride is performed so that, as a result, the openings 46 extend to the surface of the silicon dioxide layer 29. The resulting structure is illustrated in FIG. 102. As can be seen, in the cross-sectional view between IV and IV showing the array portion, the openings 46 are formed in the silicon nitride layer 41 and the polysilicon layer 208. In addition, in the peripheral portion between VI and VI, the whole surface is covered with an unpatterned layer stack comprising the silicon dioxide layer 29, the polysilicon layer 208 and the silicon nitride layer 41.

Figure 103:
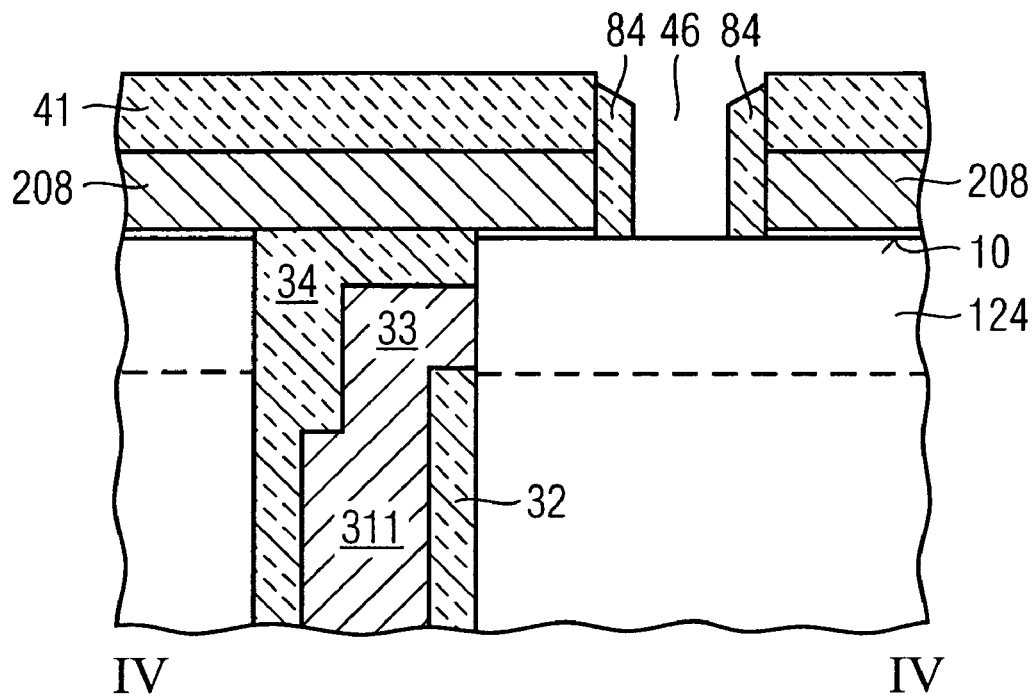

An $SiO_2$ spacer 84 is provided. To this end, as is generally known, first, a silicon dioxide liner is deposited, followed by an anisotropic etching process so as to remove the horizontal portions of the silicon dioxide liner. The resulting structure is illustrated in FIG. 103. As can be seen, on the sidewalls of the opening 46, the spacer 84 made of $SiO_2$ is formed.

Figure 104:
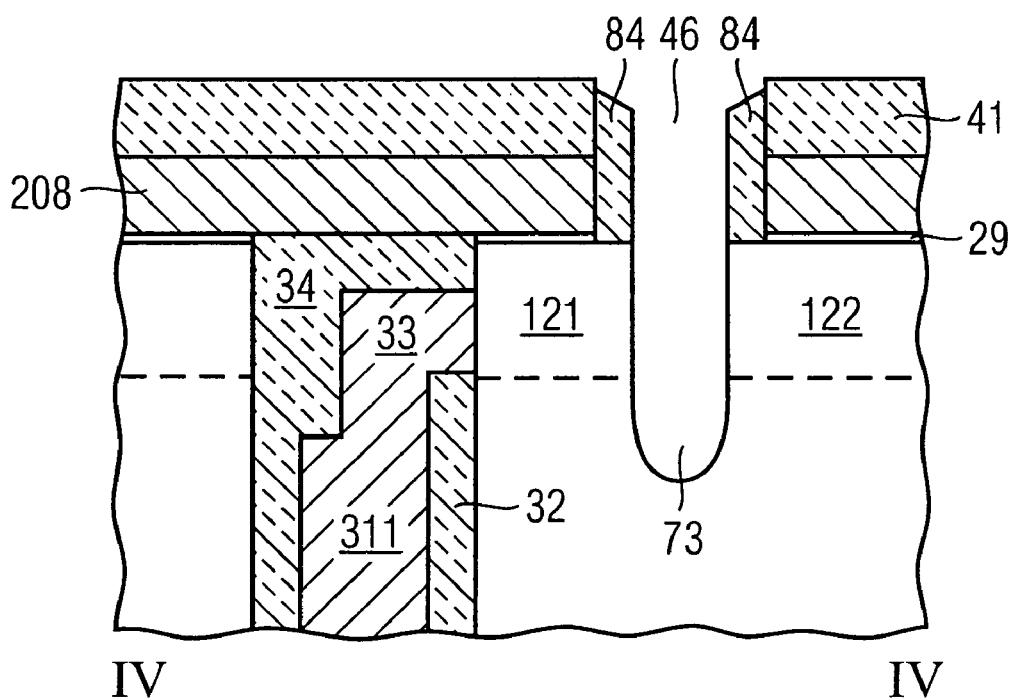

An anisotropic etching process for etching silicon is performed. During this etching process the polysilicon layer 208 is protected by the $SiO_2$ spacer 84. The resulting structure is illustrated in FIG. 104. As can be seen, a gate groove 73 is formed in the substrate 1. In addition, now the first and second source/drain regions 121, 122 are isolated from each other. As can be seen, due to the presence of the $SiO_2$ spacer 84, a gate groove having a smaller diameter than the previously patterned opening 46 can be formed. Accordingly, by employing such a spacer, a tapered etching process for etching the topmost hard mask layer as is illustrated in FIG. 39 can be dispensed with.

An isotropic etching process for etching silicon is performed. Thereby, the bottom portion of the gate groove 73 is widened. During this etching process, the polysilicon material 208 is protected by the silicon dioxide spacer 84.

Figure 105:
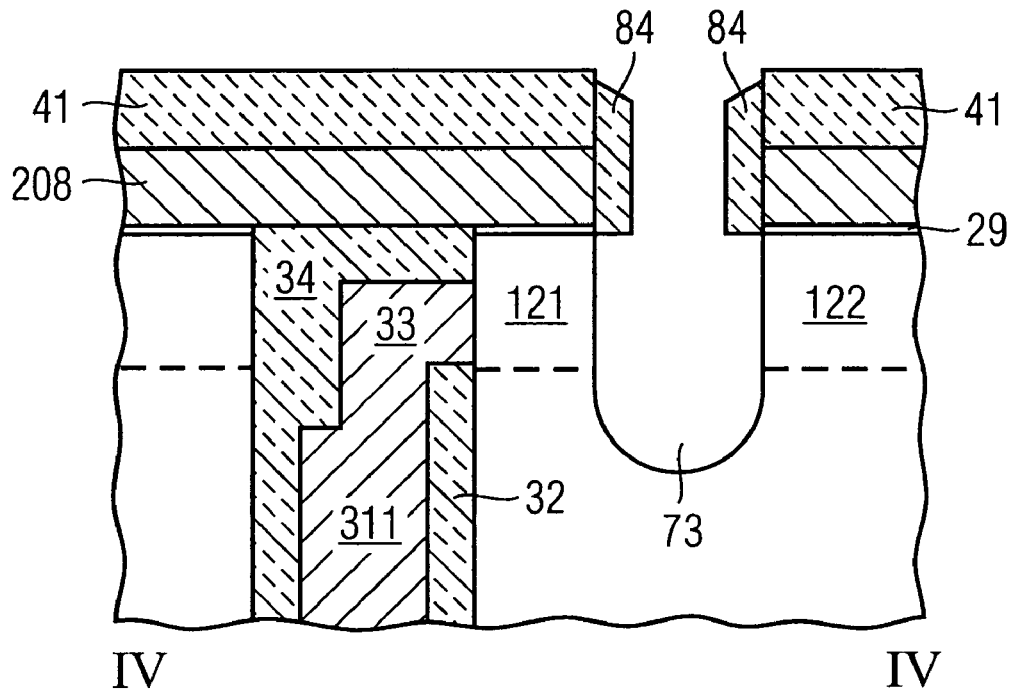

The resulting structure is illustrated in FIG. 105. As can be seen, the gate groove is widened so that the diameter of the resulting gate groove 73 approximately corresponds to the width of the opening 46 in FIG. 102.

Figure 106:
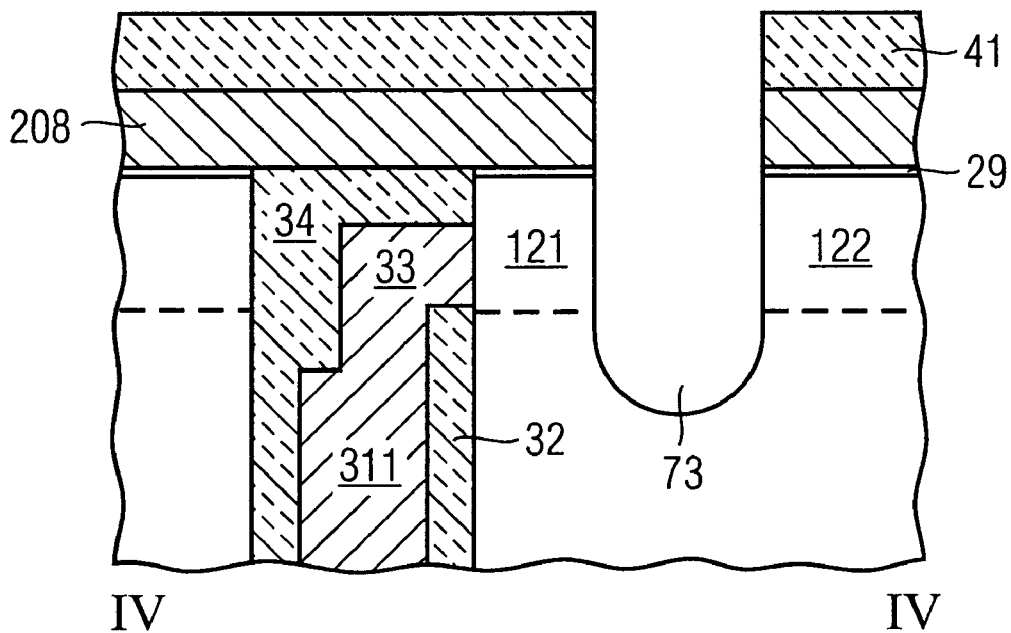
Figure 107:
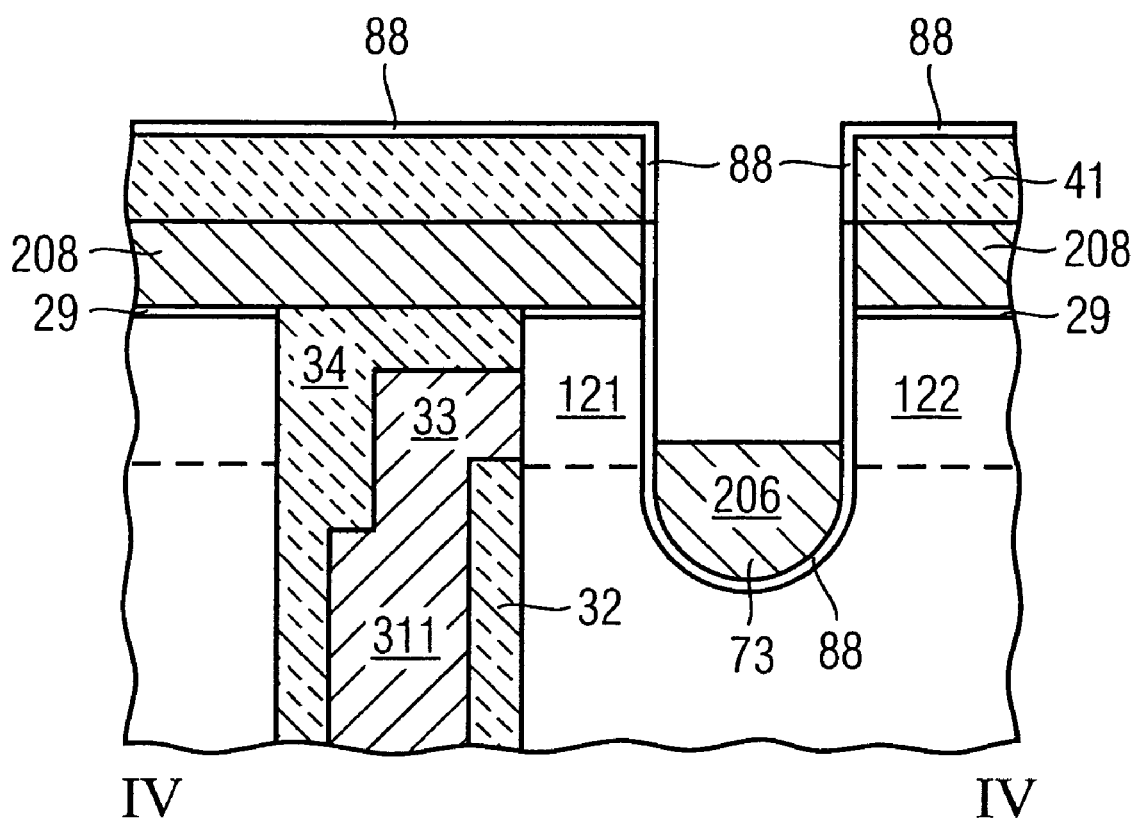

Thereafter, an etching process in diluted fluoric acid (DHF) is performed so as to etch the silicon dioxide spacer 47 as can be seen from FIG. 106. In addition, the portions of the isolation trenches (not illustrated in this cross-sectional view) which are adjacent to the active area are etched, thereby forming pockets which are adjacent to the gate groove 73. A cross-sectional view perpendicular to the cross-sectional view illustrated in FIG. 106, showing the etched portions in the isolation trenches 2, is for example illustrated in FIG. 43. In the next process, a gate dielectric layer 88 is provided, for example, by forming an ISSG (in situ steam generated) silicon dioxide layer. Thereafter, a polysilicon layer 206 is deposited, followed by a CMP (Chemical Mechanical Polishing) process by which also the silicon dioxide layer present on the silicon nitride hard mask layer 41 is removed. Thereafter, an etching process is performed so as to etch the upper portion of the polysilicon filling which is provided in the gate groove 73. The resulting structure is illustrated in FIG. 107. As can be seen from FIG. 107, the surface of the gate groove is covered with a silicon dioxide layer 88 forming a gate dielectric. Moreover, the bottom portion of the gate groove is filled with a polysilicon filling 206.

Figure 108:
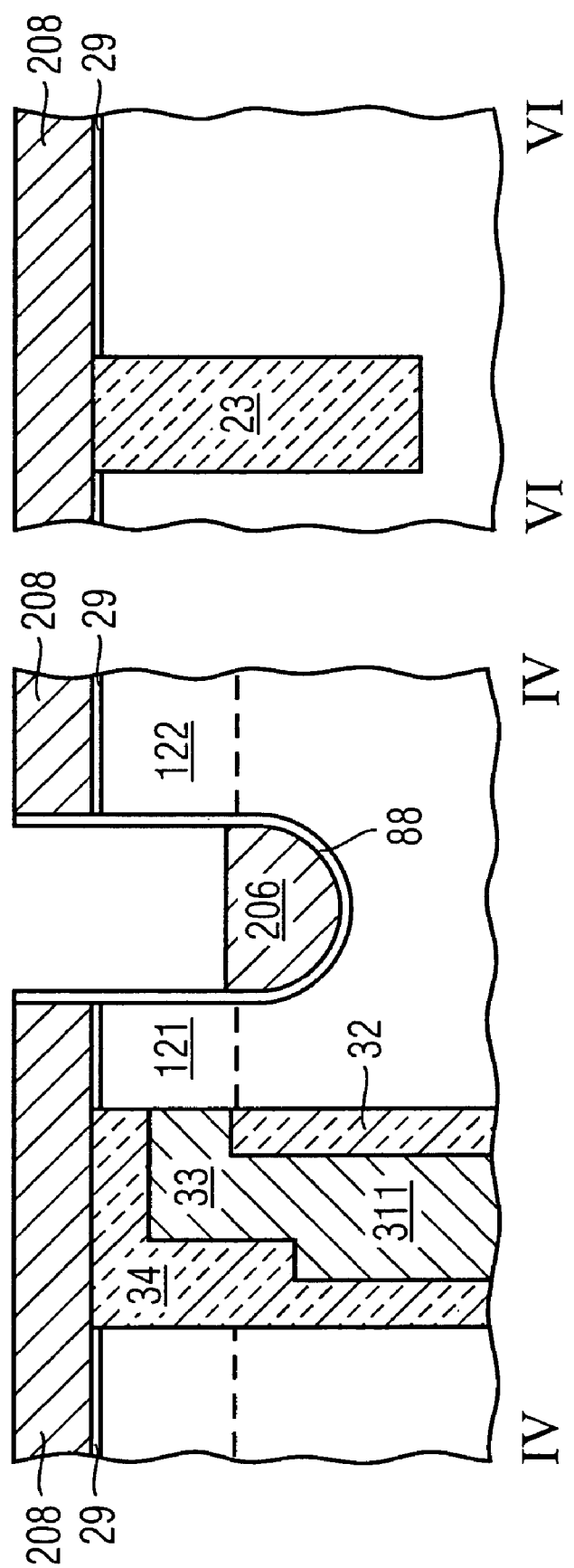

The silicon nitride layer 41 is removed by etching, for example, in hot phosphoric acid. Then, optionally, an etching process in DHF is performed so as to remove $SiO_2$ residuals. The resulting structure is illustrated in FIG. 108. As can be seen from the left hand portion of FIG. 108, in the array portion between IV and IV, the surface of the polysilicon layer 208 is exposed. Likewise, in the peripheral portion between VI and VI, the polysilicon layer 208 is exposed.

Figure 109:
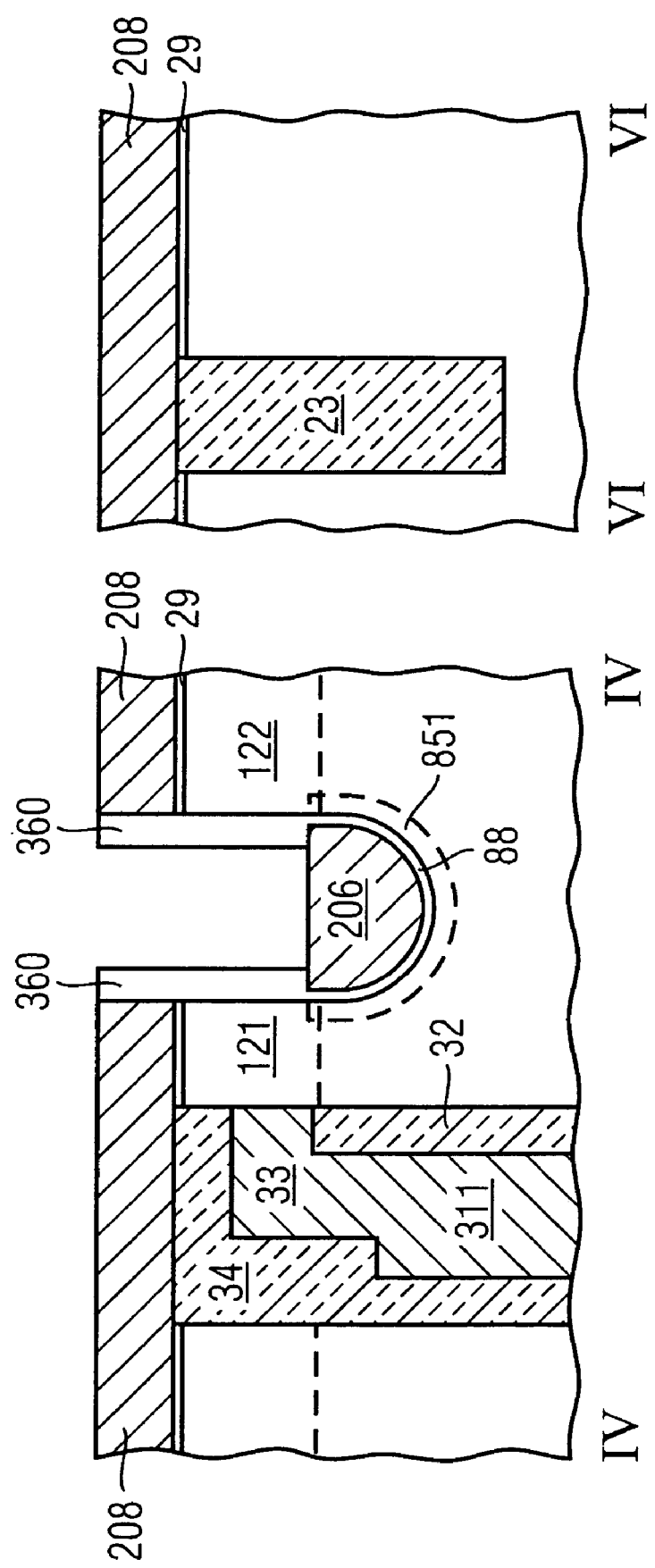

A spacer 360, which can be made of silicon dioxide or silicon nitride, is formed. Accordingly, first a silicon dioxide layer or a silicon nitride layer is conformally deposited, followed by an anisotropic spacer etching process by which the horizontal portions of the layer are etched. The resulting structure is illustrated in FIG. 109. As can be seen, in the array portion, a spacer 360 is formed on the side walls of the gate groove 73 in the upper portion thereof, whereas the peripheral portion between VI and VI remains unchanged. In FIG. 109 also the contour of the plate-like portions 851 of the gate electrode is indicated by a broken line.

Figure 110:
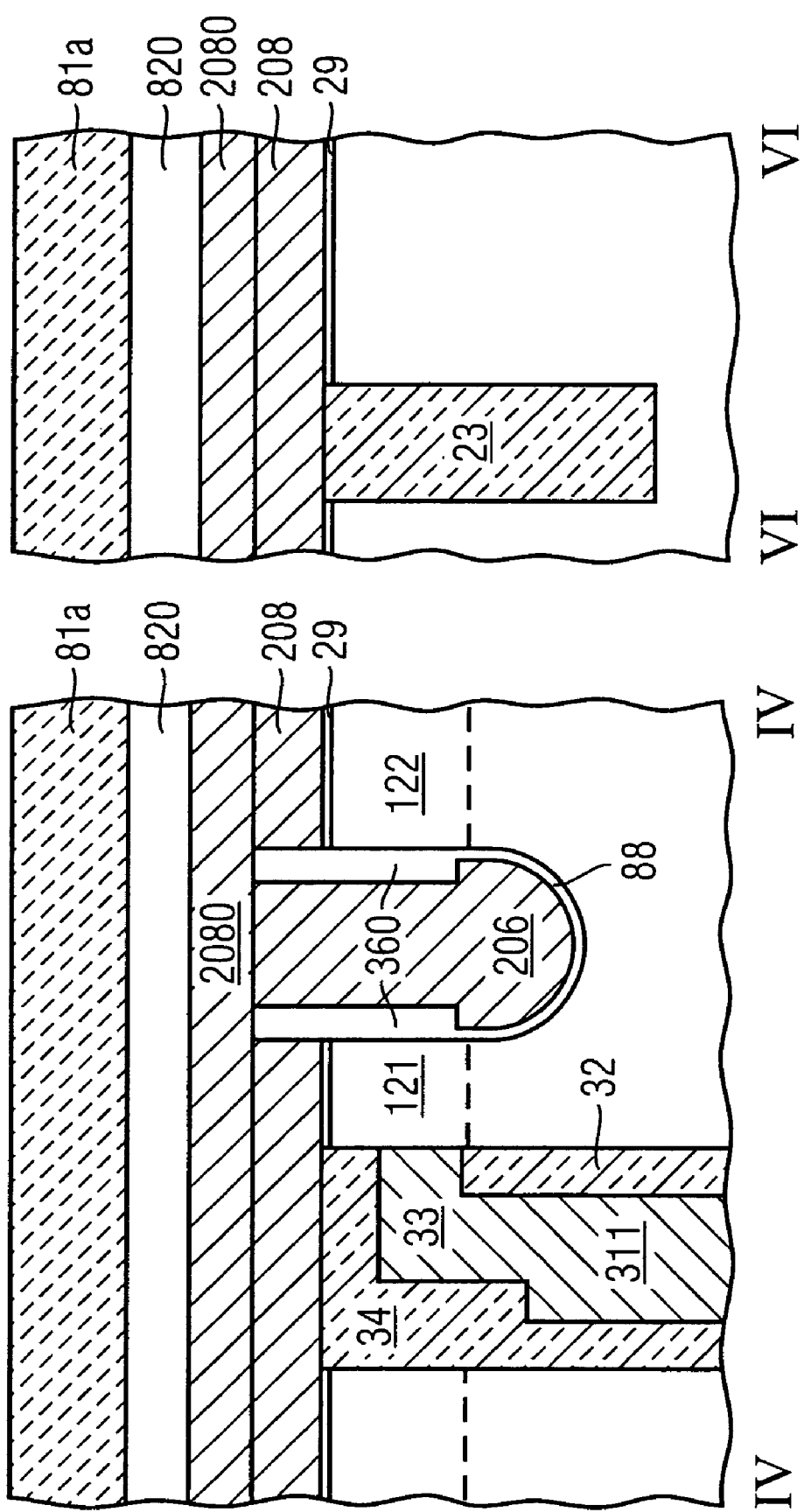

A sputter cleaning process is performed so as to clean the surface from residuals. Thereafter, the polysilicon layer 2080 for forming the gate electrode is deposited, for example by a PECVD (Plasma Enhanced Chemical Vapour Deposition) method, followed by a process of depositing a WSi layer 820 and a process of depositing a $Si_3N_4$ layer 81a. The resulting structure is illustrated in FIG. 110. As can be seen from FIG. 110, on top of the silicon dioxide layer 29, a polysilicon layer 208, 2080 is formed, followed by a WSi layer 820 and a $Si_3N_4$ layer 81a. These layers are also deposited in the peripheral portion between VI and VI. Nevertheless, as is obvious to the person skilled in the art, any other layer stack can be used for forming the gate electrode and, in particular, the peripheral gate electrode.

Figure 111:
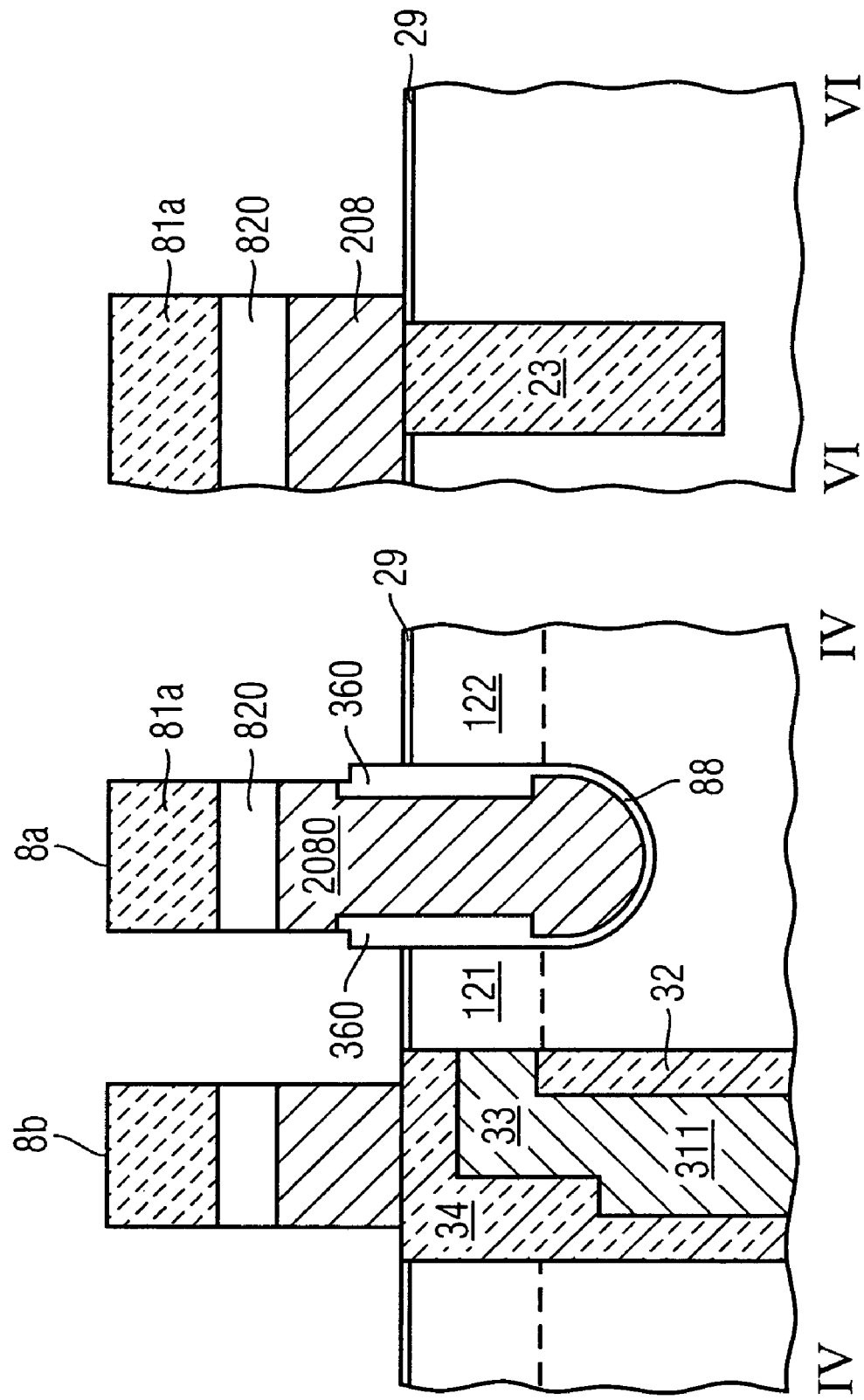

Thereafter, the layer stack for forming the word lines is patterned using a mask having a lines/spaces pattern so as to form the word lines, in particular, the active word lines 8a and the passing word lines 8b, simultaneously with the peripheral gate electrodes 8c. The resulting structure is illustrated in FIG. 111. As can be seen, in the array portion between IV and IV, on top of the silicon substrate, a silicon dioxide layer 29 is formed, and the active word lines 8a and the passing word lines 8b are patterned. In addition, in the peripheral portion between VI and VI, the layer stack is patterned by the same process processes thereby forming the peripheral gate electrodes 8c. Thereafter, the processes for providing the bit line contacts and the bit lines will be performed. In particular, the processes which have been described with reference to FIGS. 22 to 33 can be performed.

Figure 112:
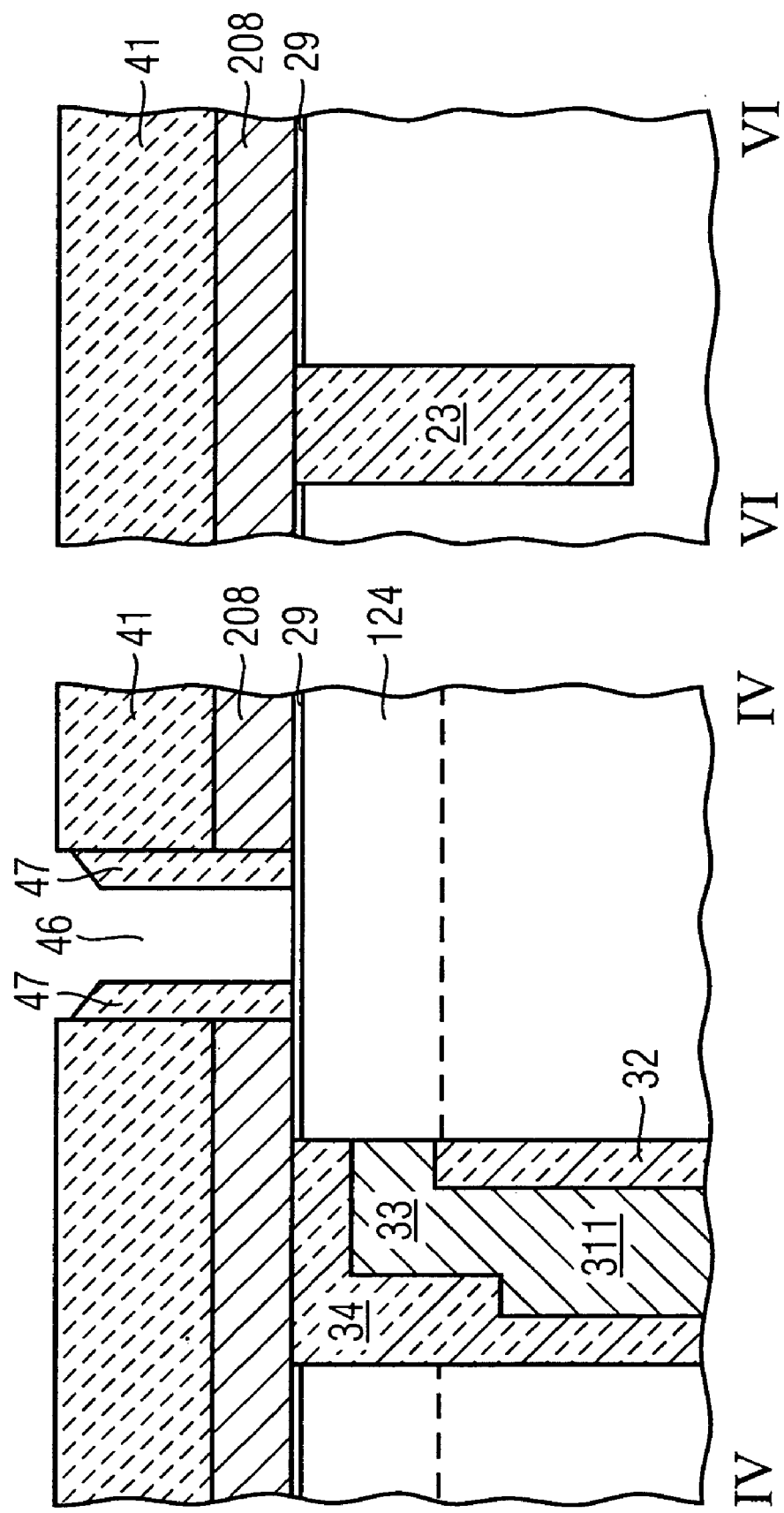

According to a modification of the sixth embodiment, a silicon nitride spacer 47 is used for laterally protecting the polysilicon layer 208 during the formation of the gate groove 73. Accordingly, starting from the structure illustrated in FIG. 102, a silicon nitride spacer 47 is formed on the side walls of the opening 46. In particular, as is generally known, a silicon nitride layer is conformally deposited, followed by an anisotropic etching process for removing the horizontal portions of the deposited silicon nitride layer. As a result, the silicon nitride spacer 47, as is illustrated in FIG. 112, are formed.

Figure 113:
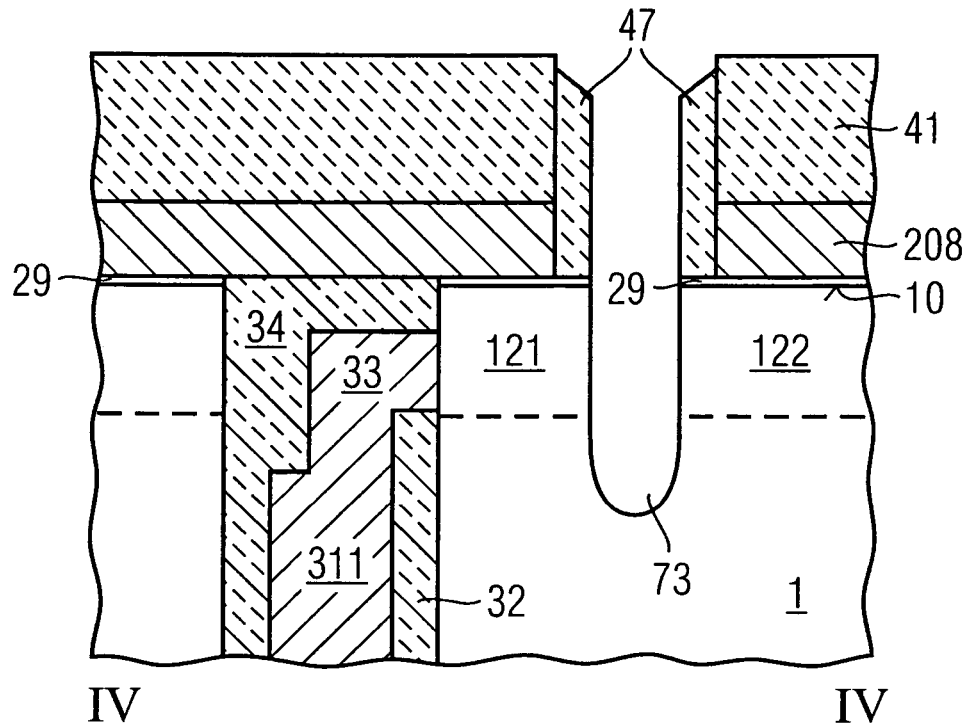
Figure 114:
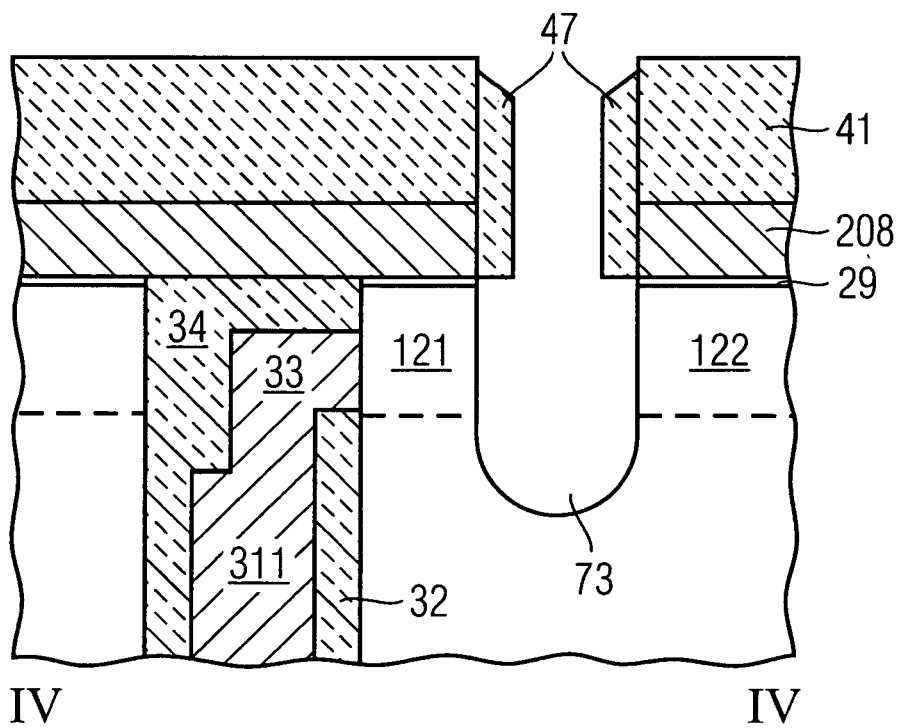

The gate groove 73 is etched in the silicon substrate. During this anisotropic etching process of etching silicon, the silicon nitride spacer 47 acts as a protecting layer, which prevents the polysilicon layer 208 from being etched. The resulting structure is illustrated in FIG. 113. As can be seen, the gate groove 73 is formed so as to extend below the bottom side of the source and drain regions 121, 122. In particular, by this etching process, the first and second source/drain regions 121, 122 are isolated from each other.

As can be seen, due to the presence of the $SiO_2$ spacer 47, a gate groove having a smaller diameter than the previously patterned opening 46 can be formed. Accordingly, by employing such a spacer, a tapered etching process for etching the topmost hard mask layer as is illustrated in FIG. 39 can be dispensed with.

An isotropic etching process for etching silicon is performed so as to widen the gate groove 73. As a consequence, the diameter of the gate groove 73 now approximately corresponds to the diameter of the opening 46 which has been formed in the silicon nitride layer 41 and the polysilicon layer 208.

Figure 115:
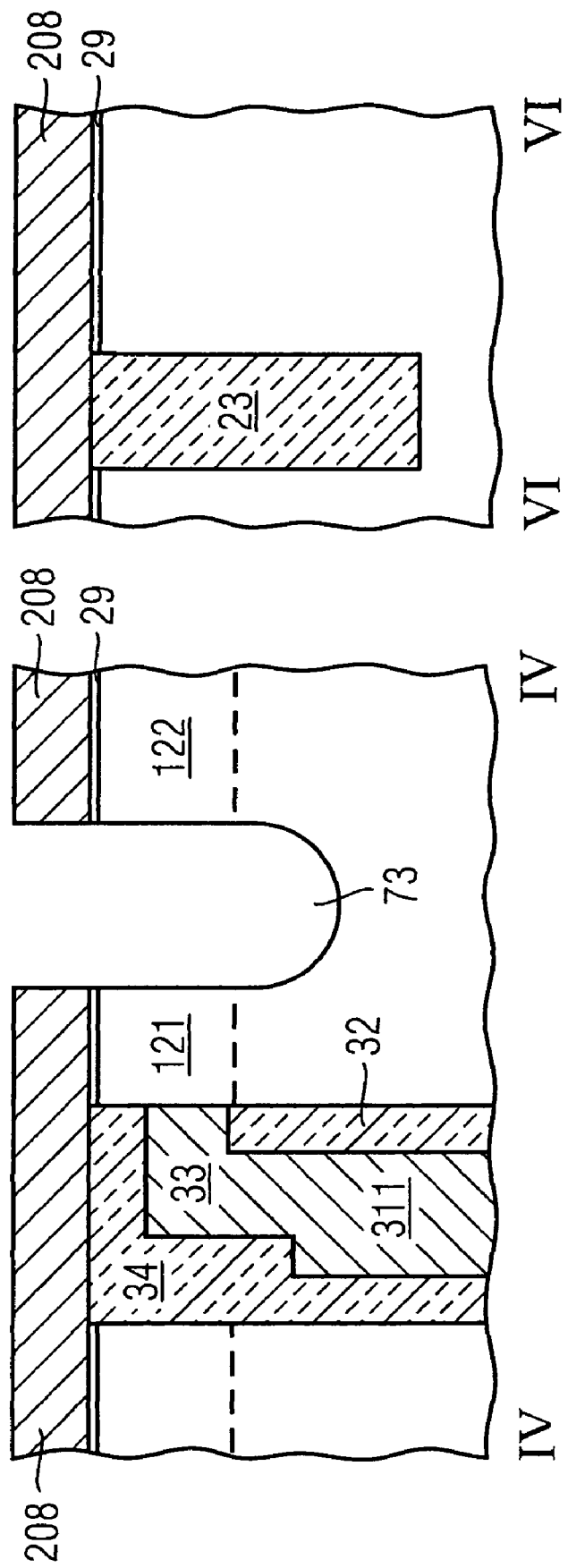

The silicon nitride layer 41 and the silicon nitride spacer 47 are removed by etching in hot phosphoric acid and an etching process for etching $SiO_2$ is performed, using a DHF bath. By this etching process, the portion of the isolation trenches 2 which are adjacent to the active area are etched as well. This can in particular be taken from the cross-sectional view which is illustrated in FIG. 43, showing a cross-sectional view which is taken perpendicular to the cross-sectional view illustrated in FIG. 115. The resulting structure is illustrated in FIG. 115, showing the cross-sectional view between IV and IV in a direction parallel to the active areas. As can be seen, now the silicon nitride layer 41 and the silicon nitride spacer are removed from the peripheral portion as well as from the array portion.

Figure 116:
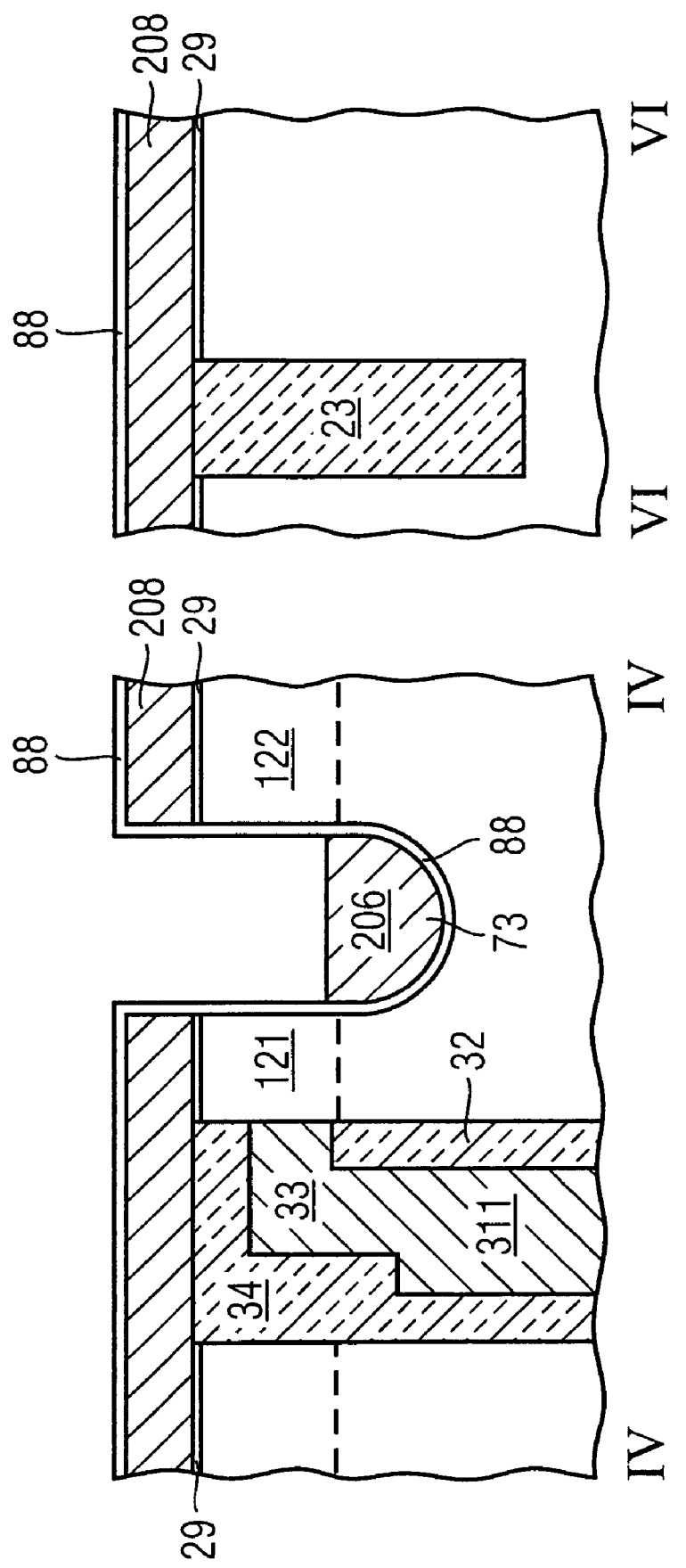

A gate dielectric 88 is provided. In particular, an ISSG process is performed for forming a $SiO_2$ layer which is formed on the surface of the gate grooves 73 as well as on the surface of the polysilicon layer 208. Thereafter, a polysilicon layer is deposited, followed by a planarization process and an etching process for recessing the polysilicon layer so as to form the polysilicon filling 206 in the bottom portion of the gate groove 73. The resulting structure is illustrated in FIG. 116. As can be seen, in the peripheral portion, a silicon dioxide layer is formed on the surface of the polysilicon layer 208. In the array portion, the gate groove is filled with a silicon dioxide layer 88 and, in the bottom portion thereof, by a polysilicon filling 206.

A spacer 360 is formed on the side walls of the gate groove 73.

Figure 117:
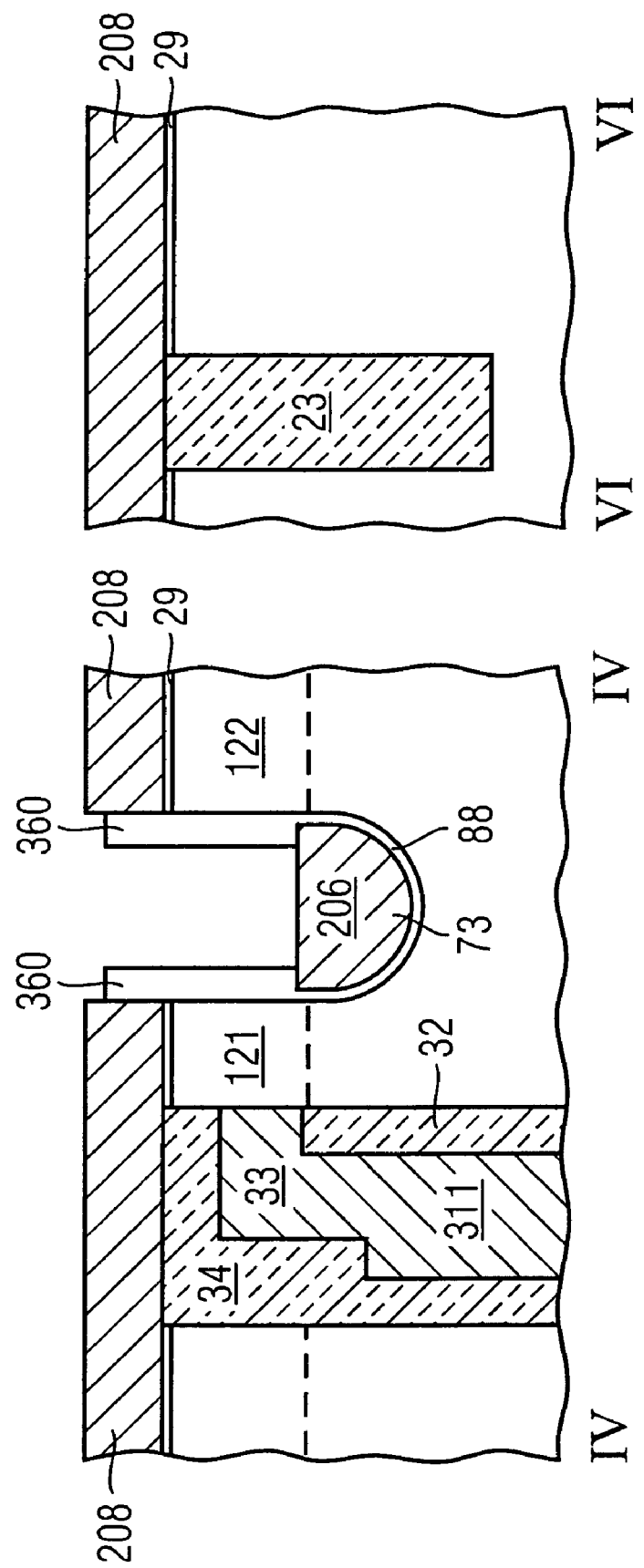
Figure 118:
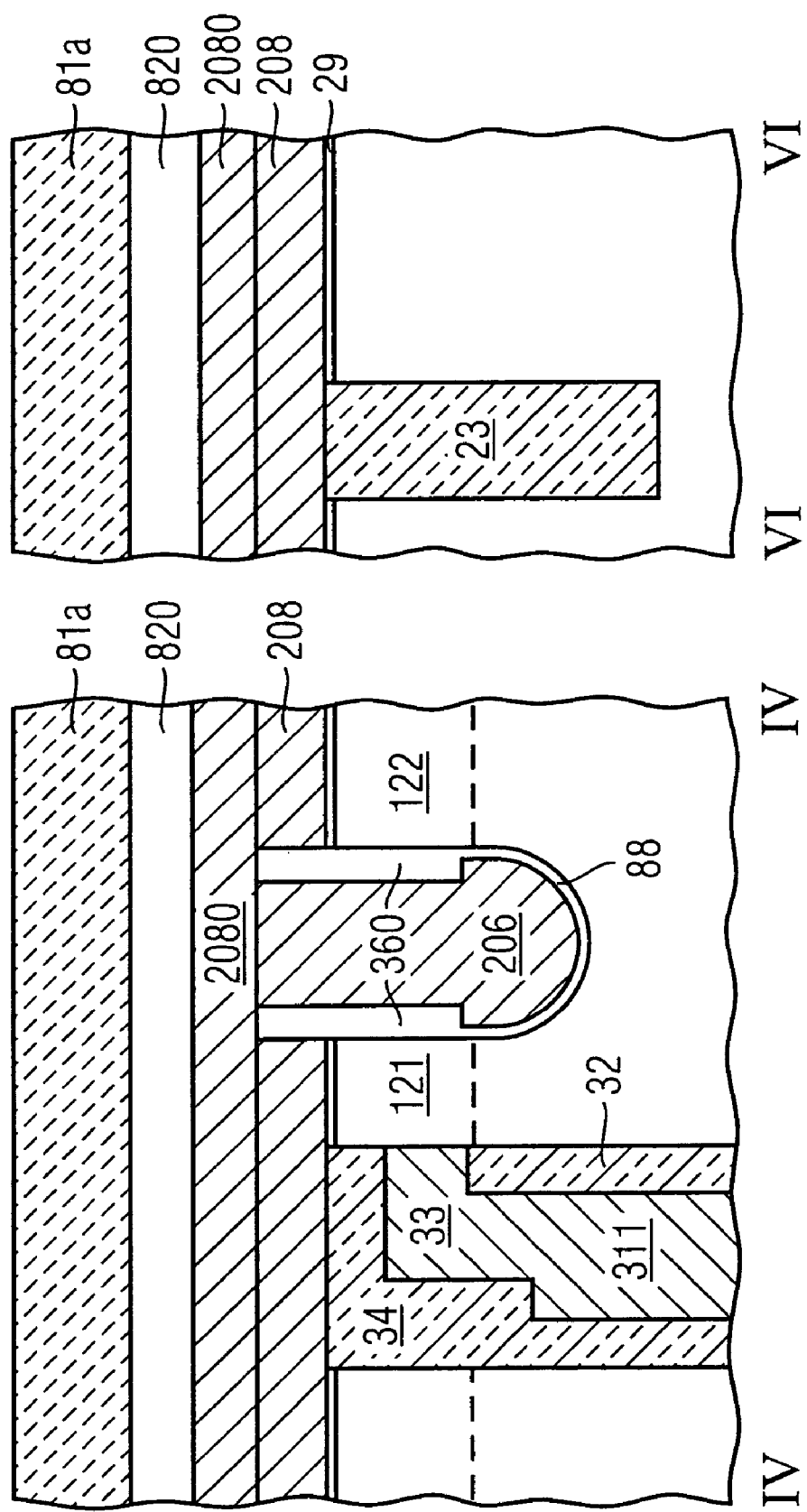

For forming the spacer 360, first a silicon dioxide layer or a silicon nitride layer is conformally deposited, followed by an anisotropic etching process for removing the horizontal portions of the deposited layer. Thereby the spacer 360 is formed. Optionally, a so-called dual work function process can be performed so as to provide a special kind of gate electrode in the peripheral portion as is generally known. The resulting structure is illustrated in FIG. 117. As can be seen, the upper portion of the gate groove 73 the spacer 360, which can be made of silicon dioxide or silicon nitride, is provided. Then, a sputter cleaning process is performed so as to remove unwanted residuals. Thereafter, a further polysilicon layer 2080 for forming the wordlines is deposited, followed by a WSi layer 820 and a silicon nitride layer 81a. The resulting structure is illustrated in FIG. 118. As can be seen, in the array portion between IV and IV, as well as in the peripheral portion between VI and VI, a layer stack made of the silicon dioxide layer 29, the polysilicon layers 208, 2080, a WSi layer 820 and a $Si_3N_4$ layer 81a is provided.

Figure 119:
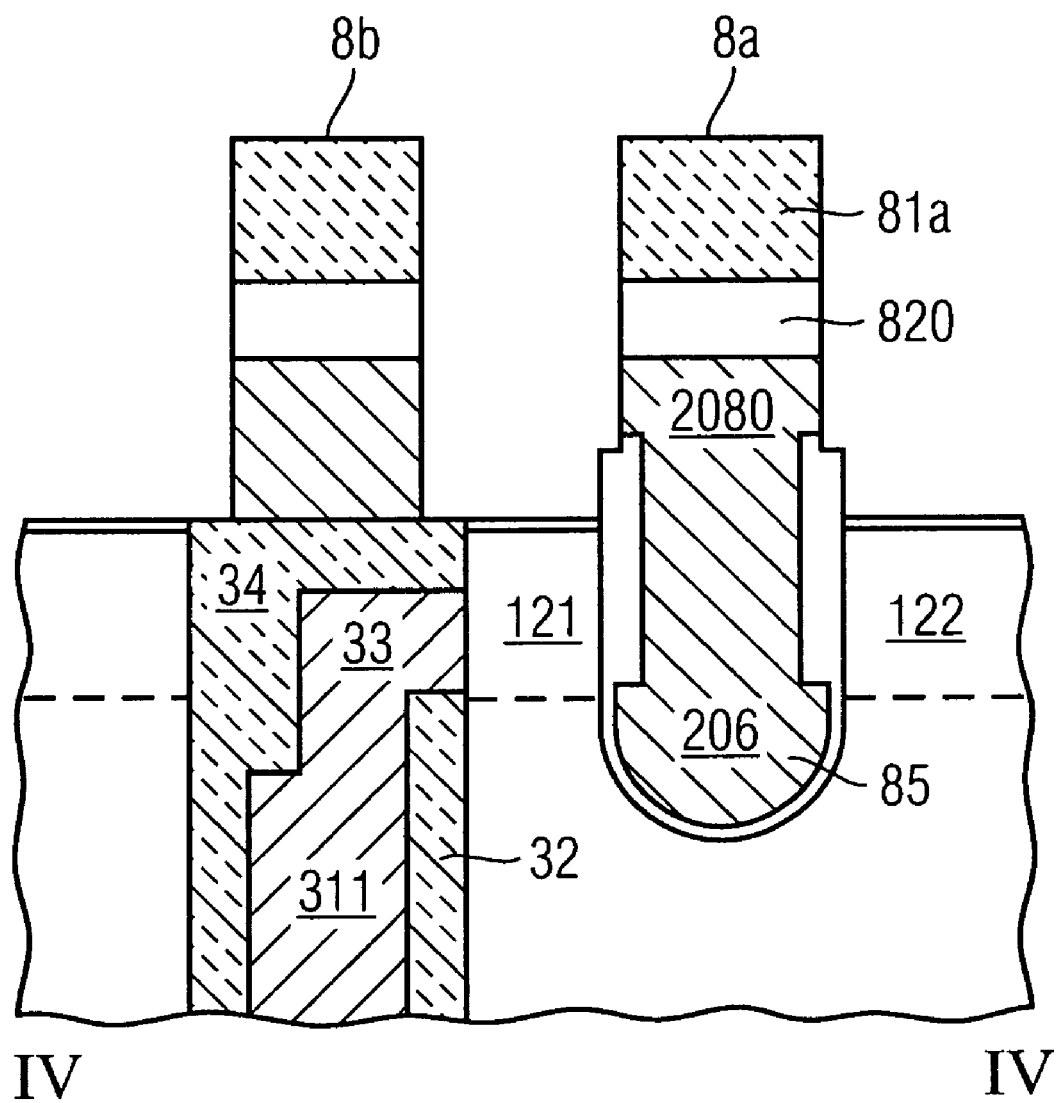

The layer stack is patterned so as to form the corresponding word lines. In particular, as is generally known, a mask having a lines/spacers pattern is used to pattern the active word lines 8a as well as the passing word lines 8b. The resulting structure is illustrated in FIG. 119. As can be seen, in the array portion between IV and V, above the gate electrode 85 the active word line 8a is formed, whereas above the storage capacitor the passing word line 8b is provided. The memory cell array is completed by forming the corresponding bit line contacts and bit lines, for example by performing the processes which are illustrated with reference to FIGS. 22 to 32.

According to the sixth embodiment of the present invention, the silicon dioxide layer 29 which is used as the peripheral gate dielectric, forms part of the hard mask layer process. Accordingly, the process of providing an additional gate dielectric layer can be omitted. Furthermore, masking processes for masking the array portion and the peripheral portion so as to process the peripheral portion and the array portion separately from each other, can be dispensed with. Accordingly, the process is greatly simplified. In addition, the complexity of the process flow can be reduced with respect to the previous embodiments. Moreover, several annealing processes can be omitted, whereby the thermal budget of the process is reduced. In particular, since the hard mask layer stack does not comprise a silicon dioxide layer which has been formed by the TEOS method, an annealing process for annealing the silicon dioxide layer can be dispensed with. Moreover, the CD control of the gate electrode can be improved by using a $Si_3N_4$ or $SiO_2$ spacer for etching the gate groove 73.

As is obvious to the person skilled in the art, the sixth embodiment can be implemented using an additional hard mask layer stack comprising a carbon hard mask layer and a SiON hard mask layer wherein the carbon hard mask layer is deposited on top of the silicon nitride layer. Moreover, the photoresist layer is deposited on top of the SiON layer. Nevertheless, the photoresist layer can as well be directly deposited on top of the silicon nitride layer 41 as is described with respect to FIGS. 101 to 119.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing an integrated circuit comprising a memory device, comprising:
    defining isolation trenches in a surface of a semiconductor substrate;
    forming array gate electrodes, wherein forming array gate electrodes comprises:
        defining a gate groove in the semiconductor substrate;
        forming a gate electrode material so as to fill the groove;
        forming word lines, the array gate electrodes being connected with corresponding word lines; and
        forming peripheral circuitry by forming at least one peripheral transistor, the process of providing a peripheral transistor comprising forming a peripheral gate electrode;
    wherein the peripheral gate electrodes and the word lines are made by:
        forming a layer stack comprising at least one layer on the substrate surface so as to cover the memory cells and the peripheral circuitry; and
        thereafter, patterning the layer stack so as to form the word lines and the peripheral gate electrodes,
    wherein the method further comprises:
    providing a gate insulating material at an interface between an active area and a groove and at an interface between the active area and pockets; and
    depositing a gate electrode material so as to fill the groove and two pockets.

2. The method of claim 1, wherein a pocket is defined in each of the isolation trenches by an etching process which etches an isolating material in the isolation trenches selectively with respect to a semiconductor substrate material.

3. A method of manufacturing an integrated circuit comprising a memory device, comprising:
    defining isolation trenches in a surface of a semiconductor substrate;
    forming array gate electrodes, wherein forming array gate electrodes comprises:
        defining a gate groove in the semiconductor substrate;
        forming a gate electrode material so as to fill the groove;
        forming word lines, the array gate electrodes being connected with corresponding word lines; and
        forming peripheral circuitry by forming at least one peripheral transistor, the process of providing a peripheral transistor comprising forming a peripheral gate electrode;
    wherein the peripheral gate electrodes and the word lines are made by:
        forming a layer stack comprising at least one layer on the substrate surface so as to cover the memory cells and the peripheral circuitry; and
        thereafter, patterning the layer stack so as to form the word lines and the peripheral gate electrodes,
    wherein the process of defining the gate groove further comprises:
    forming a first hard mask layer stack on the semiconductor substrate, the first hard mask layer stack comprising at least one layer of a material which is different from the material of the semiconductor substrate; and
    defining a first opening in the first hard mask layer stack, and
    etching the substrate material at a position corresponding to the first opening.

4. The method according to claim 3, further comprising:

forming a second hard mask layer stack on the surface of the first hard mask layer stack, the second hard mask layer stack comprising a carbon layer; and defining a second opening in the second hard mask layer stack, wherein the second opening is defined at a position at which the first opening is to be formed.

5. A method of manufacturing an integrated circuit comprising a memory device, comprising:

defining isolation trenches in a surface of a semiconductor substrate;

forming array gate electrodes, wherein forming array gate electrodes comprises:

defining a gate groove in the semiconductor substrate;

forming a gate electrode material so as to fill the groove;

forming word lines, the array gate electrodes being connected with corresponding word lines; and forming peripheral circuitry by forming at least one peripheral transistor, the process of providing a peripheral transistor comprising forming a peripheral gate electrode;

wherein the peripheral gate electrodes and the word lines are made by:

forming a layer stack comprising at least one layer on the substrate surface so as to cover the memory cells and the peripheral circuitry; and thereafter, patterning the layer stack so as to form the word lines and the peripheral gate electrodes, wherein the method further comprises:

wherein defining the gate groove comprises:

selective etching the substrate material with respect to the isolating material of the isolation trenches;

thereafter, defining a pocket in each of the isolation trenches at a position adjacent to the groove so that the two pockets will be connected with the groove and the groove is disposed between the two pockets, the two pockets extending to a second depth larger than a first depth of the gate groove.

6. The method of claim 1, wherein the patterning of the layer stack so as to form the peripheral gate electrode and the word lines comprises an etching process of simultaneously etching the word lines and the peripheral gate electrodes.

7. The method of claim 3, wherein the first hard mask layer stack further comprises a top layer made of polysilicon.

8. The method according to claim 7, wherein the peripheral gate electrode is formed by patterning a polysilicon layer forming part of the first hard mask layer stack.

9. The method according to claim 3, wherein the first hard mask layer stack comprises a bottom layer which is made of polysilicon and a top layer which is made of silicon nitride.

10. The method of claim 3, further comprising:

forming a silicon dioxide layer on the semiconductor substrate surface, this process being performed before the process of providing the first hard mask layer stack.

* * * * *